(12) United States Patent
Chin et al.

(10) Patent No.: US 12,354,958 B2
(45) Date of Patent: Jul. 8, 2025

(54) SEMICONDUCTOR DEVICES AND METHODS OF FORMATION

(71) Applicant: Taiwan Semiconductor Manufacturing Company, Ltd., Hsinchu (TW)

(72) Inventors: Shu-Cheng Chin, Hsinchu (TW);
Chih-Chien Chi, Hsinchu (TW);
Hsin-Ying Peng, Hsinchu (TW);
Jau-Jiun Huang, Kaohsiung (TW);
Ya-Lien Lee, Baoshan Township (TW);
Kuan-Chia Chen, Hsinchu (TW);
Chia-Pang Kuo, Taoyuan (TW);
Yao-Min Liu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 397 days.

(21) Appl. No.: 17/655,510

(22) Filed: Mar. 18, 2022

(65) Prior Publication Data

US 2023/0299002 A1 Sep. 21, 2023

(51) Int. Cl.
*H01L 23/532* (2006.01)
*H01L 21/768* (2006.01)
*H01L 23/522* (2006.01)

(52) U.S. Cl.
CPC .. *H01L 23/53238* (2013.01); *H01L 21/76844* (2013.01); *H01L 21/76846* (2013.01); *H01L 21/76849* (2013.01); *H01L 21/76865* (2013.01); *H01L 23/5226* (2013.01)

(58) Field of Classification Search
CPC ........... H01L 23/53238; H01L 23/5226; H01L 23/481; H01L 23/582; H01L 23/535; H01L 21/76844; H01L 21/76846; H01L 21/76849; H01L 21/76865; H01L 21/76807; H01L 21/76831; H01L 21/76808; H01L 21/76834; H01L 21/76835; H01L 21/76879; H01L 2221/1063
See application file for complete search history.

(56) References Cited

U.S. PATENT DOCUMENTS

| | | | | |
|---|---|---|---|---|
| 6,281,127 B1* | 8/2001 | Shue | ................. | H01L 21/76819 438/692 |
| 6,342,448 B1* | 1/2002 | Lin | ................... | H01L 21/76807 438/682 |
| 6,509,267 B1* | 1/2003 | Woo | ................... | H01L 21/76801 438/678 |
| 9,324,635 B2* | 4/2016 | Bao | .................... | H01L 21/76843 |
| 10,184,175 B2* | 1/2019 | Ham | .................... | C30B 23/066 |
| 10,461,027 B2* | 10/2019 | Lee | .................... | H01L 23/53238 |
| 2005/0085031 A1* | 4/2005 | Lopatin | ............... | C23C 18/1844 257/E21.174 |
| 2018/0166333 A1* | 6/2018 | Yang | .................. | H01L 23/53233 |
| 2020/0090944 A1* | 3/2020 | Lee | .................... | H01L 21/02063 |
| 2021/0057335 A1* | 2/2021 | Yang | .................. | H01L 23/5226 |

* cited by examiner

*Primary Examiner* — Dale E Page
*Assistant Examiner* — Quovaunda Jefferson
(74) *Attorney, Agent, or Firm* — Harrity & Harrity, LLP

(57) ABSTRACT

Various back end of line (BEOL) layer formation techniques described herein enable reduced contact resistance, reduced surface roughness, and/or increased semiconductor device performance for BEOL layers such as interconnects and/or metallization layers.

21 Claims, 79 Drawing Sheets

SEMICONDUCTOR DEVICES AND METHODS OF FORMATION

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
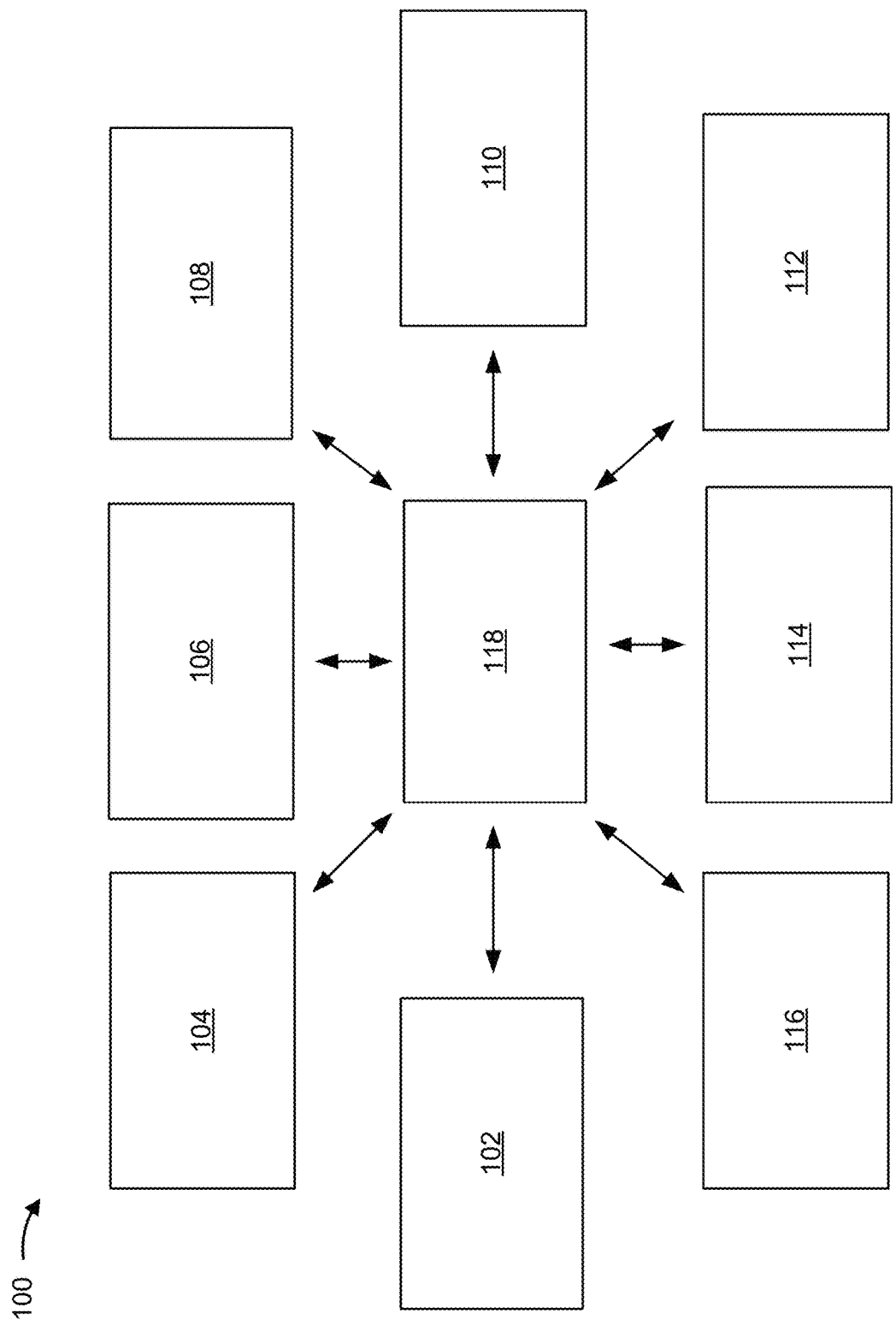
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper is often used for back end of line (BEOL) metallization layers and vias (also referred to as M1, M2, or M3 interconnects or metallization layers) or for middle end of line (MEOL) contact plugs (also referred to as M0 interconnects or metallization layers) due to low contact resistance and sheet resistance relative to other conductive materials, such as aluminum (Al). Lower resistivity provides lower resistance/capacitance (RC) time constants and faster propagation of signals across an electronic device. However, copper also has a high diffusion (or electromigration) rate, which can cause copper ions to diffuse into surrounding dielectric material. This diffusion results in an increase in resistivity for BEOL metallization layers and vias (or for MEOL contact plugs). Increased resistivity can decrease electrical performance of an electronic device. Moreover, diffusion may result in copper ions migrating into other BEOL layers and/or front end of line (FEOL) layers, such as source/drain interconnects (also referred to as source/drain vias or VDs) and/or gate interconnects (also referred to as gate vias or VGs), which can cause semiconductor device failures and reduced manufacturing yield.

A barrier layer (such as titanium nitride (TiN), tantalum nitride (TaN), and/or another type of barrier layer) may be deposited to prevent diffusion of copper between BEOL layers. However, the barrier layer may increase contact resistance when deposited at an interface between BEOL layers or between an M1 layer and an M0 interconnect, which decreases electrical performance of the electronic device. Moreover, copper may suffer from increased surface roughness when used with a barrier layer, which increases sheet resistance of a BEOL layer.

Some implementations described herein provide techniques and apparatuses for forming semiconductor structures (e.g., BEOL layers such as interconnects and/or a metallization layers). As described herein, a semiconductor structure is formed such that a barrier layer is formed on sidewalls of an opening that is formed to a conductive structure (e.g., a contact, an interconnect, a metallization layer). Implementations described herein provide various techniques for forming the barrier layer such that the barrier layer is omitted from a top surface of the conductive structure in the opening. Some techniques described herein include performing a surface treatment operation on the top surface of the conductive structure such that material of the barrier layer does not bond to the top surface of the conductive structure, which prevents and/or reduces the likelihood of the barrier layer forming on the top surface of the conductive structure. Some techniques described herein include forming a graphene layer in the opening on the top surface of the conductive structure, where the graphene layer prevents and/or reduces the likelihood of the barrier layer forming on the top surface of the conductive structure. In this way, the remainder of the opening may be filled with a conductive material to form a BEOL layer in the opening over the conductive structure such that no intervening barrier layer is between the conductive structure and the BEOL layer. This reduces contact resistance between the conductive structure and the BEOL layer, which increases semiconductor device performance of a semiconductor device in which the semiconductor structure is included.

In some implementations described herein, one or more metal liners (e.g., a ruthenium (Ru) liner, a cobalt (Co) liner) are included between the barrier layer and the BEOL layer to improve copper gap filling and/or to decrease surface roughness and promote adhesion between the barrier layer and the BEOL layer. In some implementations described herein, bilayer (or multilayer) graphene is used as the barrier layer. The inter-atom spacing of bilayer graphene is less than an atomic size (e.g., an atomic diameter) of a material used for the BEOL layer, which prevents atoms of the material used for the BEOL layer from diffusing through the bilayer graphene. Moreover, bilayer graphene has no vertical bonds along the surface/interface, which provides weak adhesion to copper and improves copper gap filling. The sheet resistance of graphene is also much lower than other barrier layers such as tantalum nitride (TaN) for example, which improves the sheet resistances of the BEOL layer.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a pre-treatment tool 114, a plasma tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-treatment tool 114 is a semiconductor processing tool that is capable of using various types of wet chemicals and/or gasses to treat the surface of one or more layers of a device in preparation for one or more subsequent semiconductor processing operations. For example, the pre-treatment tool 114 may include a chamber in which a device may be placed. The chamber may be filled with a wet chemical and/or a gas that is used to modify the physical and/or chemical properties of one or more layers of a device.

The plasma tool 116 is a semiconductor processing tool, such as a decoupled plasma source (DPS) tool, an inductively coupled plasma (ICP) tool, a transformer coupled plasma (TCP) tool, or another type of plasma-based semiconductor processing tool, that is capable of treating the surface of one or more layers of a device using a plasma. For example, the plasma tool 116 may sputter etch or otherwise remove material from the surface of a layer of a device using plasma ions.

Wafer/die transport tool 118 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-116, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 118 may be a programmed device that is configured to travel a particular path and/or may operate semi-autonomously or autonomously. In some implementations, the environment 100 includes a plurality of wafer/die transport tools 118.

For example, the wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 118 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
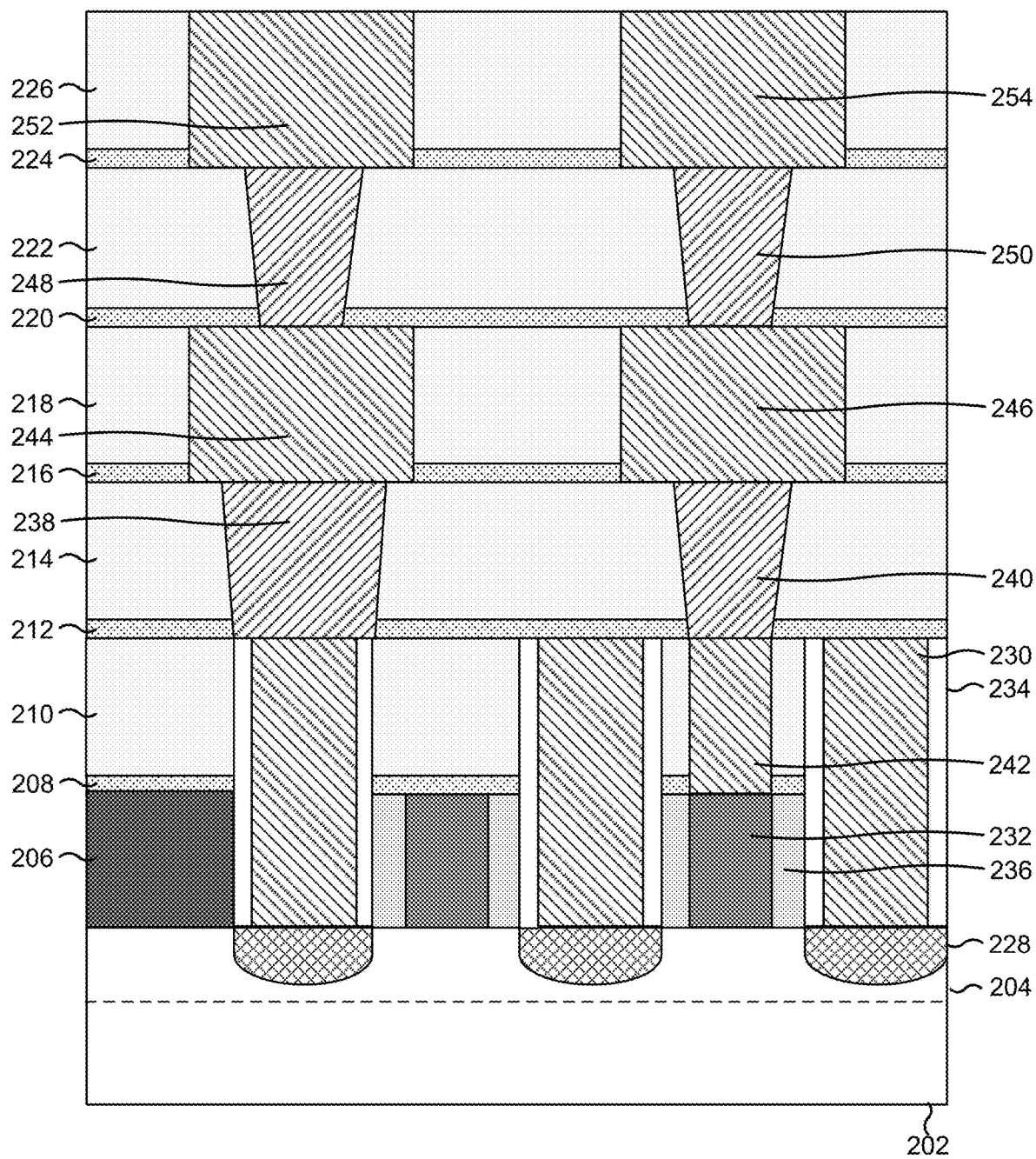
FIG. 2 is a diagram of an example semiconductor device described herein.

FIG. 2 is a diagram of a portion of an example device 200 described herein. Device 200 includes an example of a memory device, a logic device, a processor, an input/output device, or another type of semiconductor device that includes one or more transistors.

The device 200 includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, and 224 include a layer of material that is configured to permit various portions of the device 200 (or the layers included therein) to be selectively etched or protected from etching to form one or more of the structures included in the device 200. The ESLs 208, 212, 216, 220, and 224 may each include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, one or more of the ESLs 208, 212, 216, 220, and/or 224 include a plurality of ESL layers stacked together to function as an etch stop.

As further shown in FIG. 2, the device 200 includes a plurality of epitaxial (epi) regions 228 that are grown and/or otherwise formed on and/or around portions of a fin structure 204 of a substrate 202. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source/drain regions of the transistors included in the device 200.

The epitaxial regions 228 are electrically coupled with metal source/drain contacts 230 of the transistors included in the device 200. The metal source/drain contacts (MDs) 230 include cobalt (Co), ruthenium (Ru), and/or another conductive or metal material. The transistors further include gate structures 232 (MGs), which are formed of a polysilicon material, a metal (e.g., tungsten (W) or another metal), and/or another type of conductive material. In some implementations, the gate structures 232 may comprise multiple layers of material, such as multiple layers of metal or multiple layers including at least one polysilicon layer and at least one metal layer, among other examples. The metal source/drain contacts 230 and the gate structures 232 are electrically isolated by one or more sidewall spacers, including spacers 234 on each side of the metal source/drain contacts 230 and spacers 236 on each side of the gate structures 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source/drain contacts 230.

As further shown in FIG. 2, the metal source/drain contacts 230 and the gate structures 232 are electrically coupled with one or more types of interconnects. The interconnects electrically connect the transistors of the device 200 and/or electrically connect the transistors to other areas and/or components of the device 200. In some implementations, the interconnects electrically coupled the transistors to a back end of line (BEOL) region of the device 200.

The metal source/drain contacts 230 are electrically connected to source/drain interconnects 238 (e.g., source/drain vias or VDs). One or more of the gate structures 232 are electrically coupled with gate interconnects 240 (e.g., gate vias or VGs). The interconnects 238 and 240 include a conductive material such as tungsten, cobalt, ruthenium, copper, and/or another type of conductive material. In some implementations, the gate structures 232 are electrically coupled with the gate interconnects 240 by gate contacts 242 (CB or MP) to reduce contact resistance between the gate structures 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically coupled with a plurality of MEOL and BEOL layers, each including one or more metallization layers and/or vias. As an example, the interconnects 238 and 240 may be electrically coupled with an M0 metallization layer that includes conductive structures 244 and 246. The conductive structures 244 and 246 may include copper (Cu), cobalt (Co), ruthenium (Ru), and/or another conductive material. The M0 metallization layer is electrically coupled with a V0 via layer that includes vias 248 and 250. The vias 248 and 250 may include copper (Cu), cobalt (Co), ruthenium (Ru), and/or another conductive material. The V0 via layer is electrically coupled with an M1 metallization that includes conductive structures 252 and 254. The conductive structures 252 and 254 may include copper (Cu), cobalt (Co), ruthenium (Ru), and/or another conductive material. In some implementations, the BEOL layers of the device 200 include additional metallization layers and/or vias that couple the device 200 to a package.

As indicated above, FIG. 2 is provided as an example. Other examples may differ from what is described with regard to FIG. 2.

Figure 3:
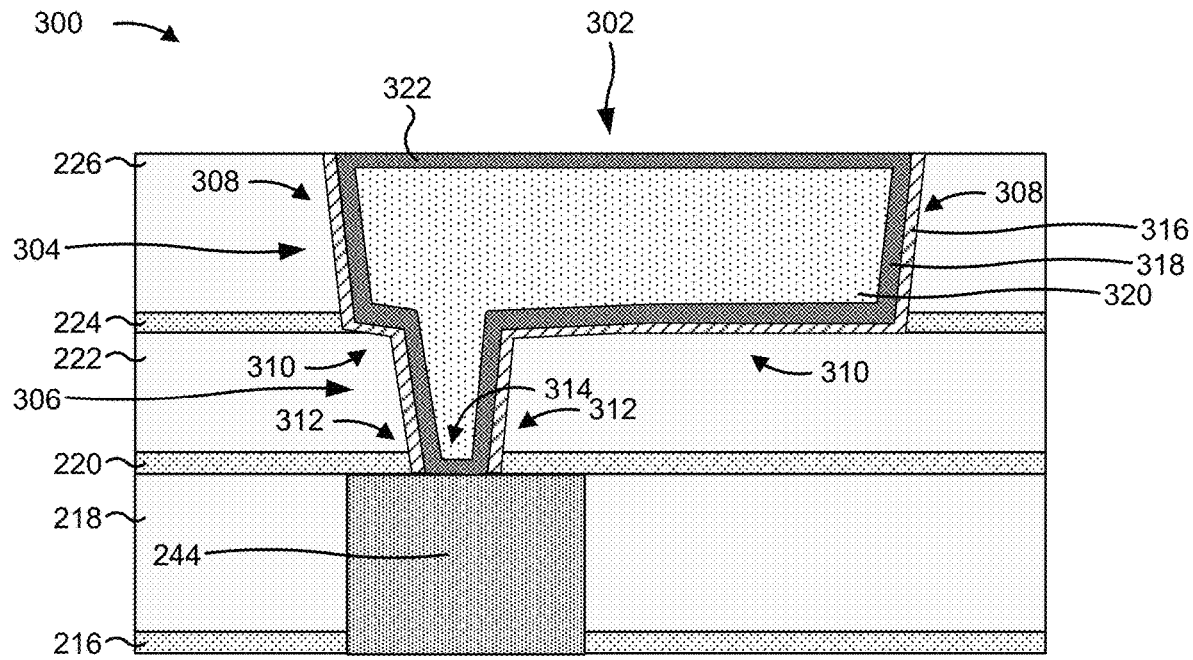
FIG. 3 is a diagram of an example semiconductor structure described herein.

FIG. 3 is a diagram of an example semiconductor structure 300 described herein. The semiconductor structure 300 includes a BEOL layer 302, which may include one or more of the BEOL layers of the device 200 described in connection with FIG. 2. In some implementations, the BEOL layer 302 includes a dual damascene structure that includes a metallization layer 304 and a via 306 below the metallization layer 304. Alternatively, the BEOL layer 302 may include a single damascene structure such as via-only structure or a metallization-layer-only structure.

As shown in FIG. 3, the BEOL layer 302 is included over and coupled with a conductive structure 244. In some implementations, the BEOL layer 302 is included over and coupled with another conductive structure of the device 200, such as a metal source/drain contact 230, a gate structure 232, an interconnect 238 or 240, a gate contact 242, a conductive structure 246, a via 248 or 250, and/or a conductive structure 252 or 254, among other examples.

The conductive structure 244 is formed and included in a dielectric layer such as the dielectric layer 218. However, the conductive structure 244 may be formed and included through another layer and/or one or more other layers of the device 200, such as the ESL 208, 212, 216, 220, and/or 224, and/or another dielectric layer 206, 210, 214, 222, and/or 226, among other examples. While the example semiconductor structure 300 of FIG. 3 shows an ESL 224 between an upper and lower dielectric layer (e.g., the dielectric layer 222 and the dielectric layer 226), the ESL 224 may be omitted in one or more of the embodiments described herein. In these implementations, a single damascene structure or a dual damascene structure is formed in a single dielectric layer. Accordingly, one or more of the dual damascene structures described herein may include a via and a trench such that there is no ESL between the via and the trench.

The BEOL layer 302 is formed and included in one or more dielectric layers such as the dielectric layer 222 and/or 226. However, the BEOL layer 302 may be formed and included through another layer and/or one or more other layers of the device 200, such as the ESL 208, 212, and/or 216, and/or another dielectric layer 210, 214, and/or 216, among other examples.

The metallization layer 304 of the BEOL layer 302 includes a plurality of sidewalls 308 and a bottom surface 310. The via 306 includes a plurality of sidewalls 312 that couple to the bottom surface 310, and a bottom surface 314 coupled (e.g., electrically and/or physically coupled) to the conductive structure 244. The sidewalls 308 and/or 312 may form an angle from approximately 84 degrees to approximately 90 degrees to permit the BEOL layer 302 to remain relatively narrow and conduct current faster while enabling formation of material on the sidewalls 308 and 312. However, other values for the range are within the scope of the present disclosure.

A width of the bottom surface 314 may be in a range of approximately 10 nanometers to approximately 180 nanometers, depending on the location of the BEOL layer 302 in the device 200, and to achieve a sufficiently low contact resistance between the BEOL layer 302 and the conductive structure 244 while providing sufficient semiconductor structure density in the device 200. However, other values for the range are within the scope of the present disclosure. For example, the width of the bottom surface 314 may be in a range of approximately 10 nanometers to approximately 22 nanometers for a circuit layout BEOL layer. As another example, the width of the bottom surface 314 may be in a range of approximately 100 nanometers to approximately 180 nanometers for a seal ring BEOL layer. As another example, the width of the bottom surface 314 may be in a range of approximately 10 nanometers to approximately 15 nanometers for an M1 BEOL layer or a V0 BEOL layer. As another example, the width of the bottom surface 314 may be in a range of approximately 14 nanometers to approximately 22 nanometers for an M2 BEOL layer or a V1 BEOL layer. As another example, the width of the bottom surface 314 may be in a range of approximately 12 nanometers to approximately 16 nanometers for an M3 BEOL layer or a V2 BEOL layer.

A barrier layer 316 is included between the BEOL layer 302 and the ESLs 220 and 224, as well as between the BEOL layer 302 and the dielectric layers 222 and 226. The barrier layer 316 is included along the sidewalls 308 and 312, and along the bottom surface 310. The barrier layer 316 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 316 helps prevent diffusion of copper atoms from the BEOL layer 302 to other layers of the device 200. The barrier layer 316 may have a thickness in a range from approximately 8 Angströms (Å) to approximately 20 Å. By selecting a thickness of at least 8 Å, the barrier layer 316 is thick enough to prevent copper diffusion from the BEOL layer 302. By selecting a thickness of no more than 20 Å, the barrier layer 316 is thin enough such that the contact resistance between the BEOL layer 302 and the conductive structure 244 is not significantly increased. Selecting a thickness of no more than 20 Å also shortens an amount of time, power, and chemicals consumed to deposit the barrier layer 316.

As described herein, the barrier layer 316 may be formed using a barrier block process. Accordingly, the barrier layer 316 may be substantially absent from, and/or omitted from, the bottom surface 314 of the BEOL layer 302 as compared with the sidewalls 308 and 312. As used herein, a substance is "substantially absent" from a surface when over 50% of the surface is characterized by a non-detectable (e.g., via transmission electron microscopy (TEM), energy dispersive x-ray analysis (EDX), and/or another similar technique) amount of the substance. Because the barrier layer 316 is substantially absent from the bottom surface 314, the contact resistance between the BEOL layer 302 and the conductive structure 244 is not significantly increased. For example, the barrier layer 316 may have a thickness that is in a range of approximately 1 Å to approximately 3 Å at the bottom surface 314 of the BEOL layer 302. For example, the thickness of the barrier layer 316 at the bottom surface 314 may be less than 2 Å.

The barrier layer 316 is adjacent to a metal liner layer 318 along the sidewalls 308, over the bottom surface 310, and along the sidewalls 312. The metal liner layer 318 includes a cobalt (Co) liner to reduce surface roughness of the BEOL layer 302, to further reduce copper diffusion of the BEOL layer 302, and/or to reduce sheet resistance of the BEOL layer 302.

A ratio of a thickness of the metal liner layer 318 to a thickness of the barrier layer 316 on the sidewalls 308, 312, and/or on the bottom surface 310 may be in a range of approximately 4:5 to approximately 5:1. Selecting a ratio of at least 4:5 ensures that the barrier layer 316 is thin enough such that the contact resistance between the BEOL layer 302 and the conductive structure 244 is not significantly increased and/or the metal liner layer 318 is thick enough to reduce surface roughness of the BEOL layer 302. Selecting a ratio of no more than 5:1 ensures that the barrier layer 316 is thick enough to prevent copper diffusion from the BEOL layer 302 and/or the metal liner layer 318 is thin enough such that the sheet resistance of the BEOL layer 302 is not significantly increased. For example, the metal liner layer 318 may have a thickness from approximately 15 Å to approximately 40 Å on the sidewalls 308, 312, and/or on the bottom surface 310. However, other values for the range are within the scope of the present disclosure.

As described herein, the barrier layer 316 is deposited using a surface treatment operation on the bottom surface 314. The surface treatment is removed after formation of the barrier layer 316 and prior to formation of the metal liner layer 318. As a result, a thickness of the metal liner layer 318 over the bottom surface 314 is greater relative to a thickness of the barrier layer 316 over the bottom surface 314. A ratio of the thickness of the metal liner layer 318 to the thickness of the barrier layer 316 over the bottom surface 314 of the BEOL layer 302 may be in a range of approximately 5:1 to approximately 40:1. Selecting a ratio of at least 5:1 ensures that the barrier layer 316 is thin enough such that the contact resistance between the BEOL layer 302 and the conductive structure 244 is not significantly increased and/or the metal liner layer 318 is thick enough to reduce sheet resistance of the BEOL layer 302. Selecting a ratio of no more than 40:1 ensures that the metal liner layer 318 is thin enough such that the contact resistance of the BEOL layer 302 is not significantly increased. For example, the metal liner layer 318 may have a thickness from approximately 15 Å to approximately 40 Å on the bottom surface 314. However, other values for the range are within the scope of the present disclosure.

The BEOL layer 302 includes a conductive structure 320 over the metal liner layer 318 in metallization layer 304 and in the via 306. The conductive structure 320 includes a conductive material such as copper (Cu) and/or another conductive or metal material. In some implementations, a cobalt (Co) capping layer 322 is included on and/or over the conductive structure 320. The cobalt capping layer 322 may have a depth included in a range from approximately 20 Å to approximately 40 Å. By selecting a depth of at least 20 Å, the cobalt is protected from overgrowth by a corresponding ESL (e.g., ESL 212, ESL 216, ESL 220, ESL 224, or another ESL) during epitaxial growth of the corresponding ESL. Preventing epitaxial overgrowth of the corresponding ESL reduces contact resistance at the cobalt capping layer 322. By selecting a depth of no more than 40 Å, the cobalt does not significantly increase contact resistance. Selecting a depth of no more than 40 Å also shortens an amount of time, power, and chemicals consumed to deposit the cobalt. However, other values for the range are within the scope of the present disclosure.

As indicated above, FIG. 3 is provided as an example. Other examples may differ from what is described with regard to FIG. 3.

FIGS. 4A-4G are diagrams of an example implementation 400 described herein. Example implementation 400 may be an example process for forming the BEOL layer 302 over a conductive structure (e.g., the conductive structure 244 or another conductive structure) of the device 200. In particular, the example implementation 400 includes an example process for forming the BEOL layer 302 such that the barrier layer 316 is substantially absent from an interface between the BEOL layer 302 and the conductive structure 244 in order to reduce contact resistance, which in turn increases electrical performance of an electronic device including the BEOL layer 302.

Figure 4A:
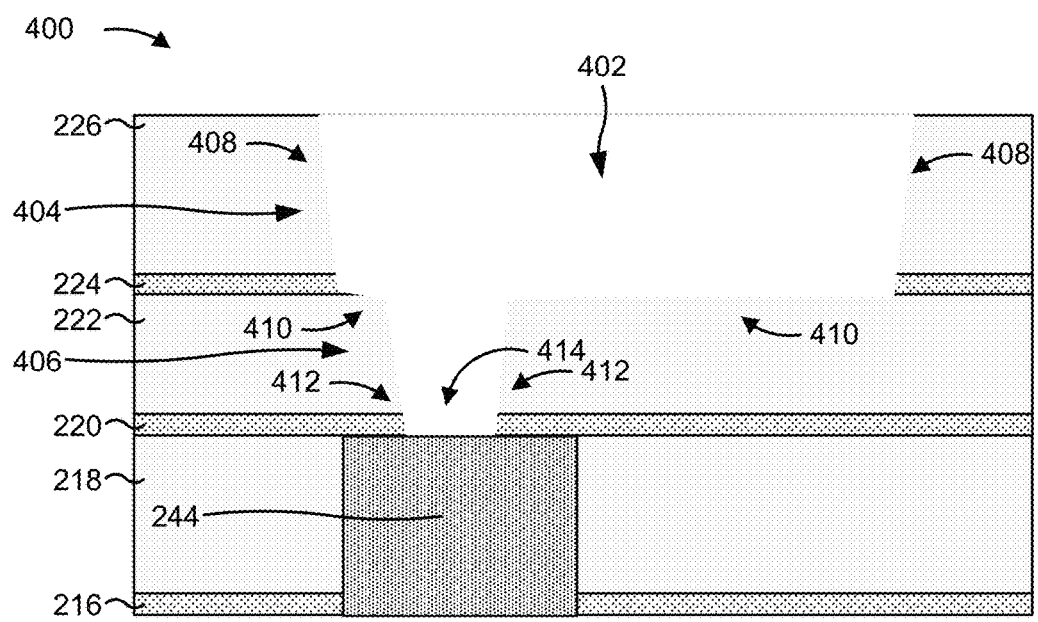
FIGS. 4A-4G are diagrams of an example implementation described herein.

As shown in FIG. 4A, an opening 402 is formed in and/or through one or more dielectric layers of the device 200, such as the dielectric layer 222 and 226. The opening may be formed to a top surface of the conductive structure 244. In some implementations, the opening 402 is formed in and/or through additional layers, such as one or more ESLs (e.g., the ESL 220 and/or the ESL 224, among other examples). The deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226, the ESL 224, the dielectric layer 222, and/or the ESL 220 to form the opening 402. In some implementations, a photoresist removal tool removes the remaining portions of the photoresist layer (e.g., using a chemical stripper, a plasma asher, and/or another technique) after the etch tool 108 forms the opening 402.

For a dual damascene profile, as is shown in the example in FIG. 4A, the opening 402 may be formed using at least two separate etching steps. The dual damascene profile may be formed using a trench first technique (e.g., where a metallization layer opening 404 is formed first, and a via opening 406 is formed second) or a via-first technique (e.g., where the via opening 406 is formed first, and the metallization layer opening 404 is formed second), among other examples.

As shown in FIG. 4A, the opening 402 may include sidewalls 408 and a bottom surface 410 of the metallization layer opening 404, and sidewalls 412 and a bottom surface 414 of the via opening 406. The bottom surface 414 may correspond to the bottom surface of the opening 402, and may correspond to the top surface of the conductive structure 244.

Figure 4B:
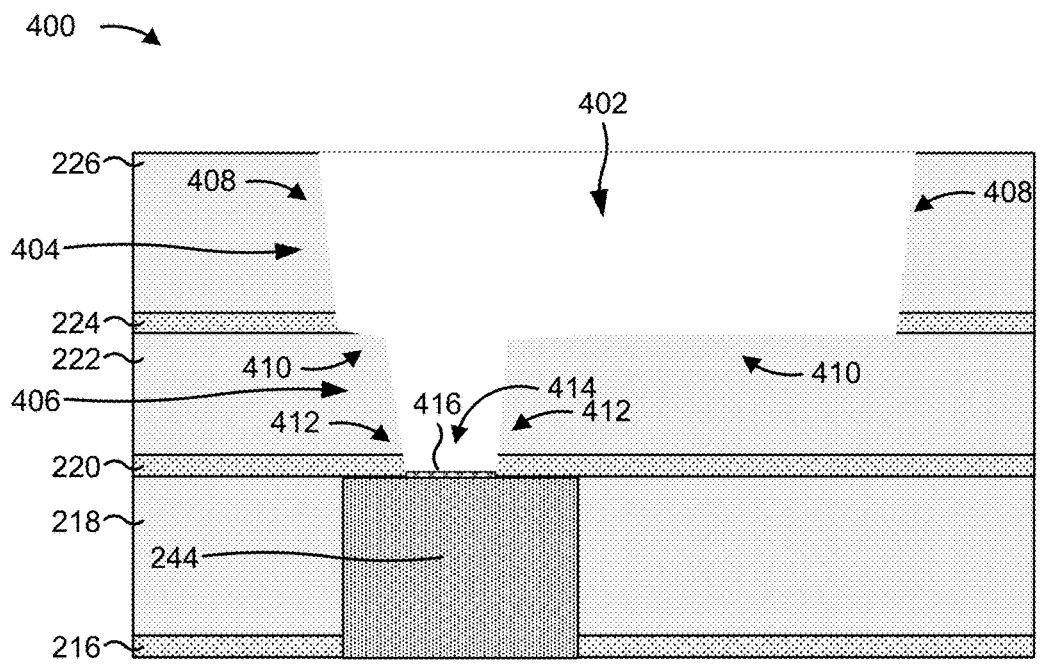

As shown in FIG. 4B, a blocking layer 416 is formed on the bottom surface 414 of the opening. Thus, the blocking layer 416 is formed on the top surface of the conductive structure 244. The blocking layer 416 may be formed as part of surface treatment operation on the bottom surface 414. In the surface treatment operation (which may also be referred to as a pre-treatment operation), the deposition tool 102 and/or the pre-treatment tool 114 modifies the bottom surface 414 to resist and/or prevent formation of the barrier layer 316 on the bottom surface 414. In particular, the deposition tool 102 and/or the pre-treatment tool 114 may perform the surface treatment operation to cause the bottom surface 414 (and thus, the top surface of the conductive structure 244) to become non-metallic.

The deposition tool 102 and/or the pre-treatment tool 114 may provide (e.g., by deposition, by immersion) benzotriazole (BTA), 5-Decyne, and/or another treatment material that includes one portion that bonds to copper and another portion that repels a barrier material of the barrier layer 316. The bottom surface 314 may be soaked in the BTA, the 5-Decyne, and/or another treatment material, which causes a complex between metal material (e.g., copper and/or another metal material) of the conductive structure 244 and the BTA, the 5-Decyne, and/or another treatment material to form the blocking layer 416.

The blocking layer 416 (which may also be referred to as a passive layer or a passivation layer) may be selectively deposited on an exposed portion of the conductive structure 244 and not on the dielectric layers 222 and 226 because one or more chemicals comprising the blocking layer 416 (and/or one or more precursor materials used to deposit the blocking layer 416) bind with copper and do not bind to dielectric layers 222 and 226. The copper-BTA complex in the blocking layer 416 acts as a corrosion inhibitor, and prevents or blocks ruthenium precursors from being absorbed into the bottom surface 414 of the opening 402 (e.g., the top surface of the conductive structure 244).

Figure 4C:
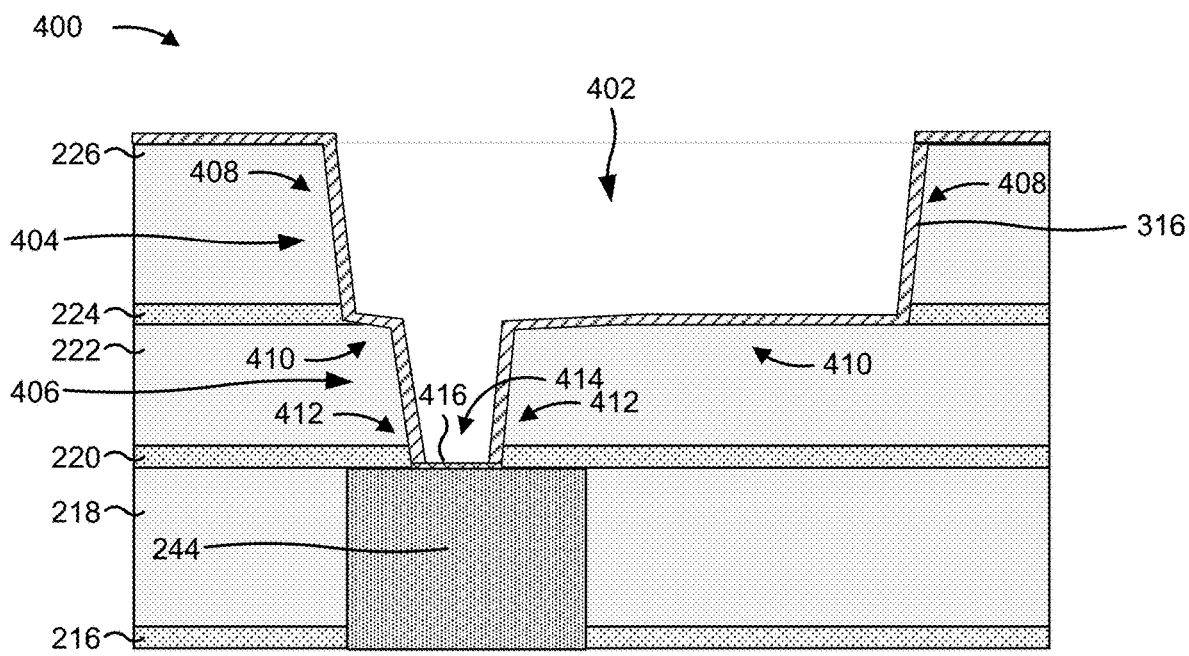

As shown in FIG. 4C, the barrier layer 316 is formed on the sidewalls 408, 412 and on the bottom surface 410 of the opening 402. The deposition tool 102 may deposit the barrier layer 316 using a CVD technique, a PVD technique, an ALD technique, or another type of deposition technique. As described above, the blocking layer 416 repels the material of the barrier layer 316 such that the barrier layer 316 is deposited on the sidewalls 408, 412, on the bottom surface 410, and not on the bottom surface 414 (e.g., not on the top surface of the conductive structure 244).

Figure 4D:
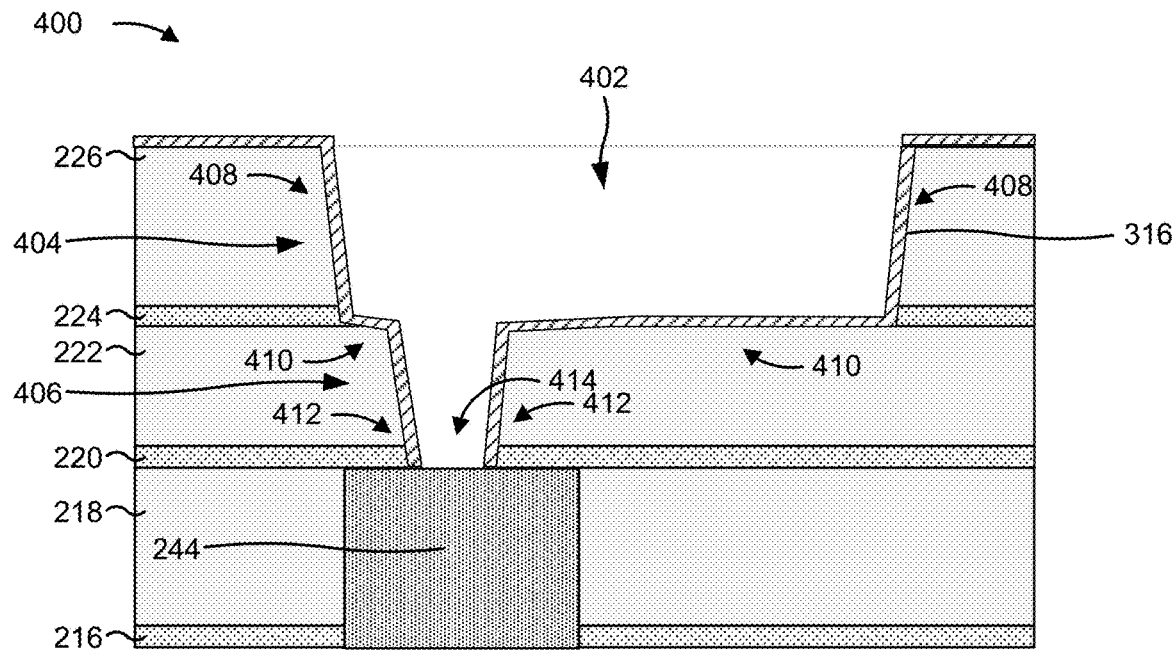

As shown in FIG. 4D, the blocking layer 416 is removed from the bottom surface 414 of the opening 402 (e.g., from the top surface of the conductive structure 244) after the barrier layer 316 is formed. In some implementations, the plasma tool 116 performs a plasma-based etch using a plasma, such as a hydrogen ($H_2$), an oxygen ($O_2$) plasma, and/or an ammonia ($NH_3$) plasma, among other examples. The plasma may chemically interact with the blocking layer 416 and not with the barrier layer 316. Accordingly, the etch tool 108 may selectively etch the blocking layer 416 and not other layers of the device 200. Ammonia ions, oxygen ions, hydrogen ions, and/or another type of ions are used to chemically remove (e.g., by chemical reaction) the blocking layer 416 off the bottom surface 414, which causes the bottom surface 414 (e.g., the top surface of the conductive structure 244) to become metallic again. An anneal may be performed to vaporize the removed material of the barrier layer 316, and the vaporized material may be vacuumed from a processing chamber of the plasma tool 116. Returning the metallic properties to the bottom surface 414 promotes metal-to-metal adhesion between the material (e.g., cobalt (Co)) of the bottom surface 414 and the metal liner layer 318 that is to be filled in the opening 402 over the bottom surface 414, which minimizes or prevents the formation of voids and other defects in the metal liner layer 318.

In some implementations, some blocking material of the blocking layer 416 may remain at the bottom surface 414 of the opening 402. Accordingly, trace amounts of benzotriazole, 5-Decyne, and/or another treatment material may be detectable at an interface between the conductive structure 244 and the BEOL layer 302. In some cases, BTA may be detected by nitrogen (N) signal measurement.

Figure 4E:
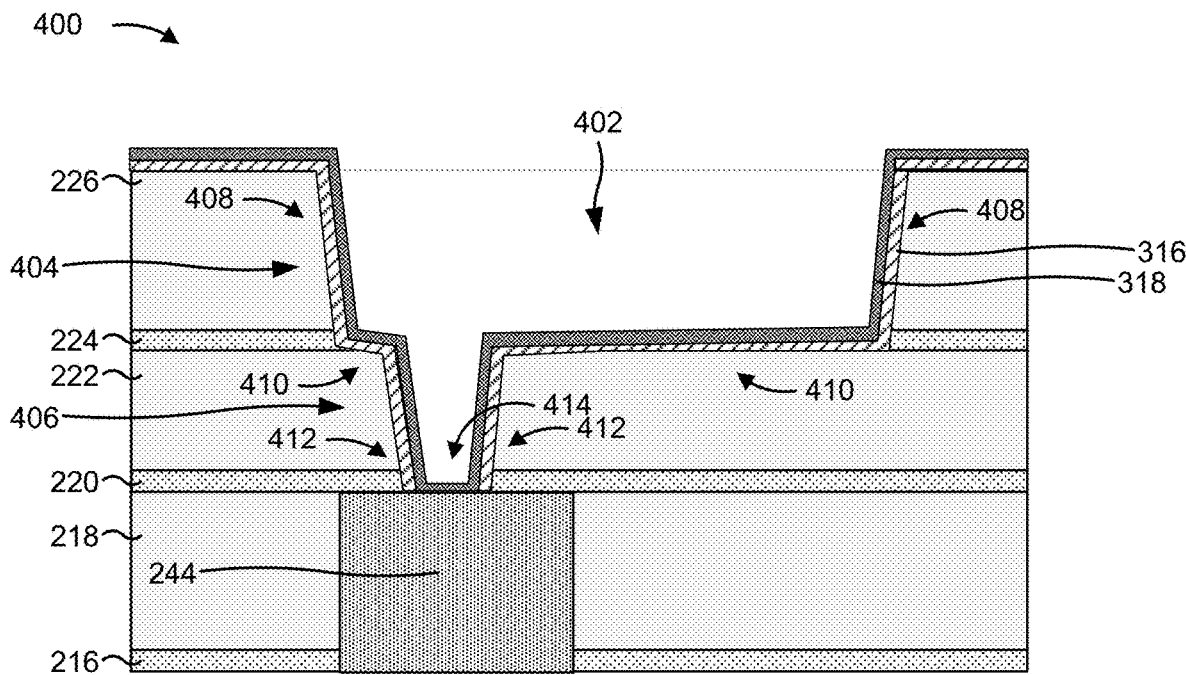

As shown in FIG. 4E, the metal liner layer 318 is formed after the blocking layer 416 is removed from the bottom surface 414. The metal liner layer 318 is formed over the barrier layer 316 along the sidewalls 408, 412, and over the bottom surface 410. Moreover, the metal liner layer 318 is formed on the bottom surface 414 of the opening 402. The deposition tool 102 may deposit the metal liner layer 318 using a CVD technique, a PVD technique, an ALD technique, or another type of deposition technique.

Figure 4F:
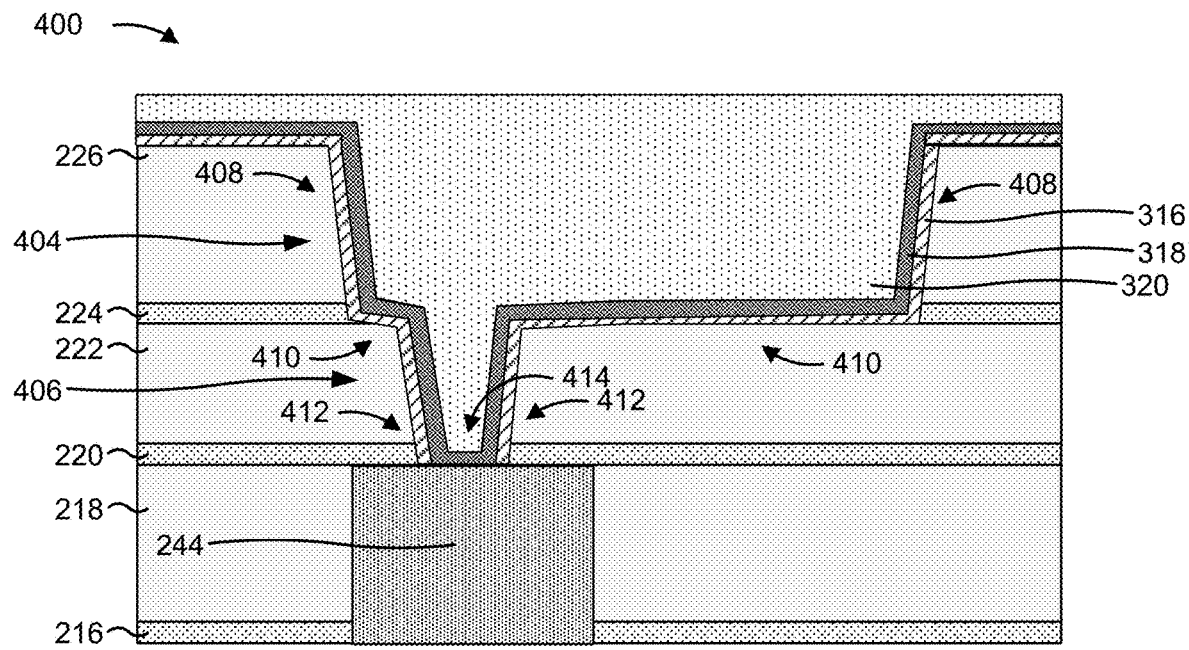

As shown in FIG. 4F, the material (e.g., copper or another material) of the conductive structure 320 is formed in the opening 402 over the barrier layer 316 and over the metal liner layer 318. The deposition tool 102 may deposit copper of the conductive structure 320 using a CVD technique, a PVD technique, an ALD technique, or another type of deposition technique, the plating tool 112 may deposit the copper of the conductive structure 320 using an electroplating operation, or a combination thereof. For example, the deposition tool 102 may deposit a seed layer on the metal liner layer 318 to promote adhesion between the metal liner layer 318 and the conductive structure 320, and the plating tool 112 may deposit the remaining material of the conductive structure 320 on the seed layer.

In some implementations, the copper flows over the top surface of the dielectric layer 226 as well as into the opening 402. Accordingly, the BEOL layer 302 may be planarized. The planarization tool 110 may planarize the BEOL layer 302 after the conductive structure 320 is deposited. Additionally, portions of the barrier layer 316 and/or portions of the metal liner layer 318 deposited over the top surface of the dielectric layer 226 may be removed during planarization. In some implementations, the planarization tool 110 uses CMP technique.

Figure 4G:
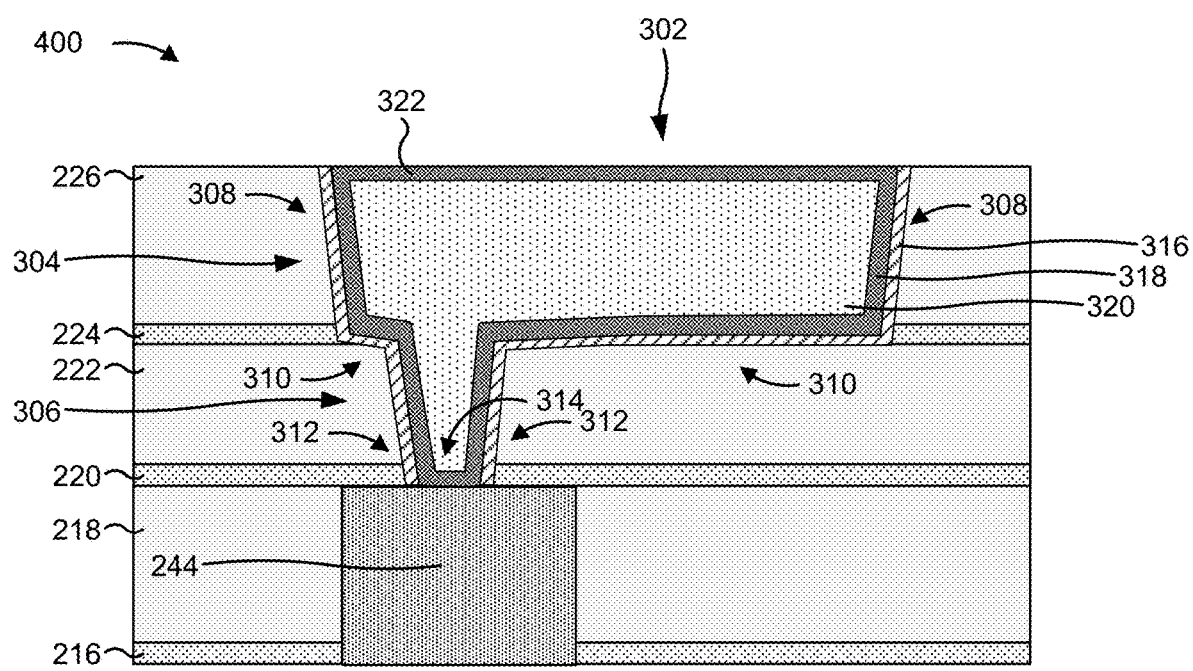

As shown in FIG. 4G, the cobalt capping layer 322 is formed over the conductive structure 320. Using CMP to planarize the BEOL layer 302 may cause a recess to form in the conductive structure 320 due to dishing. Accordingly, the cobalt capping layer 322 may be formed to fill in the recess. The deposition tool 102 may deposit the cobalt capping layer 322 by a CVD technique, a PVD technique, an ALD technique, or another type of deposition technique.

As indicated above, FIGS. 4A-4G are provided as an example. Other examples may differ from what is described with regard to FIGS. 4A-4G. For example, the techniques described in connection with FIGS. 4A-4G may be performed to form a single damascene structure for the BEOL layer 302.

Figure 5:
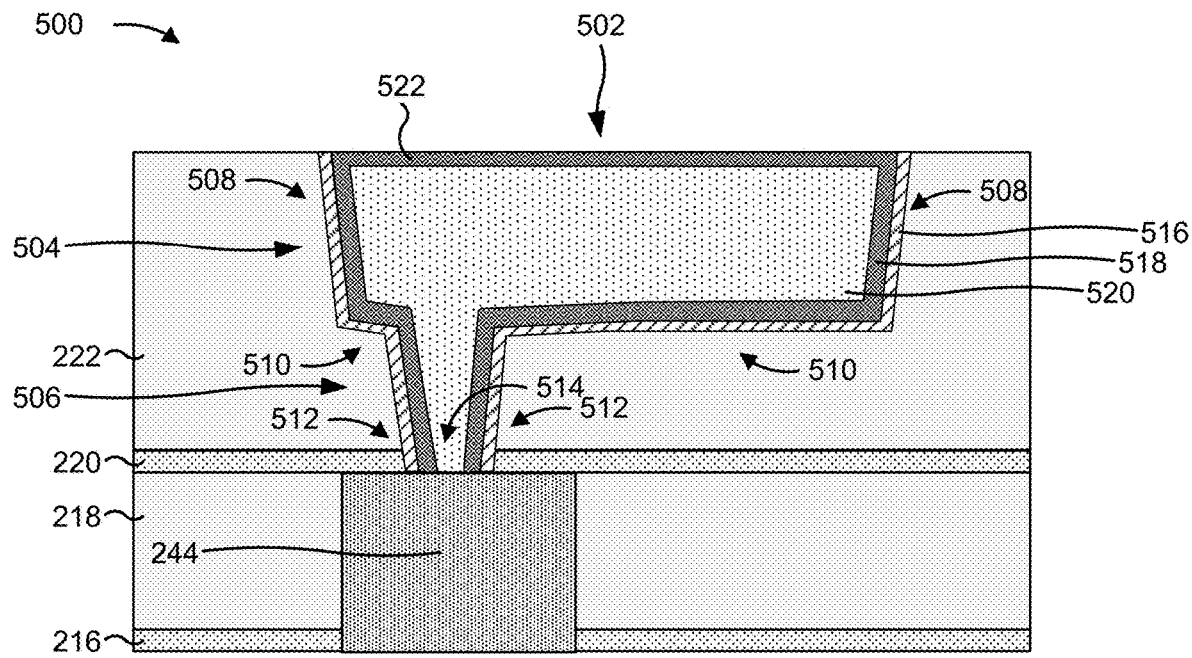
FIG. 5 is a diagram of an example semiconductor structure described herein.

FIG. 5 is a diagram of an example semiconductor structure 500 described herein. The semiconductor structure 500 includes a BEOL layer 502, which may include one or more of the BEOL layers of the device 200 described in connection with FIG. 2. The BEOL layer 502 includes a similar configuration of layers and/or structures as the BEOL layer 302 of FIG. 3. However, the conductive structure 520 of the BEOL layer 502 is in direct contact (e.g., is electrically coupled directly) with the conductive structure 244, whereas the conductive structure 320 is in contact (e.g., is electrically coupled) with the conductive structure 244 through the metal liner layer 318. Moreover, the BEOL layer 502 is included in a single dielectric layer (e.g., the dielectric layer 222) such that no ESL is included between the via 306 and the trench 304 of the dual damascene structure of the BEOL layer 502. Note that an ESL may be omitted between the via 306 and the trench 304 of the dual damascene structure of other BEOL layers described herein.

As described in connection with FIGS. 6A-6G, this occurs as a result of a blocking layer remaining over the top surface of the conductive structure 244 during formation of the metal liner layer 518. This results in the metal liner layer 518 being substantially absent from and/or omitted from the top surface of the conductive structure 244. This further reduces contact resistance for the BEOL layer 502. In some implementations, the thickness of the metal liner layer 518 at the bottom surface 514 of the BEOL layer 502 (e.g., on the top surface of the conductive structure 244) is in a range of approximately 1 Å to approximately 3 Å. However, other values for the range are within the scope of the present disclosure. In some implementations, a ratio of the thickness of the metal liner layer 518 at the bottom surface 514 of the BEOL layer 502 (e.g., over the top surface of the conductive structure 244) to the thickness of the barrier layer 516 at the bottom surface 514 of the BEOL layer 502 (e.g., over the top surface of the conductive structure 244) is in a range of approximately 1:3 to approximately 3:1. However, other values for the range are within the scope of the present disclosure.

As indicated above, FIG. 5 is provided as an example. Other examples may differ from what is described with regard to FIG. 5.

FIGS. 6A-6G are diagrams of an example implementation 600 described herein. Example implementation 600 may be an example process for forming the BEOL layer 502 over a conductive structure (e.g., the conductive structure 244 or another conductive structure) of the device 200. In particular, the example implementation 600 includes an example process for forming the BEOL layer 502 such that the barrier layer 516 and the metal liner layer 518 are substantially absent from and/or omitted from an interface between the BEOL layer 502 and the conductive structure 244 in order to reduce contact resistance, which in turn increases electrical performance of an electronic device including the BEOL layer 502.

Figure 6A:
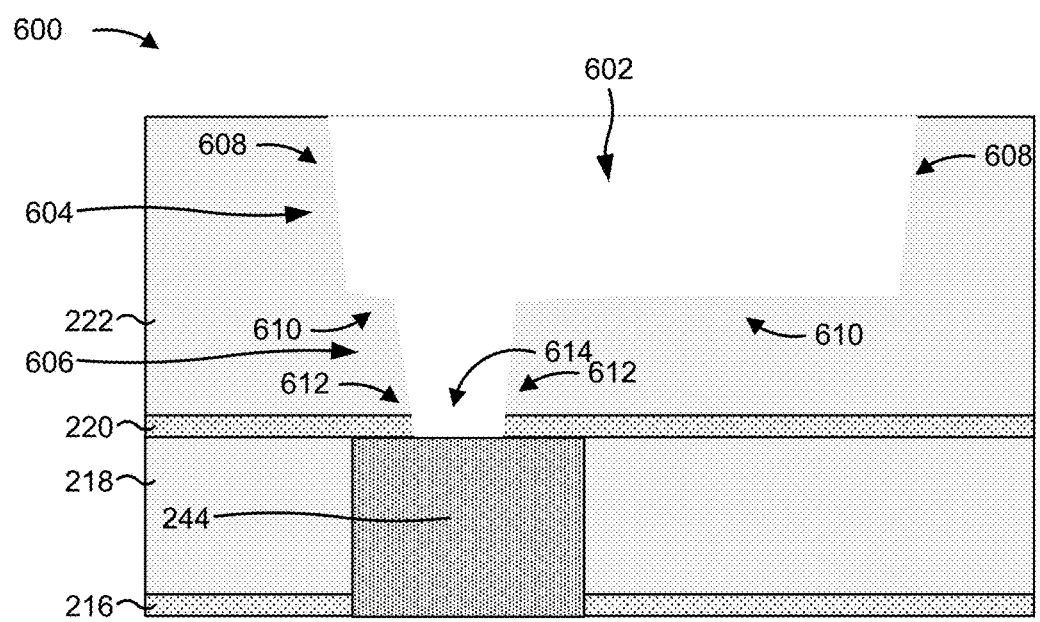
FIGS. 6A-6G are diagrams of an example implementation described herein.
Figure 6B:
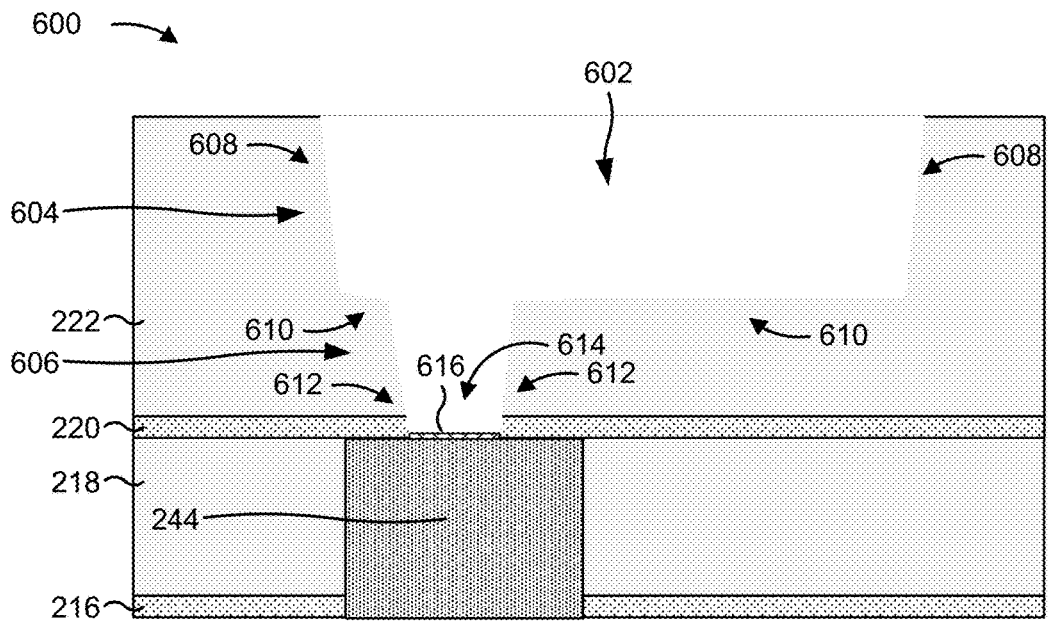
Figure 6C:
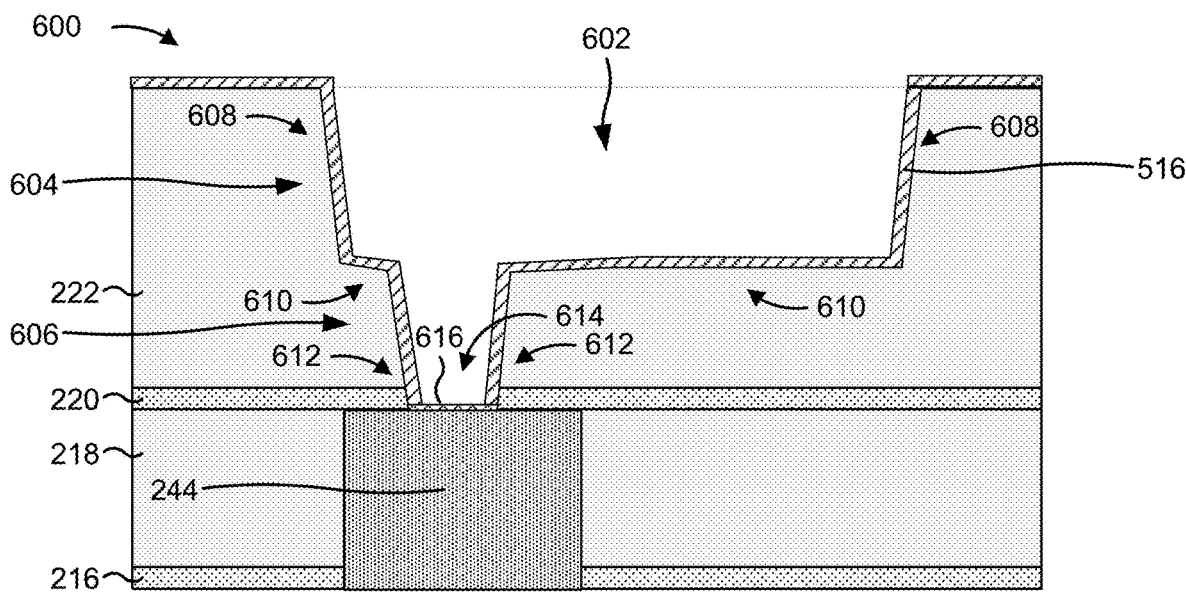
Figure 6D:
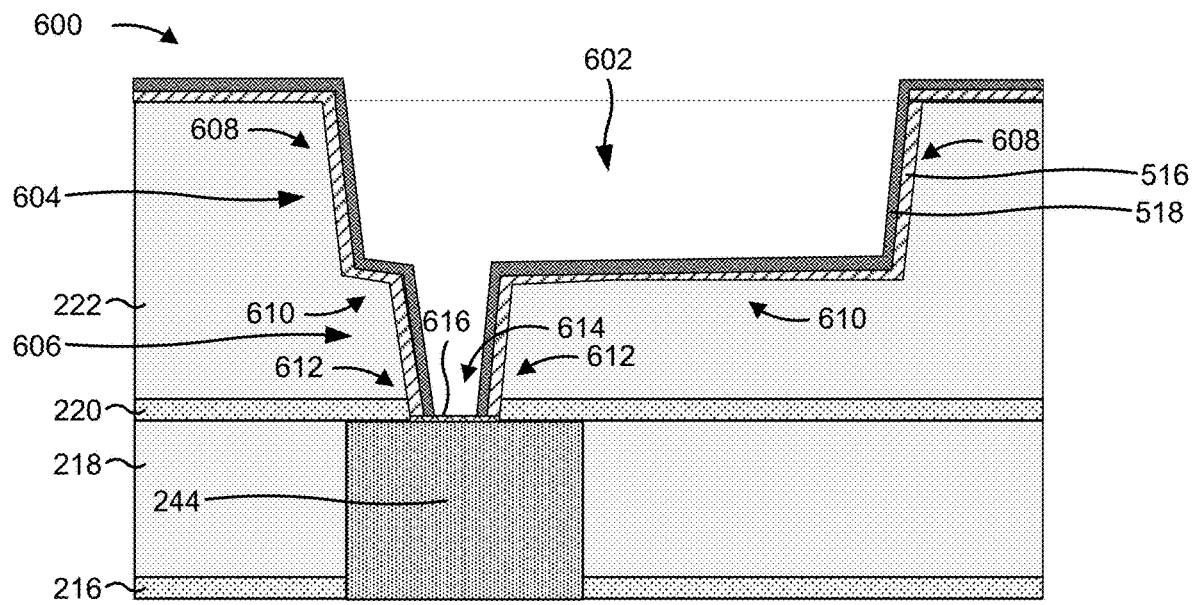
Figure 6E:
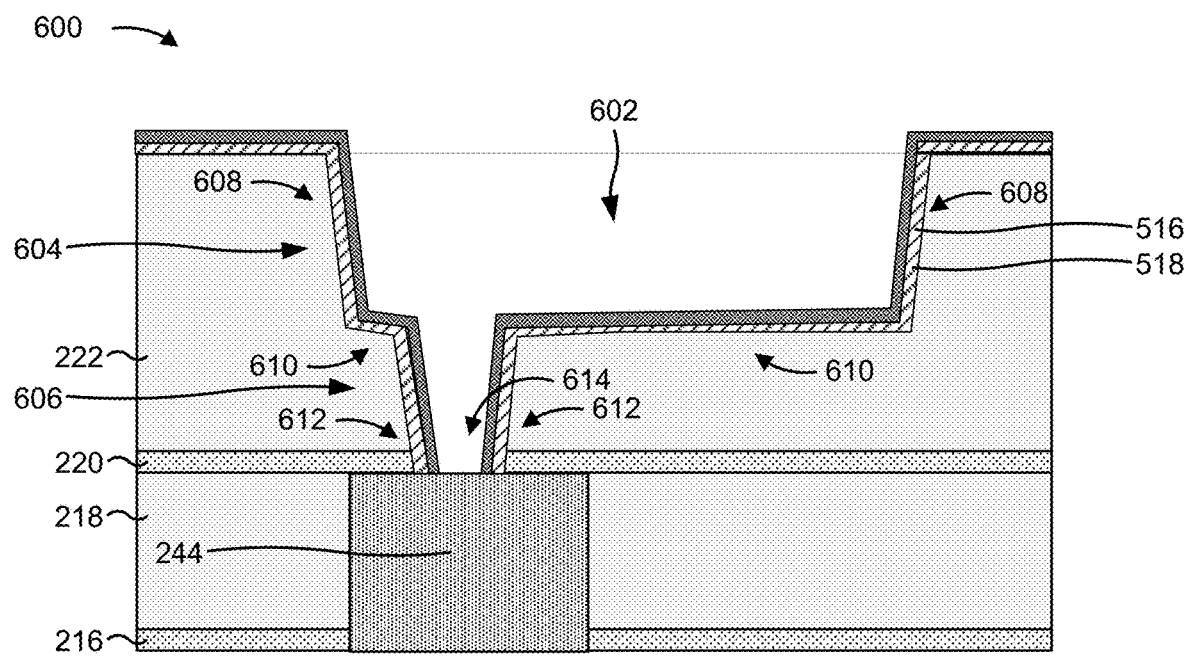
Figure 6F:
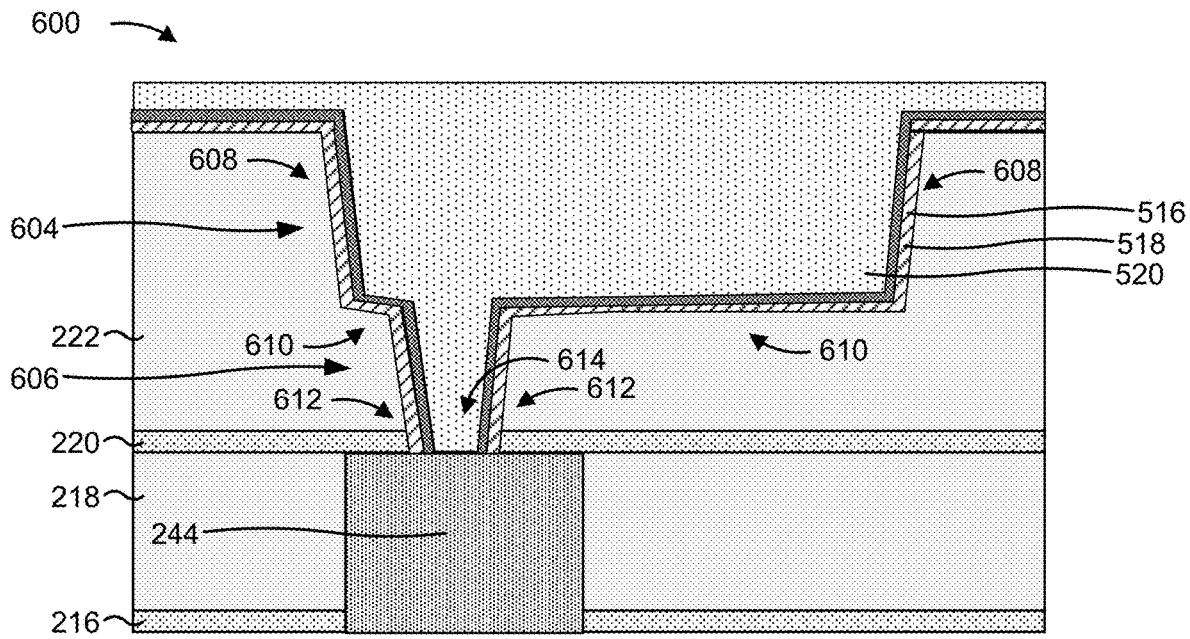
Figure 6G:
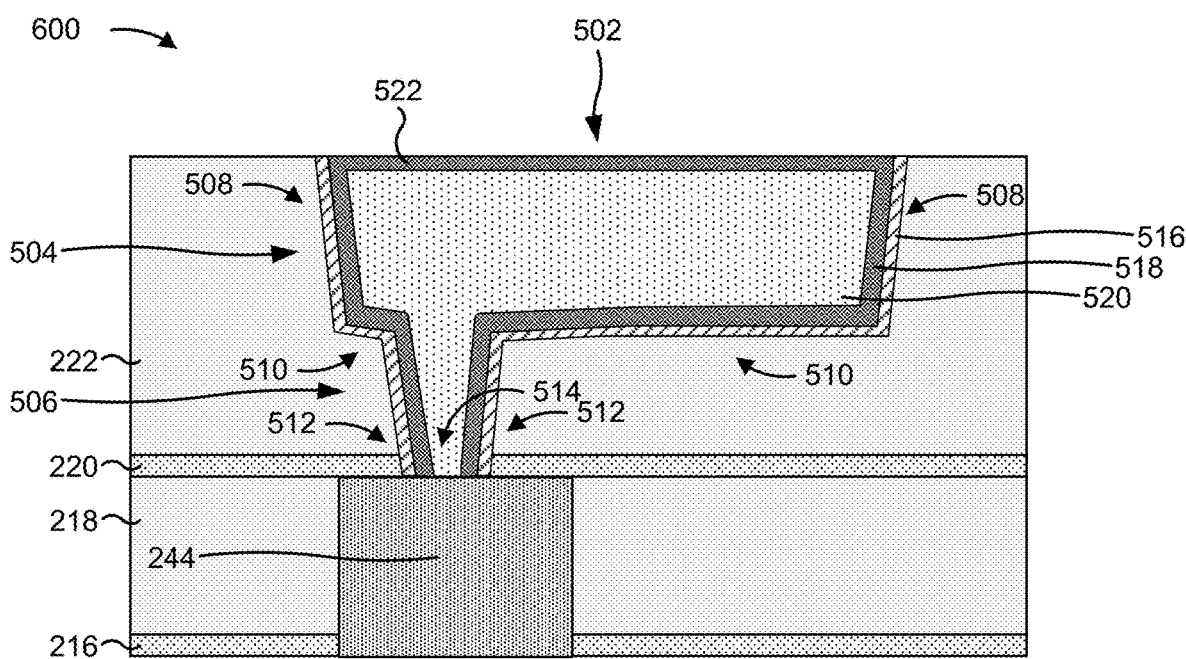

As shown in FIGS. 6A-6G, the example process of the example implementation 600 mostly follows the example process of the example implementation 400. Accordingly, similar process details are not reiterated for purposes of brevity. As shown in FIGS. 6D and 6E, however, the example process of the example implementation 600 differs from the example process of the example implementation 400 in that the blocking layer 616 remains over and/or on the bottom surface 614 of the opening 602 (which corresponds to the top surface of the conductive structure 244) during formation of the metal liner layer 518. The blocking layer 616 is then removed from the bottom surface 614 of the opening 602 (e.g., from the top surface of the conductive structure 244) after formation of the metal liner layer 518. In this way, the metal liner layer 518 is substantially absent from and/or omitted from the top surface of the conductive structure 244. This further reduces contact resistance for the BEOL layer 502.

As indicated above, FIGS. 6A-6G are provided as an example. Other examples may differ from what is described with regard to FIGS. 6A-6G. For example, the techniques described in connection with FIGS. 6A-6G may be performed to form a single damascene structure for the BEOL layer 502.

Figure 7:
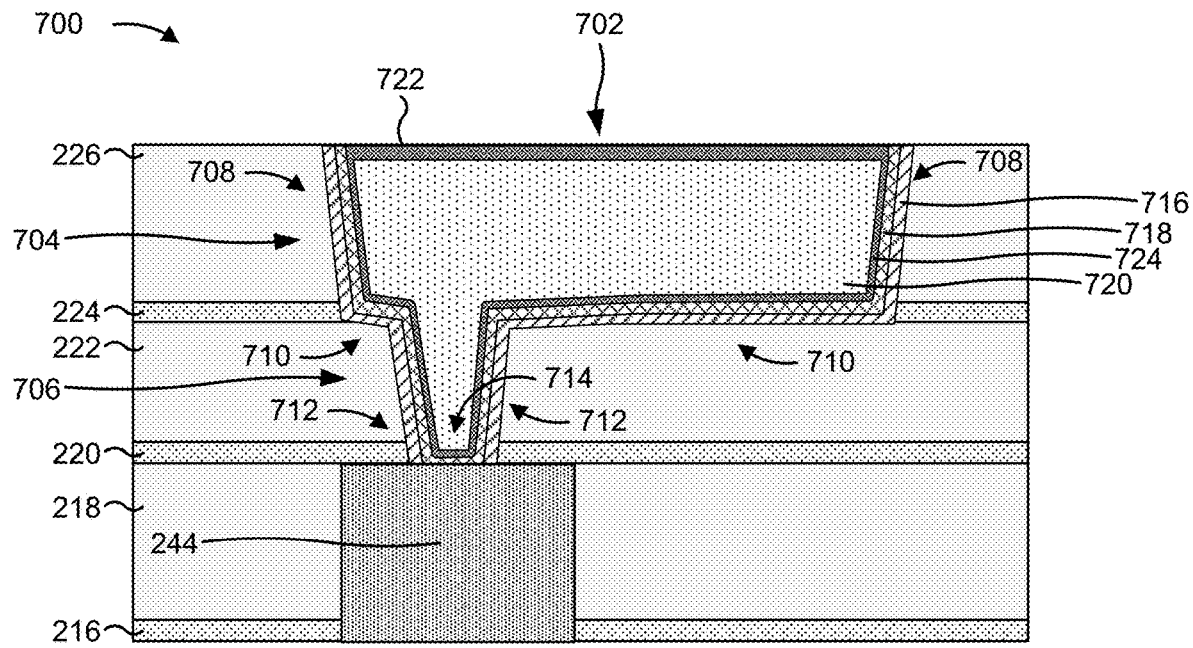
FIG. 7 is a diagram of an example semiconductor structure described herein.

FIG. 7 is a diagram of an example semiconductor structure 700 described herein. The semiconductor structure 700 includes a BEOL layer 702, which may include one or more of the BEOL layers of the device 200 described in connection with FIG. 2. The BEOL layer 702 includes a similar configuration of layers and/or structures as the BEOL layer 302 of FIG. 3. However, another metal liner layer 724 is included between the metal liner layer 718 and the conductive structure 720. The metal liner layer 718 includes a ruthenium (Ru) liner configured to improve gap filling performance for the conductive structure 720 and the conductive structure 244. The metal liner layer 724 includes a cobalt (Co) liner. The metal liner layer 718 is electrically coupled directly with the top surface of the conductive structure 244, the metal liner layer 724 is electrically coupled directly with the metal liner layer 718, and the conductive structure 720 is electrically coupled directly with the metal liner layer 724. Accordingly, the conductive structure 720 is electrically coupled with the conductive structure 244 through the metal liner layer 718 and 724.

In some implementations, a thickness of the metal liner layer 718 is in a range of approximately 5 Å to approximately 15 Å. However, other values for the range are within the scope of the present disclosure. In some implementations, a thickness of the metal liner layer 724 is in a range of approximately 5 Å to approximately 15 Å. However, other values for the range are within the scope of the present disclosure. In some implementations, a ratio of the thickness of the metal liner layer 718 to the thickness of the metal liner layer 724 is in a range of approximately 1:3 to approximately 3:1. However, other values for the range are within the scope of the present disclosure.

As indicated above, FIG. 7 is provided as an example. Other examples may differ from what is described with regard to FIG. 7.

FIGS. 8A-8H are diagrams of an example implementation 800 described herein. Example implementation 800 may be an example process for forming the BEOL layer 702 over a conductive structure (e.g., the conductive structure 244 or another conductive structure) of the device 200. In particular, the example implementation 800 includes an example process for forming the BEOL layer 702 such that the metal liner layer 724 is between the metal liner layer 718 and the conductive structure 720.

Figure 8A:
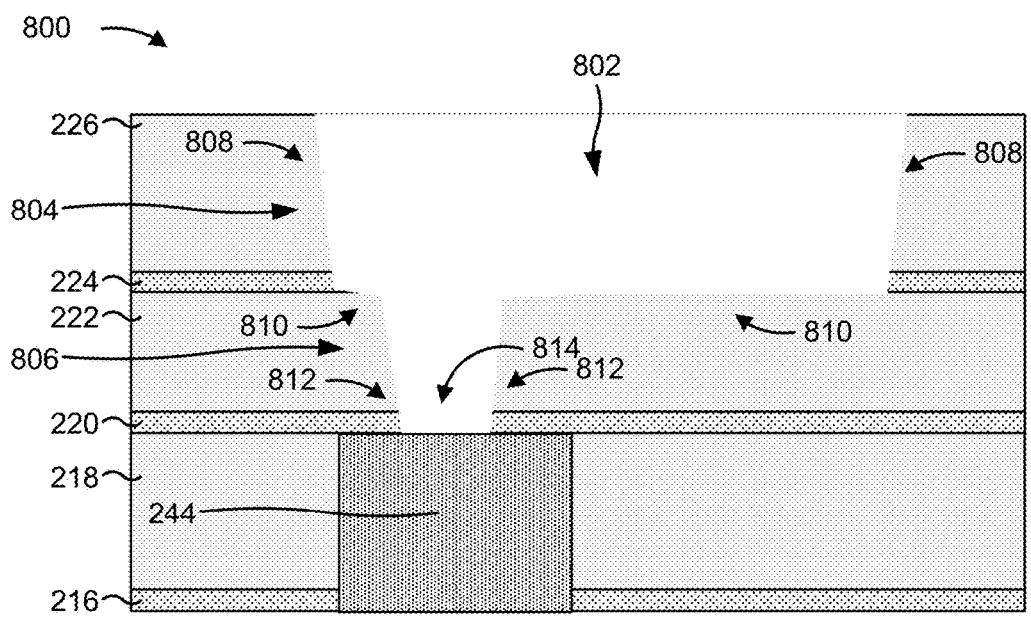
FIGS. 8A-8H are diagrams of an example implementation described herein.
Figure 8B:
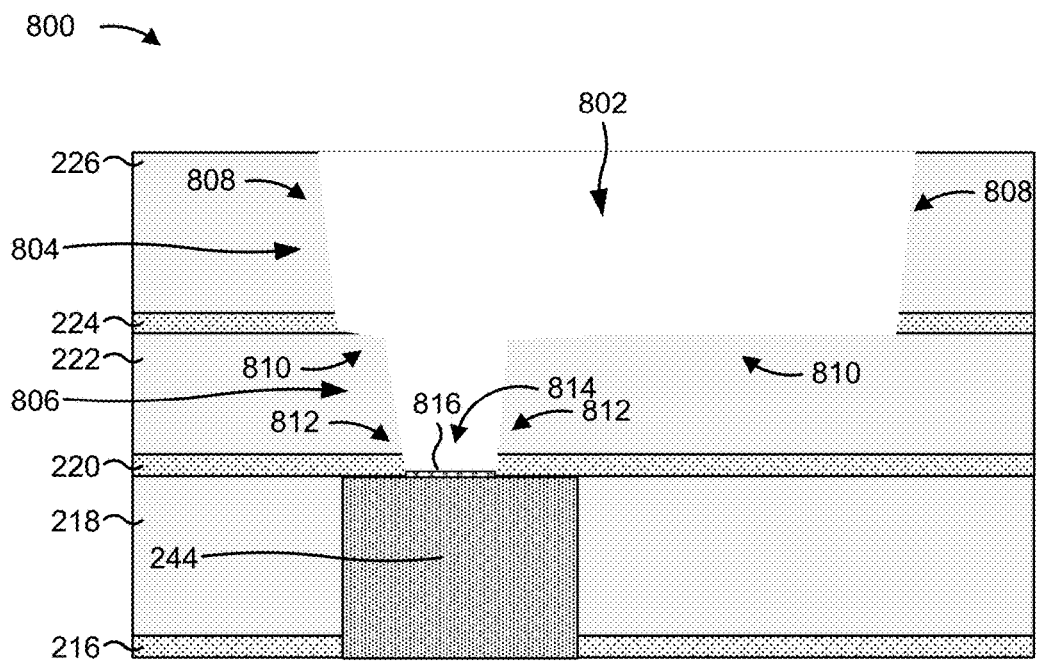
Figure 8C:
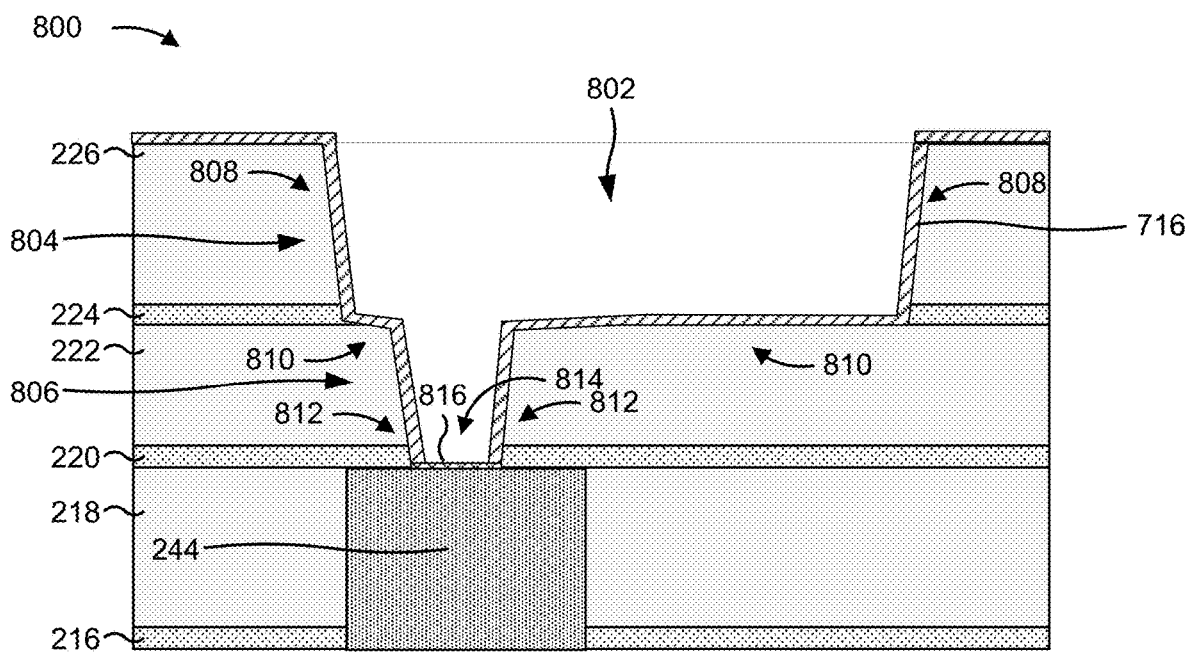
Figure 8D:
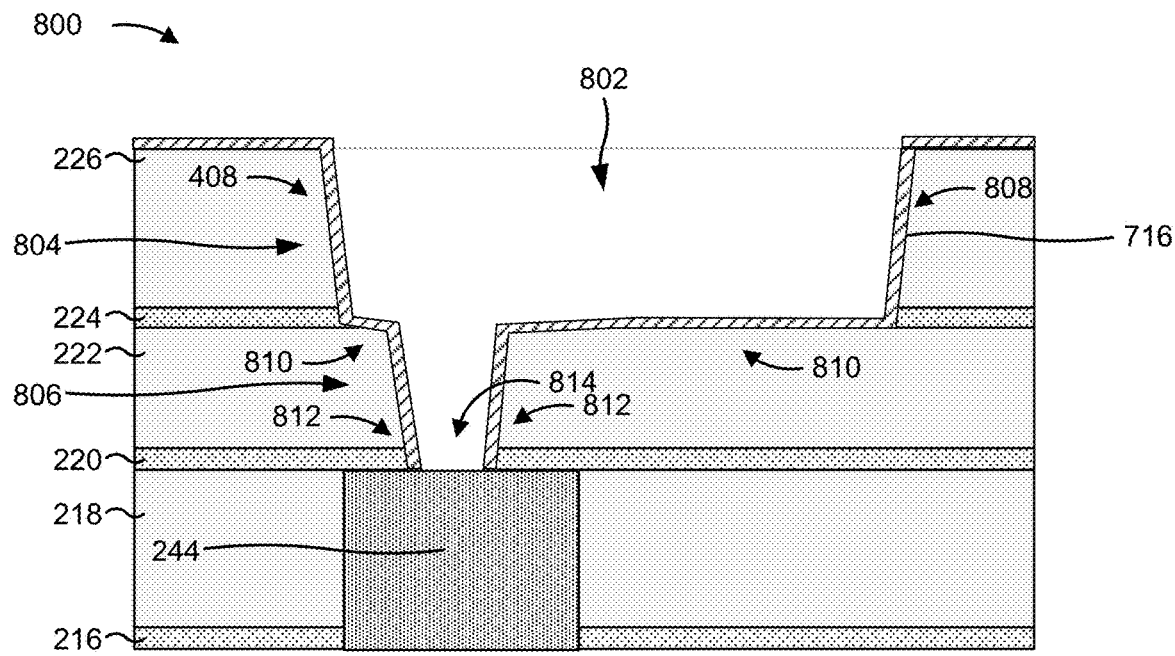
Figure 8E:
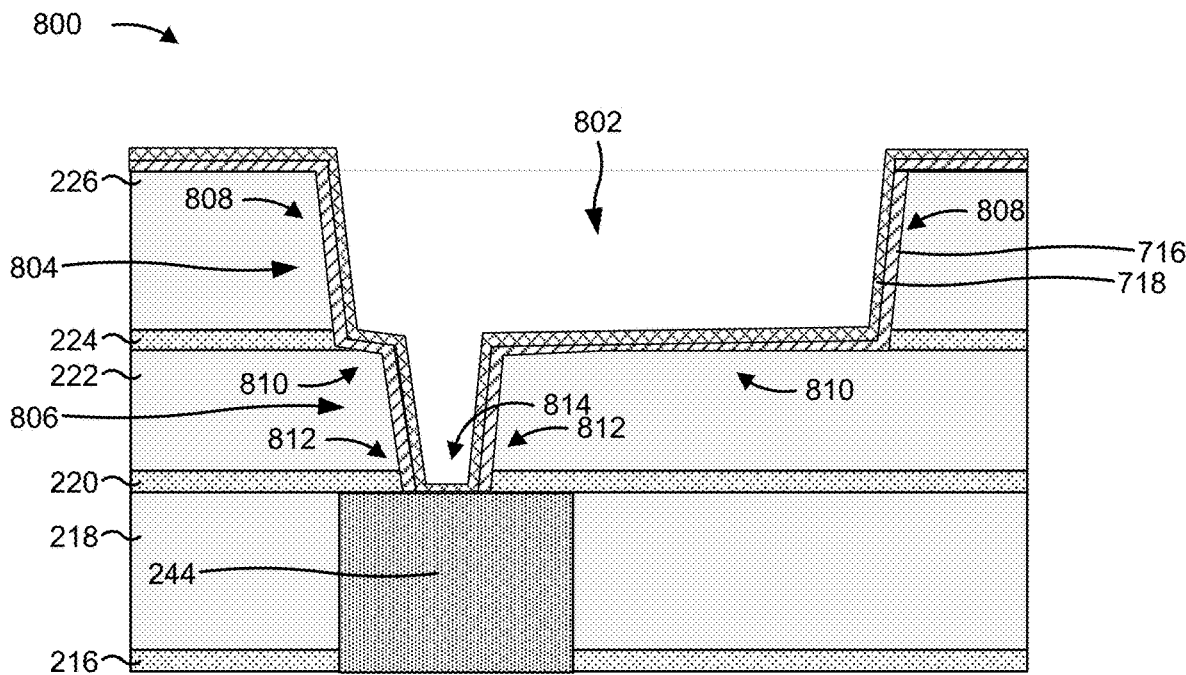
Figure 8F:
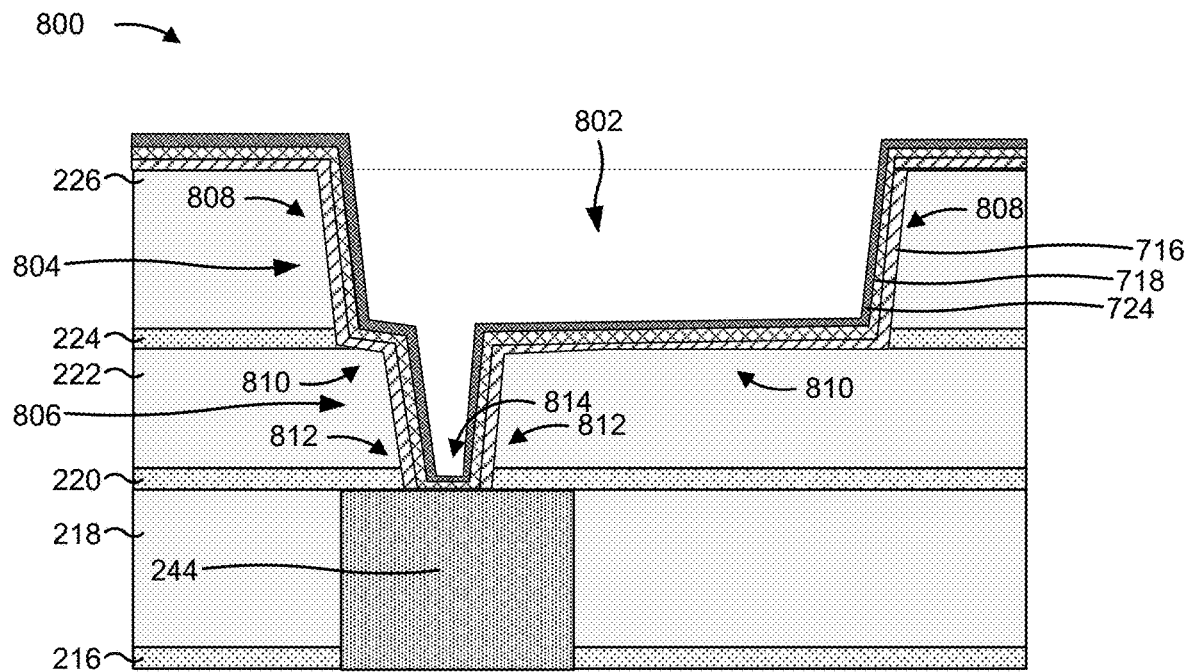
Figure 8G:
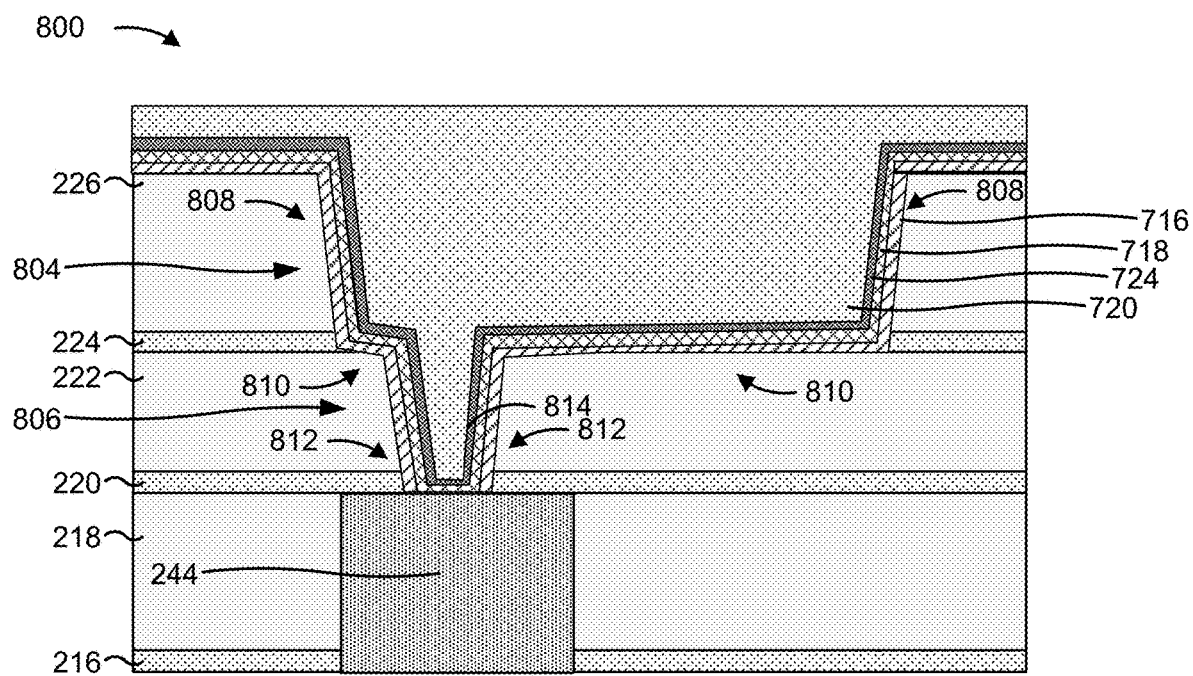
Figure 8H:
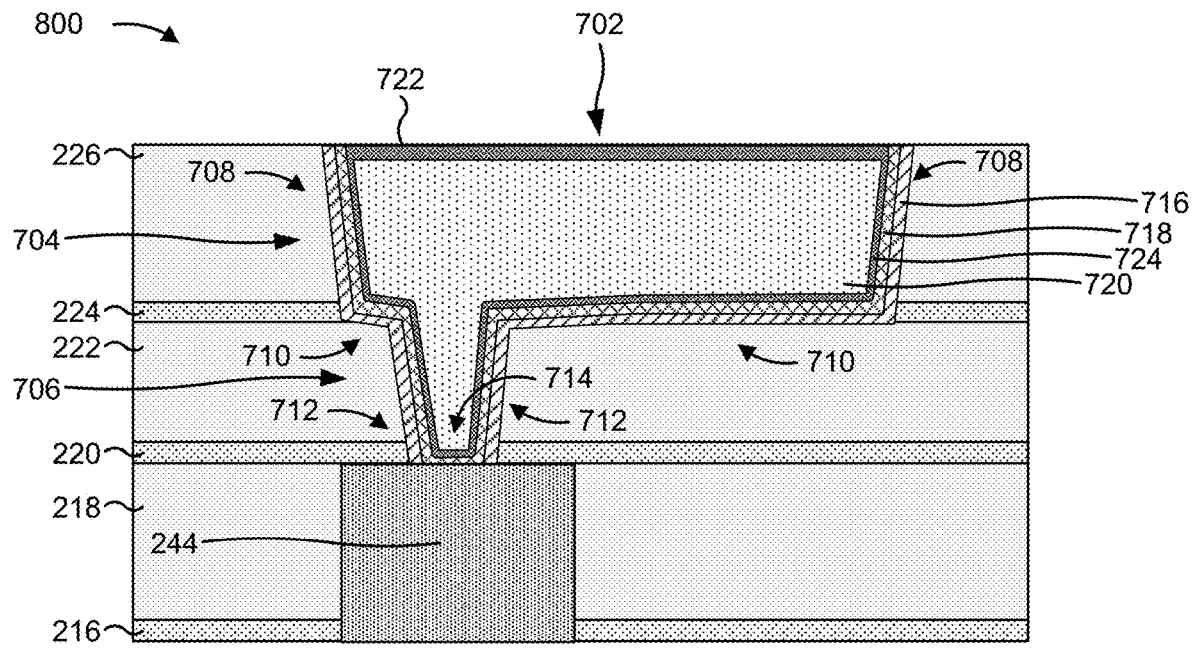

As shown in FIGS. 8A-8H, the example process of the example implementation 800 mostly follows the example process of the example implementation 400. Accordingly, similar process details are not reiterated for purposes of brevity. As shown in FIGS. 8F and 8G, however, the example process of the example implementation 800 differs from the example process of the example implementation 400 in that the metal liner layer 724 is formed over and/or on the metal liner layer 718 prior to formation of the conductive structure 720. The conductive structure 720 is then formed over and/or on the metal liner layer 724.

As indicated above, FIGS. 8A-8H are provided as an example. Other examples may differ from what is described with regard to FIGS. 8A-8H. For example, the techniques described in connection with FIGS. 8A-8H may be performed to form a single damascene structure for the BEOL layer 702.

Figure 9:
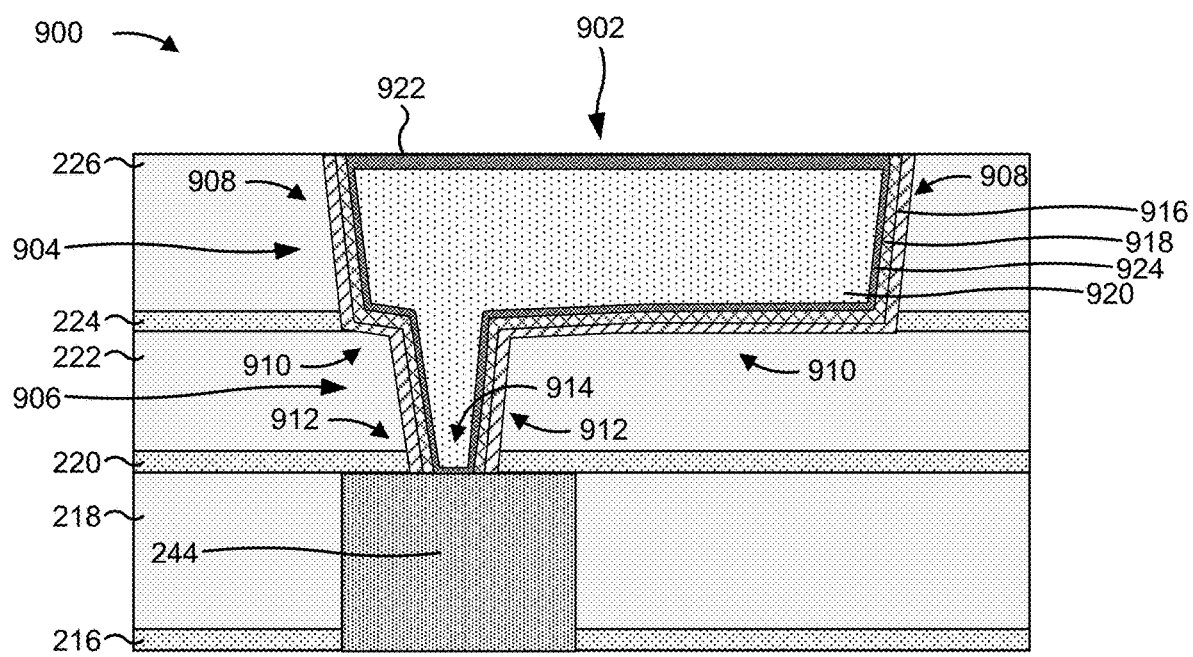
FIG. 9 is a diagram of an example semiconductor structure described herein.

FIG. 9 is a diagram of an example semiconductor structure 900 described herein. The semiconductor structure 900 includes a BEOL layer 902, which may include one or more of the BEOL layers of the device 200 described in connection with FIG. 2. The BEOL layer 902 includes a similar configuration of layers and/or structures as the BEOL layer 702 of FIG. 7. However, the metal liner layer 924 is in direct contact (e.g., is electrically coupled directly) with the conductive structure 244, and the conductive structure 920 is electrically coupled with the conductive structure 244 through the metal liner layer 924. As described in connection with FIGS. 10A-10H, this occurs as a result of a blocking layer remaining over the top surface of the conductive structure 244 during formation of the metal liner layer 918. This results in the metal liner layer 918 being substantially absent from and/or omitted from the top surface of the conductive structure 244. This further reduces contact resistance for the BEOL layer 902.

In some implementations, the thickness of the metal liner layer 918 at the bottom surface 914 of the BEOL layer 902 (e.g., on the top surface of the conductive structure 244) is in a range of approximately 1 Å to approximately 3 Å. However, other values for the range are within the scope of the present disclosure. In some implementations, a ratio of the thickness of the metal liner layer 918 at the bottom surface 914 of the BEOL layer 902 (e.g., over the top surface of the conductive structure 244) to the thickness of the barrier layer 916 at the bottom surface 914 of the BEOL layer 902 (e.g., over the top surface of the conductive structure 244) is in a range of approximately 1:3 to approximately 3:1. However, other values for the range are within the scope of the present disclosure. In some implementations, a ratio of the thickness of the metal liner layer 918 at the bottom surface 914 of the BEOL layer 902 (e.g., over the top surface of the conductive structure 244) to the thickness of the metal liner layer 924 at the bottom surface 914 of the BEOL layer 902 (e.g., over the top surface of the conductive structure 244) is in a range of approximately 1:15 to approximately 5:3. However, other values for the range are within the scope of the present disclosure.

As indicated above, FIG. 9 is provided as an example. Other examples may differ from what is described with regard to FIG. 9.

FIGS. 10A-10H are diagrams of an example implementation 1000 described herein. Example implementation 1000 may be an example process for forming the BEOL layer 902 over a conductive structure (e.g., the conductive structure 244 or another conductive structure) of the device 200. In particular, the example implementation 1000 includes an example process for forming the BEOL layer 902 such that the metal liner layer 924 is between the metal liner layer 918 and the conductive structure 920. Moreover, the example implementation 1000 includes an example process for forming the BEOL layer 902 such that the metal liner layer 918 is substantially absent and/or omitted from the top surface of the conductive structure 244, such that the metal liner layer 924 is electrically coupled directly with the top surface of the conductive structure 244, and such that the conductive structure 920 is electrically coupled with the conductive structure 244 through the metal liner layer 924.

Figure 10A:
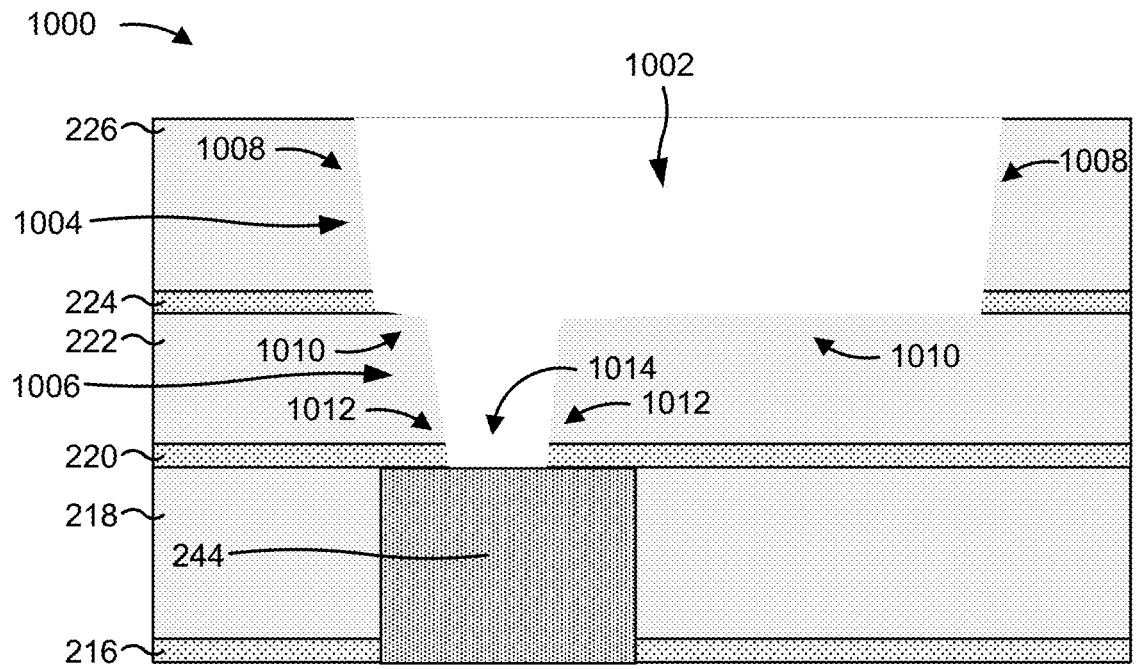
FIGS. 10A-10H are diagrams of an example implementation described herein.
Figure 10B:
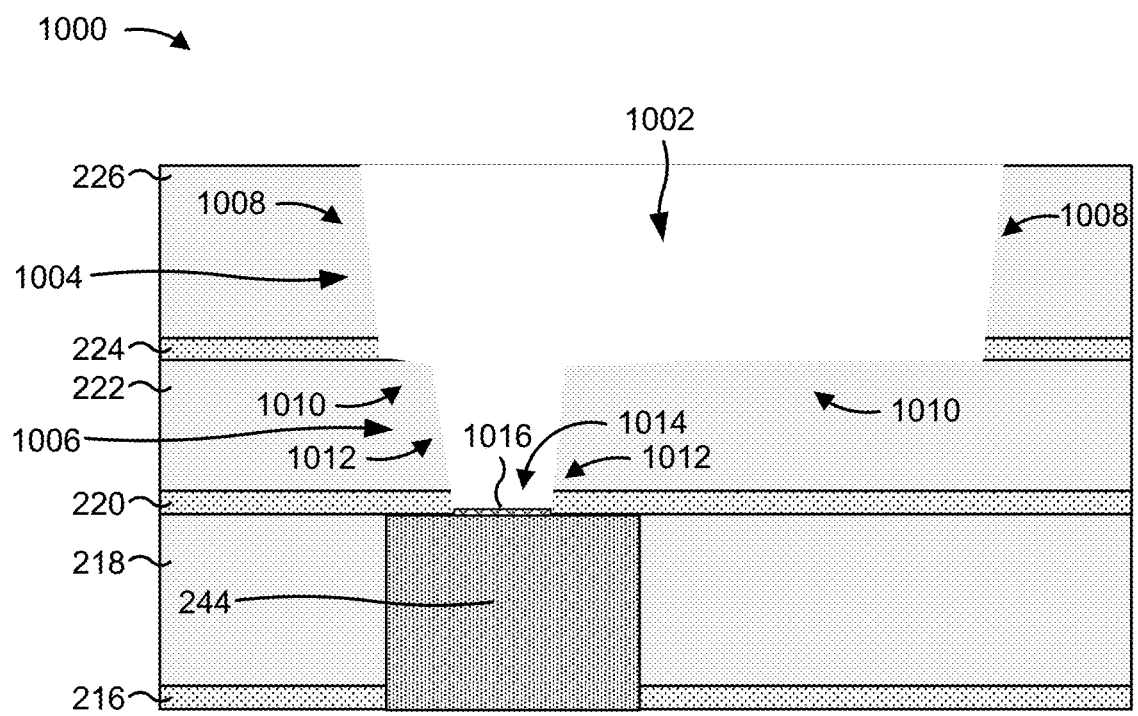
Figure 10C:
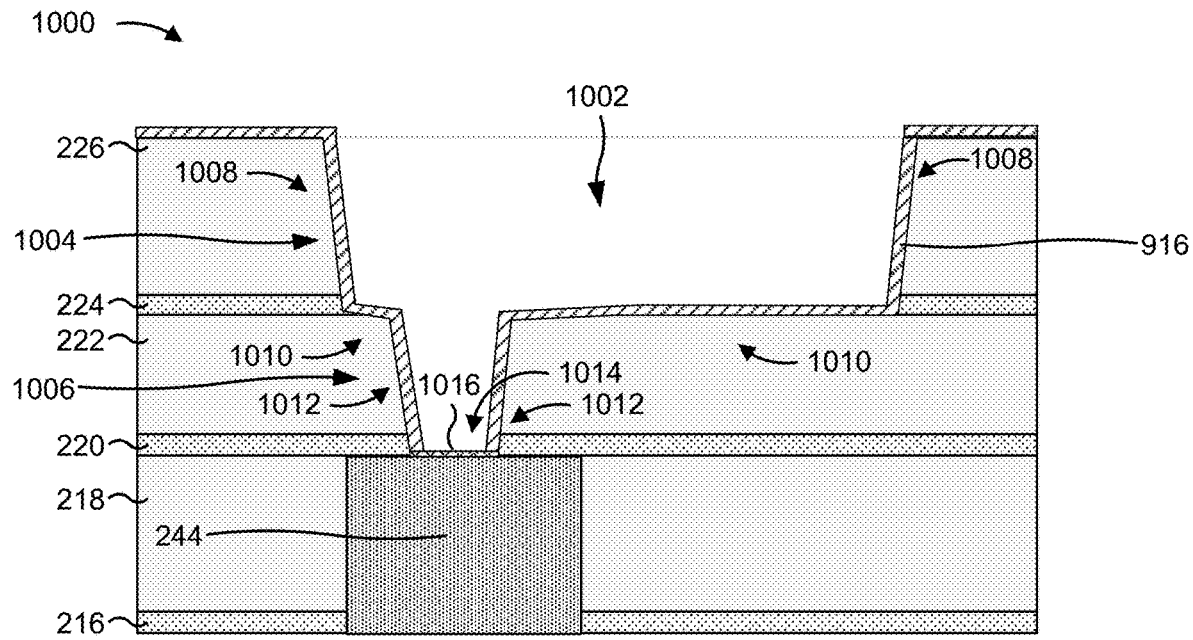
Figure 10D:
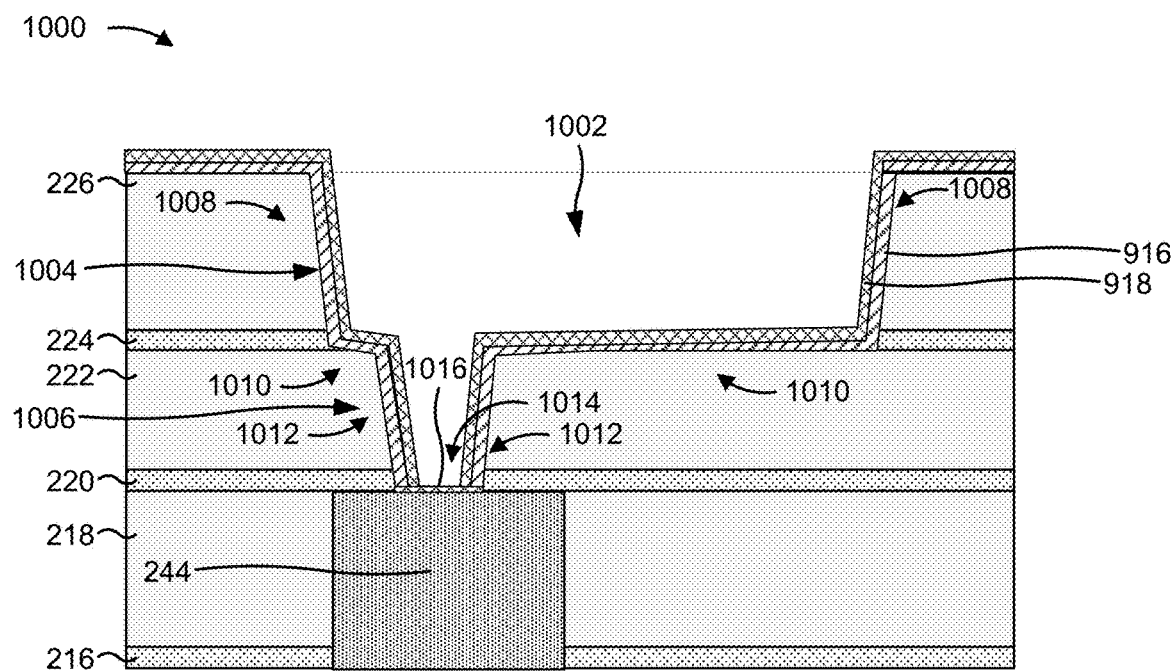
Figure 10E:
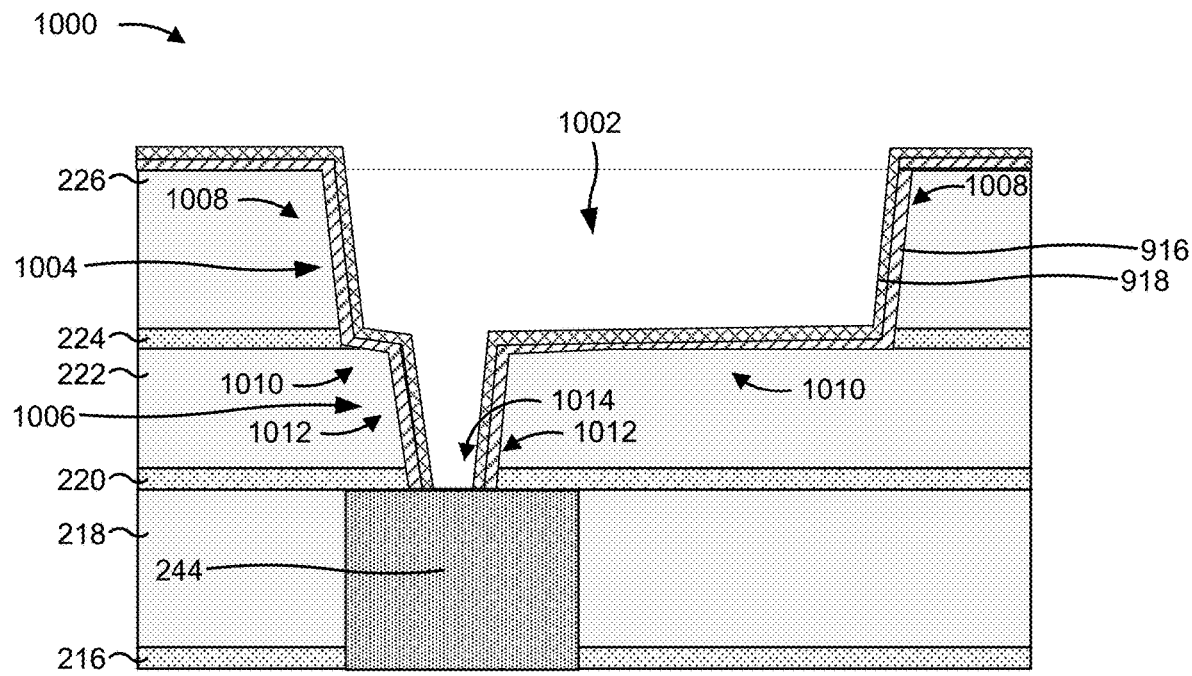
Figure 10F:
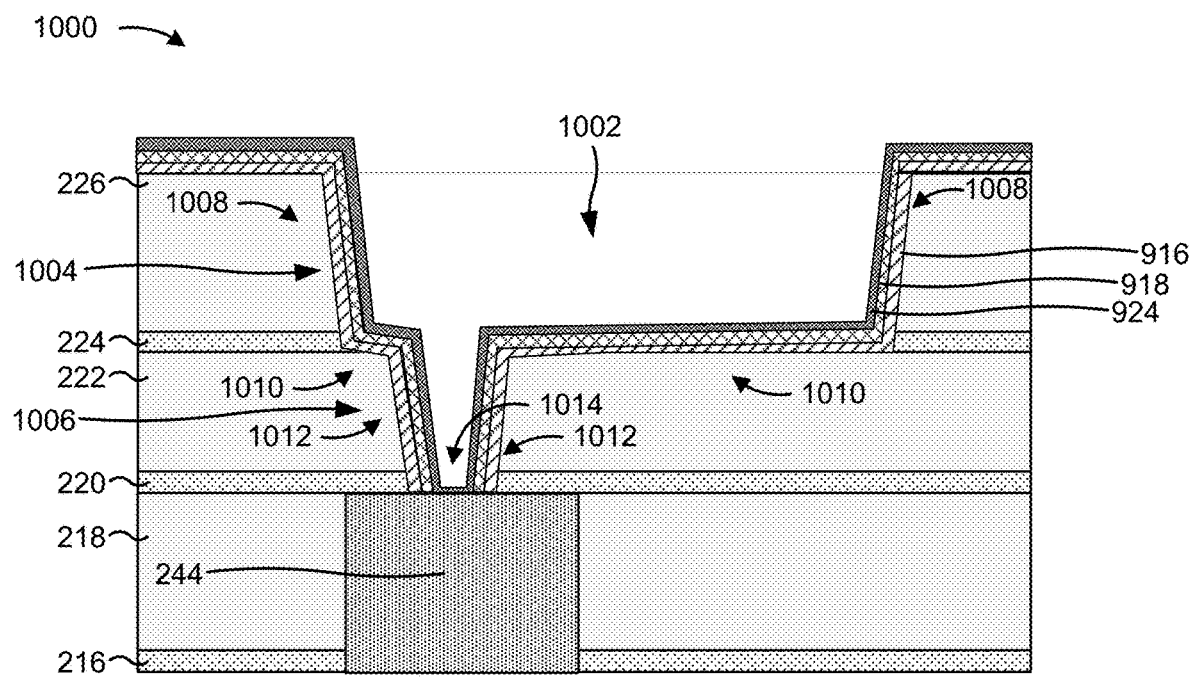
Figure 10G:
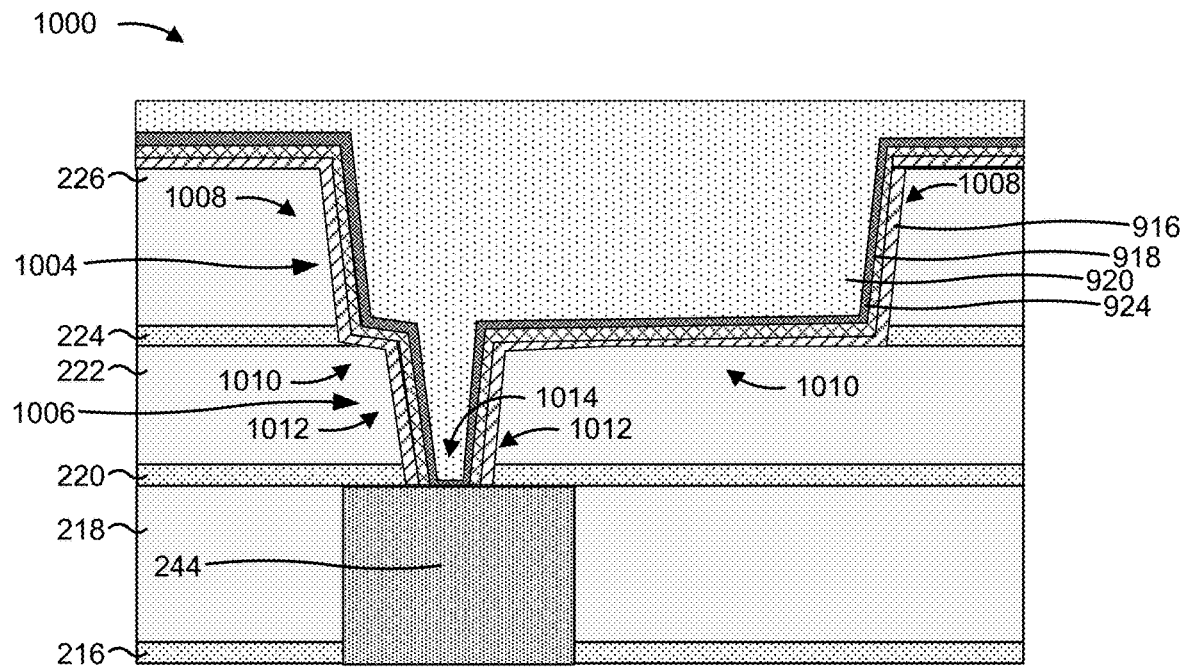
Figure 10H:
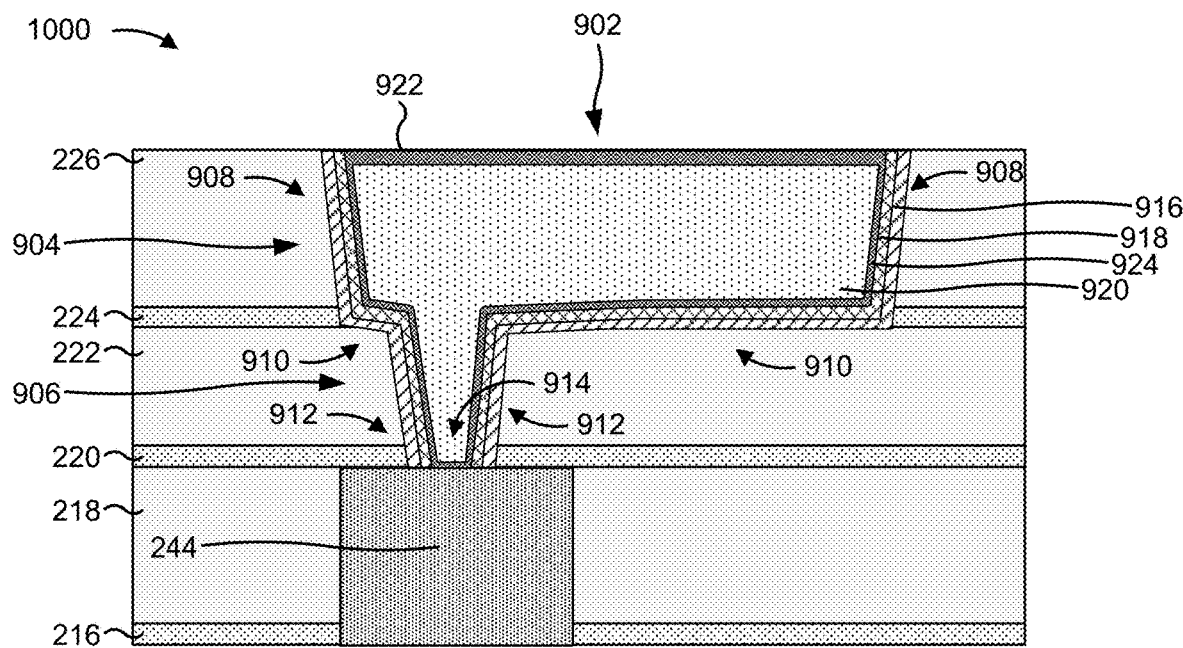

As shown in FIGS. 10A-10H, the example process of the example implementation 1000 mostly follows the example process of the example implementation 800. Accordingly, similar process details are not reiterated for purposes of brevity. As shown in FIG. 10D, however, the example process of the example implementation 1000 differs from the example process of the example implementation 800 in that the metal liner layer 918 is formed over and/or on the barrier layer 916 prior to removal of the blocking layer 1016. This results in the metal liner layer 918 being substantially absent and/or omitted from the bottom surface 1014 of the opening 1002 (e.g., from the top surface of the conductive structure 244). As shown in FIG. 10E, the blocking layer 1016 is then removed. As shown in FIG. 10F, the metal liner layer 924 is formed over and/or on the metal liner layer 918 after removal of the blocking layer 1016. This results in the metal liner layer 924 being formed on the bottom surface 1014 of the opening 1002 (e.g., on the top surface of the conductive structure 244). As shown in FIG. 10G, the conductive structure 920 is then formed over and/or on the metal liner layer 924.

As indicated above, FIGS. 10A-10H are provided as an example. Other examples may differ from what is described with regard to FIGS. 10A-10H. For example, the techniques described in connection with FIGS. 10A-10H may be performed to form a single damascene structure for the BEOL layer 902.

Figure 11:
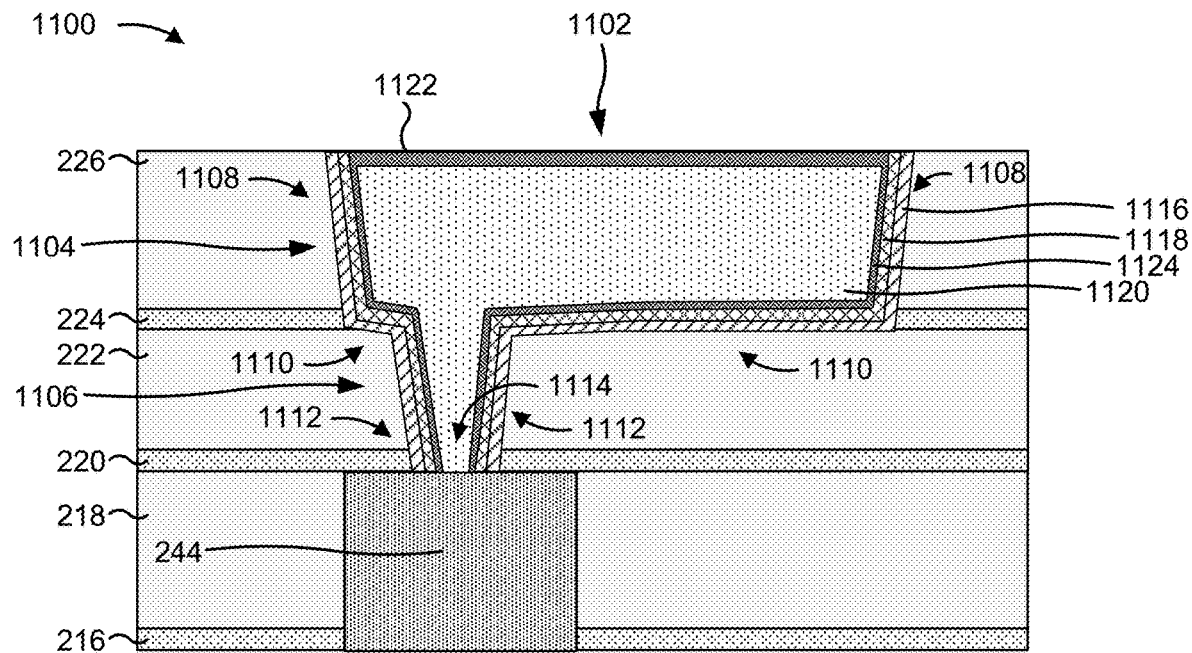
FIG. 11 is a diagram of an example semiconductor structure described herein.

FIG. 11 is a diagram of an example semiconductor structure 1100 described herein. The semiconductor structure 1100 includes a BEOL layer 1102, which may include one or more of the BEOL layers of the device 200 described in connection with FIG. 2. The BEOL layer 1102 includes a similar configuration of layers and/or structures as the BEOL layer 902 of FIG. 9. However, the conductive structure 1120 is in direct contact (e.g., is electrically coupled directly) with the conductive structure 244 as opposed to the conductive structure 920 being electrically coupled with the conductive structure 244 through the metal liner layer 924. As described in connection with FIGS. 12A-12G, this occurs as a result of a blocking layer remaining over the top surface of the conductive structure 244 during formation of the metal liner layers 1118 and 1124. This results in the metal liner layers 1118 and 1124 being substantially absent from and/or omitted from the top surface of the conductive structure 244. This further reduces contact resistance for the BEOL layer 1102.

In some implementations, the thickness of the metal liner layer 1124 at the bottom surface 1114 of the BEOL layer 1102 (e.g., on the top surface of the conductive structure 244) is in a range of approximately 1 Å to approximately 3 Å. However, other values for the range are within the scope of the present disclosure. In some implementations, a ratio of the thickness of the metal liner layer 1118 at the bottom surface 1114 of the BEOL layer 1102 (e.g., over the top surface of the conductive structure 244) to the thickness of the metal liner layer 1124 at the bottom surface 1114 of the BEOL layer 1102 (e.g., over the top surface of the conductive structure 244) is in a range of approximately 1:3 to approximately 3:1. However, other values for the range are within the scope of the present disclosure.

As indicated above, FIG. 11 is provided as an example. Other examples may differ from what is described with regard to FIG. 11.

FIGS. 12A-12G are diagrams of an example implementation 1200 described herein. Example implementation 1200 may be an example process for forming the BEOL layer 1102 over a conductive structure (e.g., the conductive structure 244 or another conductive structure) of the device 200. In particular, the example implementation 1200 includes an example process for forming the BEOL layer 1102 such that the metal liner layer 1124 is substantially absent and/or omitted from the top surface of the conductive structure 244, and such that the conductive structure 1120 is electrically coupled directly with the top surface of the conductive structure 244.

Figure 12A:
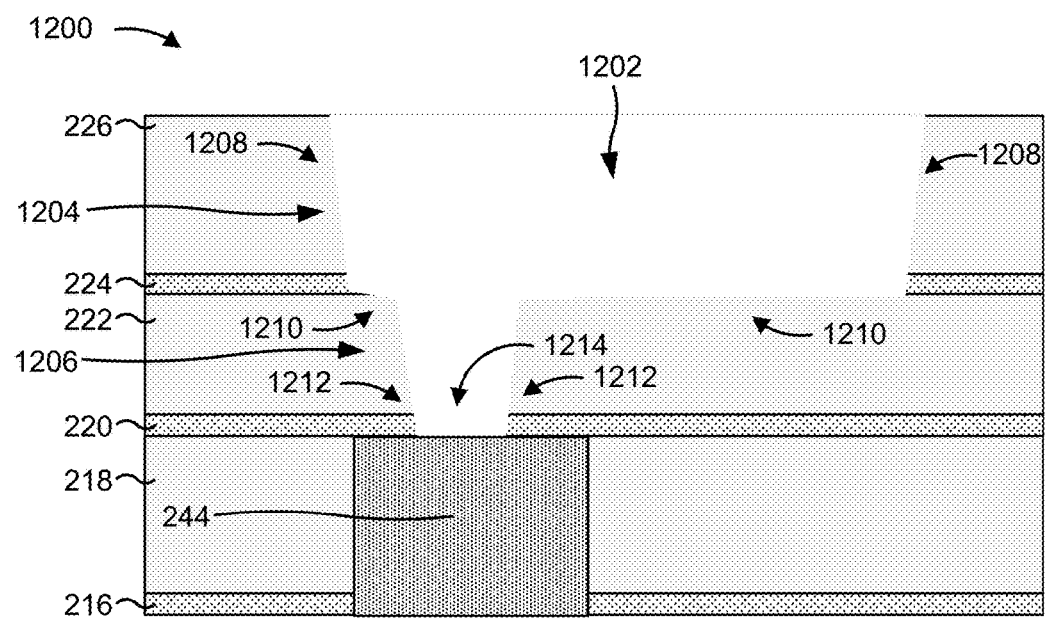
FIGS. 12A-12G are diagrams of an example implementation described herein.
Figure 12B:
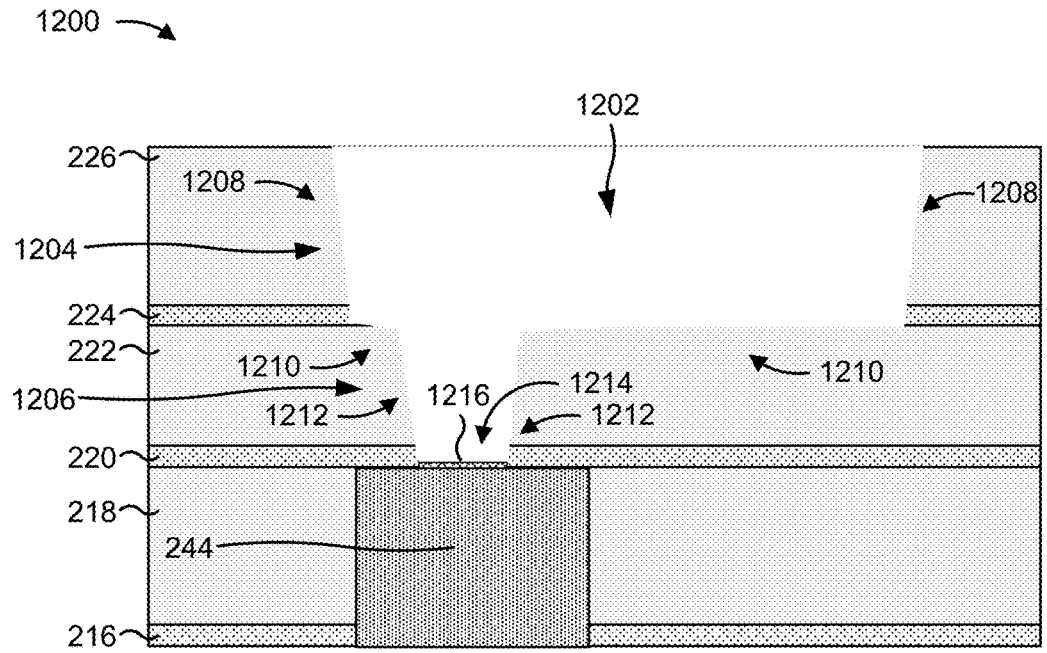
Figure 12C:
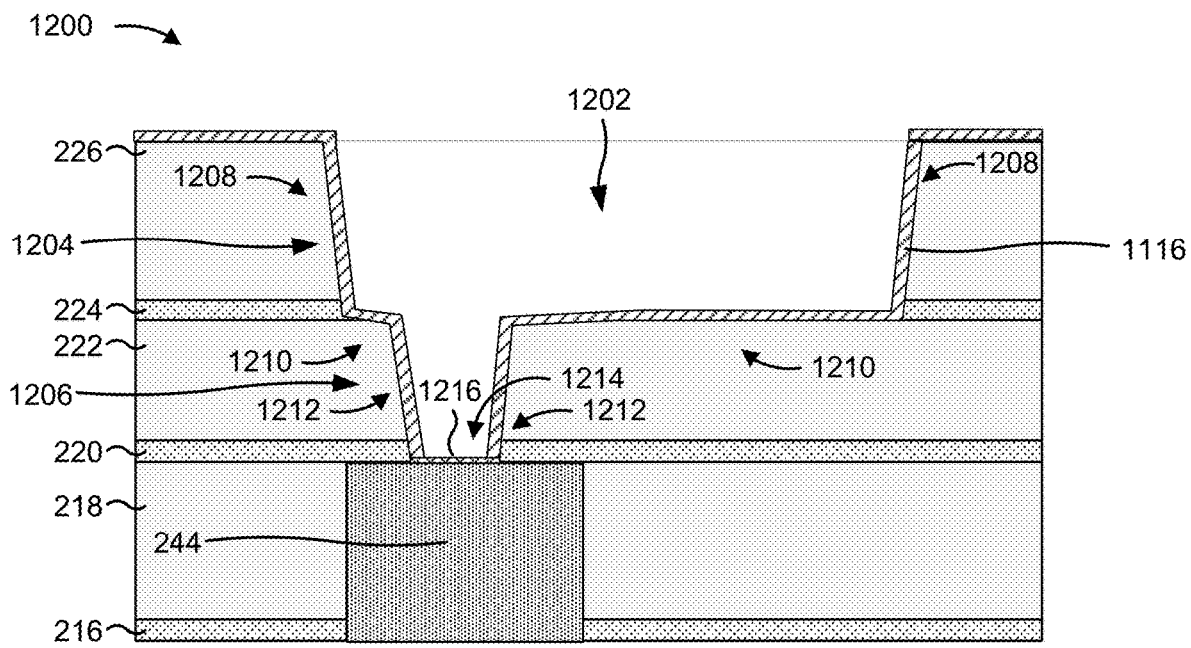
Figure 12D:
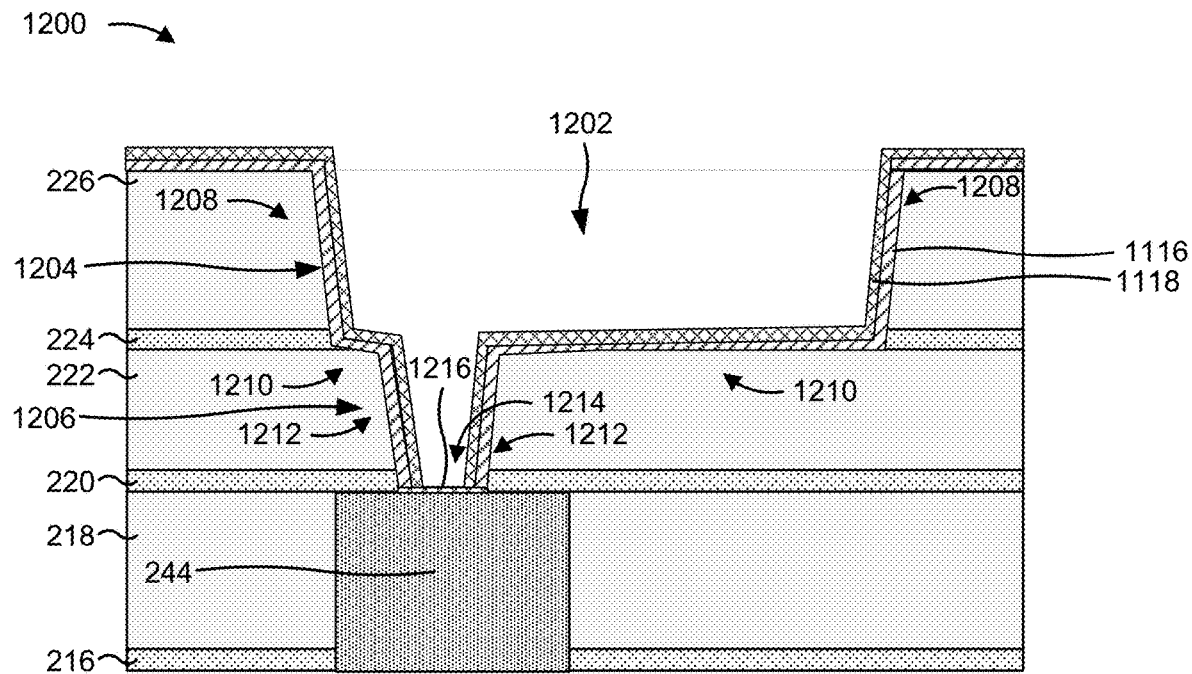
Figure 12E:
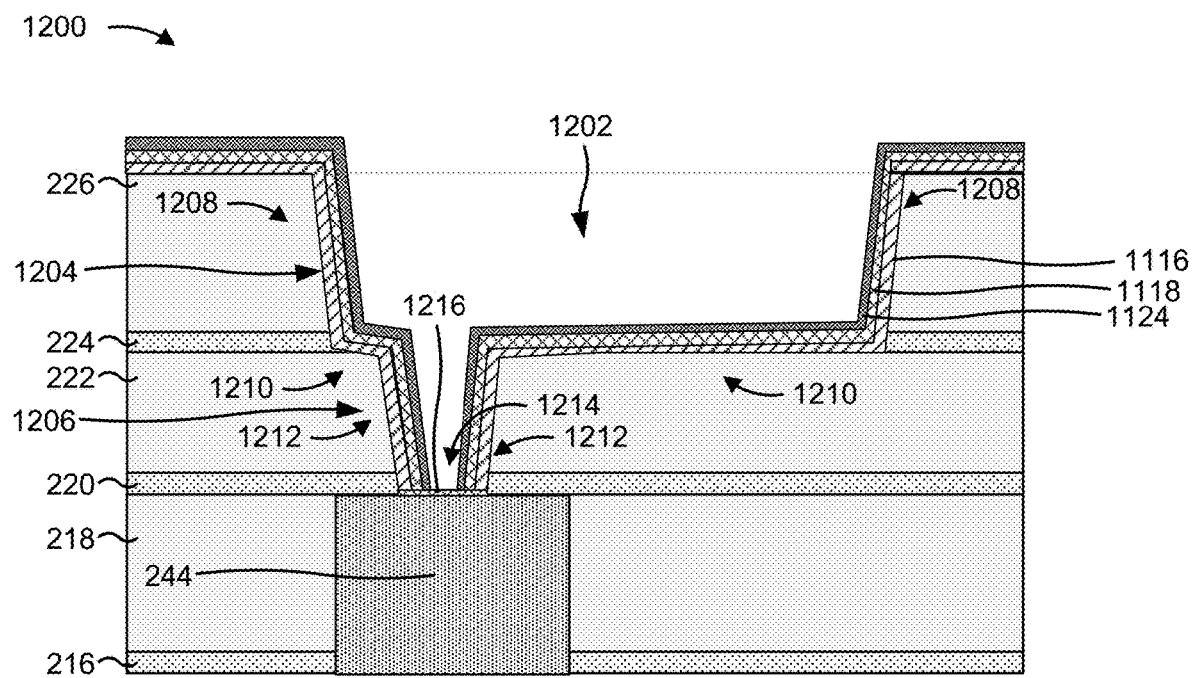
Figure 12F:
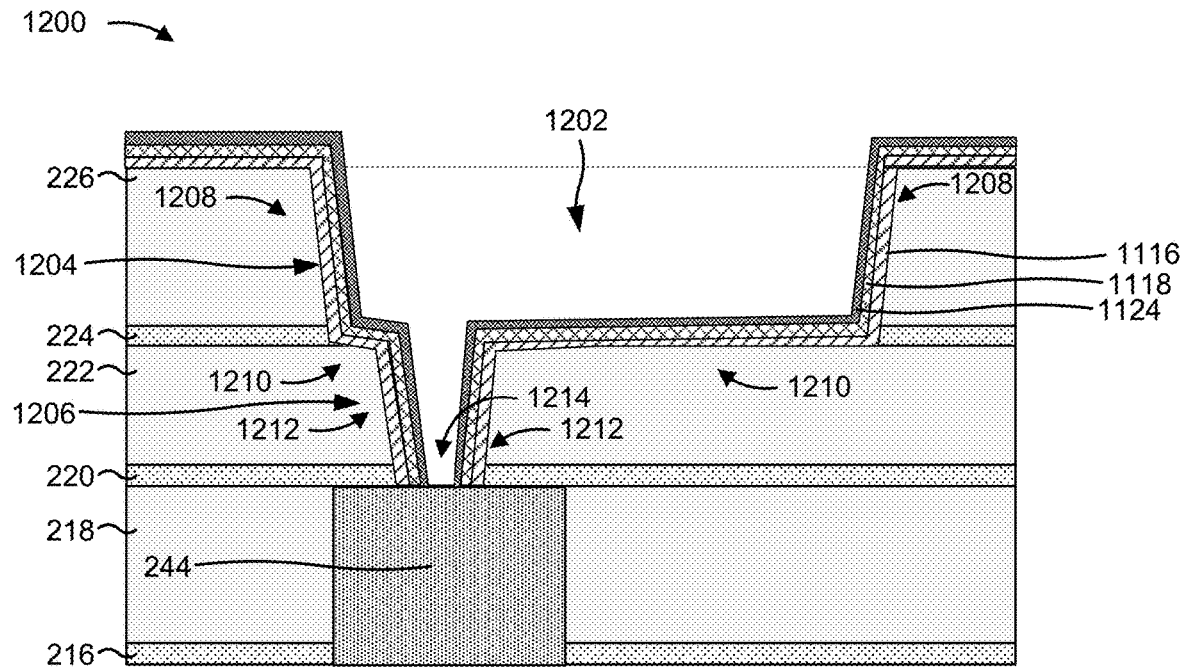
Figure 12G:
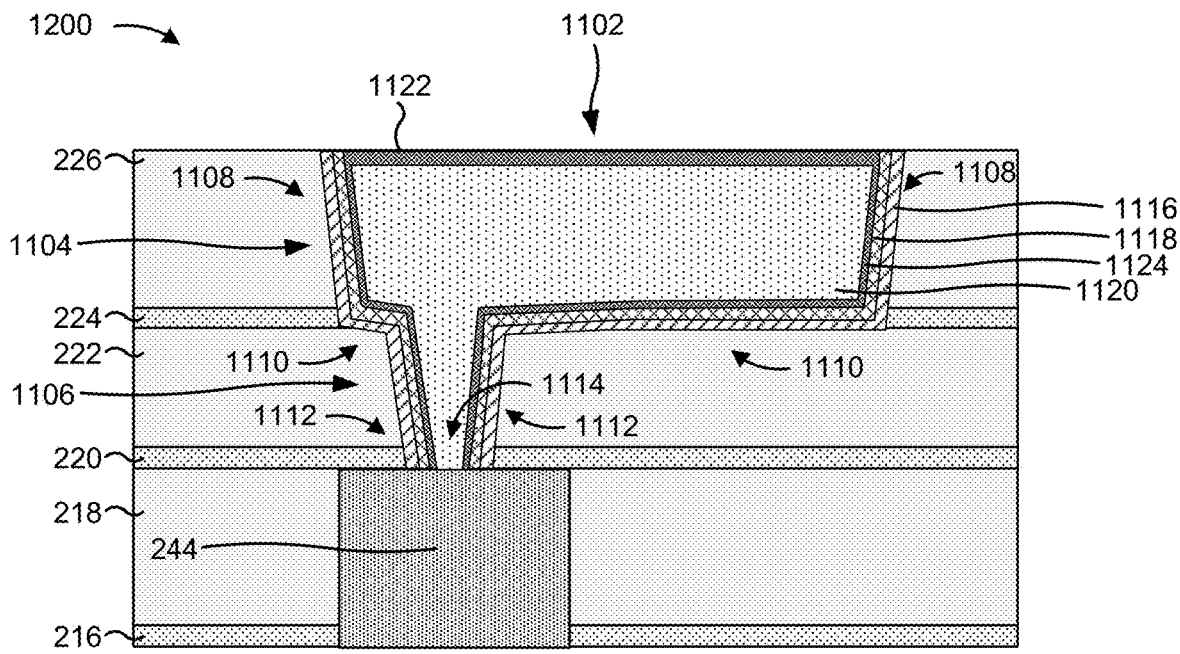

As shown in FIGS. 12A-12G, the example process of the example implementation 1200 mostly follows the example process of the example implementation 1000. Accordingly, similar process details are not reiterated for purposes of brevity. As shown in FIG. 12E, however, the example process of the example implementation 1200 differs from the example process of the example implementation 1000 in that the metal liner layer 1124 is formed over and/or on the metal liner layer 1118 prior to removal of the blocking layer 1216. This results in the metal liner layer 1124 being substantially absent and/or omitted from the bottom surface 1214 of the opening 1202 (e.g., from the top surface of the conductive structure 244). As shown in FIG. 12F, the blocking layer 1216 is then removed. As shown in FIG. 12G, the conductive structure 1120 is then formed over and/or on the metal liner layer 1124, and such that the conductive structure 1120 is electrically coupled directly with the top surface of the conductive structure 244.

As indicated above, FIGS. 12A-12G are provided as an example. Other examples may differ from what is described with regard to FIGS. 12A-12G. For example, the techniques described in connection with FIGS. 12A-12G may be performed to form a single damascene structure for the BEOL layer 1102.

Figure 13:
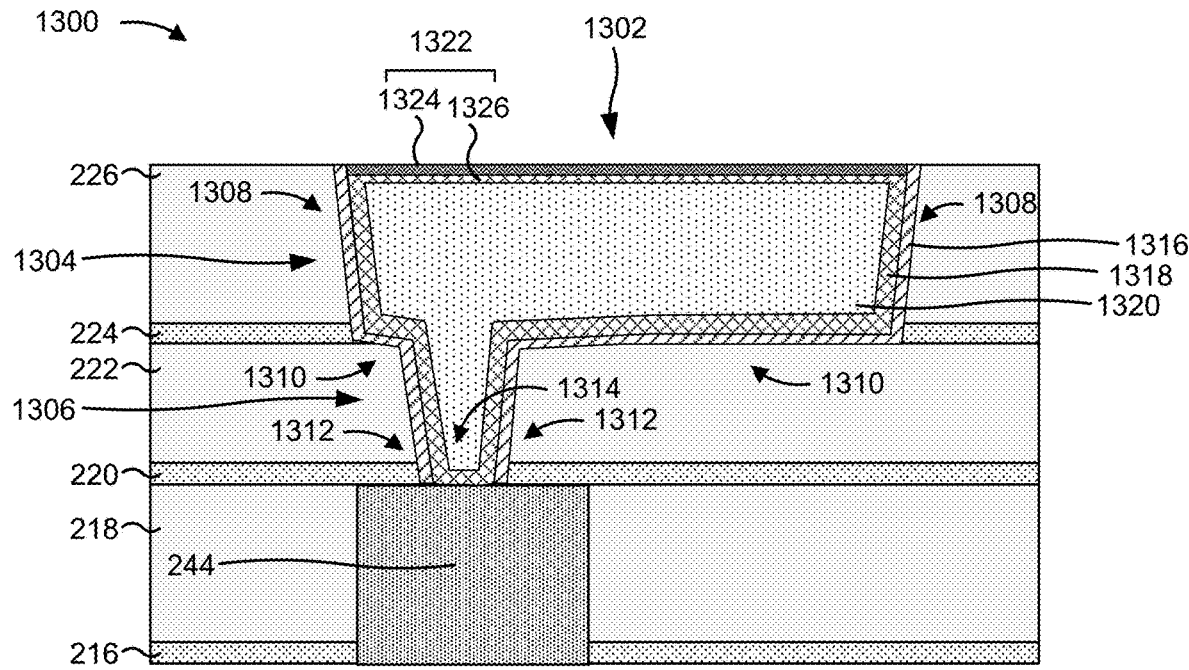
FIG. 13 is a diagram of an example semiconductor structure described herein.

FIG. 13 is a diagram of an example semiconductor structure 1300 described herein. The semiconductor structure 1300 includes a BEOL layer 1302, which may include one or more of the BEOL layers of the device 200 described in connection with FIG. 2. The BEOL layer 1302 includes a similar configuration of layers and/or structures as the BEOL layer 302 of FIG. 3. However, the metal liner layer 1318 includes a ruthenium (Ru) liner instead of a cobalt (Co) liner. Moreover, in some implementations, the semiconductor structure 1300 includes a ruthenium cobalt (RuCo) capping layer 1322 instead of a cobalt capping layer. The ruthenium cobalt capping layer 1322 includes a cobalt (Co) layer 1324 and a ruthenium (Ru) layer 1326 under the cobalt layer.

A thickness of the metal liner layer 1318 is in a range of approximately 5 Å to approximately 25 Å to provide sufficiently low contact resistance and sheet resistance while providing sufficient surface scattering reduction. However, other values for the range are within the scope of the present disclosure. In some implementations, a ratio of the thickness of the metal liner layer 1318 to a thickness of the barrier layer 1316 is in a range of approximately 1:4 to approximately 25:8. However, other values for the range are within the scope of the present disclosure. In some implementations, a ratio of the thickness of the metal liner layer 1318 to a thickness of the ruthenium cobalt capping layer 1322 is in a range of approximately 1:8 to approximately 5:3. However, other values for the range are within the scope of the present disclosure.

As indicated above, FIG. 13 is provided as an example. Other examples may differ from what is described with regard to FIG. 13.

FIGS. 14A-14G are diagrams of an example implementation 1400 described herein. Example implementation 1400 may be an example process for forming the BEOL layer 1302 over a conductive structure (e.g., the conductive structure 244 or another conductive structure) of the device 200. In particular, the example implementation 1400 includes an example process for forming the BEOL layer 1302 such that the metal liner layer 1318 includes a ruthenium (Ru) liner and such that the BEOL layer 1302 includes the ruthenium cobalt (RuCo) capping layer 1322.

Figure 14A:
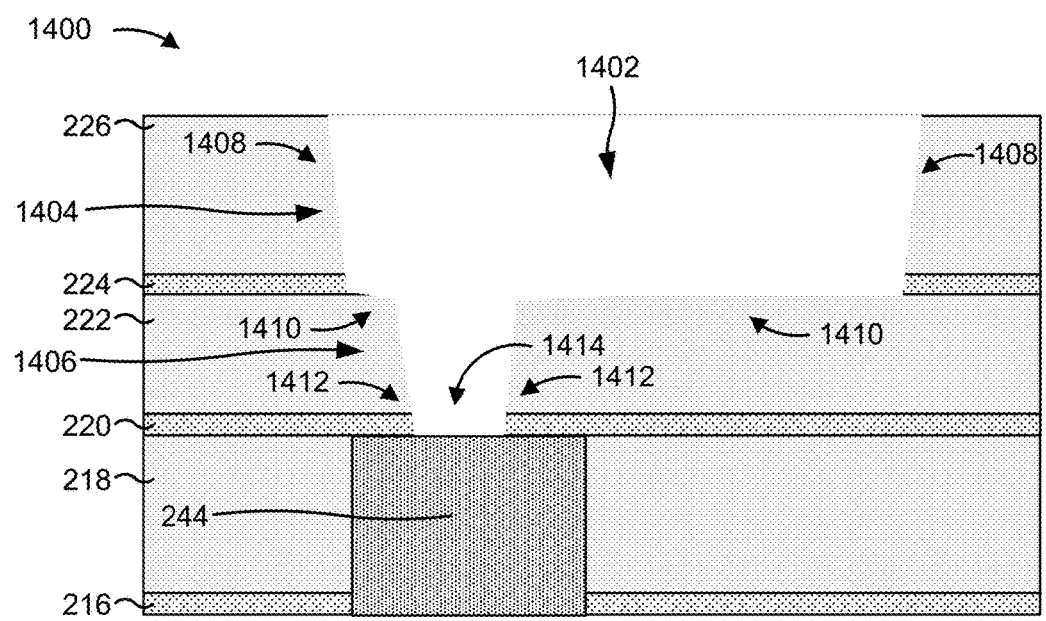
FIGS. 14A-14G are diagrams of an example implementation described herein.
Figure 14B:
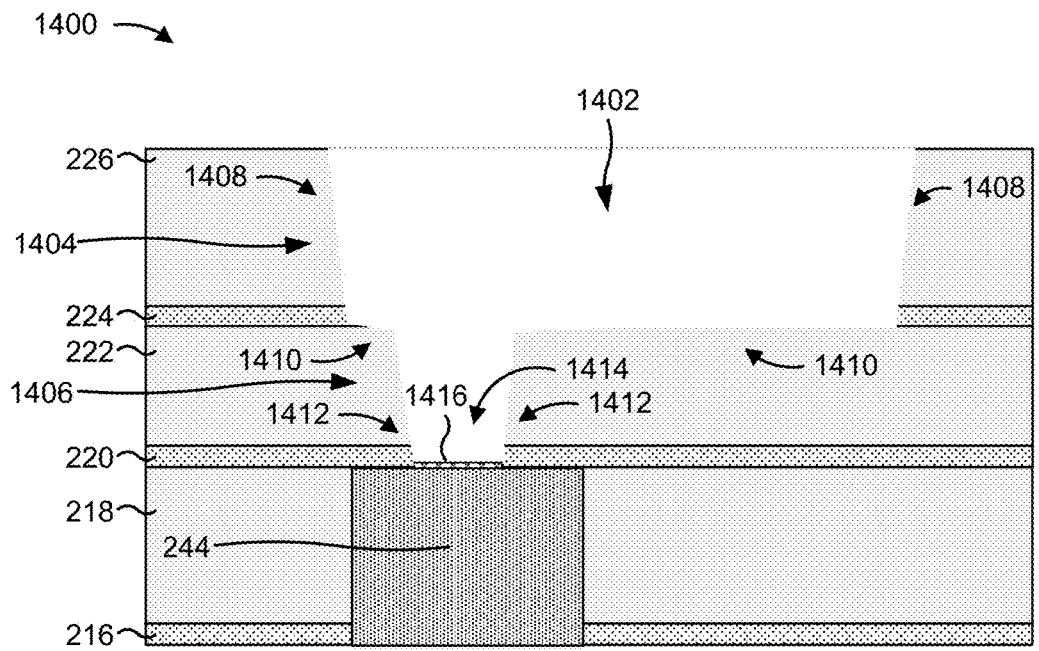
Figure 14C:
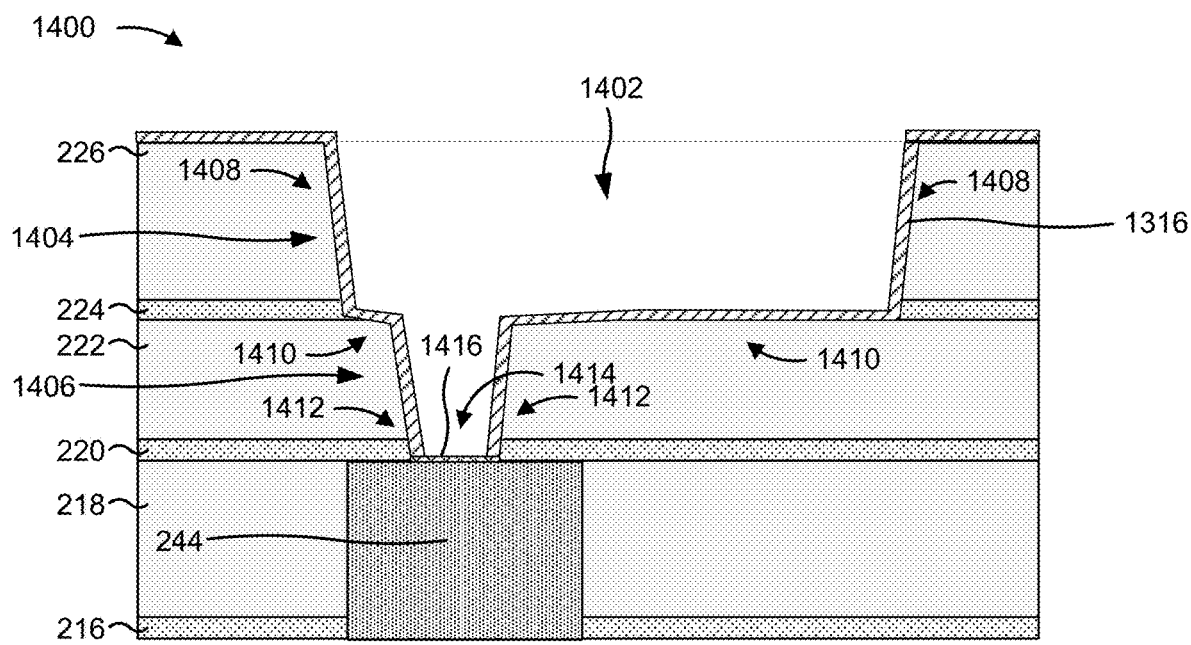
Figure 14D:
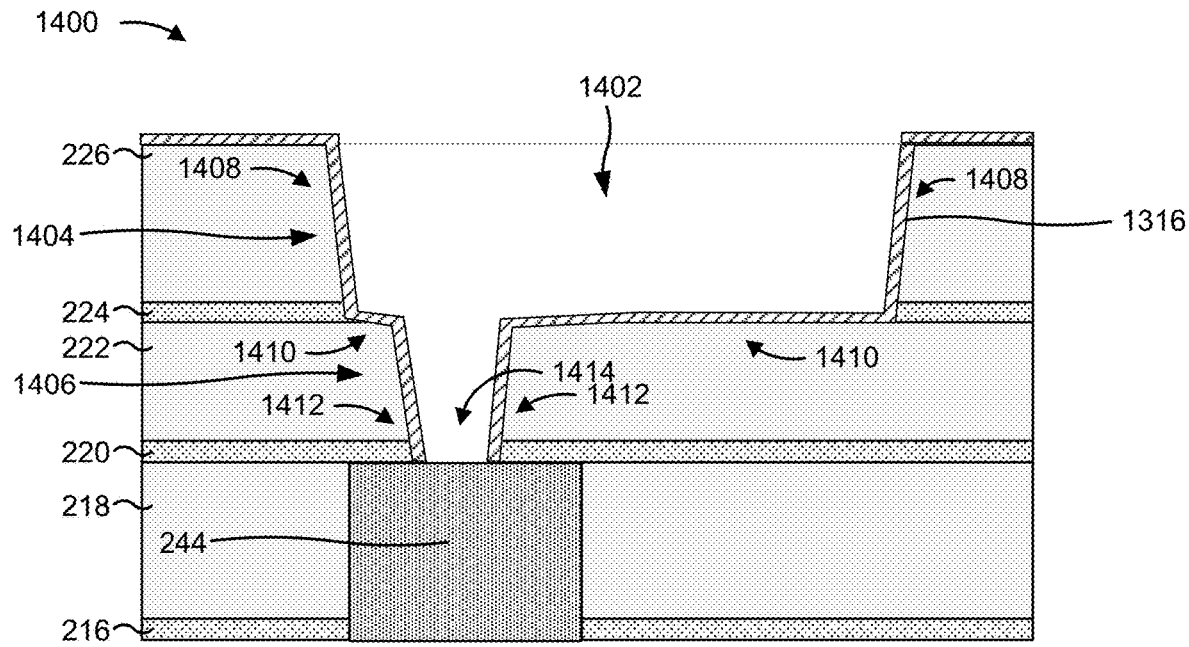
Figure 14E:
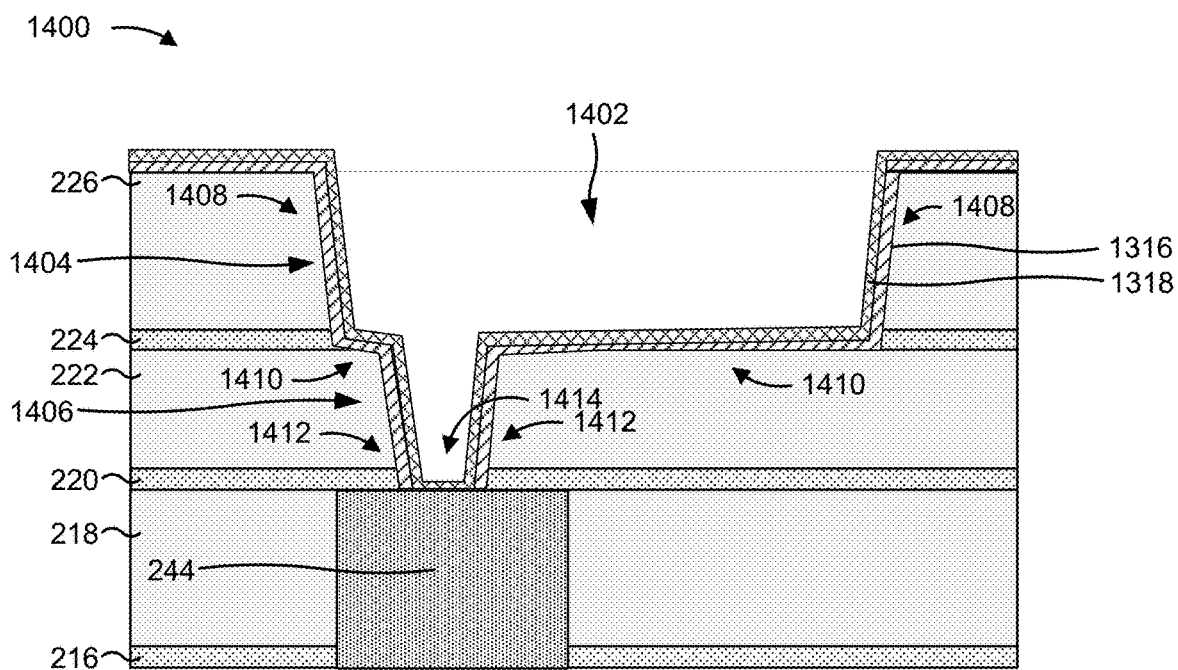
Figure 14F:
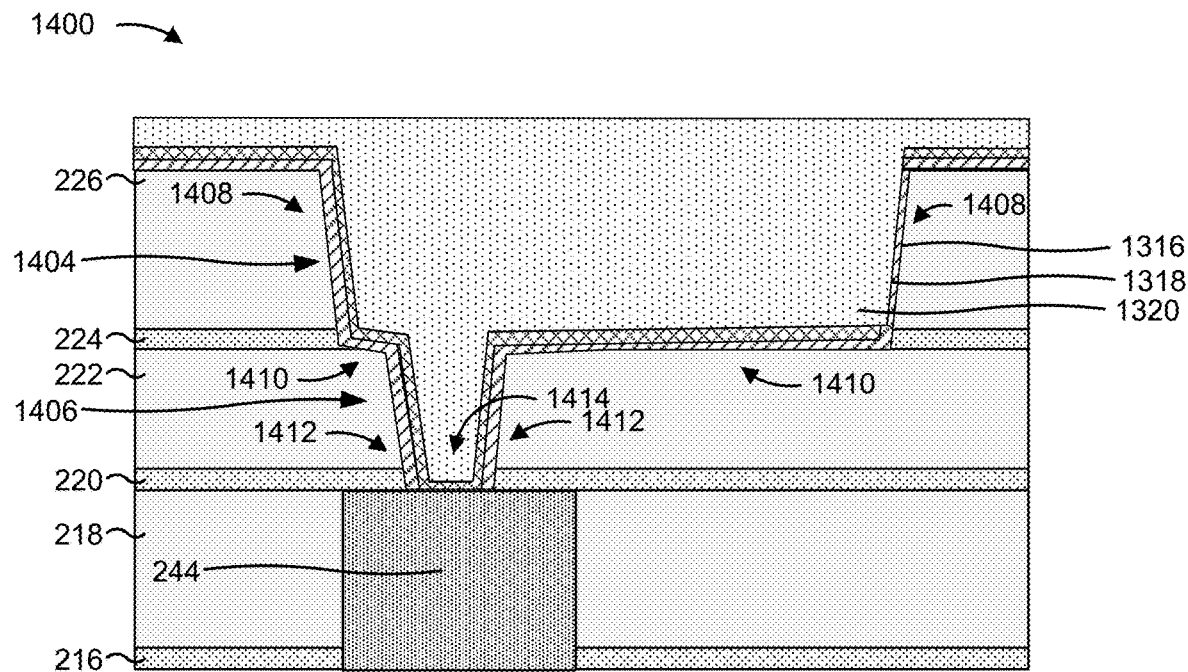
Figure 14G:
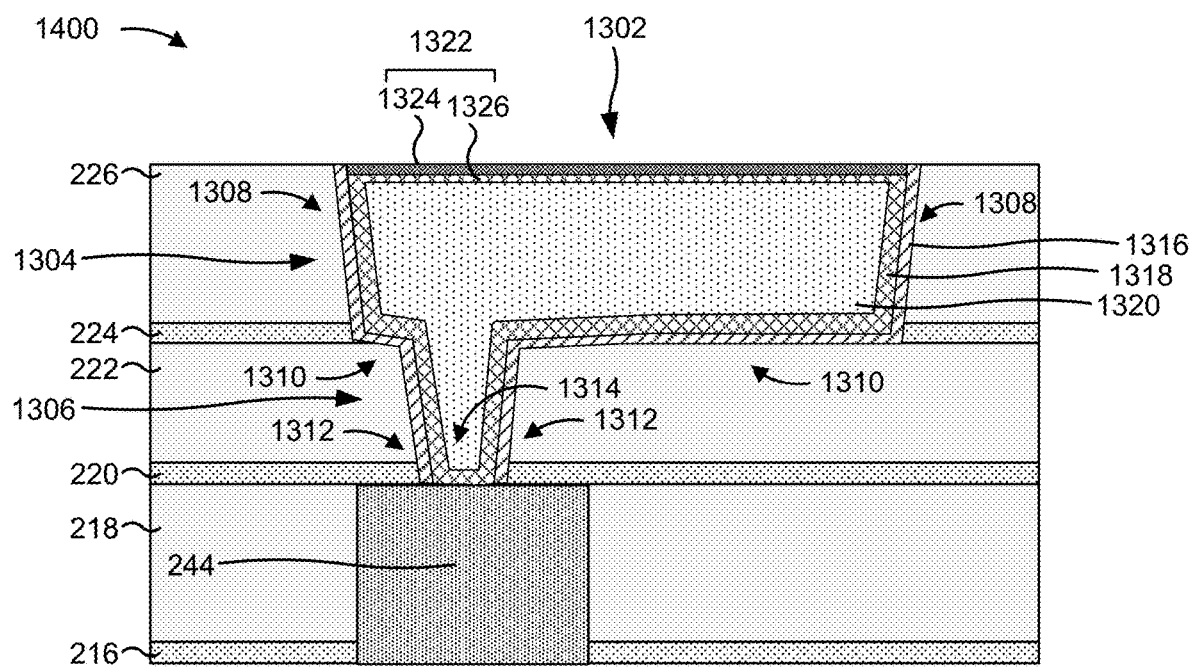

As shown in FIGS. 14A-14G, the example process of the example implementation 1400 mostly follows the example process of the example implementation 400. Accordingly, similar process details are not reiterated for purposes of brevity. As shown in FIG. 14G, however, the example process of the example implementation 1400 differs from the example process of the example implementation 400 in that the ruthenium cobalt capping layer 1322 is formed over the conductive structure 1320 for the BEOL layer 1302.

As indicated above, FIGS. 14A-14G are provided as an example. Other examples may differ from what is described with regard to FIGS. 14A-14G. For example, the techniques described in connection with FIGS. 14A-14G may be performed to form a single damascene structure for the BEOL layer 1302.

Figure 15:
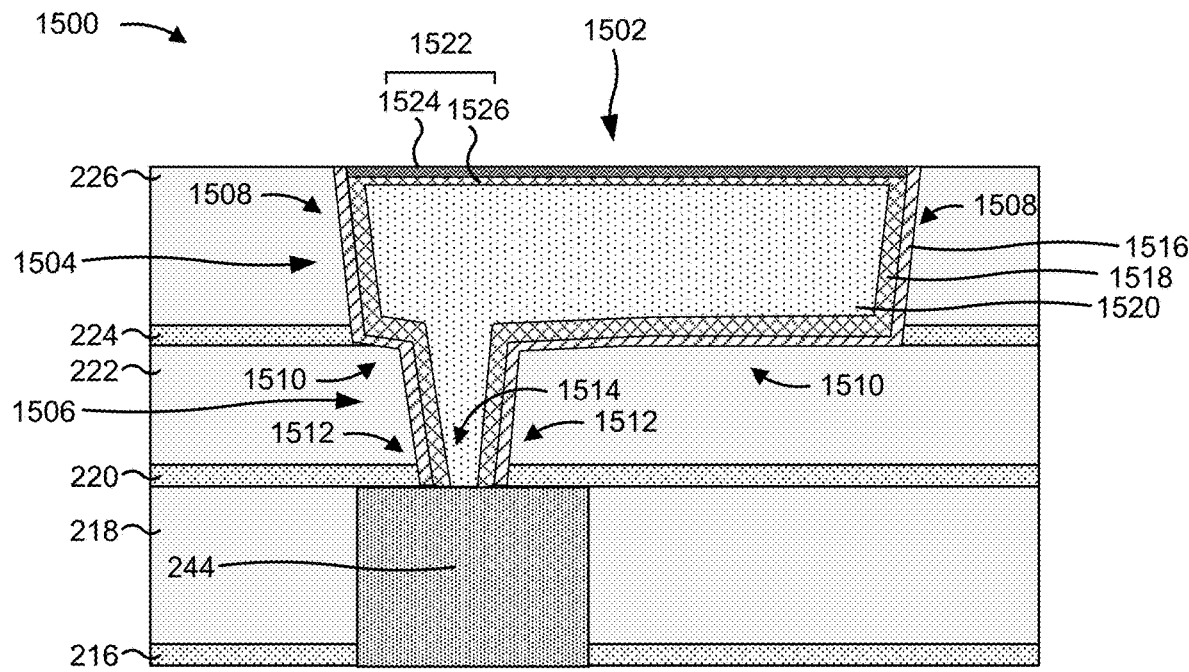
FIG. 15 is a diagram of an example semiconductor structure described herein.

FIG. 15 is a diagram of an example semiconductor structure 1500 described herein. The semiconductor structure 1500 includes a BEOL layer 1502, which may include one or more of the BEOL layers of the device 200 described in connection with FIG. 2. The BEOL layer 1502 includes a similar configuration of layers and/or structures as the BEOL layer 1302 of FIG. 13. However, the conductive structure 1520 of the BEOL layer 1502 is in direct contact (e.g., is electrically coupled directly) with the conductive structure 244, whereas the conductive structure 1320 is in contact (e.g., is electrically coupled) with the conductive structure 244 through the metal liner layer 1318. As described in connection with FIGS. 16A-16G, this occurs as a result of a blocking layer remaining over the top surface of the conductive structure 244 during formation of the metal liner layer 1518. This results in the metal liner layer 1518 being substantially absent from and/or omitted from the top surface of the conductive structure 244. This further reduces contact resistance for the BEOL layer 1502. In some implementations, the thickness of the metal liner layer 1518 at the bottom surface 1514 of the BEOL layer 1502 (e.g., on the top surface of the conductive structure 244) is in a range of approximately 1 Å to approximately 3 Å. However, other values for the range are within the scope of the present disclosure. In some implementations, a ratio of the thickness of the metal liner layer 1518 at the bottom surface 1514 of the BEOL layer 1502 (e.g., over the top surface of the conductive structure 244) to the thickness of the barrier layer 1516 at the bottom surface 1514 of the BEOL layer 1502 (e.g., over the top surface of the conductive structure 244) is in a range of approximately 1:3 to approximately 3:1. However, other values for the range are within the scope of the present disclosure.

As indicated above, FIG. 15 is provided as an example. Other examples may differ from what is described with regard to FIG. 15.

FIGS. 16A-16G are diagrams of an example implementation 1600 described herein. Example implementation 1600 may be an example process for forming the BEOL layer 1502 over a conductive structure (e.g., the conductive structure 244 or another conductive structure) of the device 200. In particular, the example implementation 1600 includes an example process for forming the BEOL layer 1502 such that the barrier layer 1516 and the metal liner layer 1518 are substantially absent from and/or omitted from an interface between the BEOL layer 1502 and the conductive structure 244 in order to reduce contact resistance, which in turn increases electrical performance of an electronic device including the BEOL layer 1502.

Figure 16A:
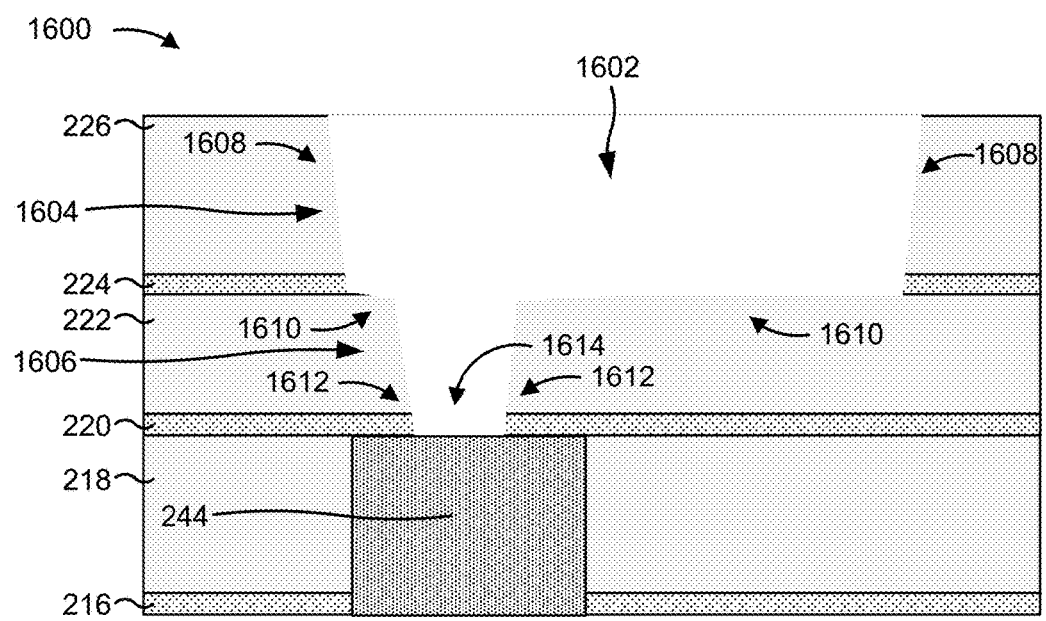
FIGS. 16A-16G are diagrams of an example implementation described herein.
Figure 16B:
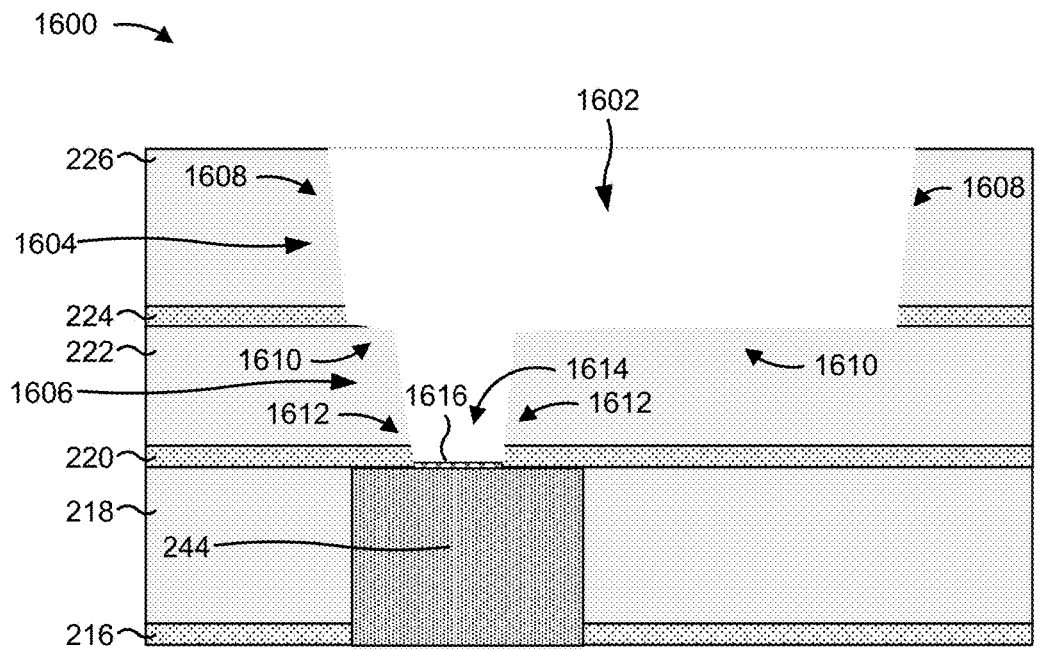
Figure 16C:
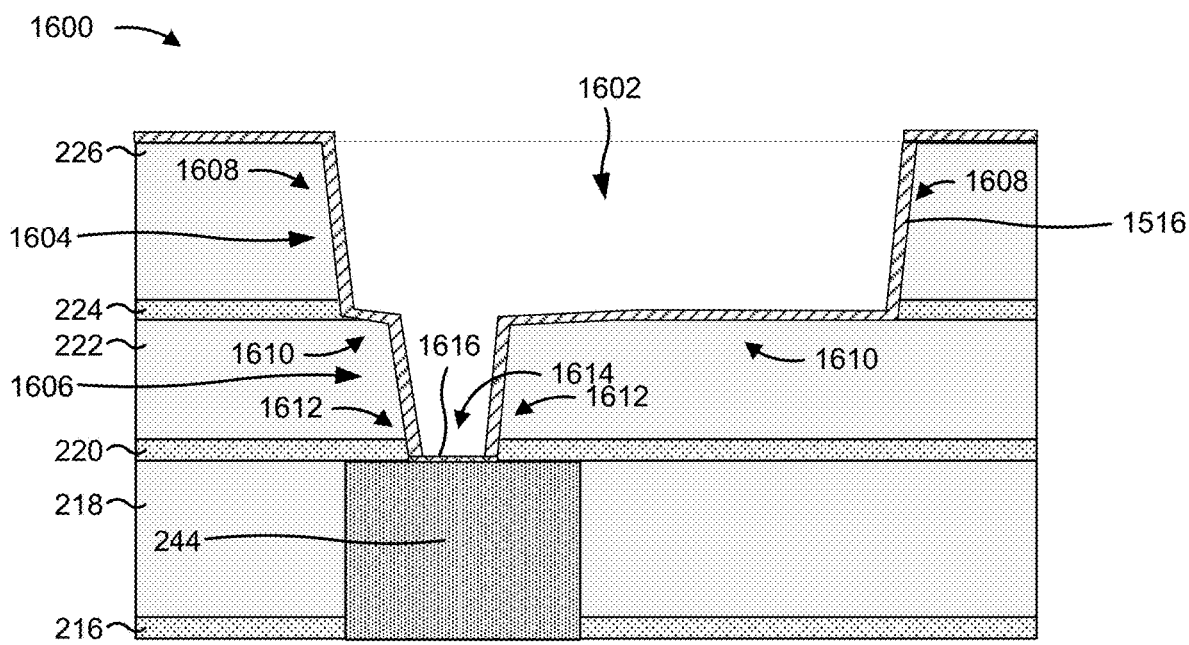
Figure 16D:
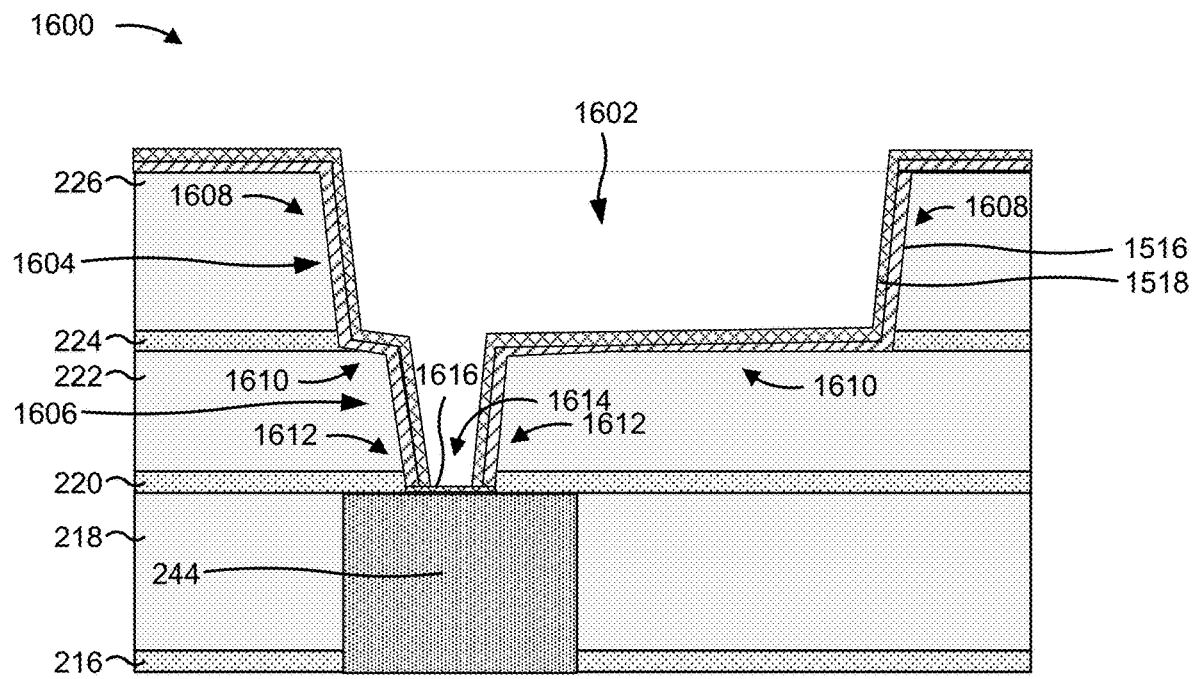
Figure 16E:
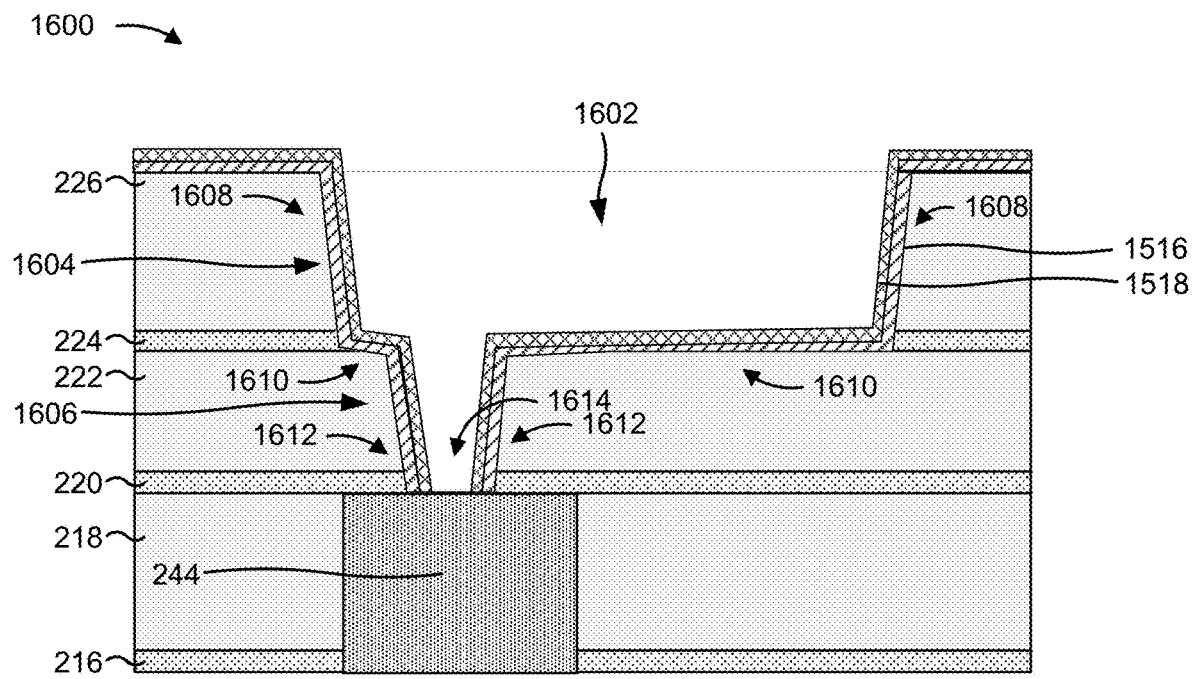
Figure 16F:
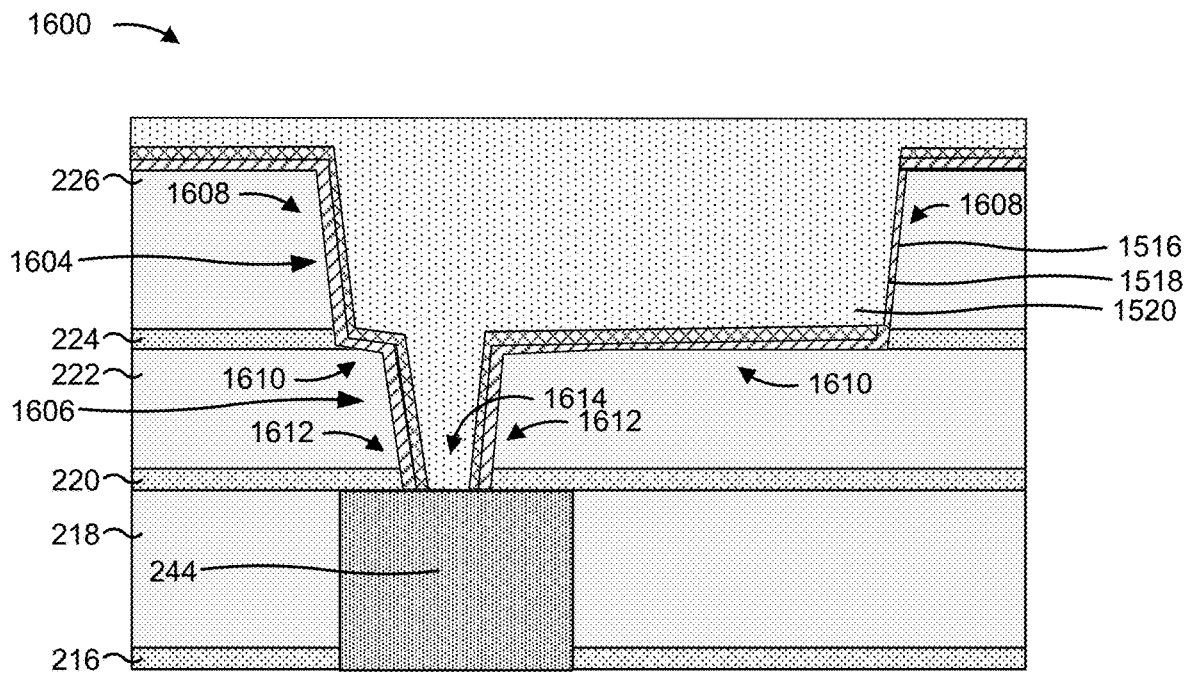
Figure 16G:
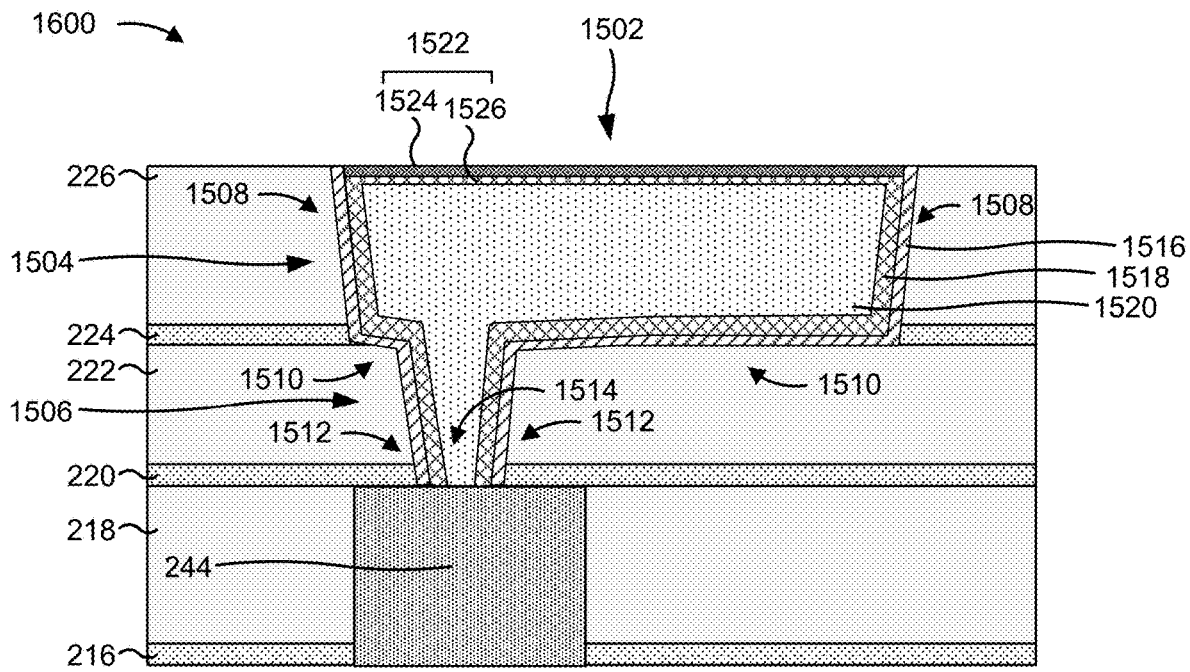

As shown in FIGS. 16A-16G, the example process of the example implementation 1600 mostly follows the example process of the example implementation 1400. Accordingly, similar process details are not reiterated for purposes of brevity. As shown in FIGS. 16D and 16E, however, the example process of the example implementation 1600 differs from the example process of the example implementation 1400 in that the blocking layer 1616 remains over and/or on the bottom surface 1614 of the opening 1602 (which corresponds to the top surface of the conductive structure 244) during formation of the metal liner layer 1518. The blocking layer 1616 is then removed from the bottom surface 1614 of the opening 1602 (e.g., from the top surface of the conductive structure 244) after formation of the metal liner layer 1518. In this way, the metal liner layer 1518 is substantially absent from and/or omitted from the top surface of the conductive structure 244. This further reduces contact resistance for the BEOL layer 1502.

As indicated above, FIGS. 16A-16G are provided as an example. Other examples may differ from what is described with regard to FIGS. 16A-16G. For example, the techniques described in connection with FIGS. 16A-16G may be performed to form a single damascene structure for the BEOL layer 1502.

Figure 17:
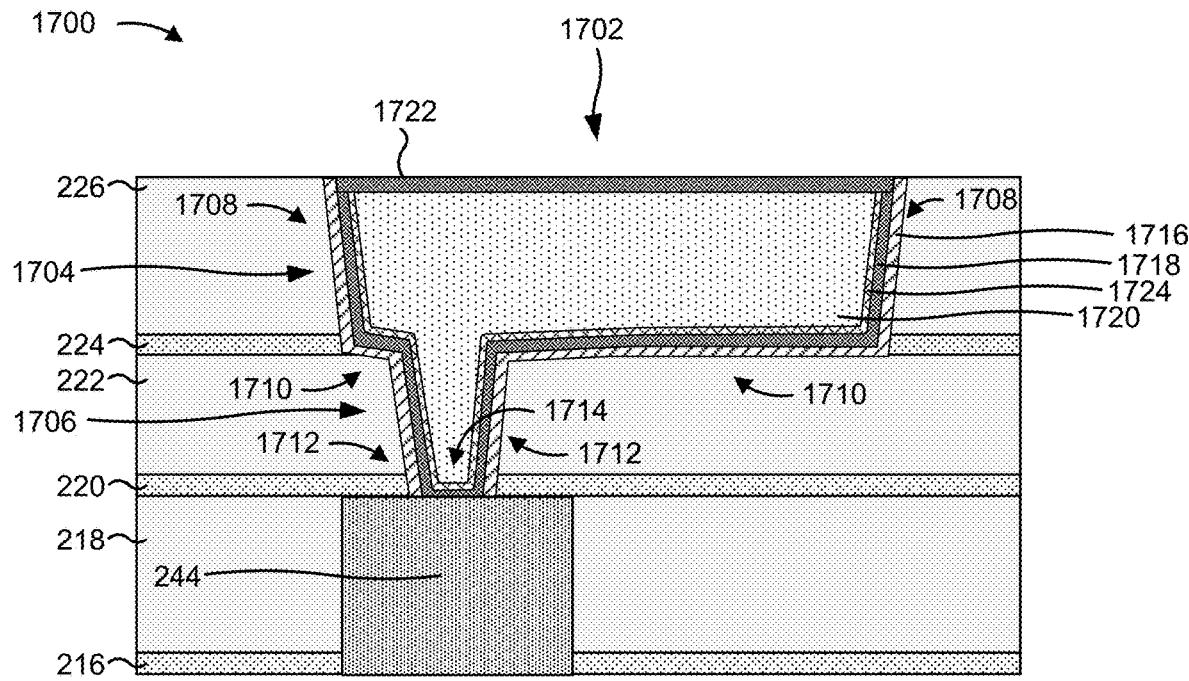
FIG. 17 is a diagram of an example semiconductor structure described herein.
Figure 18A:
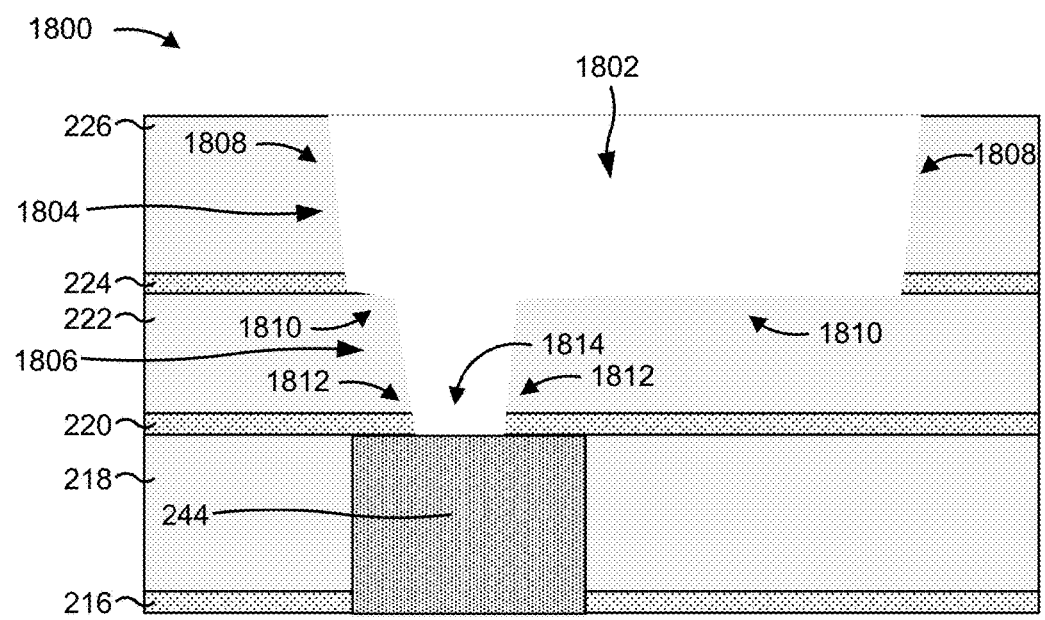
FIGS. 18A-18H are diagrams of an example implementation described herein.
Figure 18B:
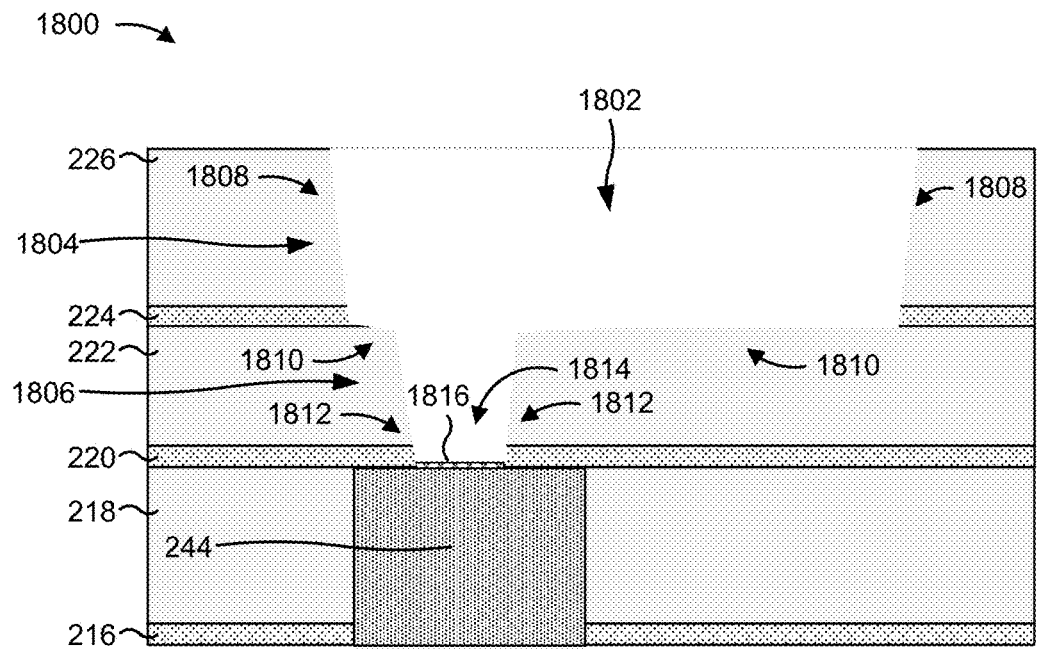
Figure 18C:
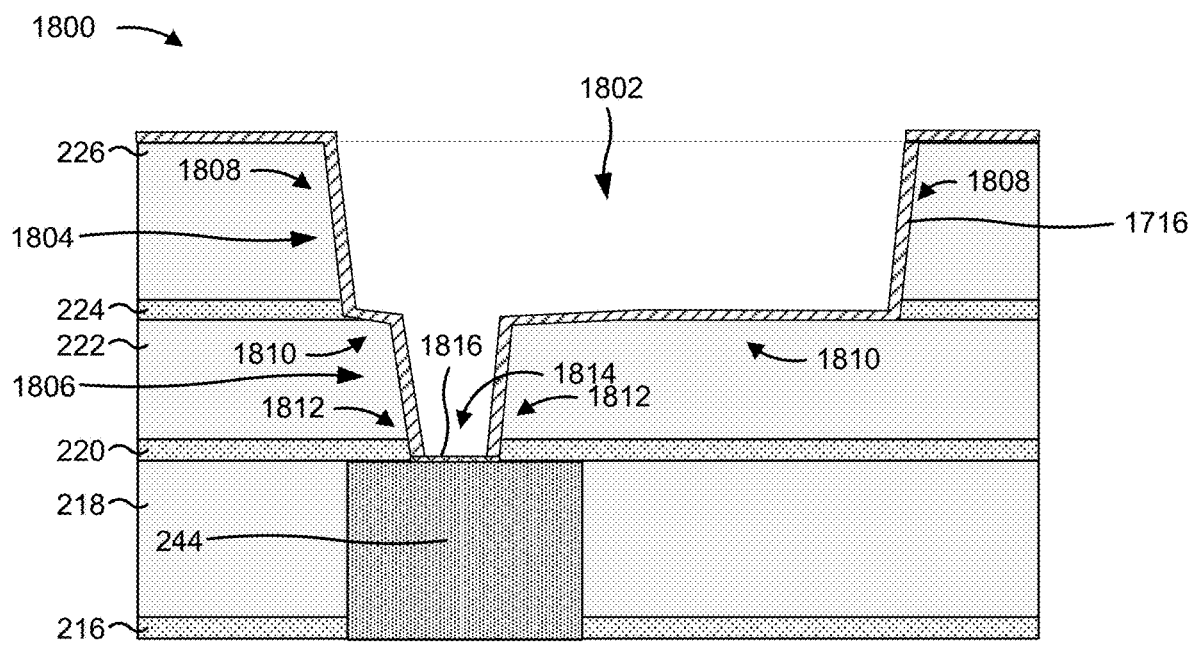
Figure 18D:
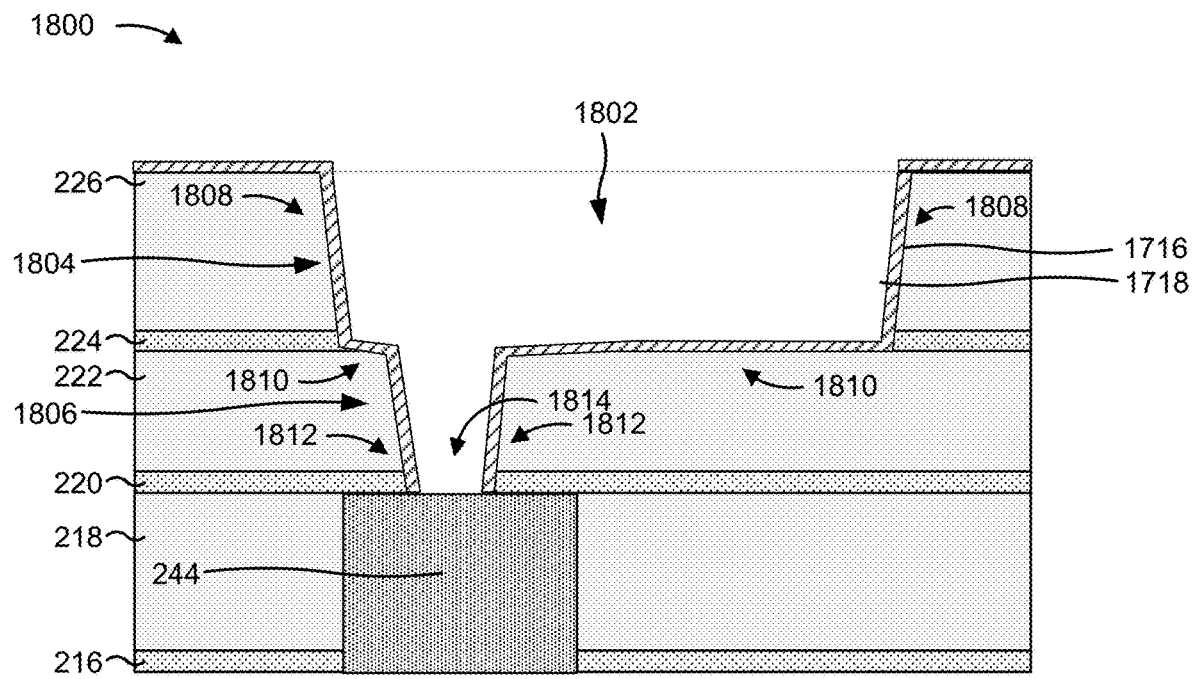
Figure 18E:
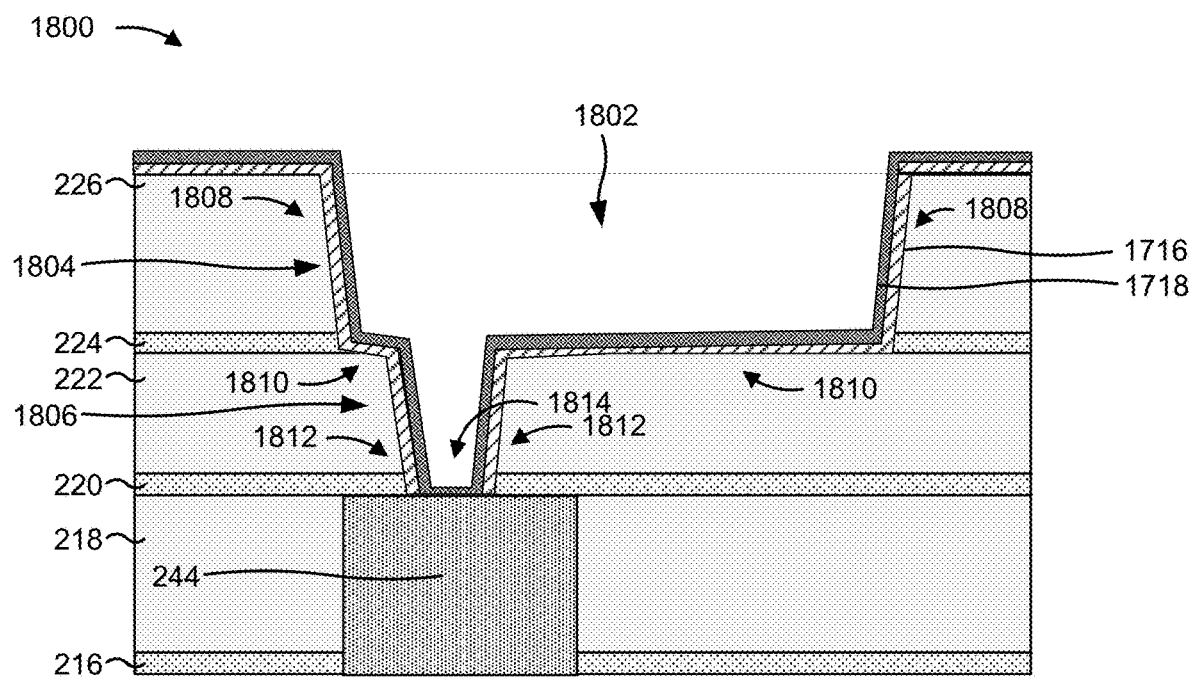
Figure 18F:
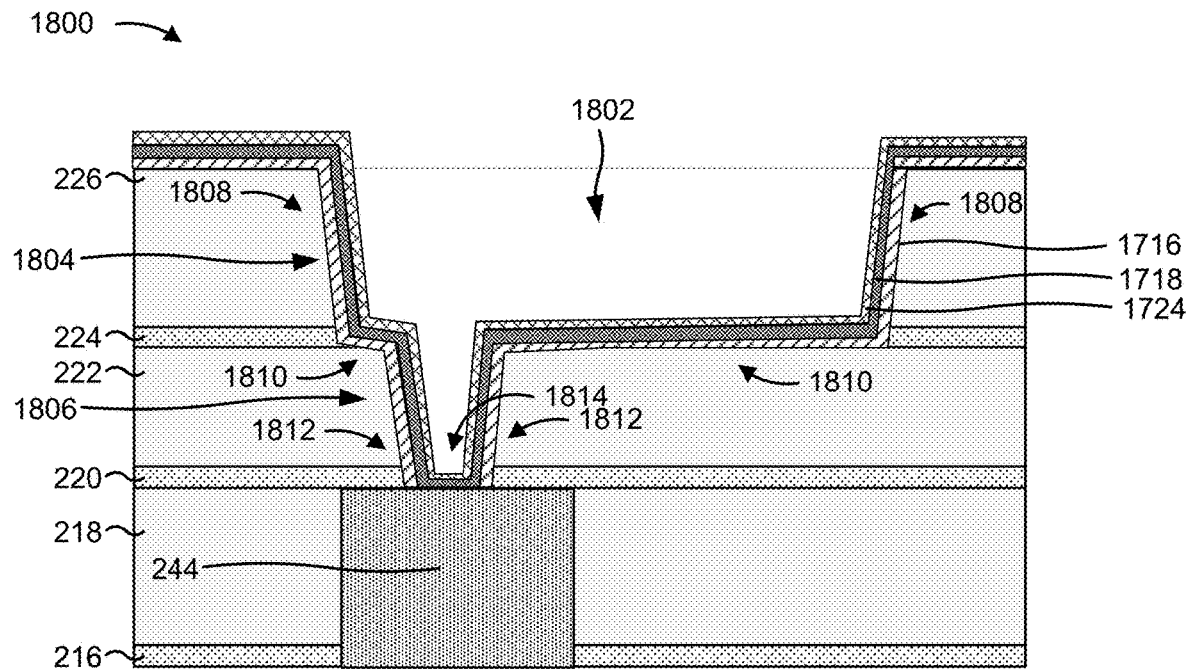
Figure 18G:
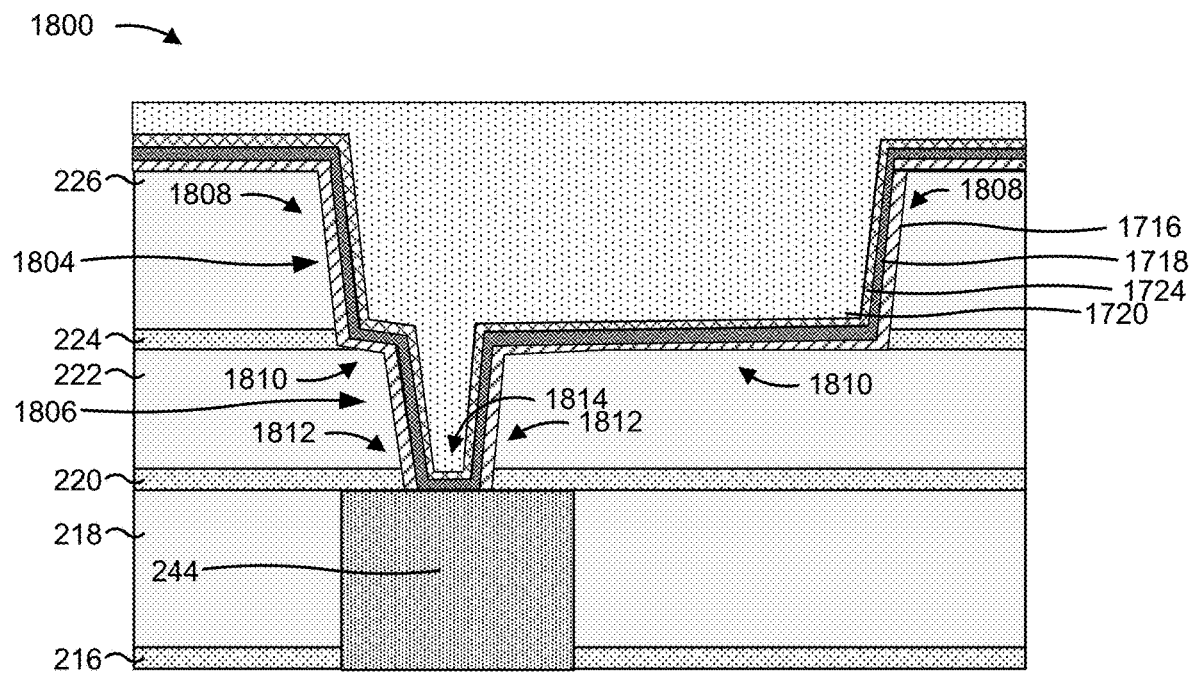
Figure 18H:
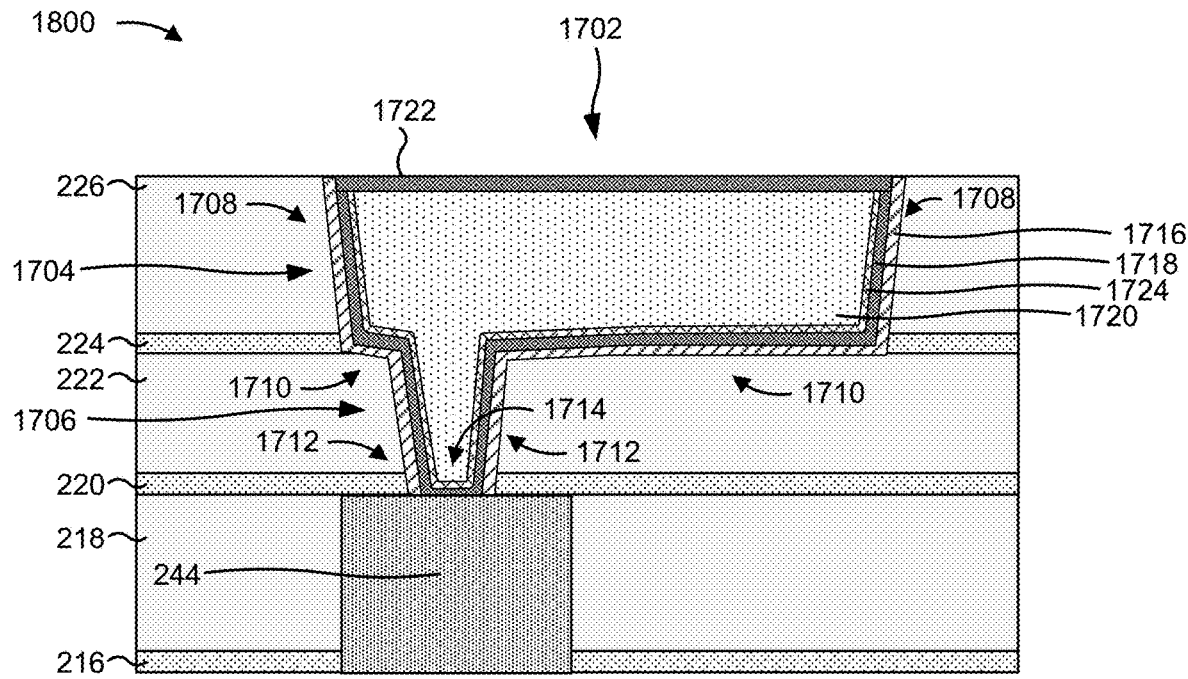

FIG. 17 is a diagram of an example semiconductor structure 1700 described herein. The semiconductor structure 1700 includes a BEOL layer 1702, which may include one or more of the BEOL layers of the device 200 described in connection with FIG. 2. The BEOL layer 1702 includes a similar configuration of layers and/or structures as the BEOL layer 702 of FIG. 7. However, the metal liner layer 1718 includes a cobalt (Co) liner instead of a ruthenium (Ru) liner, and the metal liner layer 1724 includes a ruthenium (Ru) liner instead of a cobalt (Cu) liner.

In some implementations, a thickness of the metal liner layer 1718 is in a range of approximately 5 Å to approximately 15 Å. However, other values for the range are within the scope of the present disclosure. In some implementations, a thickness of the metal liner layer 1724 is in a range of approximately 5 Å to approximately 15 Å. However, other values for the range are within the scope of the present disclosure. In some implementations, a ratio of the thickness of the metal liner layer 1718 to the thickness of the metal liner layer 1724 is in a range of approximately 1:3 to approximately 3:1. However, other values for the range are within the scope of the present disclosure.

As indicated above, FIG. 17 is provided as an example. Other examples may differ from what is described with regard to FIG. 17.

FIGS. 18A-18H are diagrams of an example implementation 1800 described herein. Example implementation 1800 may be an example process for forming the BEOL layer 1702 over a conductive structure (e.g., the conductive structure 244 or another conductive structure) of the device 200. In particular, the example implementation 1800 includes an example process for forming the BEOL layer 1702 such that the metal liner layer 1718 includes cobalt (Co) and the metal liner layer 1724 includes ruthenium (Ru).

As indicated above, FIGS. 18A-18H are provided as an example. Other examples may differ from what is described with regard to FIGS. 18A-18H. For example, the techniques described in connection with FIGS. 18A-18H may be performed to form a single damascene structure for the BEOL layer 1702.

Figure 19:
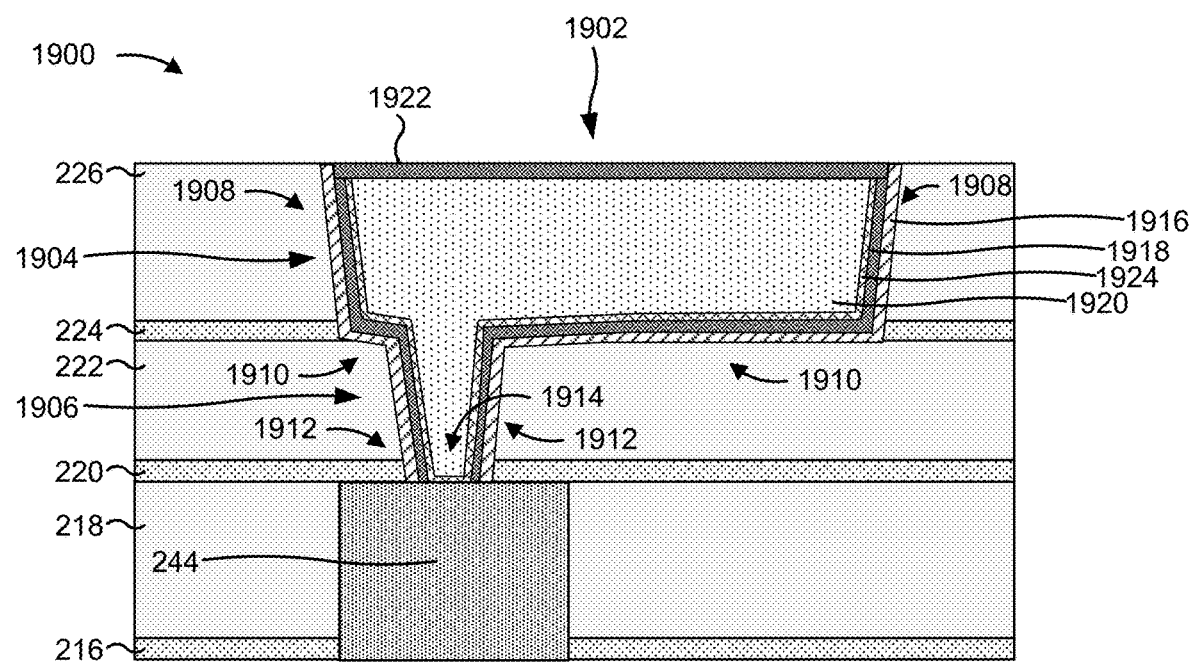
FIG. 19 is a diagram of an example semiconductor structure described herein.

FIG. 19 is a diagram of an example semiconductor structure 1900 described herein. The semiconductor structure 1900 includes a BEOL layer 1902, which may include one or more of the BEOL layers of the device 200 described in connection with FIG. 2. The BEOL layer 1902 includes a similar configuration of layers and/or structures as the BEOL layer 1702 of FIG. 17. However, the metal liner layer 1924 is in direct contact (e.g., is electrically coupled directly) with the conductive structure 244, and the conductive structure 1920 is electrically coupled with the conductive structure 244 through the metal liner layer 1924. As described in connection with FIGS. 20A-20H, this occurs as a result of a blocking layer remaining over the top surface of the conductive structure 244 during formation of the metal liner layer 1918. This results in the metal liner layer 1918 being substantially absent from and/or omitted from the top surface of the conductive structure 244. This further reduces contact resistance for the BEOL layer 1902.

In some implementations, the thickness of the metal liner layer 1918 at the bottom surface 1914 of the BEOL layer 1902 (e.g., on the top surface of the conductive structure 244) is in a range of approximately 1 Å to approximately 3 Å. However, other values for the range are within the scope of the present disclosure. In some implementations, a ratio of the thickness of the metal liner layer 1918 at the bottom surface 1914 of the BEOL layer 1902 (e.g., over the top surface of the conductive structure 244) to the thickness of the barrier layer 1916 at the bottom surface 1914 of the BEOL layer 1902 (e.g., over the top surface of the conductive structure 244) is in a range of approximately 1:3 to approximately 3:1. However, other values for the range are within the scope of the present disclosure. In some implementations, a ratio of the thickness of the metal liner layer 1918 at the bottom surface 1914 of the BEOL layer 1902 (e.g., over the top surface of the conductive structure 244) to the thickness of the metal liner layer 1924 at the bottom surface 1914 of the BEOL layer 1902 (e.g., over the top surface of the conductive structure 244) is in a range of approximately 1:15 to approximately 5:3. However, other values for the range are within the scope of the present disclosure.

As indicated above, FIG. 19 is provided as an example. Other examples may differ from what is described with regard to FIG. 19.

FIGS. 20A-20H are diagrams of an example implementation 2000 described herein. Example implementation 2000 may be an example process for forming the BEOL layer 1902 over a conductive structure (e.g., the conductive structure 244 or another conductive structure) of the device 200. In particular, the example implementation 2000 includes an example process for forming the BEOL layer 1902 such that the metal liner layer 1924 is between the metal liner layer 1918 and the conductive structure 1920. Moreover, the example implementation 2000 includes an example process for forming the BEOL layer 1902 such that the metal liner layer 1918 is substantially absent and/or omitted from the top surface of the conductive structure 244, such that the metal liner layer 1924 is electrically coupled directly with the top surface of the conductive structure 244, and such that the conductive structure 1920 is electrically coupled with the conductive structure 244 through the metal liner layer 1924.

Figure 20A:
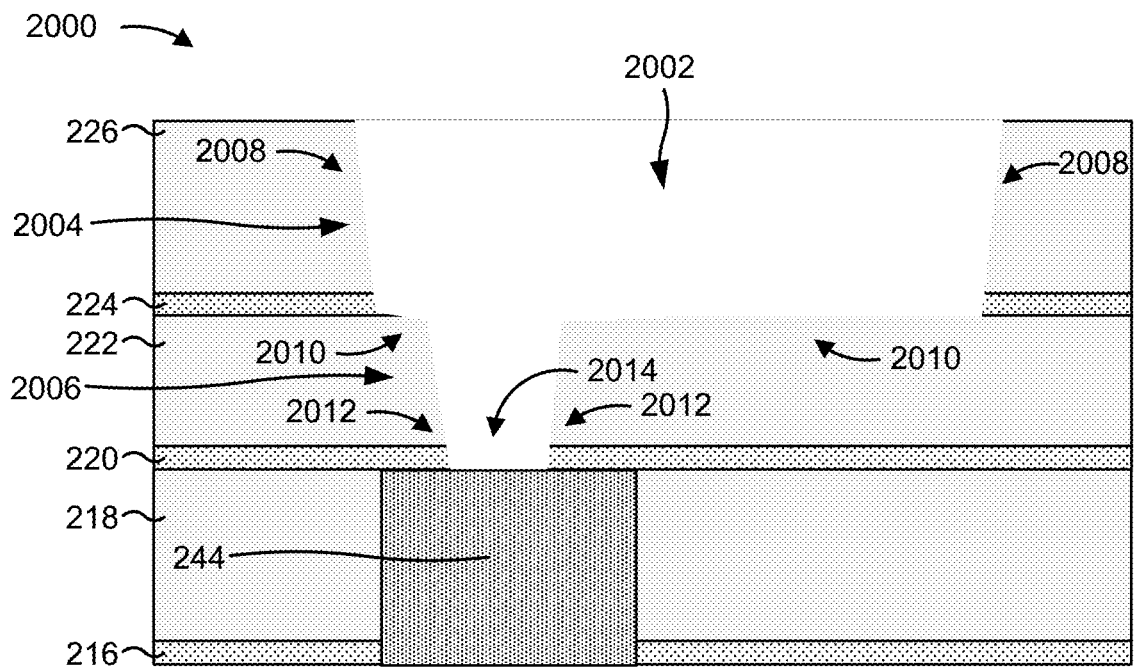
FIGS. 20A-20H are diagrams of an example implementation described herein.
Figure 20B:
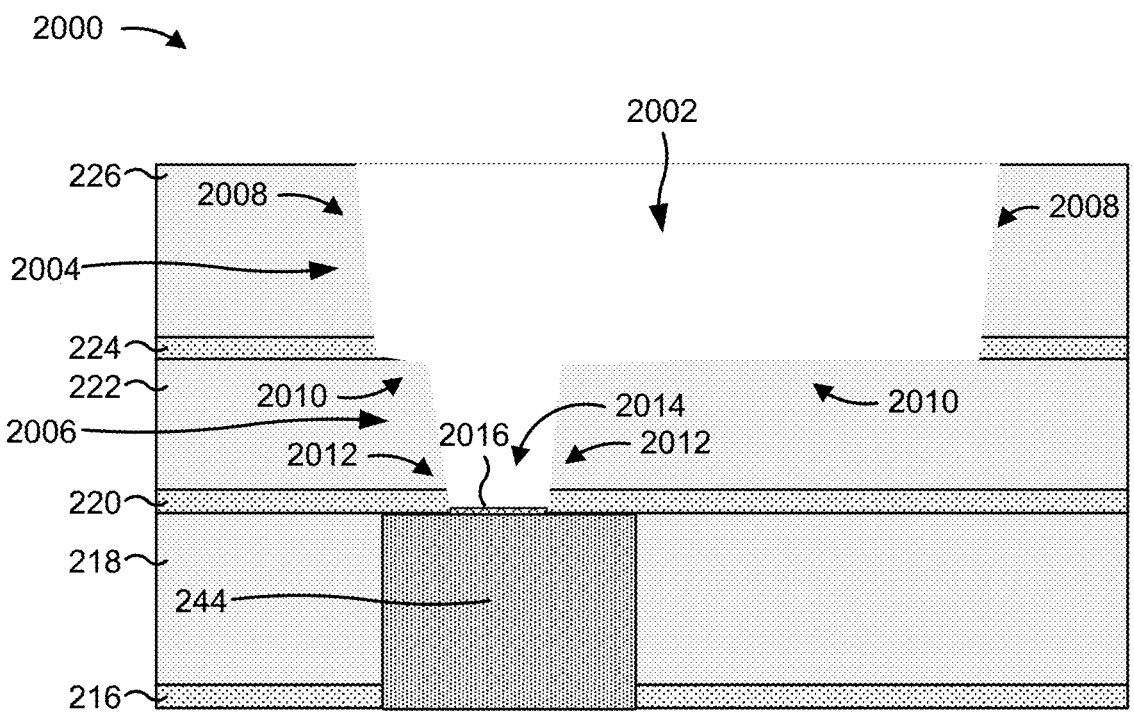
Figure 20C:
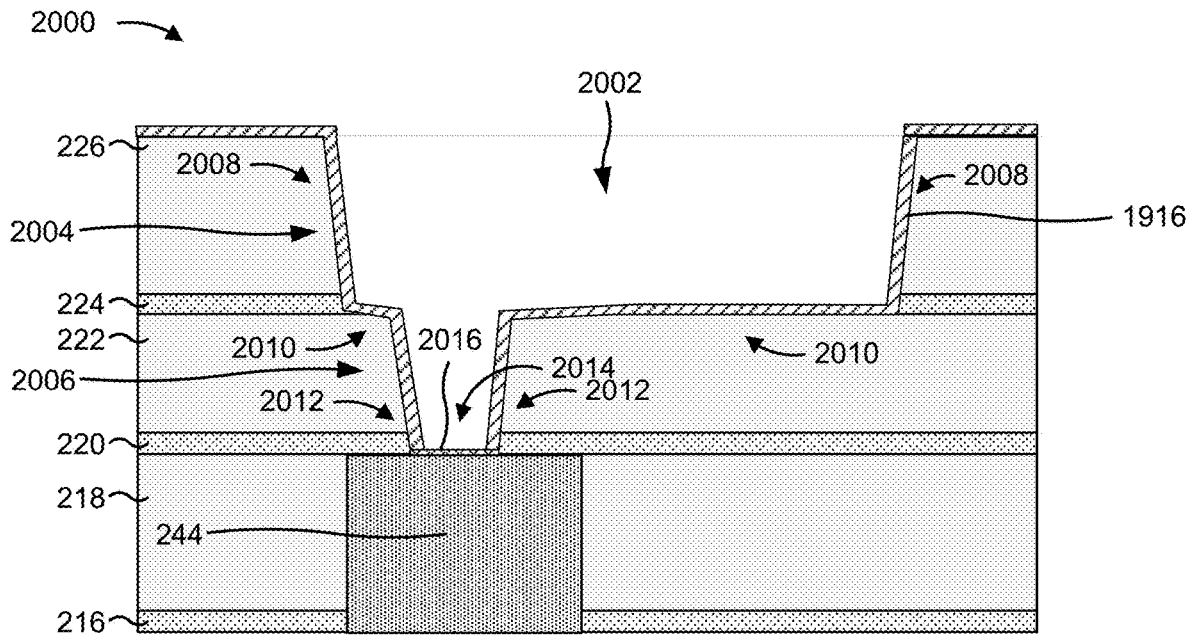
Figure 20D:
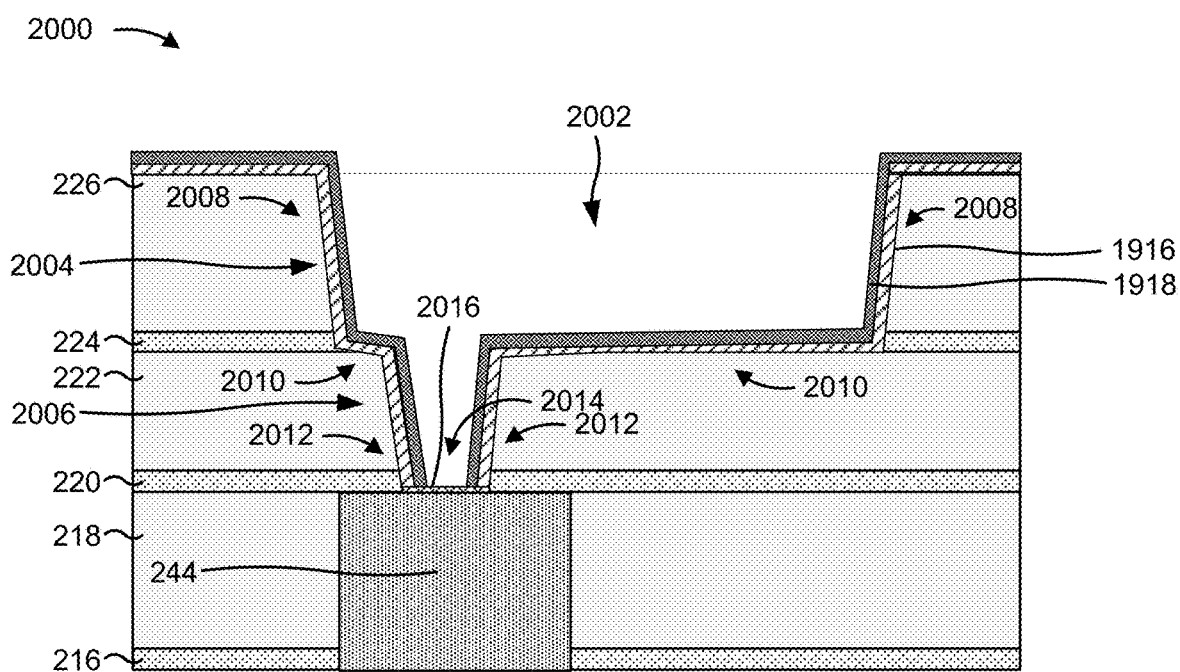
Figure 20E:
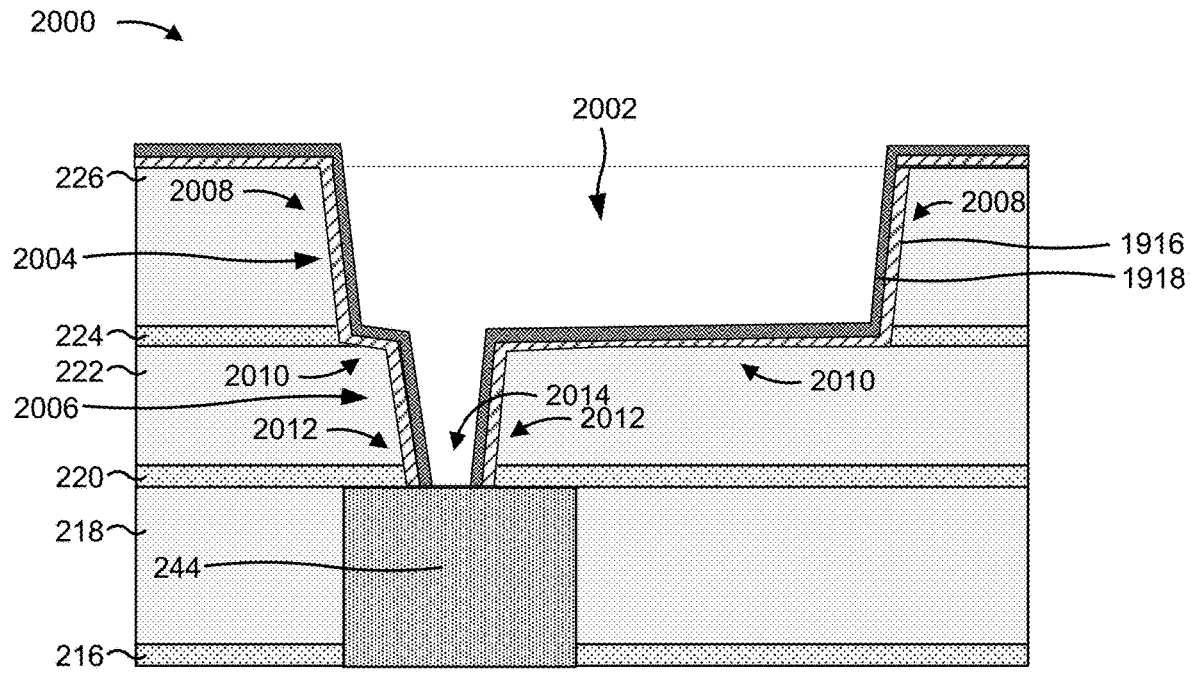
Figure 20F:
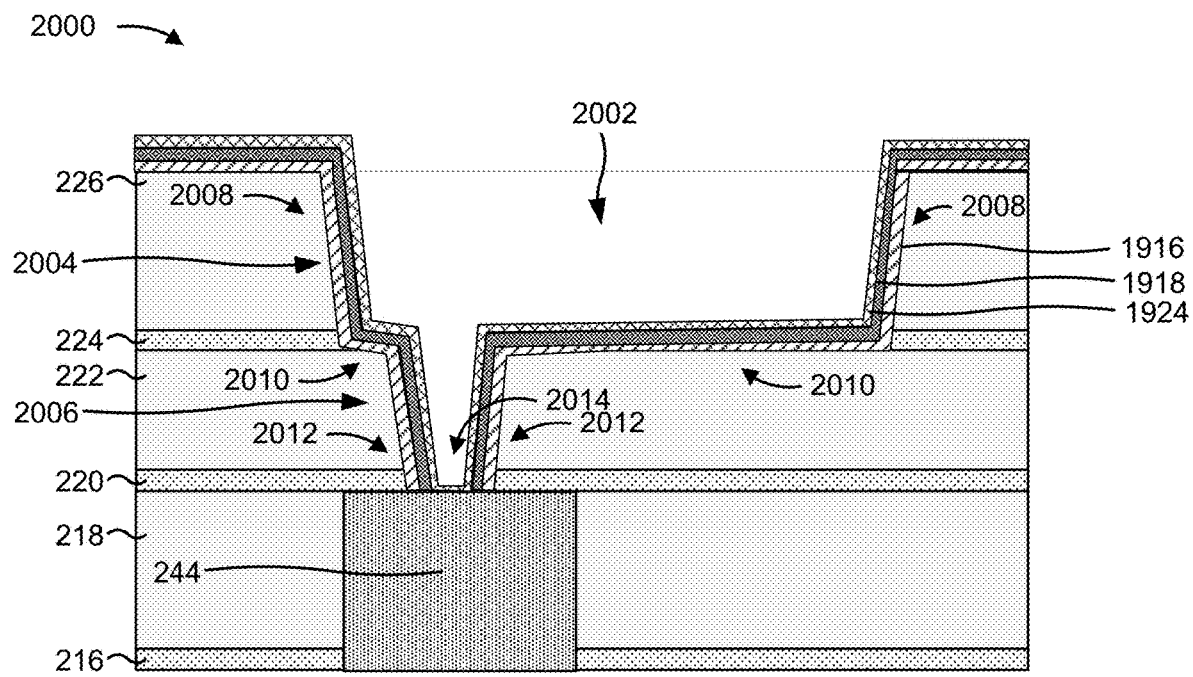
Figure 20G:
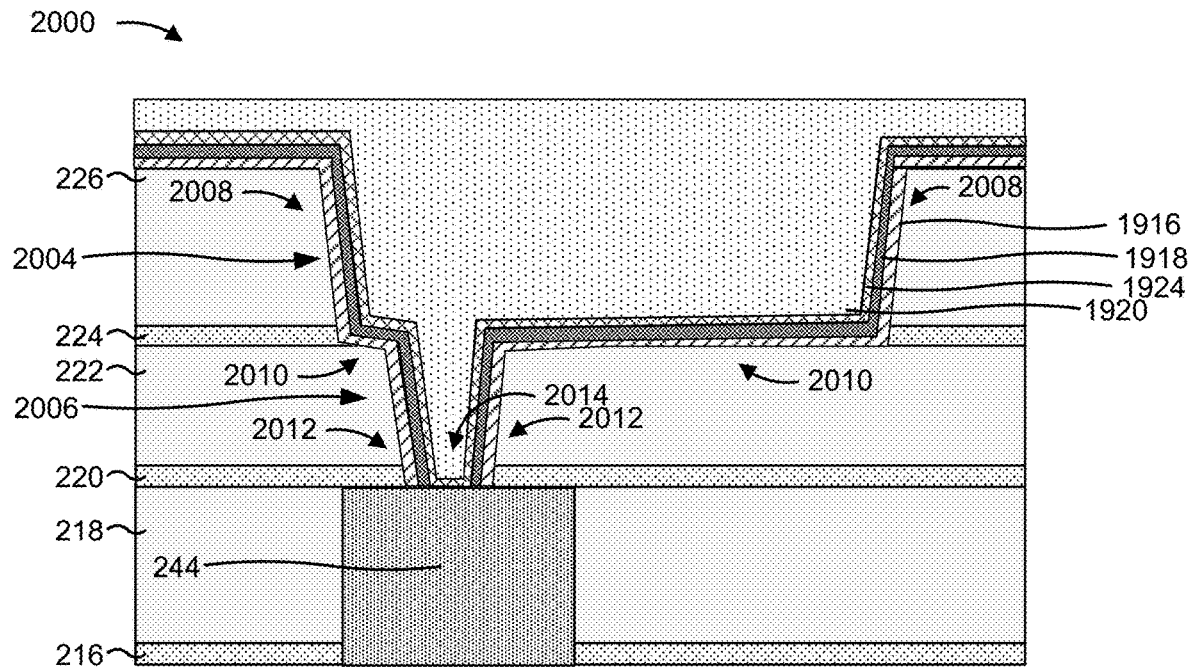
Figure 20H:
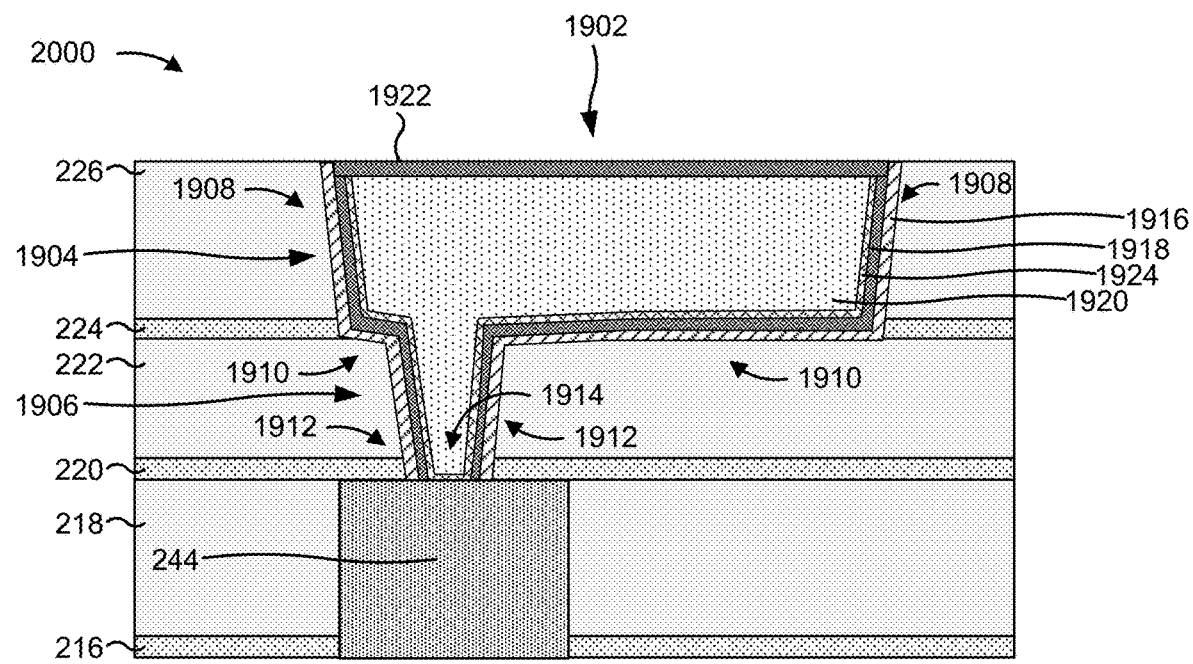

As shown in FIGS. 20A-20H, the example process of the example implementation 2000 mostly follows the example process of the example implementation 1800. Accordingly, similar process details are not reiterated for purposes of brevity. As shown in FIG. 20D, however, the example process of the example implementation 2000 differs from the example process of the example implementation 1800 in that the metal liner layer 1918 is formed over and/or on the barrier layer 1916 prior to removal of the blocking layer 2016. This results in the metal liner layer 1918 being substantially absent and/or omitted from the bottom surface 2014 of the opening 2002 (e.g., from the top surface of the conductive structure 244). As shown in FIG. 20E, the blocking layer 2016 is then removed. As shown in FIG. 20F, the metal liner layer 1924 is formed over and/or on the metal liner layer 1918 after removal of the blocking layer 2016. This results in the metal liner layer 1924 being formed on the bottom surface 2014 of the opening 2002 (e.g., on the top surface of the conductive structure 244). As shown in FIG. 20G, the conductive structure 1920 is then formed over and/or on the metal liner layer 1924.

As indicated above, FIGS. 20A-20H are provided as an example. Other examples may differ from what is described with regard to FIGS. 20A-20H. For example, the techniques described in connection with FIGS. 20A-20H may be performed to form a single damascene structure for the BEOL layer 1902.

Figure 21:
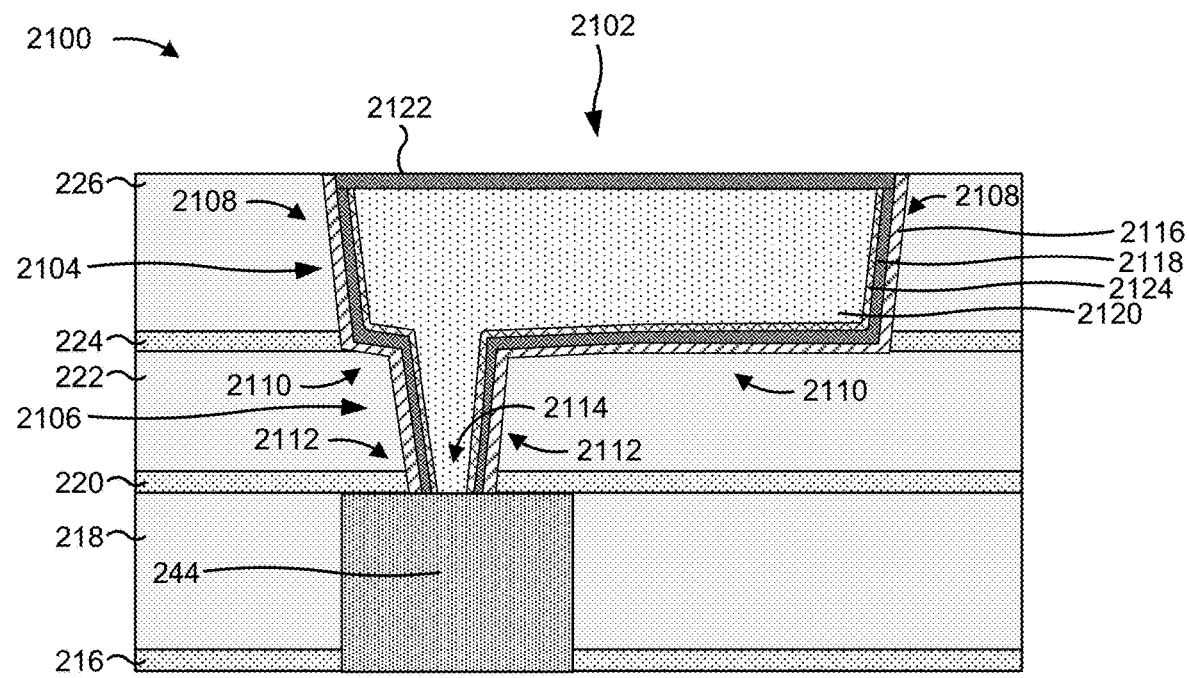
FIG. 21 is a diagram of an example semiconductor structure described herein.

FIG. 21 is a diagram of an example semiconductor structure 2100 described herein. The semiconductor structure 2100 includes a BEOL layer 2102, which may include one or more of the BEOL layers of the device 200 described in connection with FIG. 2. The BEOL layer 2102 includes a similar configuration of layers and/or structures as the BEOL layer 1902 of FIG. 19. However, the conductive structure 2120 is in direct contact (e.g., is electrically coupled directly) with the conductive structure 244 as opposed to the conductive structure 1920 being electrically coupled with the conductive structure 244 through the metal liner layer 1924. As described in connection with FIGS. 22A-22H, this occurs as a result of a blocking layer remaining over the top surface of the conductive structure 244 during formation of the metal liner layers 2118 and 2124. This results in the metal liner layers 2118 and 2124 being substantially absent and/or omitted from the top surface of the conductive structure 244. This further reduces contact resistance for the BEOL layer 2102.

In some implementations, the thickness of the metal liner layer 2124 at the bottom surface 2114 of the BEOL layer 2102 (e.g., on the top surface of the conductive structure 244) is in a range of approximately 1 Å to approximately 3 Å. However, other values for the range are within the scope of the present disclosure. In some implementations, a ratio of the thickness of the metal liner layer 2118 at the bottom surface 2114 of the BEOL layer 2102 (e.g., over the top surface of the conductive structure 244) to the thickness of the metal liner layer 2124 at the bottom surface 2114 of the BEOL layer 2102 (e.g., over the top surface of the conductive structure 244) is in a range of approximately 1:3 to approximately 3:1. However, other values for the range are within the scope of the present disclosure.

As indicated above, FIG. 21 is provided as an example. Other examples may differ from what is described with regard to FIG. 21.

FIGS. 22A-22H are diagrams of an example implementation 2200 described herein. Example implementation 2200 may be an example process for forming the BEOL layer 2102 over a conductive structure (e.g., the conductive structure 244 or another conductive structure) of the device 200. In particular, the example implementation 2200 includes an example process for forming the BEOL layer 2102 such that the metal liner layer 2124 is substantially absent and/or omitted from the top surface of the conductive structure 244, and such that the conductive structure 2120 is electrically coupled directly with the top surface of the conductive structure 244.

Figure 22A:
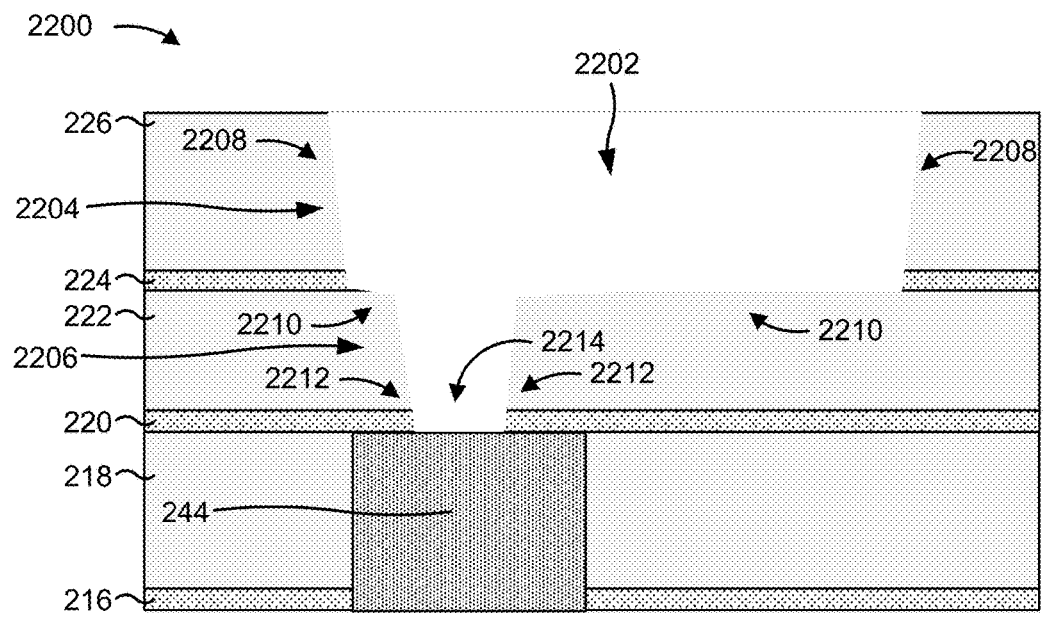
FIGS. 22A-22H are diagrams of an example implementation described herein.
Figure 22B:
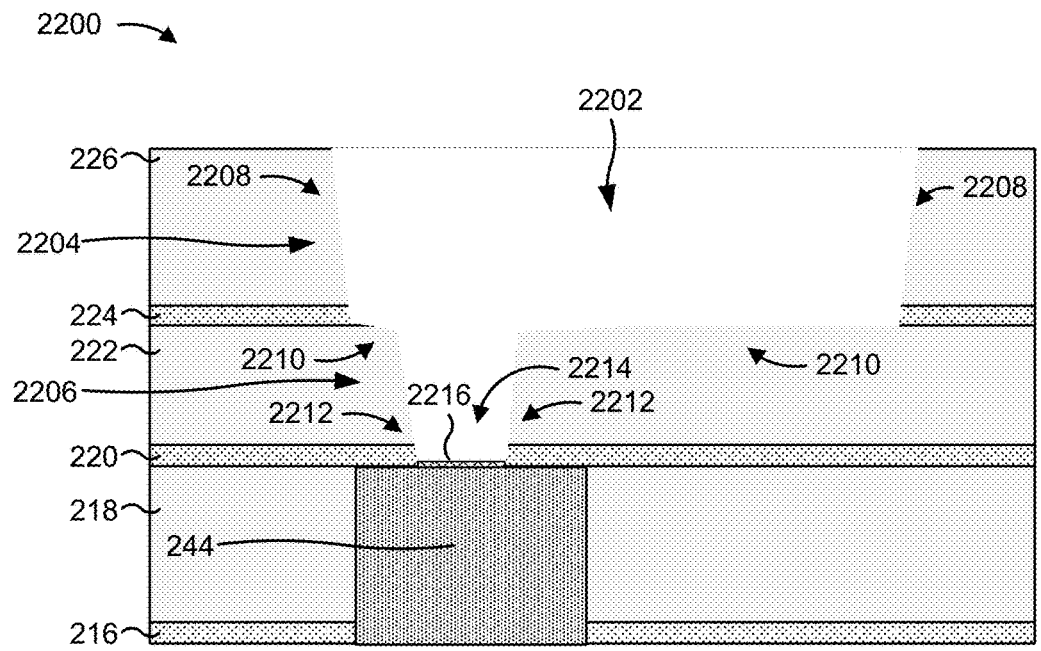
Figure 22C:
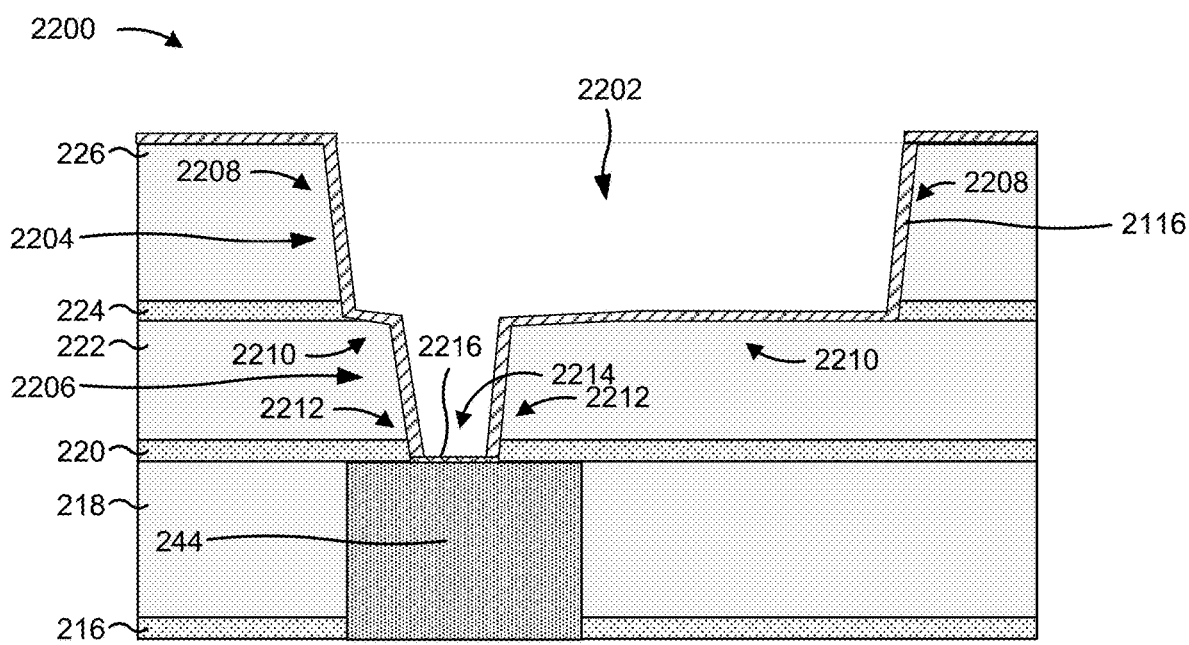
Figure 22D:
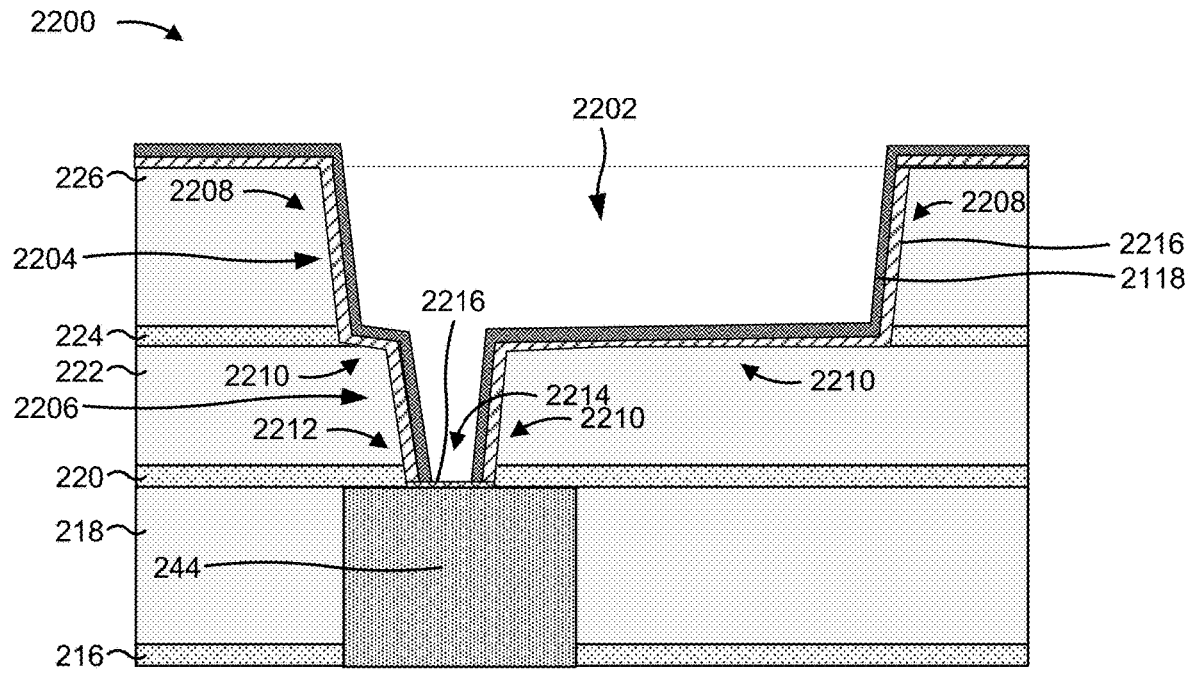
Figure 22E:
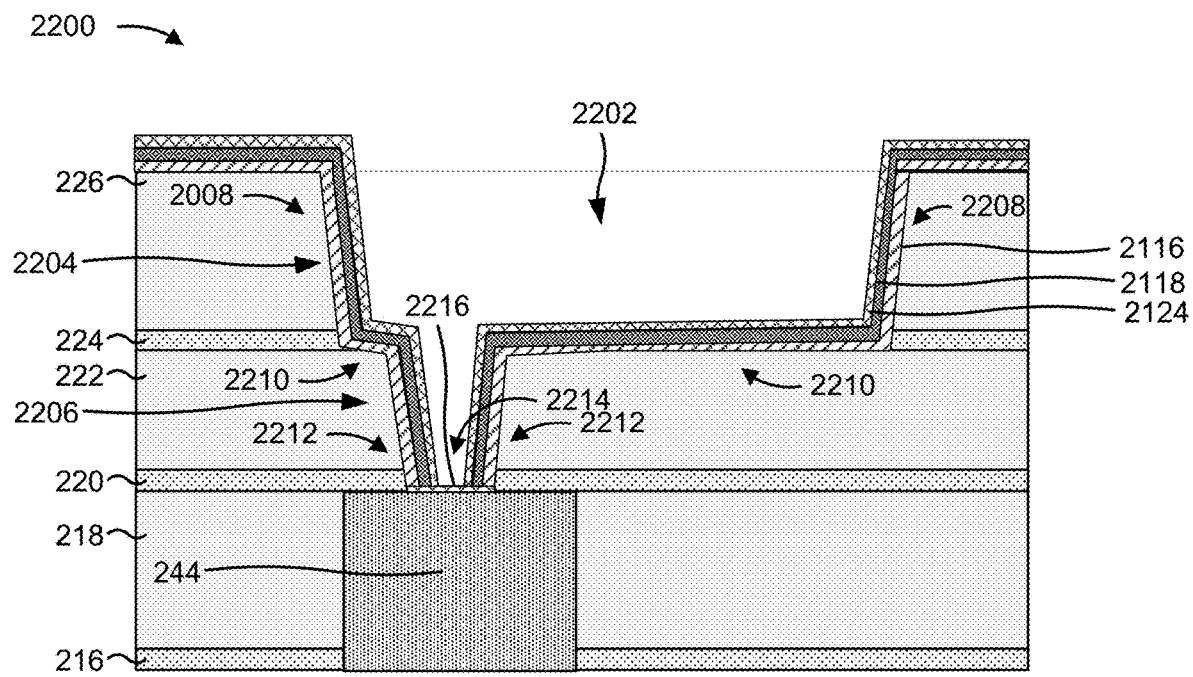
Figure 22F:
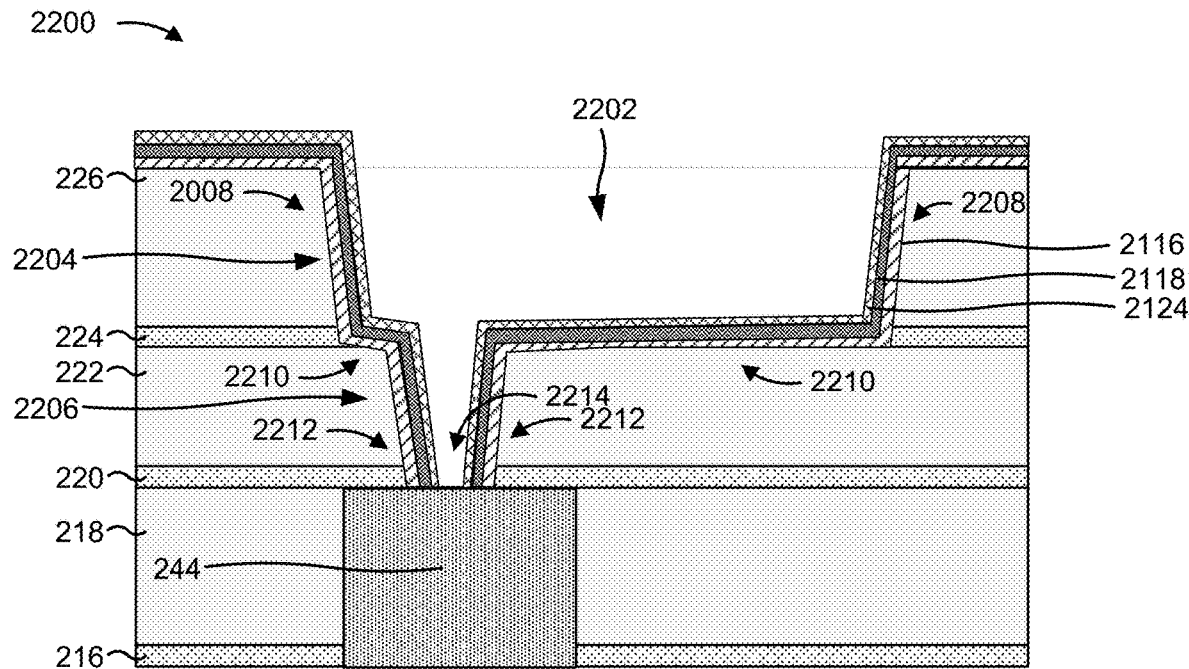
Figure 22G:
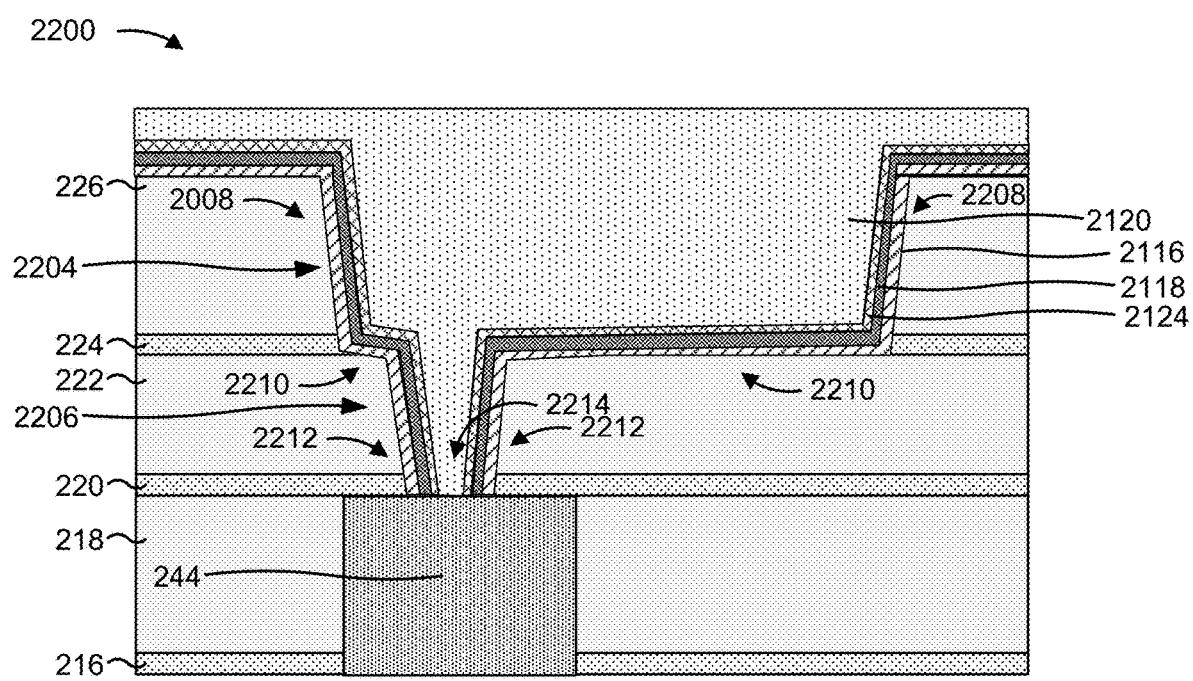
Figure 22H:
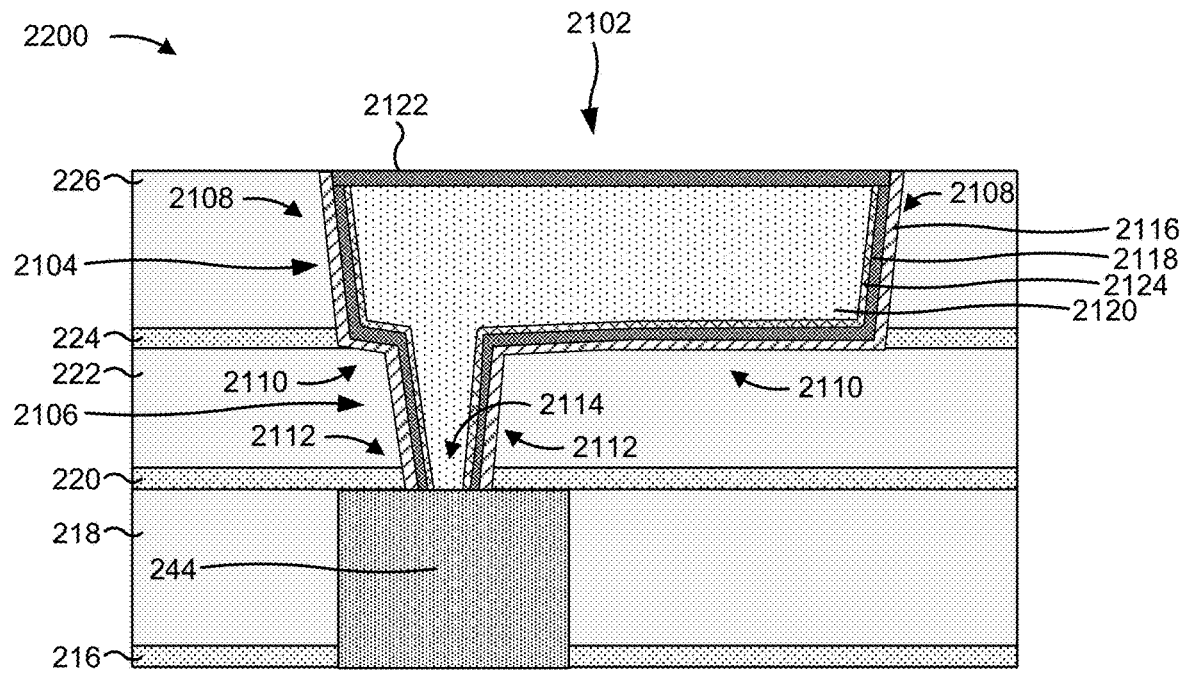

As shown in FIGS. 22A-22H, the example process of the example implementation 2200 mostly follows the example process of the example implementation 2000. Accordingly, similar process details are not reiterated for purposes of brevity. As shown in FIG. 22E, however, the example process of the example implementation 2200 differs from the example process of the example implementation 2000 in that the metal liner layer 2124 is formed over and/or on the metal liner layer 2118 prior to removal of the blocking layer 2216. This results in the metal liner layer 2124 being substantially absent and/or omitted from the bottom surface 2214 of the opening 2202 (e.g., from the top surface of the conductive structure 244). As shown in FIG. 22F, the blocking layer 2216 is then removed. As shown in FIG. 22G, the conductive structure 2120 is then formed over and/or on the metal liner layer 2124, and such that the conductive structure 2120 is electrically coupled directly with the top surface of the conductive structure 244.

As indicated above, FIGS. 22A-22H are provided as an example. Other examples may differ from what is described with regard to FIGS. 22A-22H. For example, the techniques described in connection with FIGS. 22A-22H may be performed to form a single damascene structure for the BEOL layer 2102.

Figure 23:
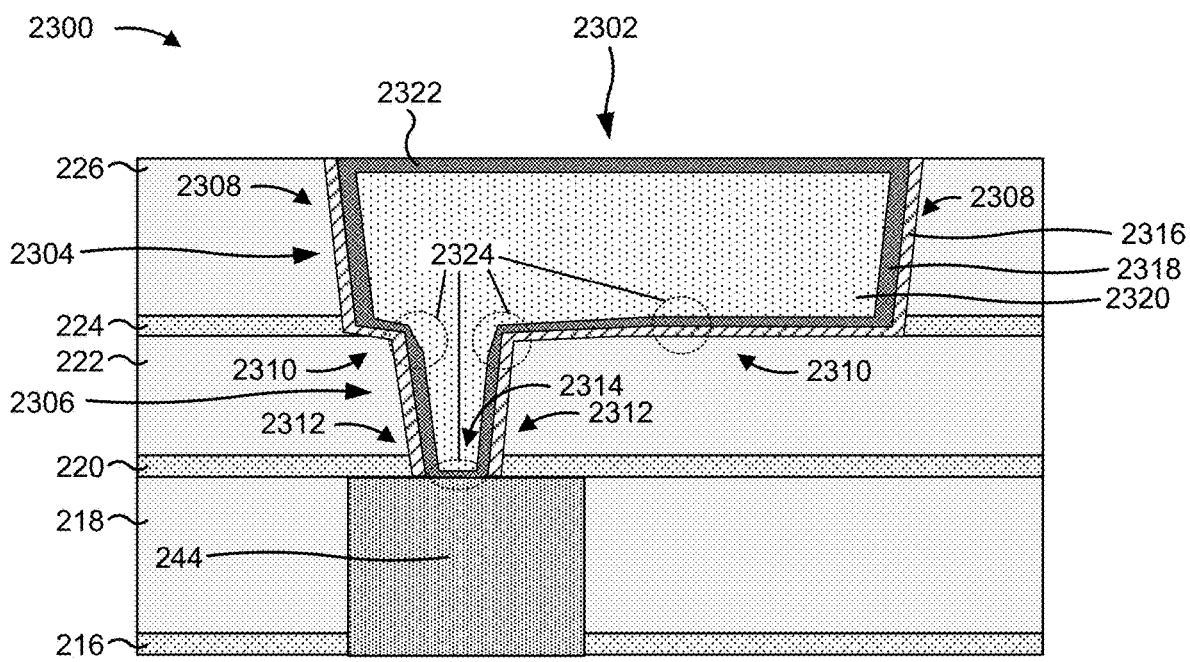
FIG. 23 is a diagram of an example semiconductor structure described herein.

FIG. 23 is a diagram of an example semiconductor structure 2300 described herein. The semiconductor structure 2300 includes a BEOL layer 2302, which may include one or more of the BEOL layers of the device 200 described in connection with FIG. 2. The BEOL layer 2302 includes a similar configuration of layers and/or structures as the BEOL layer 302 of FIG. 3. However, the metal liner layer 2318 is trimmed prior to forming the conductive structure 2320 to reduce the thickness of the metal liner layer 2318. As described in connection with FIGS. 24A-24C, the metal liner layer 2318 is trimmed such that the thickness of portions 2324 of the metal liner layer 2318 over the bottom surfaces 2310 and 2314, and at transitions between the bottom surface 2310 and the sidewalls 2312, are reduced. The reduced thickness reduces contact resistance of the BEOL layer 2302 (which increases the performance of the BEOL layer 2302) and provides increased area or volume for forming the conductive structure 2320 (which increases the gap filling performance for the conductive structure 2320).

A thickness of the metal liner layer 2318 over the sidewalls 2308 and 2312 is in a range of approximately 15 Å to approximately 35 Å to provide sufficiently low contact resistance and sheet resistance while providing sufficient area for the conductive structure 2320. However, other values for the range are within the scope of the present disclosure. A thickness of the metal liner layer 2318 in the portions 2324 of the metal liner layer 2318 over the bottom surfaces 2310 and 2314, and at transitions between the bottom surface 2310 and the sidewalls 2312, is in a range of approximately 30% to approximately 80% of the thickness of the metal liner layer 2318 over the sidewalls 2308 and 2312 to provide sufficiently low contact resistance and sheet resistance while providing sufficient area for the conductive structure 2320. However, other values for the range are within the scope of the present disclosure.

As indicated above, FIG. 23 is provided as an example. Other examples may differ from what is described with regard to FIG. 23.

Figure 24A:
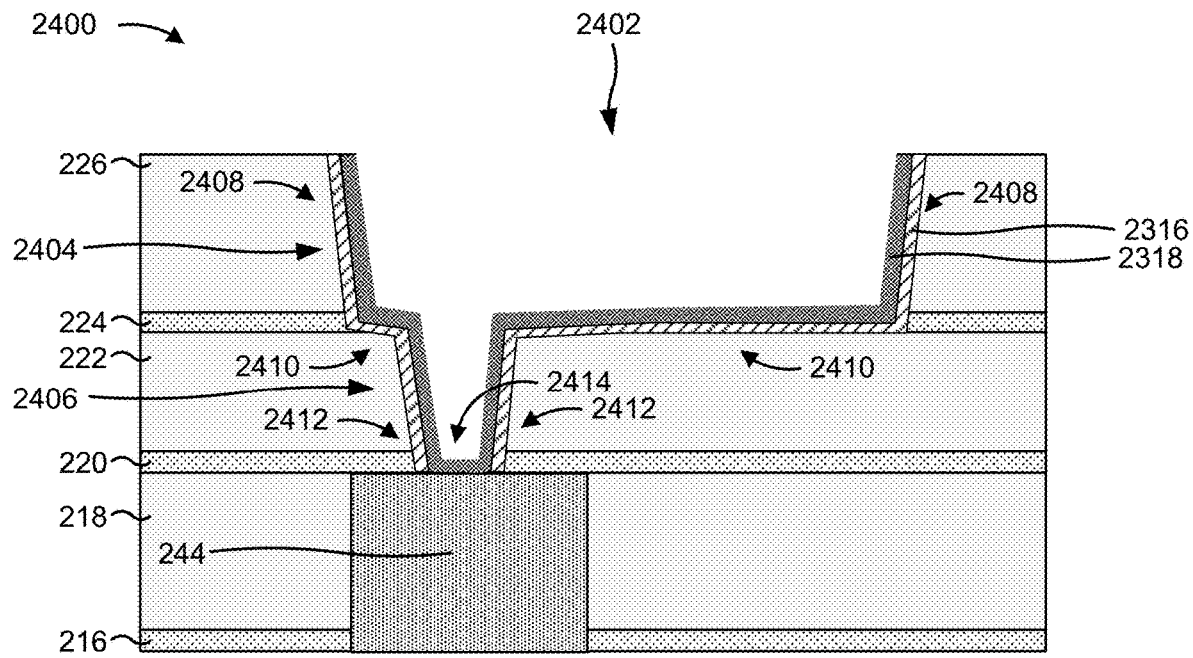
FIGS. 24A-24C are diagrams of an example implementation described herein.
Figure 24B:
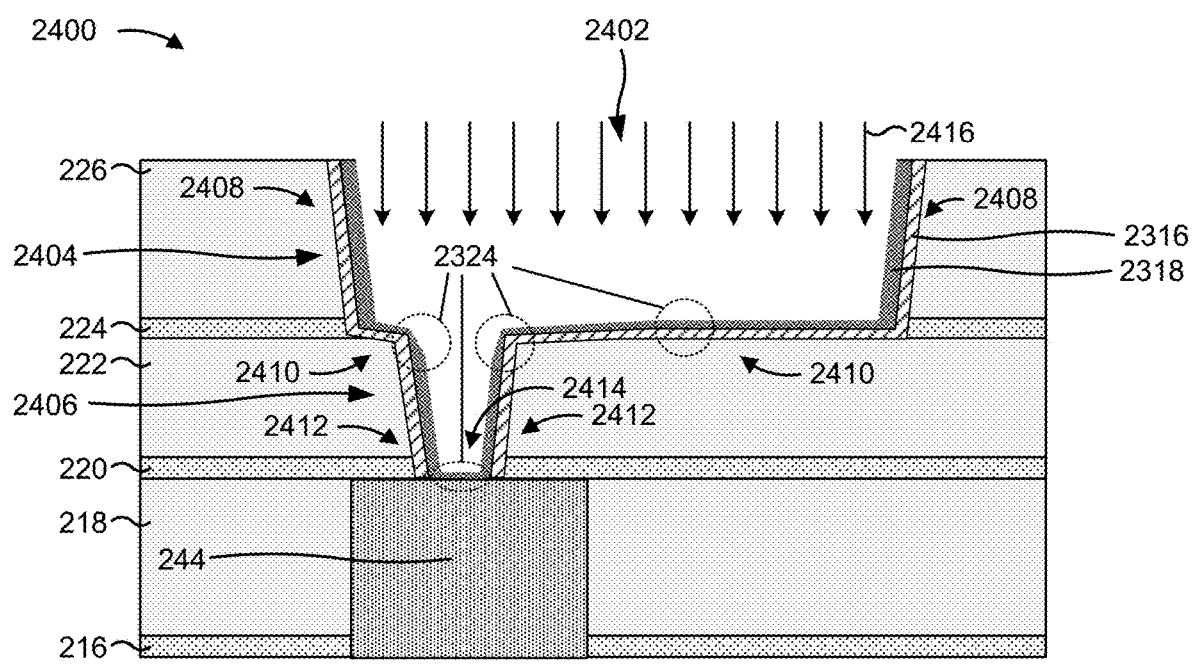
Figure 24C:
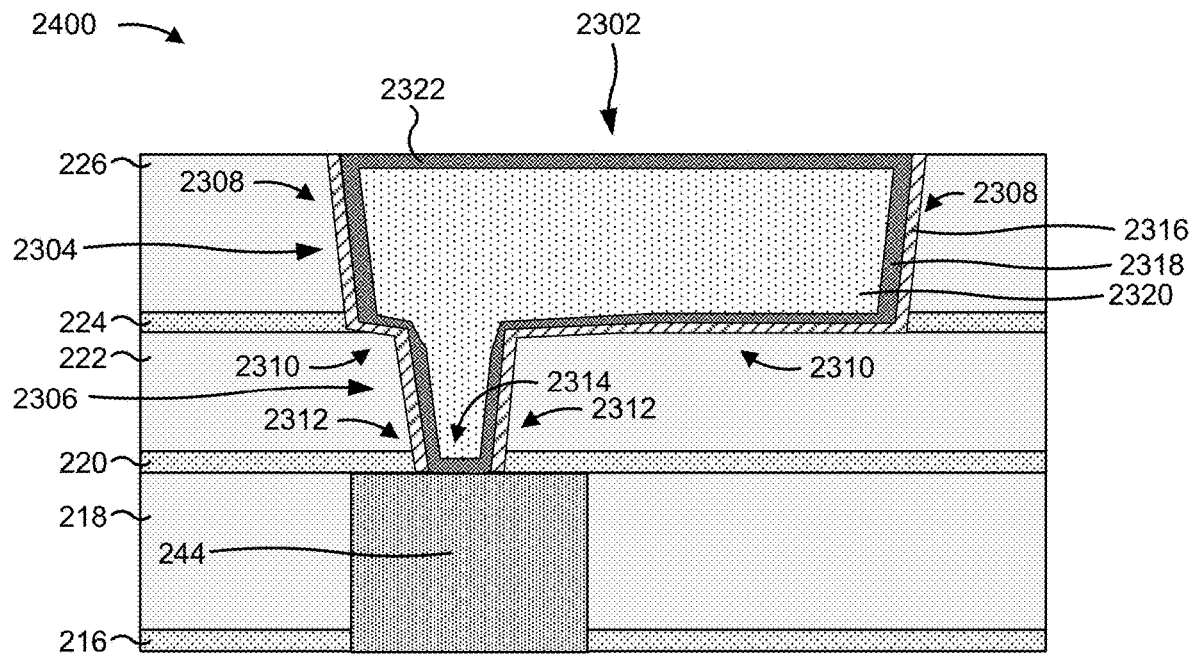

FIGS. 24A-24C are diagrams of an example implementation 2400 described herein. Example implementation 2400 may be an example process for forming the BEOL layer 2302 over a conductive structure (e.g., the conductive structure 244 or another conductive structure) of the device 200. In particular, the example implementation 2400 includes an example process for trimming the metal liner layer 2318 in connection with forming the BEOL layer 2302.

The example process of the example implementation 2400 mostly follows the example process of the example implementation 400. Accordingly, similar process details are not reiterated for purposes of brevity. As shown in FIG. 24B, however, the example process of the example implementation 2400 differs from the example process of the example implementation 400 in that the plasma tool 116 performs a trimming operation after formation of the metal liner layer 2318 and prior to formation of the conductive structure 2320. The trimming operation is performed to reduce the thickness of the portions 2324 of the metal liner layer 2318 over the bottom surfaces 2410 and 2414 of the opening 2402, and at the transitions between the bottom surface 2410 and sidewalls 2412 of the opening 2404.

The trimming operation includes the use of a plasma, such as argon (Ar) plasma, a neon (Ne) plasma, and/or another type of plasma. Ions in the plasma are used to bombard the metal liner layer 2318 to sputter etch material from the metal liner layer 2318. The ions in the plasma bombard the metal liner layer 2318 in a highly directional (e.g., vertical and anisotropic) manner such that the portions 2324 of the metal liner layer 2318 over the bottom surfaces 2410 and 2414, and at the transitions between the bottom surface 2410 and sidewalls 2412, experience a greater etch rate relative to the portions of the metal liner layer 2318 over the sidewalls 2408 and 2412. The difference in etch rate results in thinning (e.g., a reduction in thickness) of the metal liner layer 2318 in the portions 2324. In some implementations, the thickness of the portions 2324 of the metal liner layer 2318 is reduced by approximately 3 Å to approximately 10 Å to provide sufficiently low contact resistance and sheet resistance while providing sufficient area for the conductive structure 2320. However, other values for the range are within the scope of the present disclosure.

Additionally and/or alternatively, the plasma tool 116 may use copper (Cu) ions to sputter etch the metal liner layer 2318 prior to and/or during the operation to form the conductive structure 2320. The plasma tool 116 may control the copper ions during the Cu PVD process.

As indicated above, FIGS. 24A-24C are provided as an example. Other examples may differ from what is described with regard to FIGS. 24A-24C. For example, the techniques described in connection with FIGS. 24A-24C may be performed to form a single damascene structure for the BEOL layer 2302. As another example, the techniques described in connection with FIG. 24A-24C may be performed in implementations in which the metal liner layer 2318 includes a ruthenium (Ru) liner (similar to the BEOL layer 1302 of the semiconductor structure 1300 in FIG. 13) instead of a cobalt (Co) liner.

Figure 25:
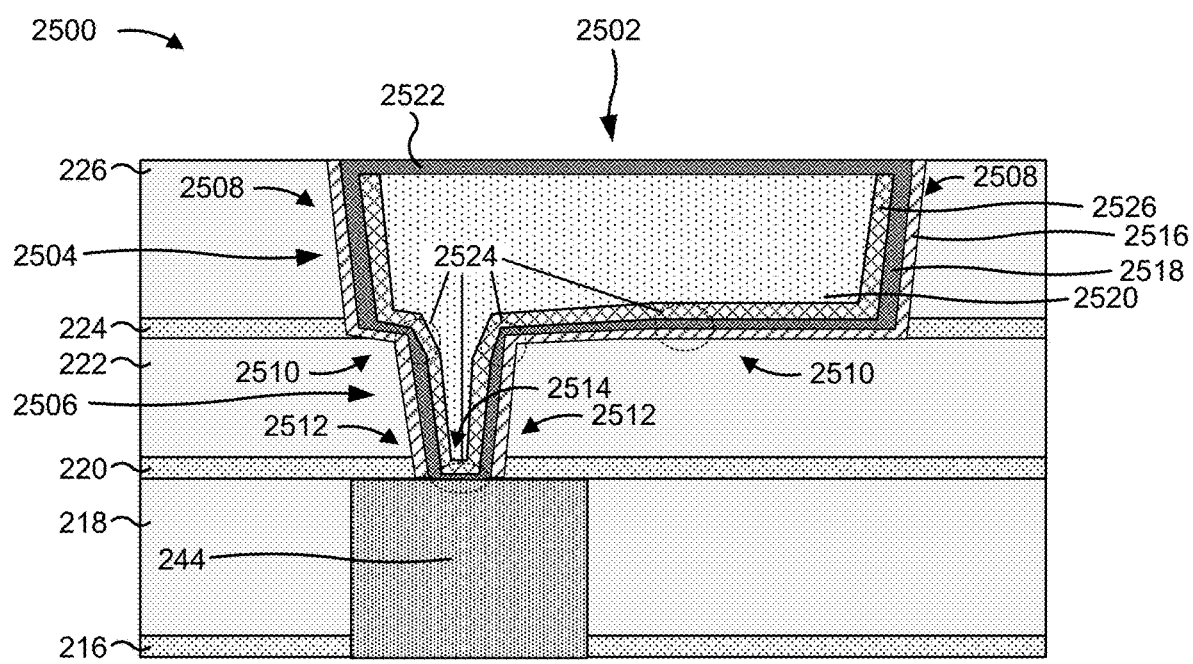
FIG. 25 is a diagram of an example semiconductor structure described herein.

FIG. 25 is a diagram of an example semiconductor structure 2500 described herein. The semiconductor structure 2500 includes a BEOL layer 2502, which may include one or more of the BEOL layers of the device 200 described in connection with FIG. 2. The BEOL layer 2502 includes a similar configuration of layers and/or structures as the BEOL layer 2302 of FIG. 23. However, another metal liner layer 2526 is formed on the metal liner layer 2518 after the metal liner layer 2518 is trimmed and prior to forming the conductive structure 2520. In this way, the metal liner layer 2526 conforms to the shape of the metal liner layer 2518 resulting from the trimming operation.

In the example shown in FIG. 25, the metal liner layer 2518 includes a cobalt (Co) liner and the metal liner layer 2526 includes a ruthenium (Ru) liner, similar to the semiconductor structure 1700 of FIG. 17. However, in other implementations, the metal liner layer 2518 may include a ruthenium (Ru) liner and the metal liner layer 2526 may include a cobalt (Co) liner, similar to the semiconductor structure 700 of FIG. 7. In these implementations, the ruthenium liner is trimmed prior to formation of the cobalt liner.

As indicated above, FIG. 25 is provided as an example. Other examples may differ from what is described with regard to FIG. 25.

FIGS. 26A-26D are diagrams of an example implementation 2600 described herein. Example implementation 2600 may be an example process for forming the BEOL layer 2502 over a conductive structure (e.g., the conductive structure 244 or another conductive structure) of the device 200. In particular, the example implementation 2600 includes an example process for trimming the metal liner layer 2518 and forming the metal liner layer 2526 prior to formation of the conductive structure 2520.

Figure 26A:
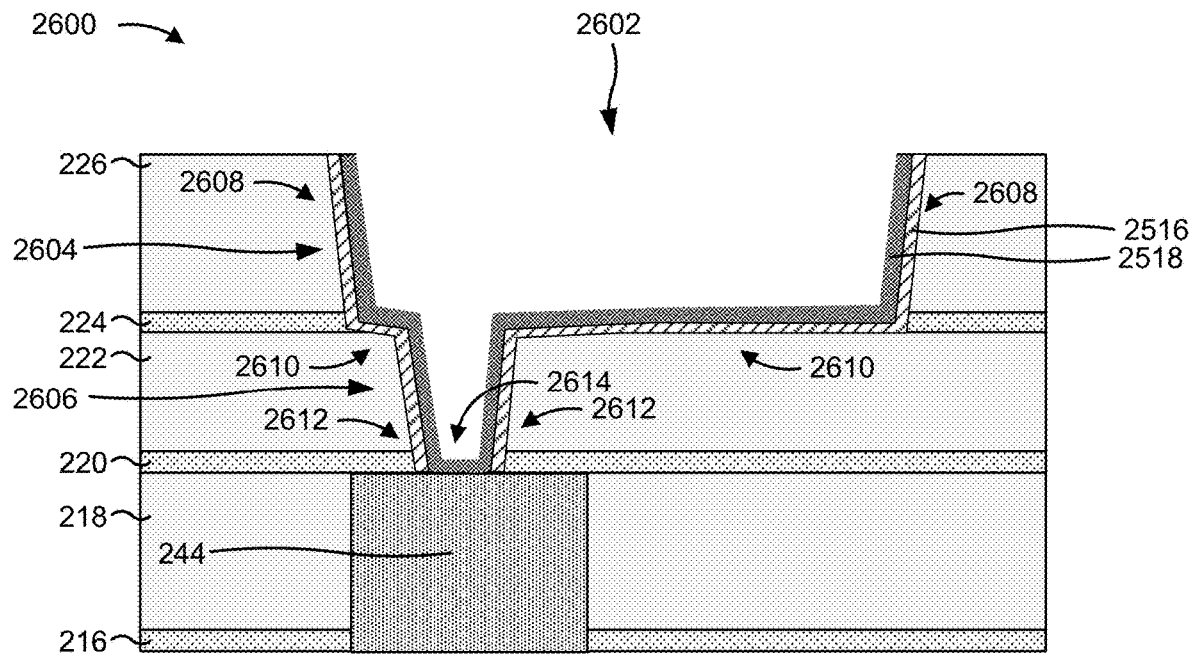
FIGS. 26A-26D are diagrams of an example implementation described herein.
Figure 26B:
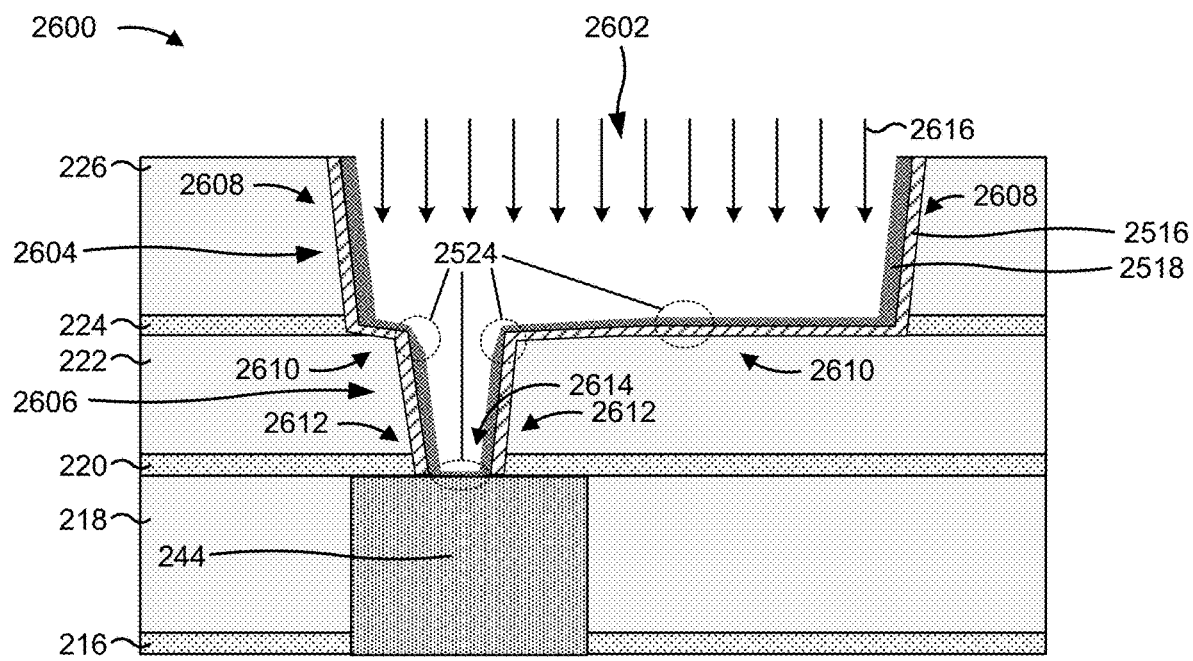
Figure 26C:
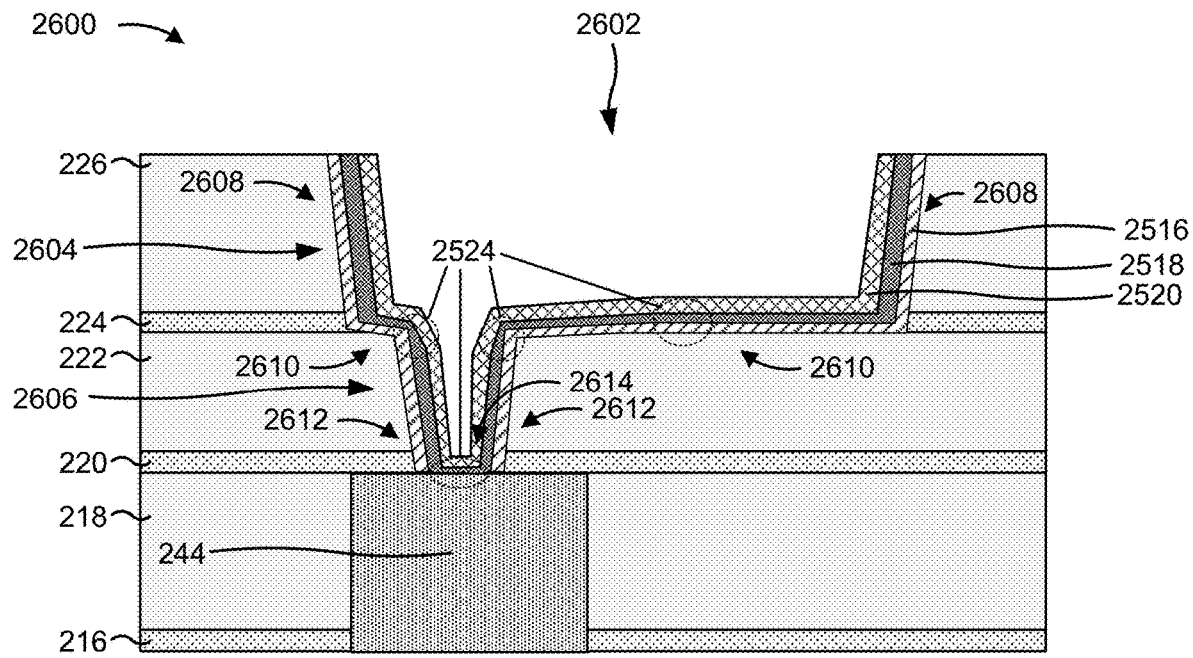
Figure 26D:
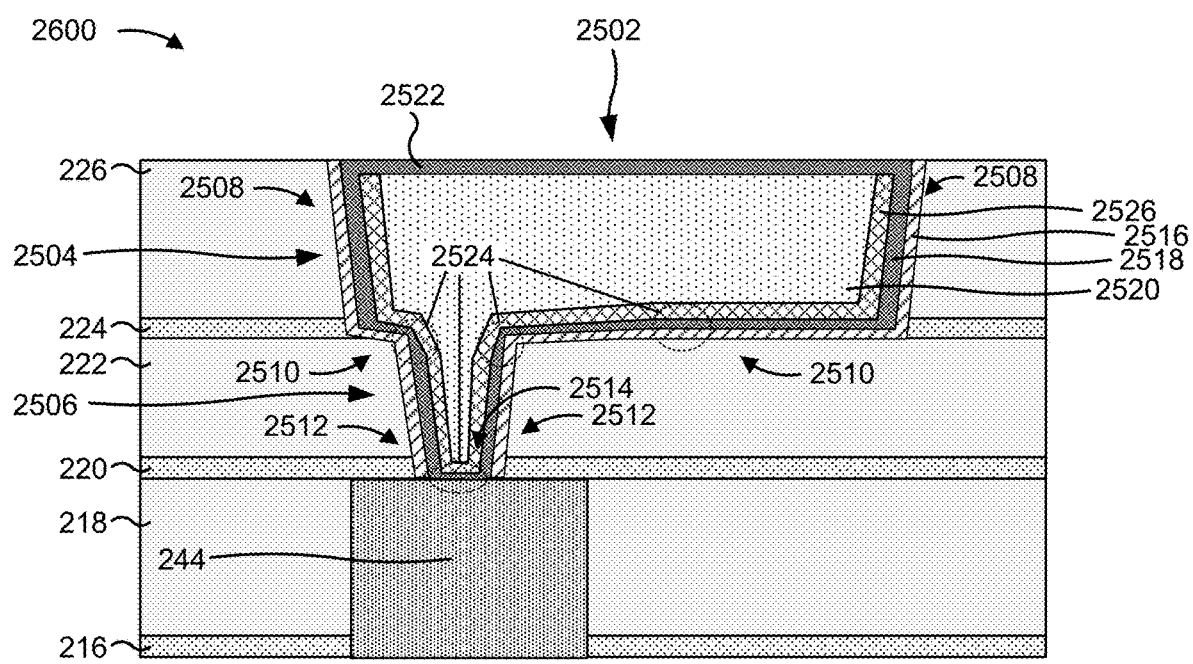

The example process of the example implementation 2600 mostly follows the example process of the example implementation 2400. Accordingly, similar process details are not reiterated for purposes of brevity. As shown in FIG. 26C, however, the example process of the example implementation 2600 differs from the example process of the example implementation 2400 in that the metal liner layer 2526 is formed on the metal liner layer 2518 after trimming of the metal liner layer 2518 and prior to formation of the conductive structure 2520 on the metal liner layer 2526.

As indicated above, FIGS. 26A-26D are provided as an example. Other examples may differ from what is described with regard to FIGS. 26A-26D. For example, the techniques described in connection with FIGS. 26A-26D may be performed to form a single damascene structure for the BEOL layer 2502. As another example, the techniques described in connection with FIG. 26A-26D may be performed in implementations in which the metal liner layer 2518 includes a ruthenium (Ru) liner and the metal liner layer 2526 includes a cobalt (Co) liner (similar to the BEOL layer 702 of the semiconductor structure 700 in FIG. 7).

Figure 27:
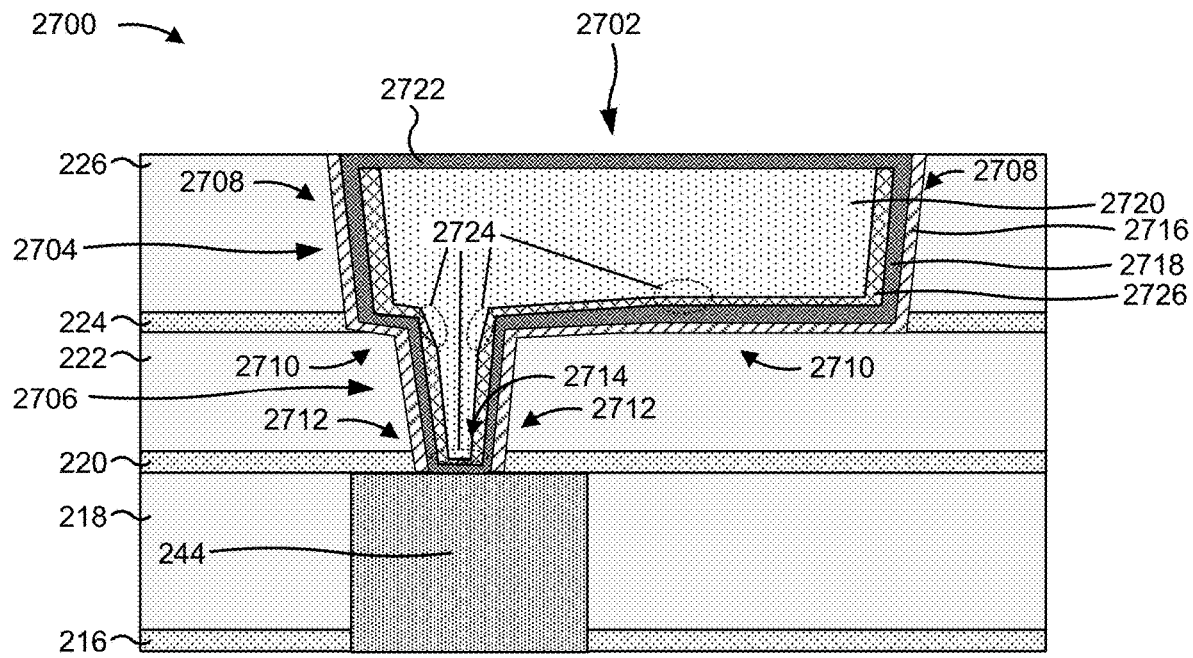
FIG. 27 is a diagram of an example semiconductor structure described herein.

FIG. 27 is a diagram of an example semiconductor structure 2700 described herein. The semiconductor structure 2700 includes a BEOL layer 2702, which may include one or more of the BEOL layers of the device 200 described in connection with FIG. 2. The BEOL layer 2702 includes a similar configuration of layers and/or structures as the BEOL layer 2502 of FIG. 25. However, the metal liner layer 2726 is trimmed to reduce the thickness of the metal liner layer 2726 in portions 2724 as opposed to the metal liner layer 2718 being trimmed.

A thickness of the metal liner layer 2726 over the sidewalls 2708 and 2712 is in a range of approximately 15 Å to approximately 35 Å to provide sufficiently low contact resistance and sheet resistance while providing sufficient area for the conductive structure 2720. However, other values for the range are within the scope of the present disclosure. A thickness of the metal liner layer 2726 in the portions 2724 of the metal liner layer 2726 over the bottom surfaces 2710 and 2714, and at transitions between the bottom surface 2710 and the sidewalls 2712, is in a range of approximately 30% to approximately 80% of the thickness of the metal liner layer 2726 over the sidewalls 2708 and 2712 to provide sufficiently low contact resistance and sheet resistance while providing sufficient area for the conductive structure 2720. However, other values for the range are within the scope of the present disclosure.

In the example shown in FIG. 27, the metal liner layer 2718 includes a cobalt (Co) liner and the metal liner layer 2726 includes a ruthenium (Ru) liner, similar to the semiconductor structure 1700 of FIG. 17. However, in other implementations, the metal liner layer 2718 may include a ruthenium (Ru) liner and the metal liner layer 2726 may include a cobalt (Co) liner, similar to the semiconductor structure 700 of FIG. 7. In these implementations, the cobalt liner is trimmed after to formation of the cobalt liner.

As indicated above, FIG. 27 is provided as an example. Other examples may differ from what is described with regard to FIG. 27.

FIGS. 28A-28D are diagrams of an example implementation 2800 described herein. Example implementation 2800 may be an example process for forming the BEOL layer 2702 over a conductive structure (e.g., the conductive structure 244 or another conductive structure) of the device 200. In particular, the example implementation 2800 includes an example process for trimming the metal liner layer 2726 after formation of the metal liner layer 2718 and prior to formation of the conductive structure 2720.

Figure 28A:
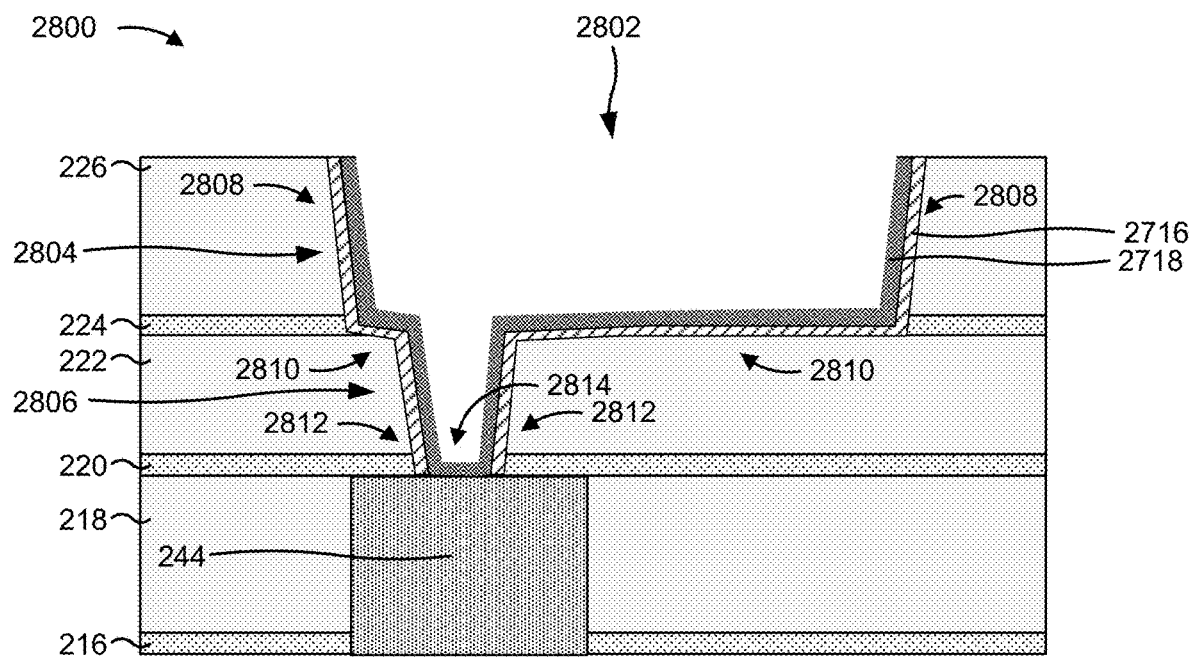
FIGS. 28A-28D are diagrams of an example implementation described herein.
Figure 28B:
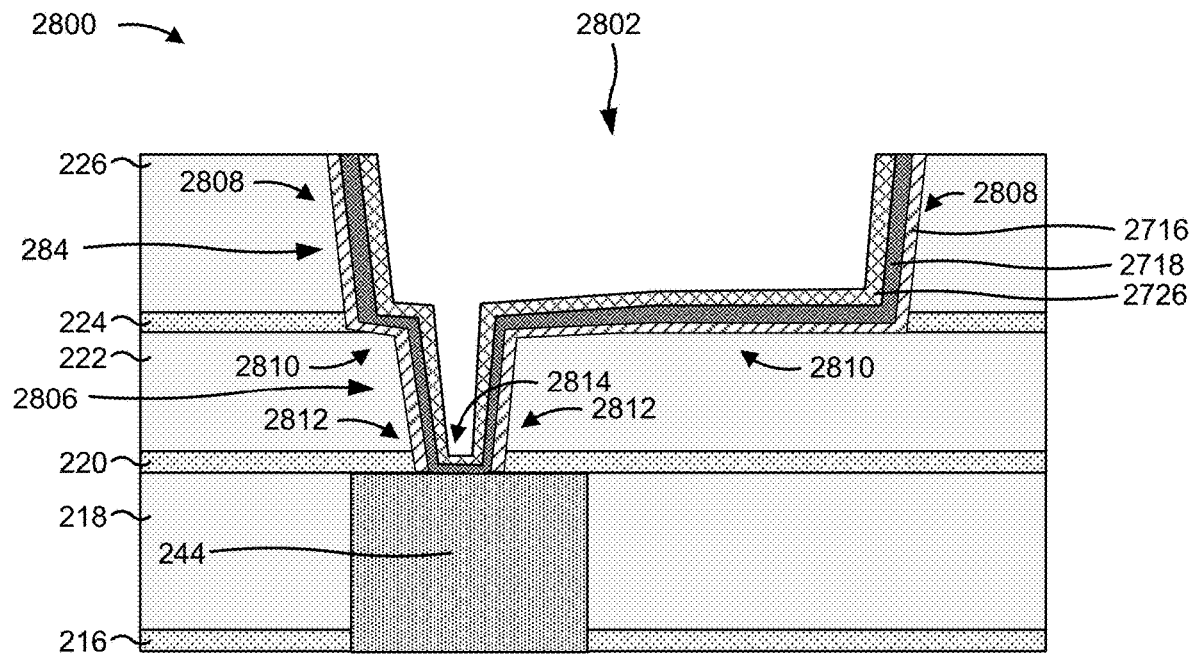
Figure 28C:
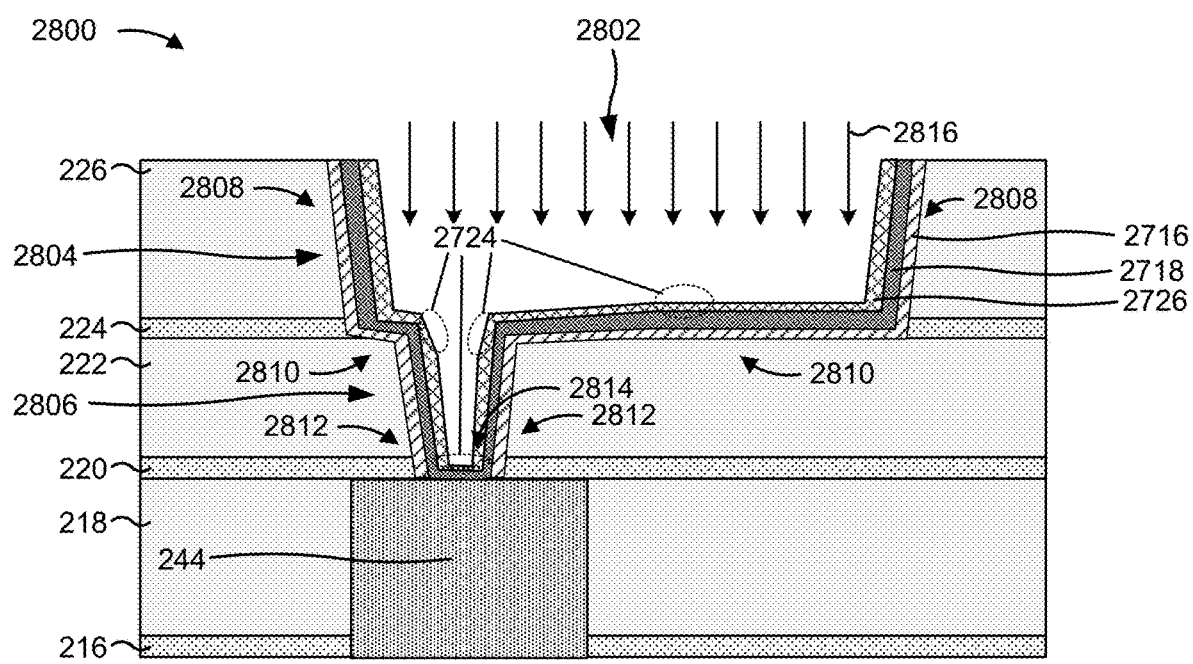
Figure 28D:
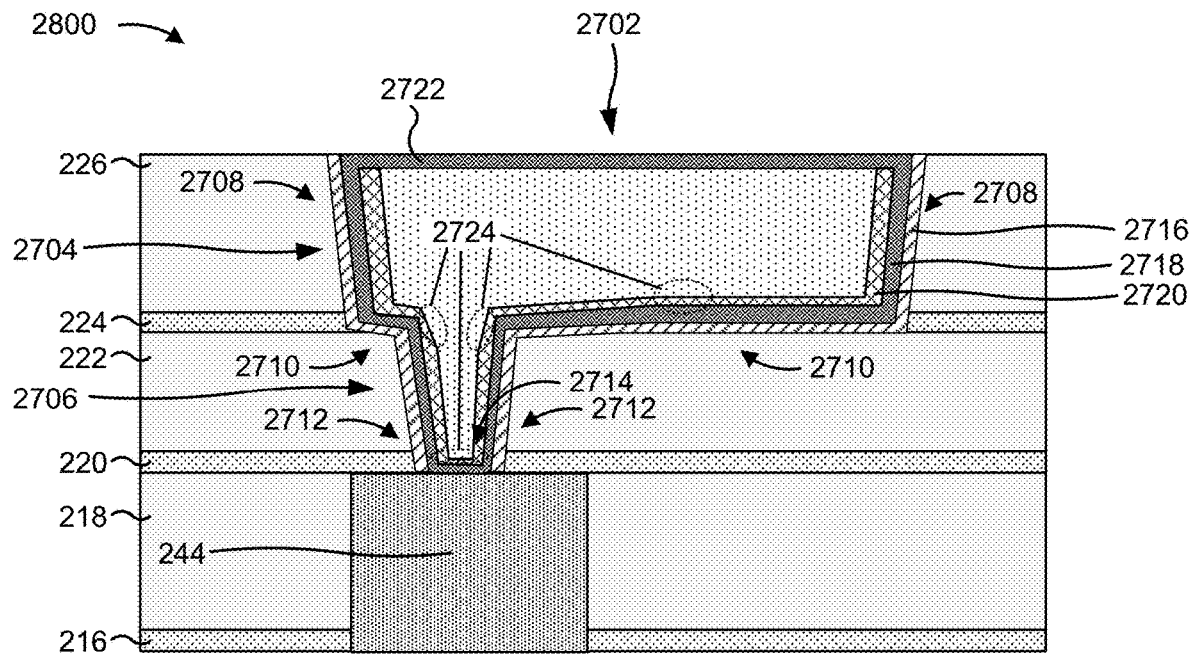

The example process of the example implementation 2800 mostly follows the example process of the example implementation 2600. Accordingly, similar process details are not reiterated for purposes of brevity. As shown in FIGS. 28B and 28C, however, the example process of the example implementation 2800 differs from the example process of the example implementation 2600 in that the metal liner layer 2718 is formed, the metal liner layer 2726 is formed on the metal liner layer 2718 (e.g., without trimming of the metal liner layer 2718), and metal liner layer 2726 is trimmed prior to formation of the conductive structure 2720 on the metal liner layer 2726.

As indicated above, FIGS. 28A-28D are provided as an example. Other examples may differ from what is described with regard to FIGS. 28A-28D. For example, the techniques described in connection with FIGS. 28A-28D may be performed to form a single damascene structure for the BEOL layer 2702. As another example, the techniques described in connection with FIG. 28A-28D may be performed in implementations in which the metal liner layer 2718 includes a ruthenium (Ru) liner and the metal liner layer 2726 includes a cobalt (Co) liner (similar to the BEOL layer 702 of the semiconductor structure 700 in FIG. 7).

Figure 29:
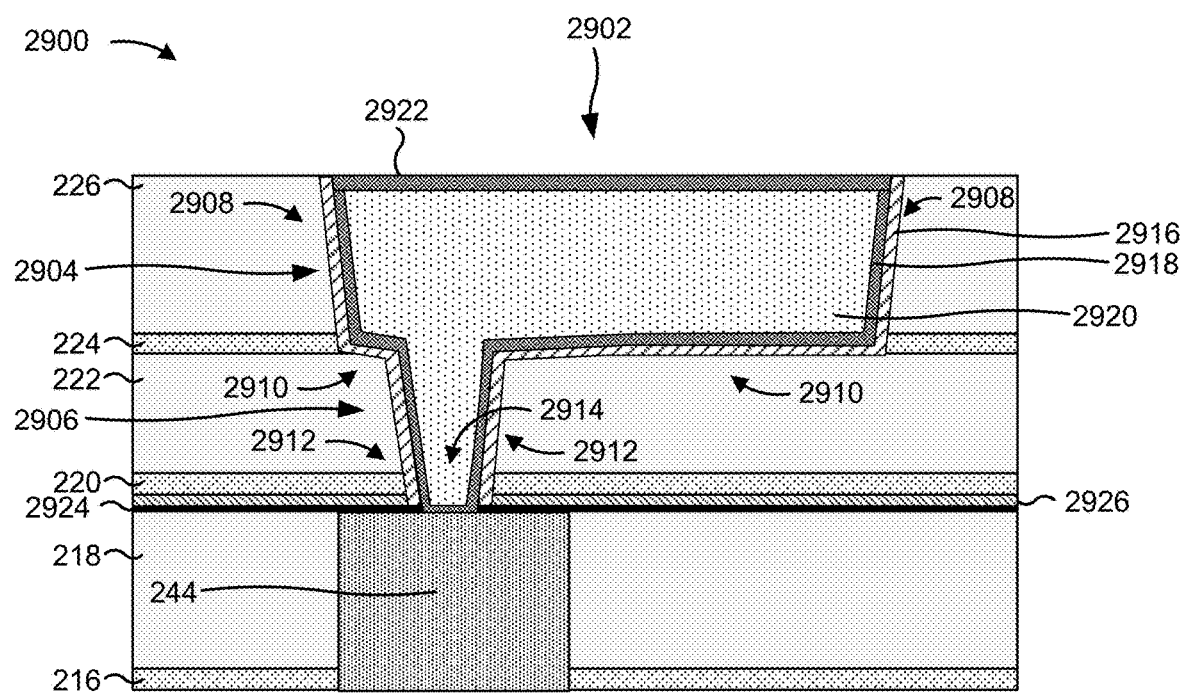
FIG. 29 is a diagram of an example semiconductor structure described herein.

FIG. 29 is a diagram of an example semiconductor structure 2900 described herein. The semiconductor structure 2900 includes a BEOL layer 2902, which may include one or more of the BEOL layers of the device 200 described in connection with FIG. 2. The semiconductor structure 2900 includes a similar configuration of layers and/or structures as the semiconductor structure 300 of FIG. 3. However, a graphene layer 2924 is included in the semiconductor structure 2900 over the dielectric layer 218 and the conductive structure 244, and below the ESL 220. In other words, the graphene layer 2924 is included as an interfacial layer between the ESL 220 and the dielectric layer 218 and the conductive structure 244. In some implementations, the semiconductor structure 2900 includes additional interfacial layers such as a cobalt layer 2926 between the graphene layer 2924 and the ESL 220. Moreover, while the semiconductor structure 2900 is illustrated in the example of FIG. 29 as including a cobalt (Co) liner for the metal liner layer 2918, the metal liner layer 2918 may alternatively include a ruthenium (Ru) liner similar to the BEOL layer 1302 of the semiconductor structure 1300 in FIG. 13.

As described in connection with FIGS. 30A-30D, the graphene layer 2924 blocks and/or reduces the likelihood of formation of the barrier layer 2916 on the top surface of the conductive structure 244 at the bottom surface 2914 of the BEOL layer 2902. In this way, the barrier layer 2916 is substantially absent and/or omitted from the top surface of the conductive structure 244, which decreases contact resistance between the BEOL layer 2902 and the conductive structure 244.

As indicated above, FIG. 29 is provided as an example. Other examples may differ from what is described with regard to FIG. 29.

FIGS. 30A-30D are diagrams of an example implementation 3000 described herein. Example implementation 3000 may be an example process for forming the BEOL layer 2902 over a conductive structure (e.g., the conductive structure 244 or another conductive structure) of the device 200.

Figure 30A:
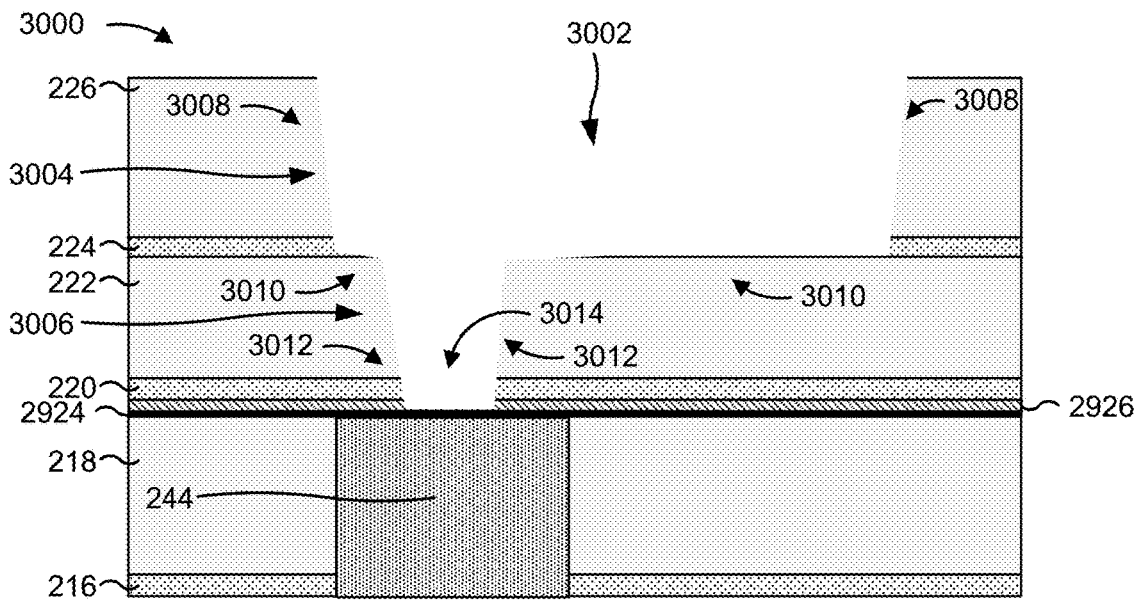
FIGS. 30A-30D are diagrams of an example implementation described herein.

Turning to FIG. 30A, the graphene layer 2924 may be formed over and/or on the dielectric layer 218, and over and/or on the conductive structure 244. In implementations in which additional interfacial layers are included, the cobalt layer 2926 may be formed over and/or on the graphene layer 2924. The deposition tool 102 form the graphene layer 2924 and/or the cobalt layer 2926 prior to formation of the dielectric layers 222 and 226, and prior to formation of the ESLs 220 and 224. The deposition tool 102 may form the ESLs 220, 224 and the dielectric layer 222, 226 over the graphene layer 2924.

The deposition tool 102 may form the graphene layer 2924 using a CVD technique, an ALD technique, a PVD technique, and/or another deposition technique. The deposition tool 102 may form the graphene layer 2924 to a thickness in a range of approximately 3 Å to approximately 8 Å to provide sufficiently low sheet resistance and sufficiently low contact resistance while providing a sufficiently thick blocking layer for the barrier layer 2916. However, other values for the range are within the scope of the present disclosure.

The graphene layer 2924 may include a single-layer graphene layer or a multilayer graphene layer (e.g., bilayer graphene or greater than two layers of graphene). In implementations in which the graphene layer 2924 includes bilayer graphene, the graphene layer 2924 may include an AB stacked bilayer graphene, an AA stacked bilayer graphene, a twisted stacked bilayer graphene, and/or another stacking configuration for bilayer graphene.

As shown in FIG. 30A, an opening 3002 is formed in and/or through one or more dielectric layers of the device 200, such as the dielectric layer 222 and 226. The opening 3002 may be formed to a portion of a top surface of the graphene layer 2924 that is over the conductive structure 244. In some implementations, the opening 3002 is formed in and/or through additional layers, such as one or more ESLs (e.g., the ESL 220 and/or the ESL 224, among other examples). The deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226, the ESL 224, the dielectric layer 222, and/or the ESL 220 to form the opening 3002. In some implementations, a photoresist removal tool removes the remaining portions of the photoresist layer (e.g., using a chemical stripper, a plasma asher, and/or another technique) after the etch tool 108 forms the opening 3002.

For a dual damascene profile, as is shown in the example in FIG. 30A, the opening 3002 may be formed using at least two separate etching steps. The dual damascene profile may be formed using a trench first technique (e.g., where a metallization layer opening 3004 is formed first, and a via opening 3006 is formed second) or a via-first technique (e.g., where the via opening 3006 is formed first, and the metallization layer opening 3004 is formed second), among other examples.

As shown in FIG. 30A, the opening 3002 may include sidewalls 3008 and a bottom surface 3010 of the metallization layer opening 3004, and sidewalls 3012 and a bottom surface 3014 of the via opening 3006. The bottom surface 3014 may correspond to the bottom surface of the opening 3002, and may correspond to the top surface of the graphene layer 2924 over the conductive structure 244.

Figure 30B:
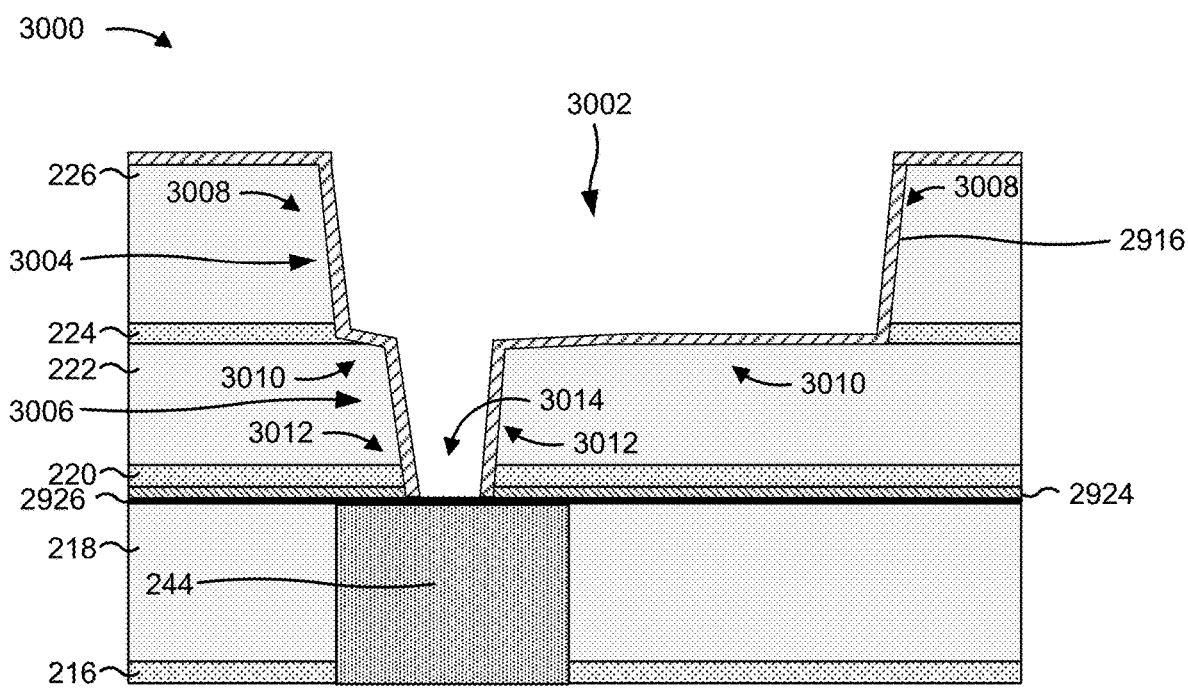

As shown in FIG. 30B, the barrier layer 2916 is formed on the sidewalls 3008, 3012 and on the bottom surface 3010 of the opening 3002. The deposition tool 102 may deposit the barrier layer 2916 using a CVD technique, a PVD technique, an ALD technique, or another type of deposition technique. As described above, the graphene layer 2924 repels the material of the barrier layer 2916 such that the barrier layer 2916 is deposited on the sidewalls 3008, 3012, on the bottom surface 3010, and not on the bottom surface 3014 (e.g., not on the top surface of the conductive structure 244). Graphene includes a very dense atomic structure (as described in connection with FIG. 53) that saturates bonds in a two-dimensional manner. This leaves no vertical dangling bonds and no empty state of carbon atoms for the graphene layer 2924. As a result, the graphene layer 2924 inhibits organic precursor adsorption of the material of the barrier layer 2916, which prevents chemisorption and formation of the barrier layer 2916 on the graphene layer 2924. Thus, the barrier layer 2916 is substantially absent from and/or omitted from the top surface of the conductive structure 244.

Figure 30C:
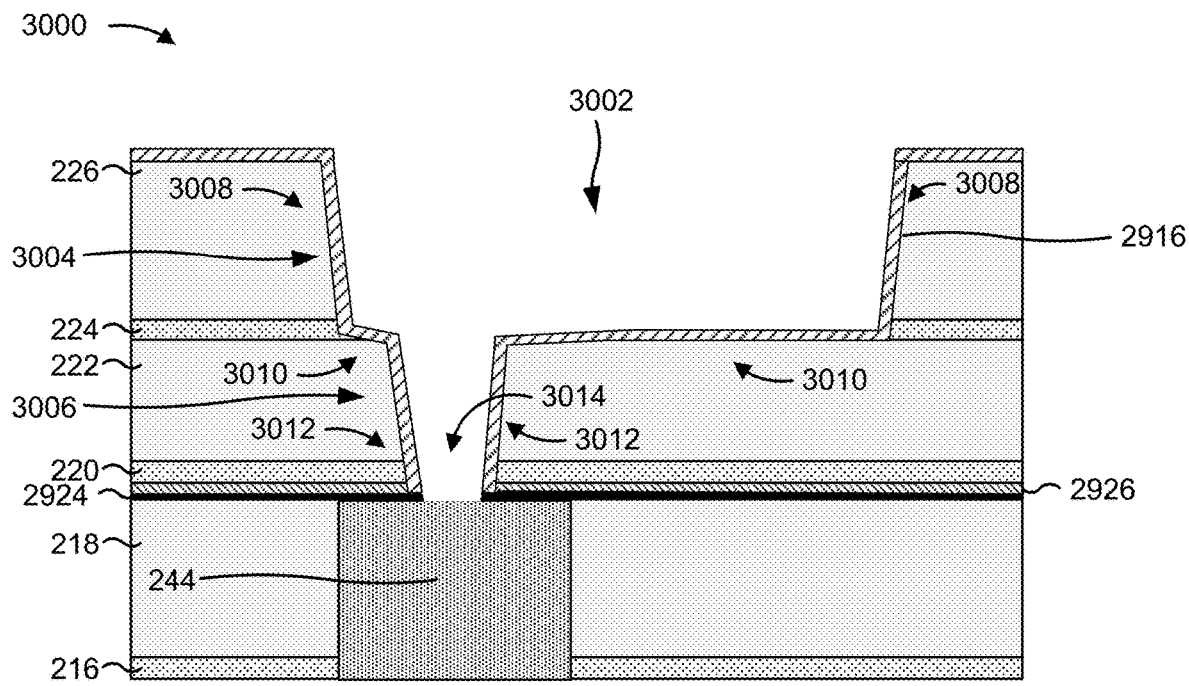

As shown in FIG. 30C, a portion of the graphene layer 2924 over the conductive structure 244 and between the sidewalls 3012 is removed through the opening 3002. The plasma tool 116 may perform a plasma operation to remove the portion of the graphene layer 2924. In particular, the plasma tool 116 may use an argon (Ar) plasma and/or another type of plasma to bombard the portion of the graphene layer 2924, which breaks the bonds of the portion of the graphene layer 2924. This results in the formation of oxygen-terminated defects and/or hydroxyl-terminated defects in the portion of the graphene layer 2924. The oxygen-terminated defects and the hydroxyl-terminated defects cause the portion of the graphene layer 2924 to transition to an amorphous organic carbon (e.g., carbon flakes). The plasma tool 116 then uses another type of plasma (e.g., a hydrogen ($H_2$) plasma among other examples) and/or radicals (e.g., hydrogen (H) radicals among other examples) to remove the amorphous organic carbon from the top surface of the conductive structure 244. The hydrogen may also prevent oxidation of the top surface of the conductive structure 244.

Removing the portion of the graphene layer 2924 returns the metallic properties to the bottom surface 3014, which promotes metal-to-metal adhesion between the material of the bottom surface 3014 (e.g., cobalt (Co) or copper (Cu), and/or ruthenium (Ru), among other examples) and the metal liner layer 2918 that is to be filled in the opening 3002 over the bottom surface 3014, which minimizes or prevents the formation of voids and other defects in the metal liner layer 2918. In some implementations, some graphene material of the graphene layer 2924 may remain at the bottom surface 3014 of the opening 3002. Accordingly, trace amounts of graphene may be detectable at an interface between the conductive structure 244 and the BEOL layer 2902.

Figure 30D:
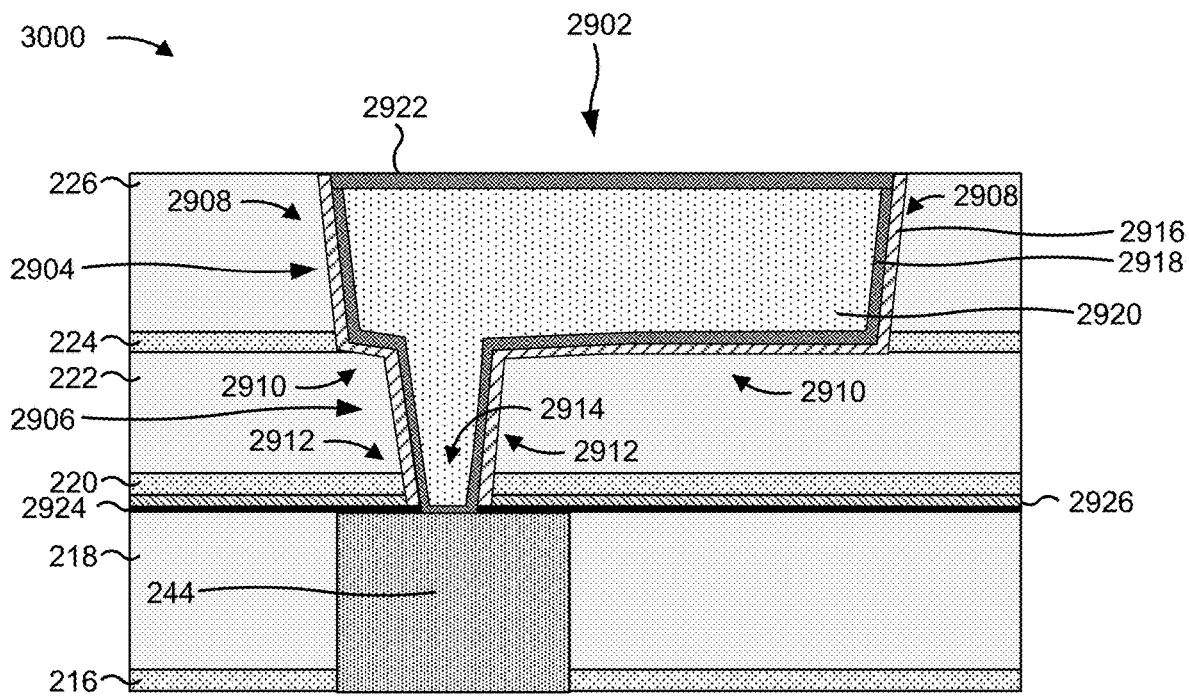

As shown in FIG. 30D, the metal liner layer 2918 is formed after the portion of the graphene layer 2924 is removed from the bottom surface 3014 (e.g., after exposing the top surface of the conductive structure 244). The metal liner layer 2918 is formed over the barrier layer 2916 along the sidewalls 3008, 3012, and over the bottom surface 3010. Moreover, the metal liner layer 2918 is formed on the bottom surface 3014 of the opening 3002. Accordingly, the metal liner layer 2918 is electrically coupled directly with the conductive structure 244. The deposition tool 102 may deposit the metal liner layer 2918 using a CVD technique, a PVD technique, an ALD technique, or another type of deposition technique.

As further shown in FIG. 30D, the material (e.g., copper or another material) of the conductive structure 2920 is formed in the opening 3002 over the barrier layer 2916 and over the metal liner layer 2918. The deposition tool 102 may deposit copper of the conductive structure 2920 using a CVD technique, a PVD technique, an ALD technique, or another type of deposition technique, the plating tool 112 may deposit the copper of the conductive structure 2920 using an electroplating operation, or a combination thereof. For example, the deposition tool 102 may deposit a seed layer on the metal liner layer 2918 to promote adhesion between the metal liner layer 2918 and the conductive structure 2920, and the plating tool 112 may deposit the remaining material of the conductive structure 2920 on the seed layer.

In some implementations, the copper flows over the top surface of the dielectric layer 226 as well as into the opening 3002. Accordingly, the BEOL layer 2902 may be planarized. The planarization tool 110 may planarize the BEOL layer 2902 after the conductive structure 2920 is deposited. Additionally, portions of the barrier layer 2916 and/or portions of the metal liner layer 2918 deposited over the top surface of the dielectric layer 226 may be removed during planarization. In some implementations, the planarization tool 110 uses CMP technique.

As further shown in FIG. 30D, the cobalt capping layer 2922 is formed over the conductive structure 2920. Using CMP to planarize the BEOL layer 2902 may cause a recess to form in the conductive structure 2920 due to dishing. Accordingly, the cobalt capping layer 2922 may be formed to fill in the recess. The deposition tool 102 may deposit the cobalt capping layer 2922 by a CVD technique, a PVD technique, an ALD technique, or another type of deposition technique.

As indicated above, FIGS. 30A-30D are provided as an example. Other examples may differ from what is described with regard to FIGS. 30A-30D. For example, the techniques described in connection with FIGS. 30A-30D may be performed to form a single damascene structure for the BEOL layer 2902. As another example, the techniques described in connection with FIG. 30A-30D may be performed in implementations in which the metal liner layer 2918 includes a ruthenium (Ru) liner (similar to the BEOL layer 1302 of the semiconductor structure 1300 in FIG. 13) as opposed to a cobalt (Co) liner. As another example, the techniques described in connection with FIG. 30A-30D may be performed in implementations in which the cobalt capping layer 2922 alternatively includes a ruthenium cobalt (RuCo) capping layer. As another example, a trimming operation described herein may be performed to reduce the thickness of one or more portions of the metal liner layer 2918.

Figure 31:
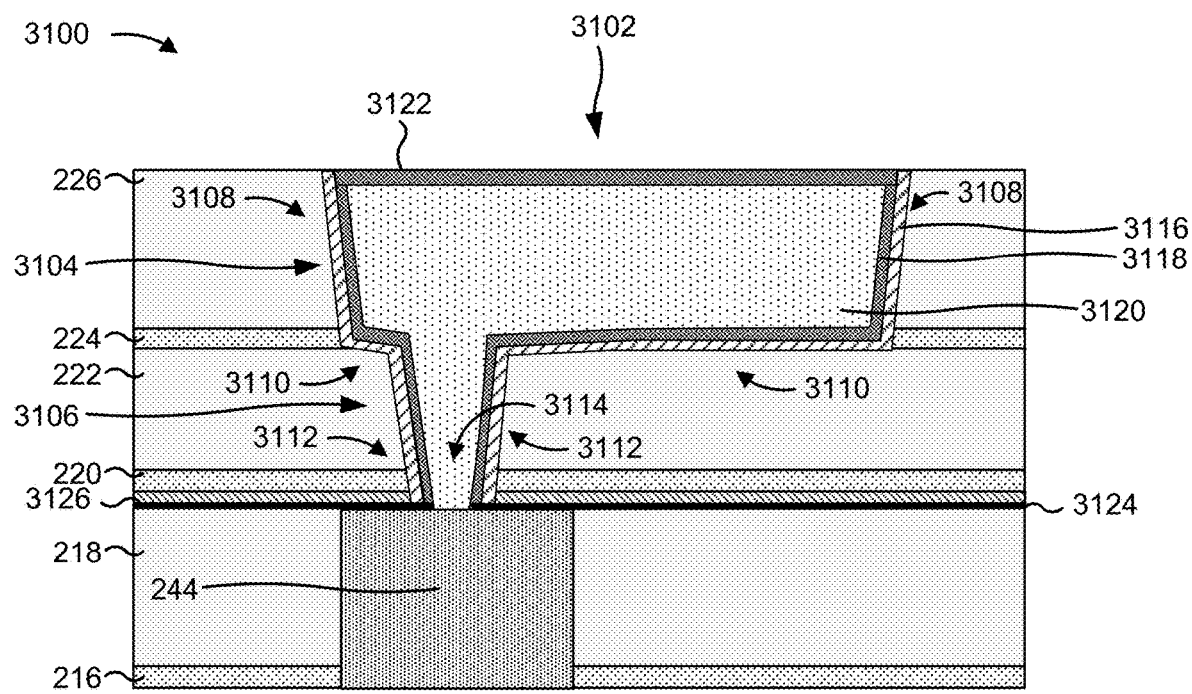
FIG. 31 is a diagram of an example semiconductor structure described herein.

FIG. 31 is a diagram of an example semiconductor structure 3100 described herein. The semiconductor structure 3100 includes a BEOL layer 3102, which may include one or more of the BEOL layers of the device 200 described in connection with FIG. 2. The BEOL layer 3102 includes a similar configuration of layers and/or structures as the BEOL layer 2902 of FIG. 29. However, the conductive structure 3120 of the BEOL layer 3102 is in direct contact (e.g., is electrically coupled directly) with the conductive structure 244, whereas the conductive structure 2920 is electrically coupled with the conductive structure 244 through the metal liner layer 2918. As described in connection with FIGS. 32A-32E, this occurs as a result of a portion of the graphene layer 3124 over the top surface of the conductive structure 244 being in place during formation of the metal liner layer 3118. This results in the metal liner layer 3118 being substantially absent from and/or omitted from the top surface of the conductive structure 244. This further reduces contact resistance for the BEOL layer 3102. Accordingly, the semiconductor structure 3100 includes a similar configuration of layers and/or structures as the semiconductor structure 500 of FIG. 5, except that the semiconductor structure 3100 further includes the graphene layer 3124 (and, in some implementations a cobalt layer 3126).

As indicated above, FIG. 31 is provided as an example. Other examples may differ from what is described with regard to FIG. 31.

FIGS. 32A-32E are diagrams of an example implementation 3200 described herein. Example implementation 3200 may be an example process for forming the BEOL layer 3102 over a conductive structure (e.g., the conductive structure 244 or another conductive structure) of the device 200. In particular, the example implementation 3200 includes an example process for forming the BEOL layer 3102 such that the barrier layer 3116 and the metal liner layer 3118 are substantially absent from and/or omitted from an interface between the BEOL layer 3102 and the conductive structure 244 as a result of the intervening graphene layer 3124.

Figure 32A:
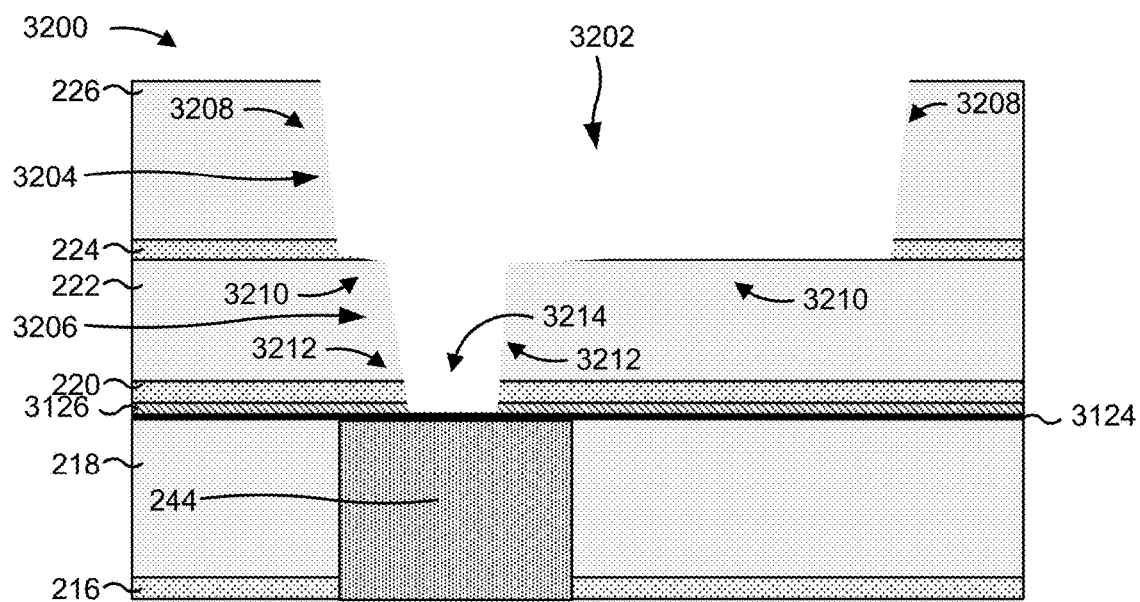
FIGS. 32A-32E are diagrams of an example implementation described herein.
Figure 32B:
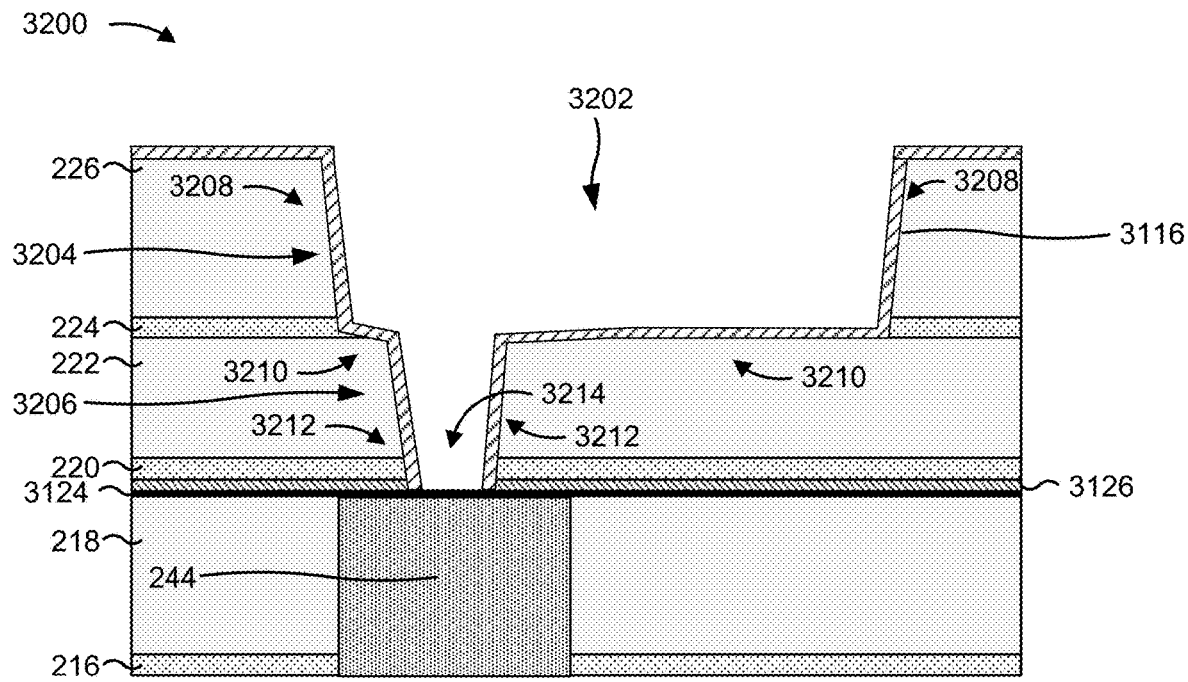
Figure 32C:
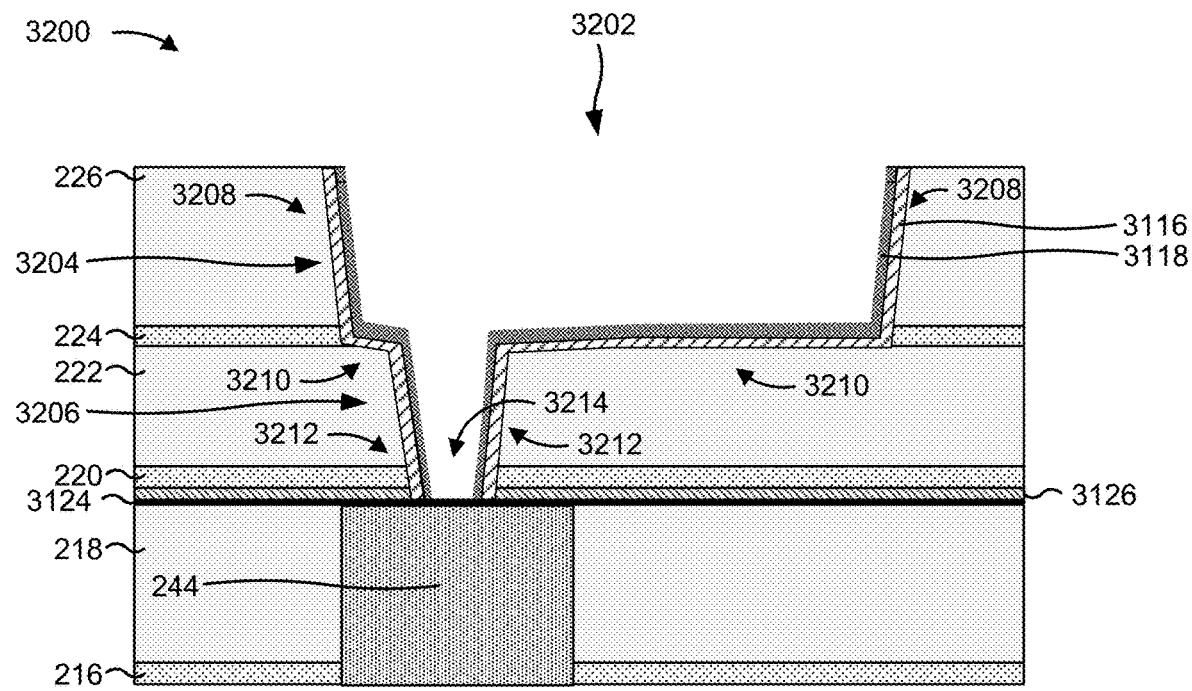
Figure 32D:
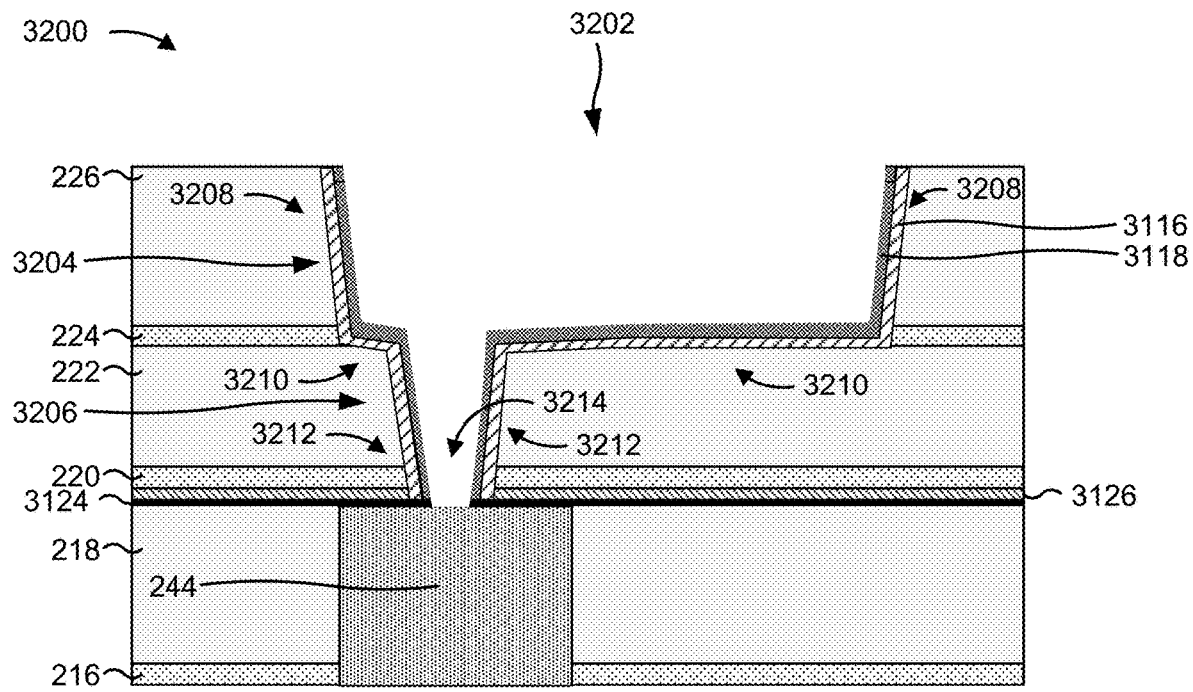

As shown in FIGS. 32A-32E, the example process of the example implementation 3200 mostly follows the example process of the example implementation 3000. Accordingly, similar process details are not reiterated for purposes of brevity. As shown in FIG. 32C, however, the example process of the example implementation 3200 differs from the example process of the example implementation 3000 in that the graphene layer 3124 remains over and/or on the bottom surface 3214 of the opening 3202 (which corresponds to the top surface of the conductive structure 244) during formation of the metal liner layer 3118. As shown in FIG. 32D, the portion of the graphene layer 3124 over the conductive structure 244 is then removed from the bottom surface 3214 of the opening 3202 (e.g., from the top surface of the conductive structure 244) after formation of the metal liner layer 3118. In this way, the metal liner layer 3118 is substantially absent from and/or omitted from the top surface of the conductive structure 244. This further reduces contact resistance for the BEOL layer 3102.

Figure 32E:
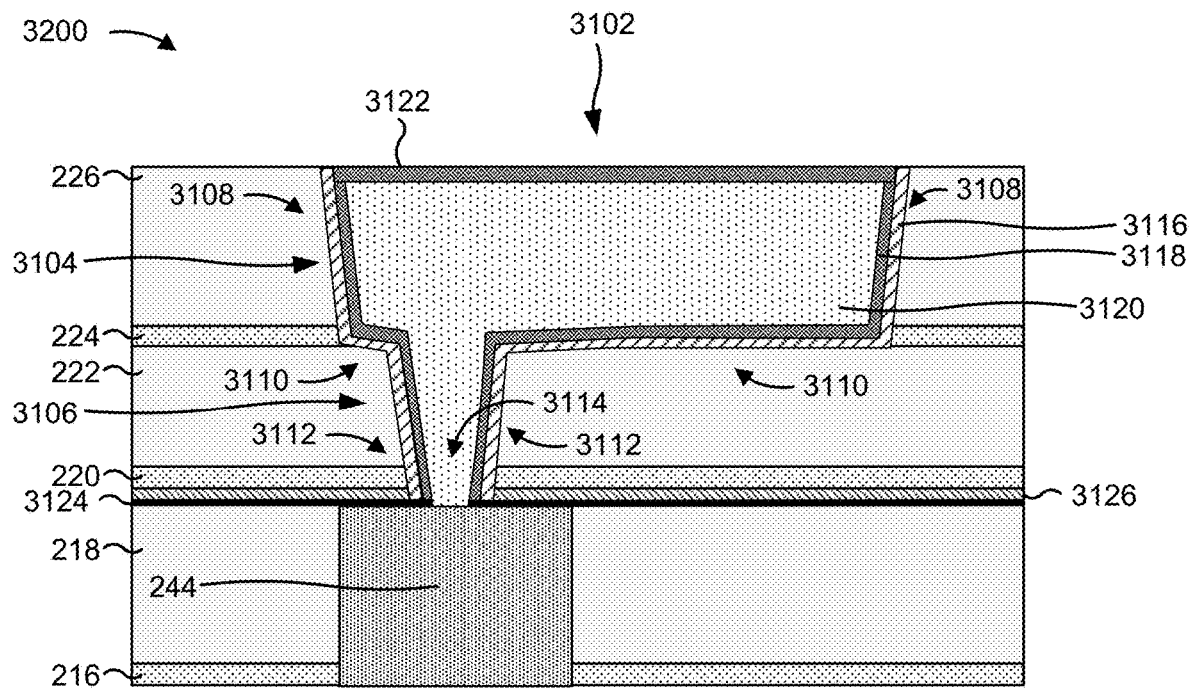

As shown in FIG. 32E, the conductive structure 3120 is formed over the conductive structure 244 and over the metal liner layer 3118. The conductive structure 3120 is electrically coupled directly with the top surface of the conductive structure 244 as a result of the metal liner layer 3118 being substantially absent from and/or omitted from the top surface of the conductive structure 244.

As indicated above, FIGS. 32A-32E are provided as an example. Other examples may differ from what is described with regard to FIGS. 32A-32E. For example, the techniques described in connection with FIGS. 32A-32E may be performed to form a single damascene structure for the BEOL layer 3102. As another example, the techniques described in connection with FIG. 32A-32E may be performed in implementations in which the metal liner layer 3118 includes a ruthenium (Ru) liner (similar to the BEOL layer 1502 of the semiconductor structure 1500 in FIG. 15) as opposed to a cobalt (Co) liner. As another example, the techniques described in connection with FIG. 32A-32E may be performed in implementations in which the cobalt capping layer 3122 alternatively includes a ruthenium cobalt (RuCo) capping layer. As another example, a trimming operation described herein may be performed to reduce the thickness of one or more portions of the metal liner layer 3118.

Figure 33:
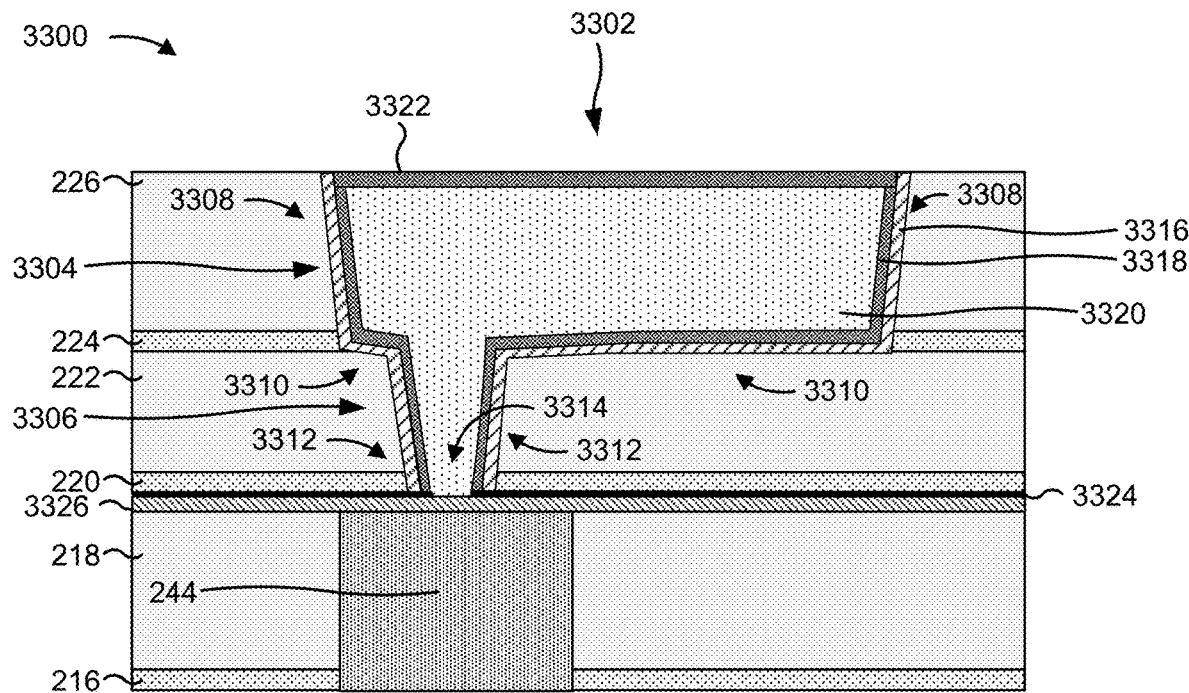
FIGS. 33 and 34 are diagrams of example semiconductor structures described herein.

FIG. 33 is a diagram of an example semiconductor structure 3300 described herein. The semiconductor structure 3300 includes a BEOL layer 3302, which may include one or more of the BEOL layers of the device 200 described in connection with FIG. 2. The BEOL layer 3302 includes a similar configuration of layers and/or structures as the BEOL layer 3102 of FIG. 31. However, the graphene layer 3324 is included between the cobalt layer 3326 and the ESL 220 as opposed to the graphene layer 3124 being included between the cobalt layer 3126 and the dielectric layer 218 and between the cobalt layer 3126 and the conductive structure 244. In these implementations, the conductive structure 3320 is electrically coupled directly with the cobalt layer 3326, and is electrically coupled with the conductive structure 244 through the cobalt layer 3326.

As indicated above, FIG. 33 is provided as an example. Other examples may differ from what is described with regard to FIG. 33. For example, the BEOL layer 3302 may alternatively include a single damascene structure. As another example, the metal liner layer 3318 may alternatively include a ruthenium (Ru) liner (similar to the BEOL layer 1502 of the semiconductor structure 1500 in FIG. 15) as opposed to a cobalt (Co) liner. As another example, the cobalt capping layer 3322 may alternatively include a ruthenium cobalt (RuCo) capping layer. As another example, a trimming operation described herein may be performed to reduce the thickness of one or more portions of the metal liner layer 3318.

Figure 34:
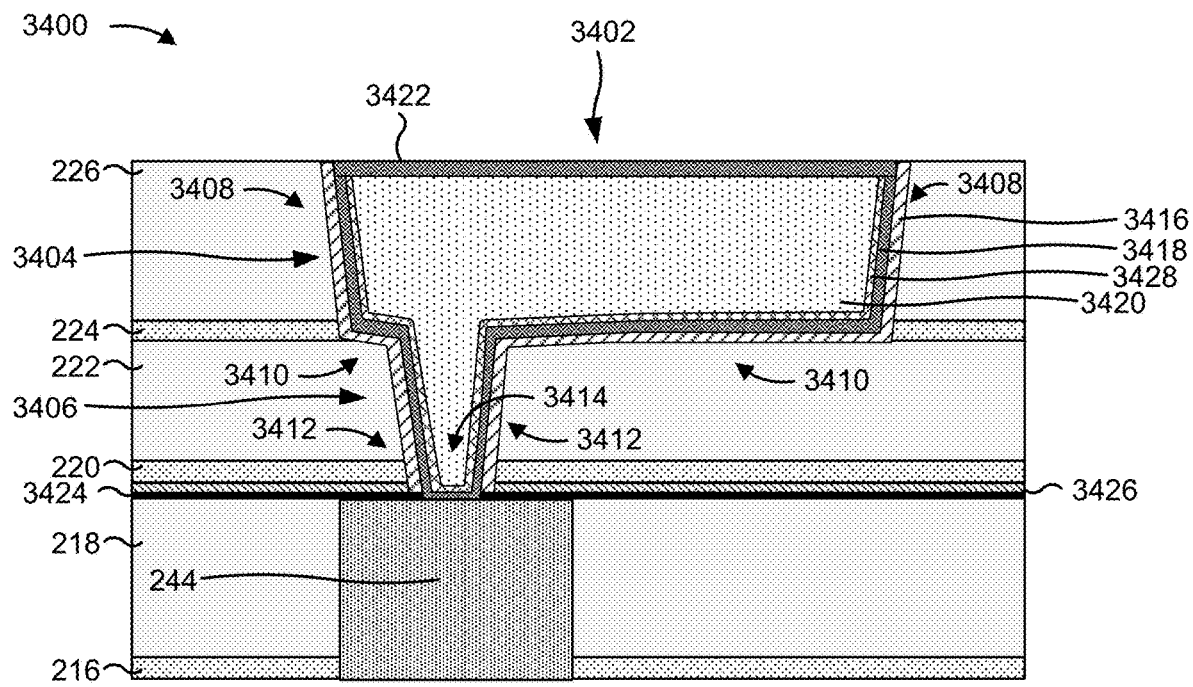

FIG. 34 is a diagram of an example semiconductor structure 3400 described herein. The semiconductor structure 3400 includes a BEOL layer 3402, which may include one or more of the BEOL layers of the device 200 described in connection with FIG. 2. The BEOL layer 3402 includes a similar configuration of layers and/or structures as the BEOL layer 2902 of FIG. 29. However, the BEOL layer 3402 includes an additional metal liner layer 3428 between the metal liner layer 3418 and the conductive structure 3420. The metal liner layer 3418 is electrically coupled directly with the top surface of the conductive structure 244, the metal liner layer 3428 is electrically coupled directly with the metal liner layer 3418, and the conductive structure 3420 is electrically coupled directly with the metal liner layer 3428. Accordingly, the conductive structure 3420 of the BEOL layer 3402 is electrically coupled with the conductive structure 244 through the metal liner layers 3418 and 3428. Accordingly, the semiconductor structure 3400 includes a similar configuration of layers and/or structures as the semiconductor structure 1700 of FIG. 17, except that the semiconductor structure 3400 further includes the graphene layer 3424 (and, in some implementations a cobalt layer 3426) between the barrier layer 3416 and the top surface of the conductive structure 244.

As indicated above, FIG. 34 is provided as an example. Other examples may differ from what is described with regard to FIG. 34.

FIGS. 35A-35D are diagrams of an example implementation 3500 described herein. Example implementation 3500 may be an example process for forming the BEOL layer 3402 over a conductive structure (e.g., the conductive structure 244 or another conductive structure) of the device 200. In particular, the example implementation 3500 includes an example process for forming the BEOL layer 3402 such that the metal liner layer 3428 is included between the metal liner layer 3418 and the conductive structure 3420.

Figure 35A:
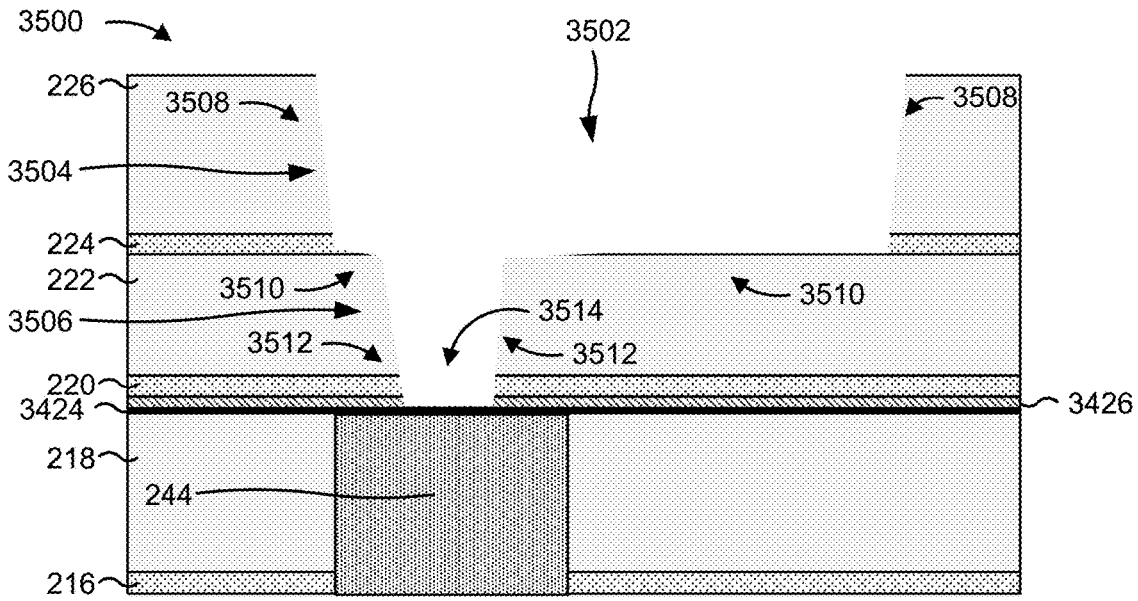
FIGS. 35A-35D are diagrams of an example implementation described herein.
Figure 35B:
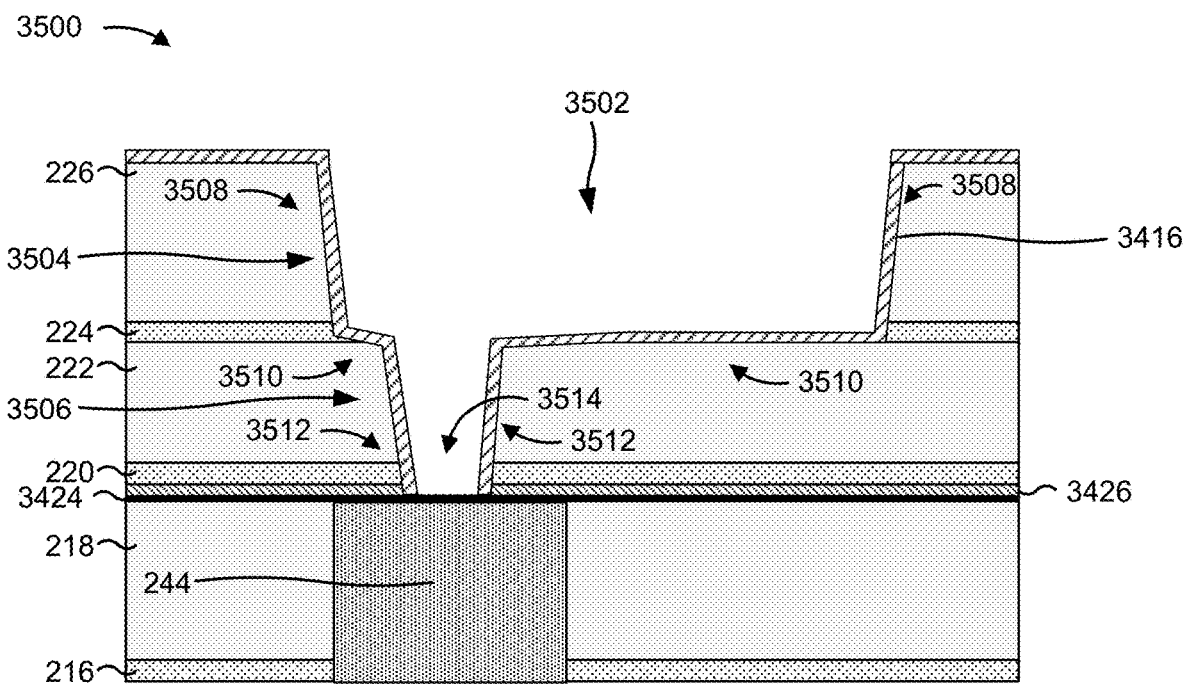
Figure 35C:
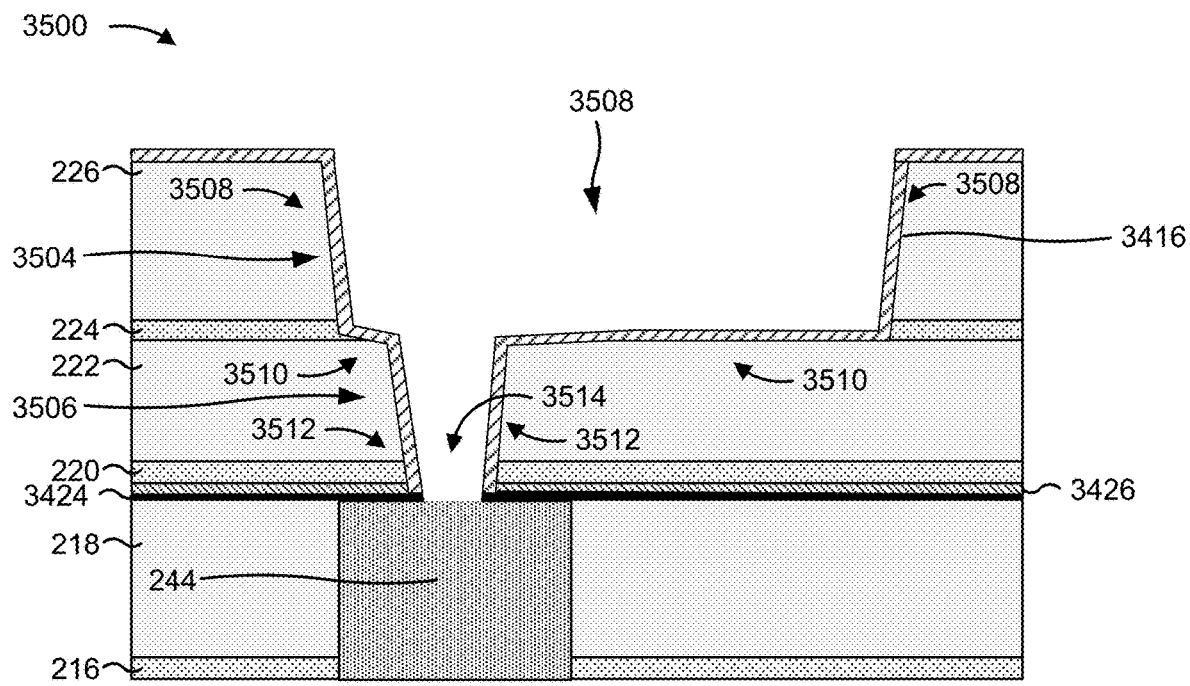
Figure 35D:
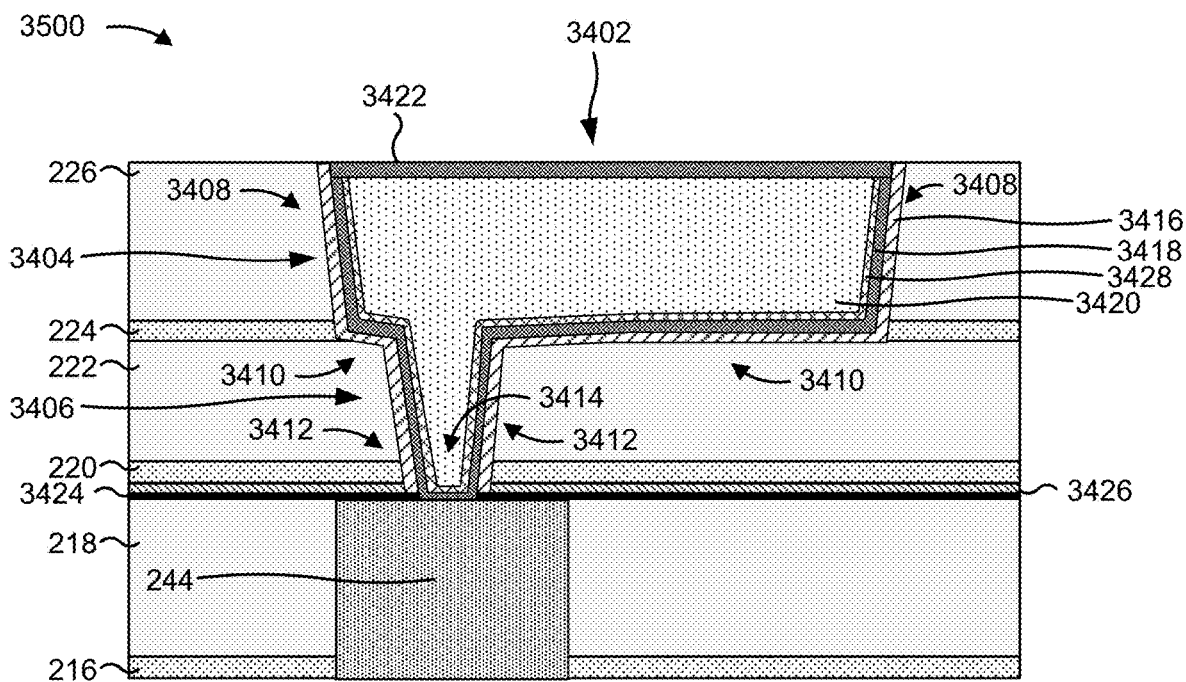

As shown in FIGS. 35A-35D, the example process of the example implementation 3500 mostly follows the example process of the example implementation 3000. Accordingly, similar process details are not reiterated for purposes of brevity. As shown in FIG. 35D, however, the example process of the example implementation 3500 differs from the example process of the example implementation 3000 in that the metal liner layer 3428 is formed over and/or on the metal liner layer 3418 prior to formation of the conductive structure 3420. The conductive structure 3420 is then formed over and/or on the metal liner layer 3428.

As indicated above, FIGS. 35A-35D are provided as an example. Other examples may differ from what is described with regard to FIGS. 35A-35D. For example, the techniques described in connection with FIGS. 35A-35D may be performed to form a single damascene structure for the BEOL layer 3402. As another example, the techniques described in connection with FIG. 35A-35D may be performed in implementations in which the metal liner layer 3418 includes a ruthenium (Ru) liner (similar to the BEOL layer 702 of the semiconductor structure 700 in FIG. 7) as opposed to a cobalt (Co) liner, and in which the metal liner layer 3428 includes a cobalt (Co) liner as opposed to a ruthenium (Ru) liner. As another example, the techniques described in connection with FIG. 35A-35D may be performed in implementations in which the cobalt capping layer 3422 alternatively includes a ruthenium cobalt (RuCo) capping layer. As another example, a trimming operation described herein may be performed to reduce the thickness of one or more portions of the metal liner layer 3418 and/or the thickness of one or more portions of the metal liner layer 3428.

Figure 36:
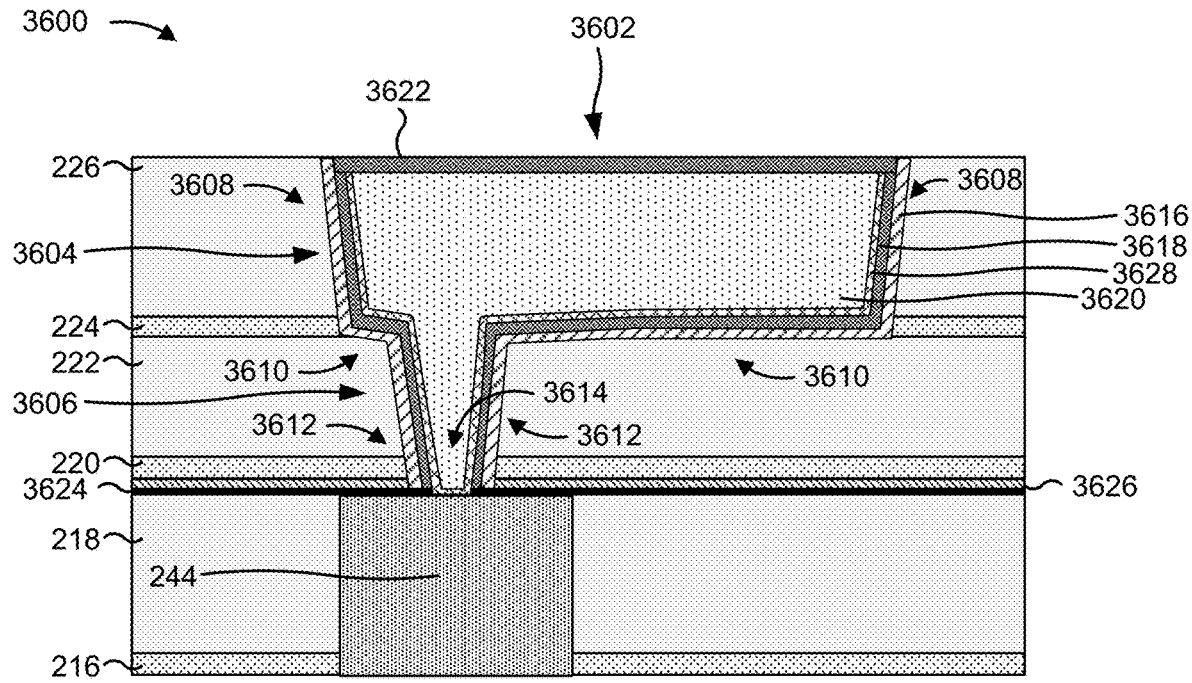
FIG. 36 is a diagram of an example semiconductor structure described herein.

FIG. 36 is a diagram of an example semiconductor structure 3600 described herein. The semiconductor structure 3600 includes a BEOL layer 3602, which may include one or more of the BEOL layers of the device 200 described in connection with FIG. 2. The BEOL layer 3602 includes a similar configuration of layers and/or structures as the BEOL layer 3102 of FIG. 31. However, the BEOL layer 3602 includes an additional metal liner layer 3628 between the metal liner layer 3618 and the conductive structure 3620. The metal liner layer 3628 is electrically coupled directly with the top surface of the conductive structure 244, and the conductive structure 3620 is electrically coupled directly with the metal liner layer 3628. Accordingly, the conductive structure 3620 of the BEOL layer 3602 is electrically coupled with the conductive structure 244 through the metal liner layer 3628. Accordingly, the semiconductor structure 3600 includes a similar configuration of layers and/or structures as the semiconductor structure 1900 of FIG. 19, except that the semiconductor structure 3600 further includes the graphene layer 3624 (and, in some implementations a cobalt layer 3626) between the barrier layer 3616 and the top surface of the conductive structure 244, and between the metal liner layer 3618 and the top surface of the conductive structure 244.

As indicated above, FIG. 36 is provided as an example. Other examples may differ from what is described with regard to FIG. 36.

FIGS. 37A-37E are diagrams of an example implementation 3700 described herein. Example implementation 3700 may be an example process for forming the BEOL layer 3602 over a conductive structure (e.g., the conductive structure 244 or another conductive structure) of the device 200. In particular, the example implementation 3700 includes an example process for forming the BEOL layer 3602 such that the metal liner layer 3628 is included between the metal liner layer 3618 and the conductive structure 3620.

Figure 37A:
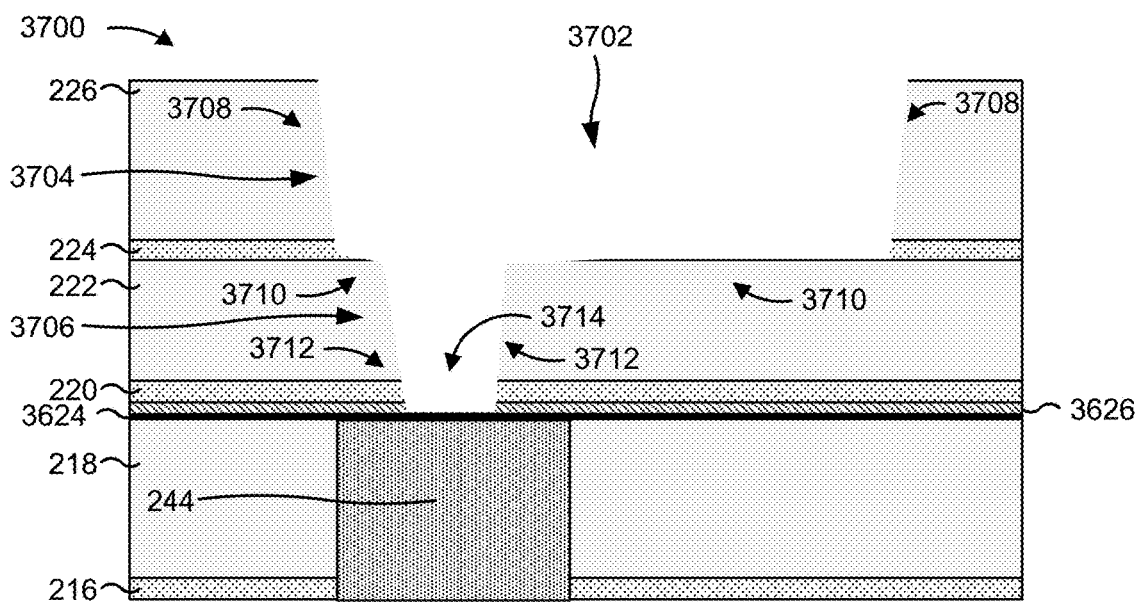
FIGS. 37A-37E are diagrams of an example implementation described herein.
Figure 37B:
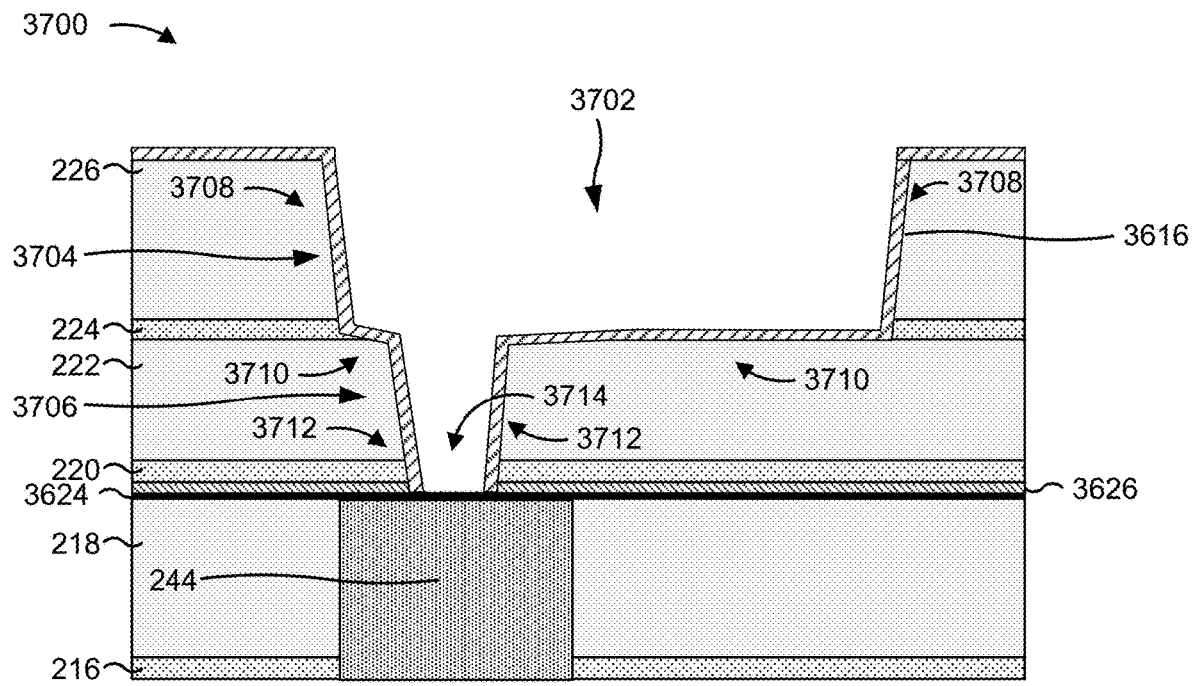
Figure 37C:
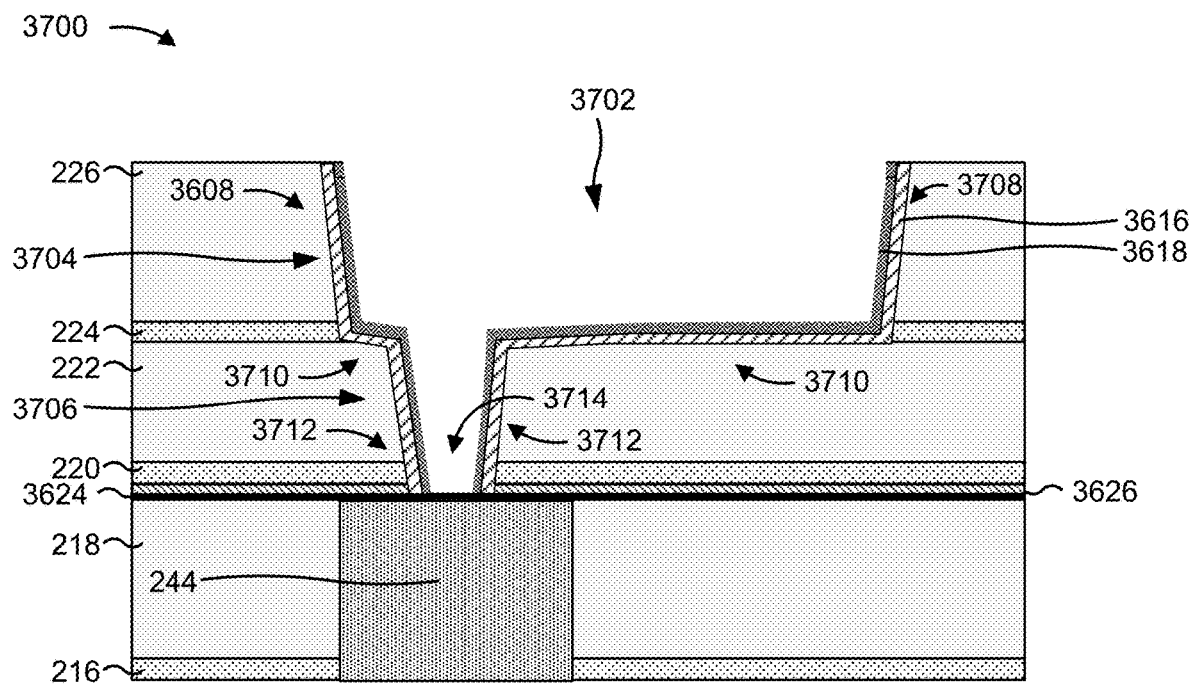
Figure 37D:
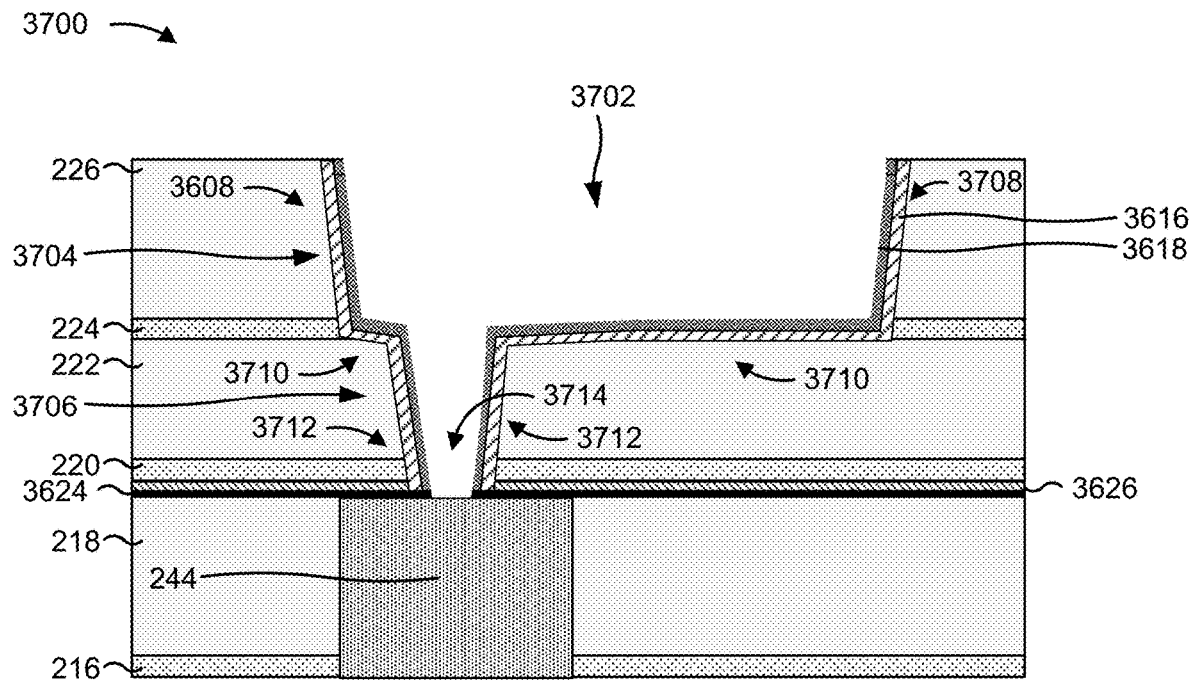
Figure 37E:
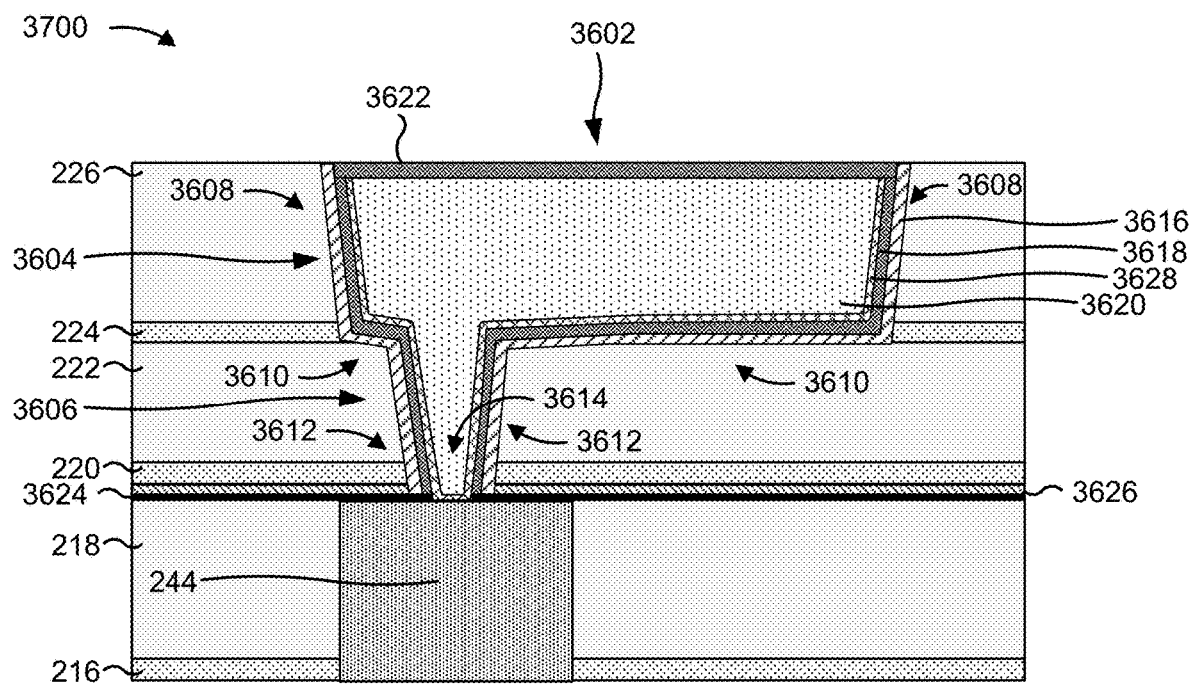

As shown in FIGS. 37A-37E, the example process of the example implementation 3700 mostly follows the example process of the example implementation 3200. Accordingly, similar process details are not reiterated for purposes of brevity. As shown in FIG. 37E, however, the example process of the example implementation 3700 differs from the example process of the example implementation 3200 in that the metal liner layer 3628 is formed over and/or on the metal liner layer 3618, and over and/or on the top surface of the conductive structure 244, prior to formation of the conductive structure 3620. The conductive structure 3620 is then formed over and/or on the metal liner layer 3628.

As indicated above, FIGS. 37A-37E are provided as an example. Other examples may differ from what is described with regard to FIGS. 37A-37E. For example, the techniques described in connection with FIGS. 37A-37E may be performed to form a single damascene structure for the BEOL layer 3602. As another example, the techniques described in connection with FIG. 37A-37E may be performed in implementations in which the metal liner layer 3618 includes a ruthenium (Ru) liner as opposed to a cobalt (Co) liner, and in which the metal liner layer 3628 includes a cobalt (Co) liner as opposed to a ruthenium (Ru) liner (similar to the BEOL layer 902 of the semiconductor structure 900 in FIG. 9). As another example, the techniques described in connection with FIG. 37A-37E may be performed in implementations in which the cobalt capping layer 3622 alternatively includes a ruthenium cobalt (RuCo) capping layer. As another example, a trimming operation described herein may be performed to reduce the thickness of one or more portions of the metal liner layer 3618 and/or the thickness of one or more portions of the metal liner layer 3628.

Figure 38:
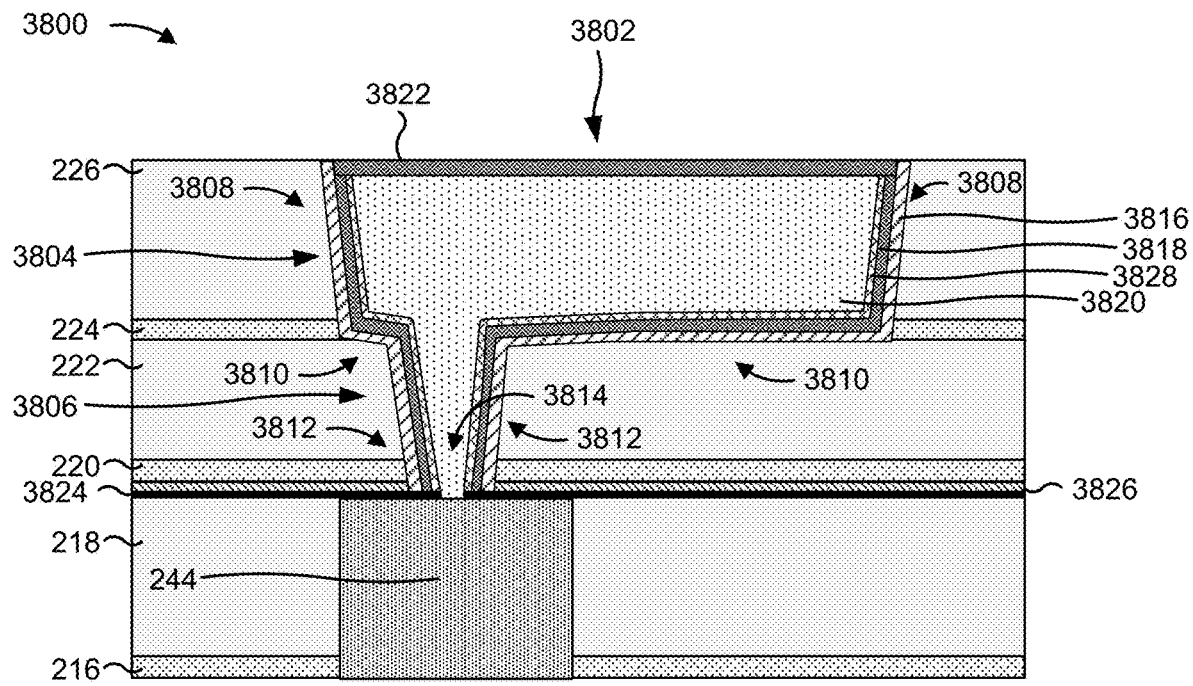
FIG. 38 is a diagram of an example semiconductor structure described herein.

FIG. 38 is a diagram of an example semiconductor structure 3800 described herein. The semiconductor structure 3800 includes a BEOL layer 3802, which may include one or more of the BEOL layers of the device 200 described in connection with FIG. 2. The BEOL layer 3802 includes a similar configuration of layers and/or structures as the BEOL layer 3602 of FIG. 36. However, the conductive structure 3820 of the BEOL layer 3802 is in direct contact (e.g., is electrically coupled directly) with the conductive structure 244, whereas the conductive structure 3620 is electrically coupled with the conductive structure 244 through the metal liner layer 3628. As described in connection with FIGS. 39A-39F, this occurs as a result of a portion of the graphene layer 3824 over the top surface of the conductive structure 244 being in place during formation of the metal liner layer 3828. This results in the metal liner layer 3828 being substantially absent from and/or omitted from the top surface of the conductive structure 244. This further reduces contact resistance for the BEOL layer 3802. Accordingly, the semiconductor structure 3800 includes a similar configuration of layers and/or structures as the semiconductor structure 2100 of FIG. 21, except that the semiconductor structure 3800 further includes the graphene layer 3824 (and, in some implementations a cobalt layer 3826).

As indicated above, FIG. 38 is provided as an example. Other examples may differ from what is described with regard to FIG. 38.

FIGS. 39A-39F are diagrams of an example implementation 3900 described herein. Example implementation 3900 may be an example process for forming the BEOL layer 3802 over a conductive structure (e.g., the conductive structure 244 or another conductive structure) of the device 200. In particular, the example implementation 3900 includes an example process for forming the BEOL layer 3802 such that the barrier layer 3816, the metal liner layer 3818, and the metal liner layer 3828 are substantially absent from and/or omitted from an interface between the BEOL layer 3802 and the conductive structure 244 as a result of the intervening graphene layer 3824.

Figure 39A:
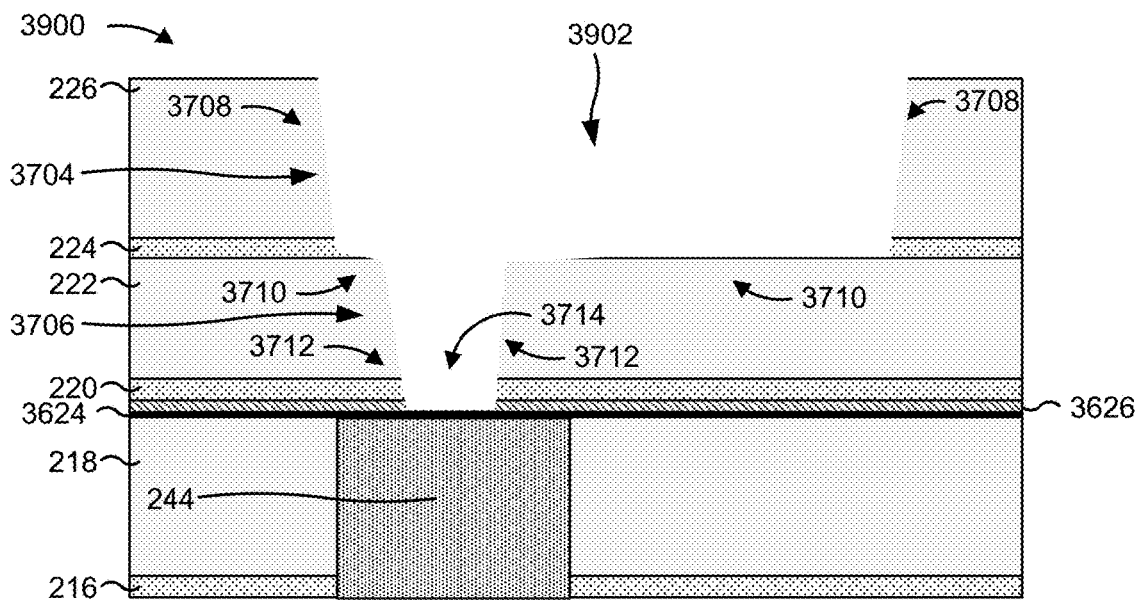
FIGS. 39A-39F are diagrams of an example implementation described herein.
Figure 39B:
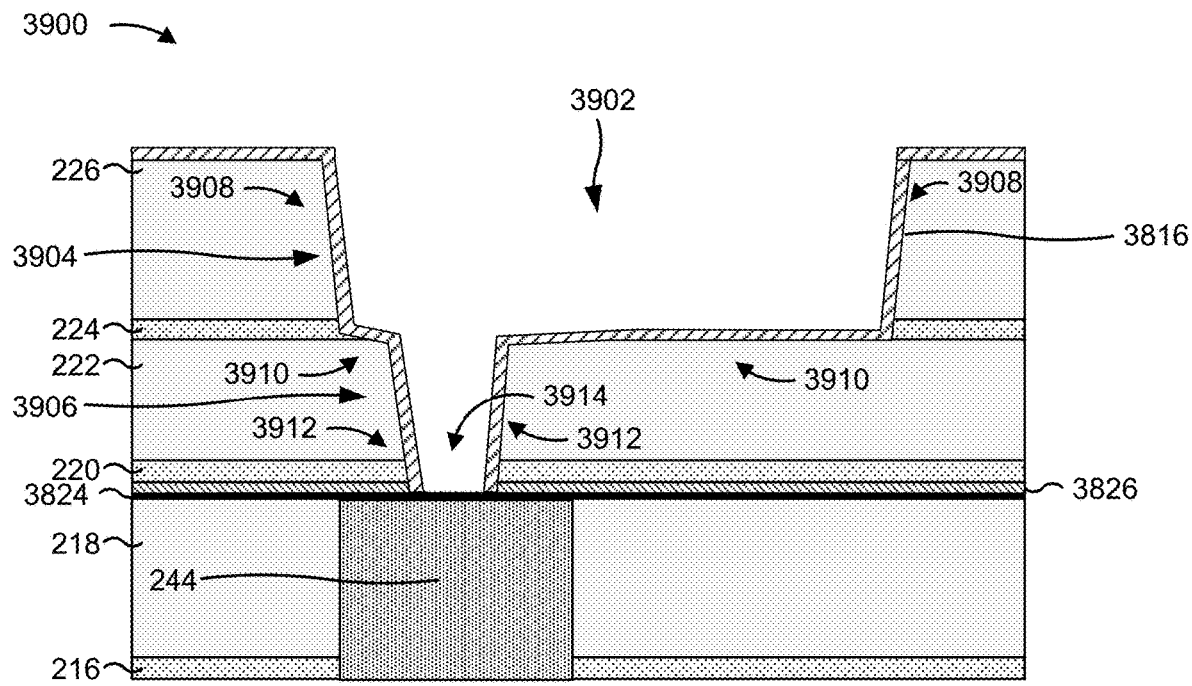
Figure 39C:
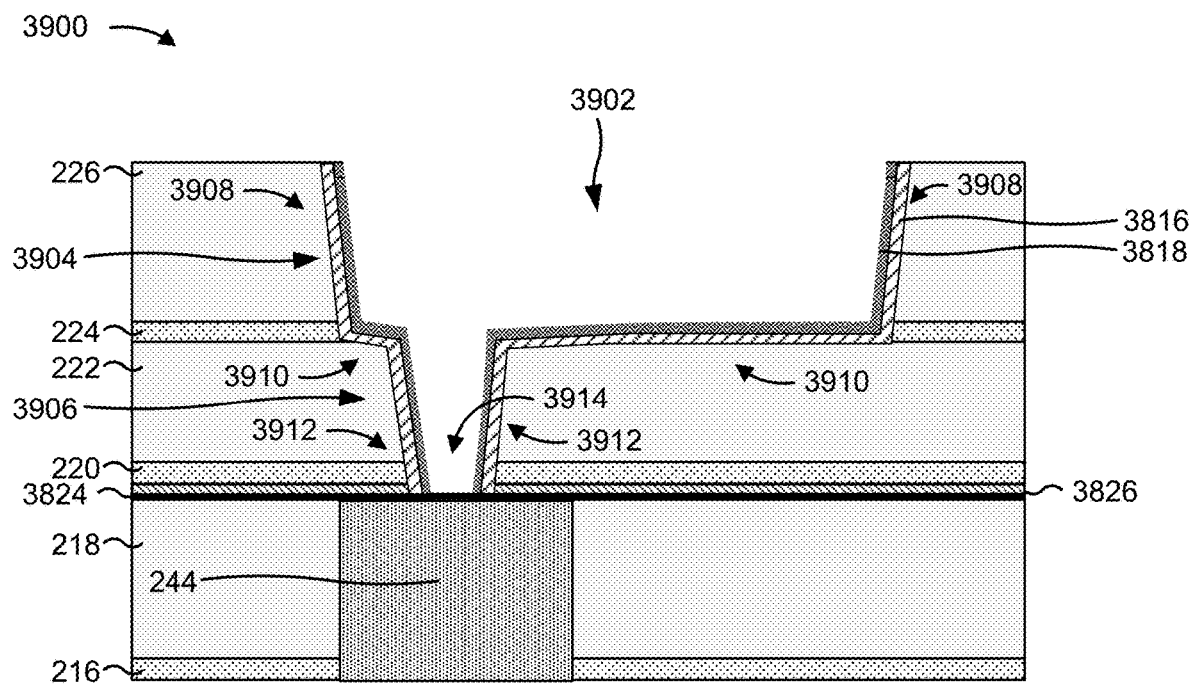
Figure 39D:
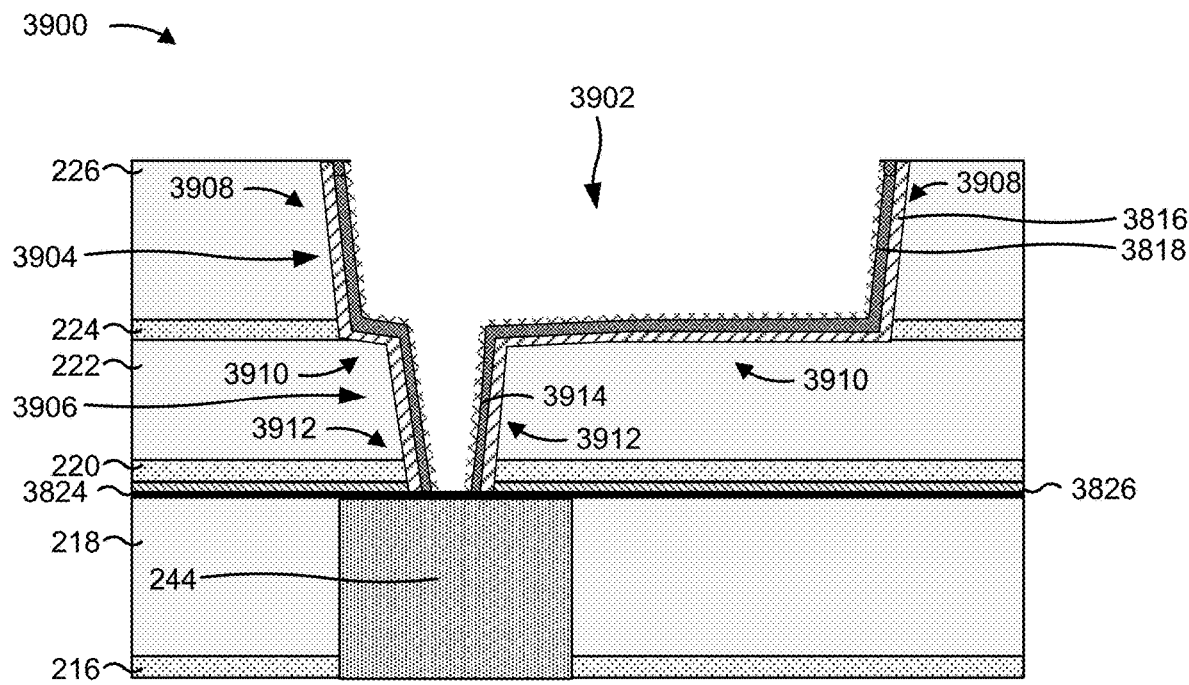
Figure 39E:
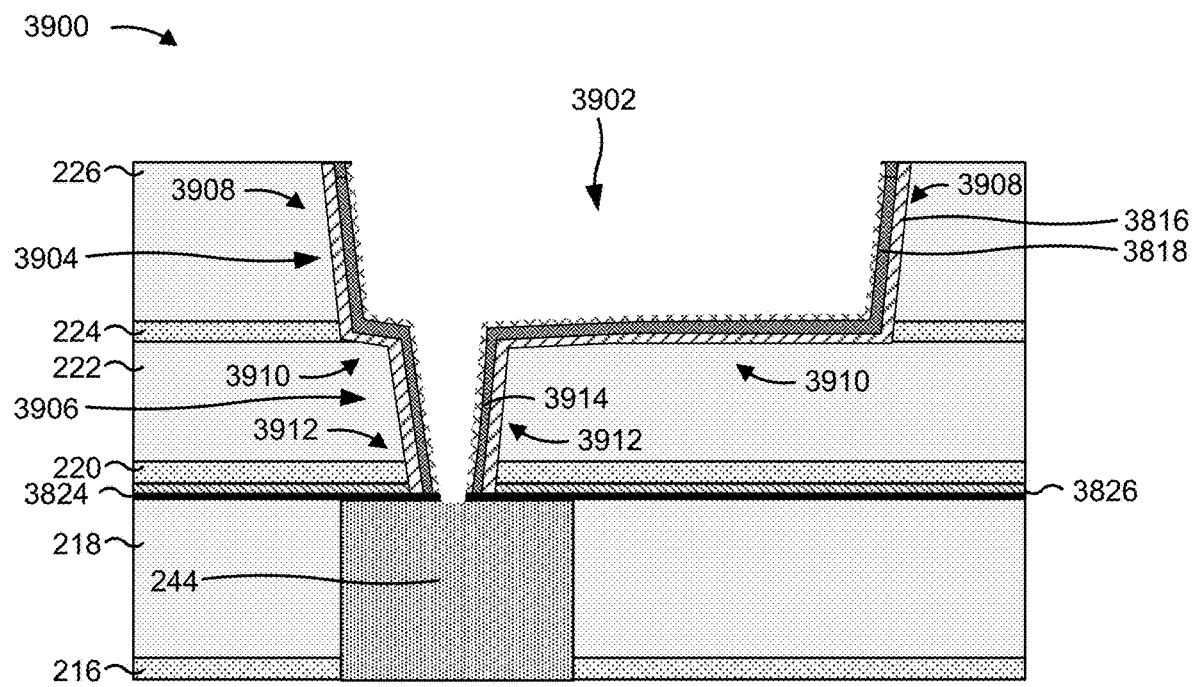

As shown in FIGS. 39A-39F, the example process of the example implementation 3900 mostly follows the example process of the example implementation 3700. Accordingly, similar process details are not reiterated for purposes of brevity. As shown in FIG. 39D, however, the example process of the example implementation 3900 differs from the example process of the example implementation 3700 in that the graphene layer 3824 remains over and/or on the bottom surface 3914 of the opening 3902 (which corresponds to the top surface of the conductive structure 244) during formation of the metal liner layer 3828. As shown in FIG. 39E, the portion of the graphene layer 3824 over the conductive structure 244 is then removed from the bottom surface 3914 of the opening 3902 (e.g., from the top surface of the conductive structure 244) after formation of the metal liner layer 3828. In this way, the metal liner layer 3828 is substantially absent from and/or omitted from the top surface of the conductive structure 244. This further reduces contact resistance for the BEOL layer 3802.

Figure 39F:
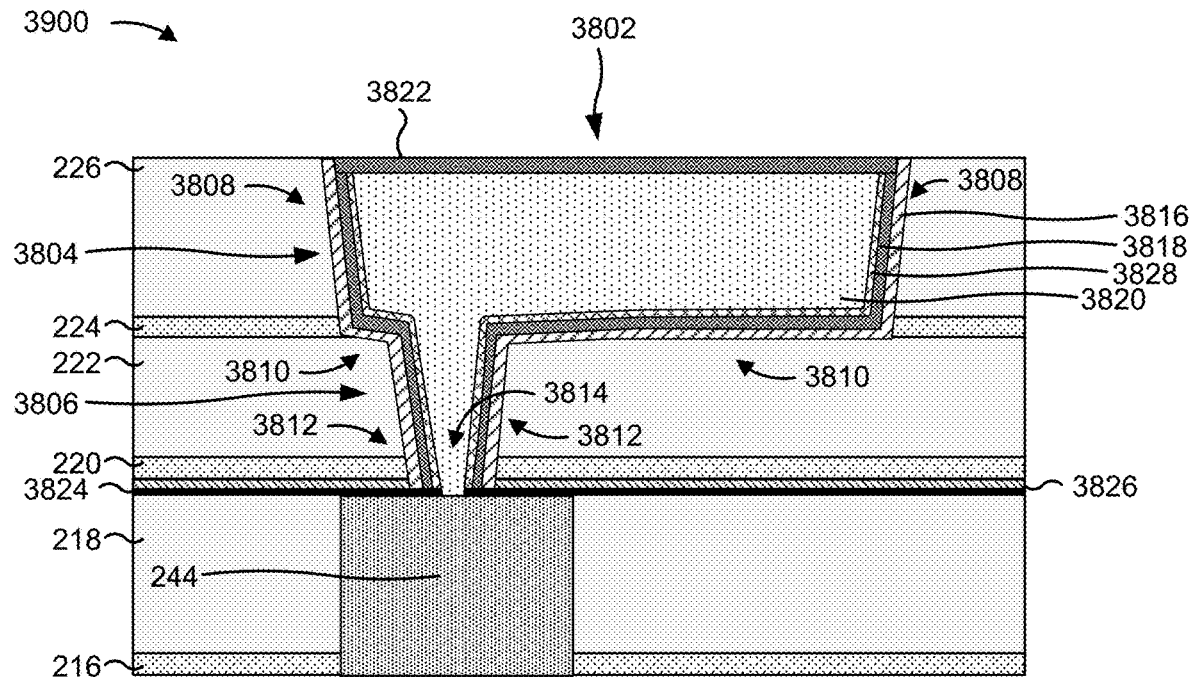

As shown in FIG. 39F, the conductive structure 3820 is formed over the conductive structure 244 and over the metal liner layer 3828. The conductive structure 3820 is electrically coupled directly with the top surface of the conductive structure 244 as a result of the metal liner layer 3828 being substantially absent from and/or omitted from the top surface of the conductive structure 244.

As indicated above, FIGS. 39A-39F are provided as an example. Other examples may differ from what is described with regard to FIGS. 39A-39F. For example, the techniques described in connection with FIGS. 39A-39F may be performed to form a single damascene structure for the BEOL layer 3802. As another example, the techniques described in connection with FIG. 39A-39F may be performed in implementations in which the metal liner layer 3818 includes a ruthenium (Ru) liner as opposed to a cobalt (Co) liner, and in which the metal liner layer 3828 includes a cobalt (Co) liner as opposed to a ruthenium (Ru) liner (similar to the BEOL layer 1102 of the semiconductor structure 1100 in FIG. 11). As another example, the techniques described in connection with FIG. 39A-39F may be performed in implementations in which the cobalt capping layer 3122 alternatively includes a ruthenium cobalt (RuCo) capping layer. As another example, a trimming operation described herein may be performed to reduce the thickness of one or more portions of the metal liner layer 3818 and/or the thickness of one or more portions of the metal liner layer 3828.

Figure 40:
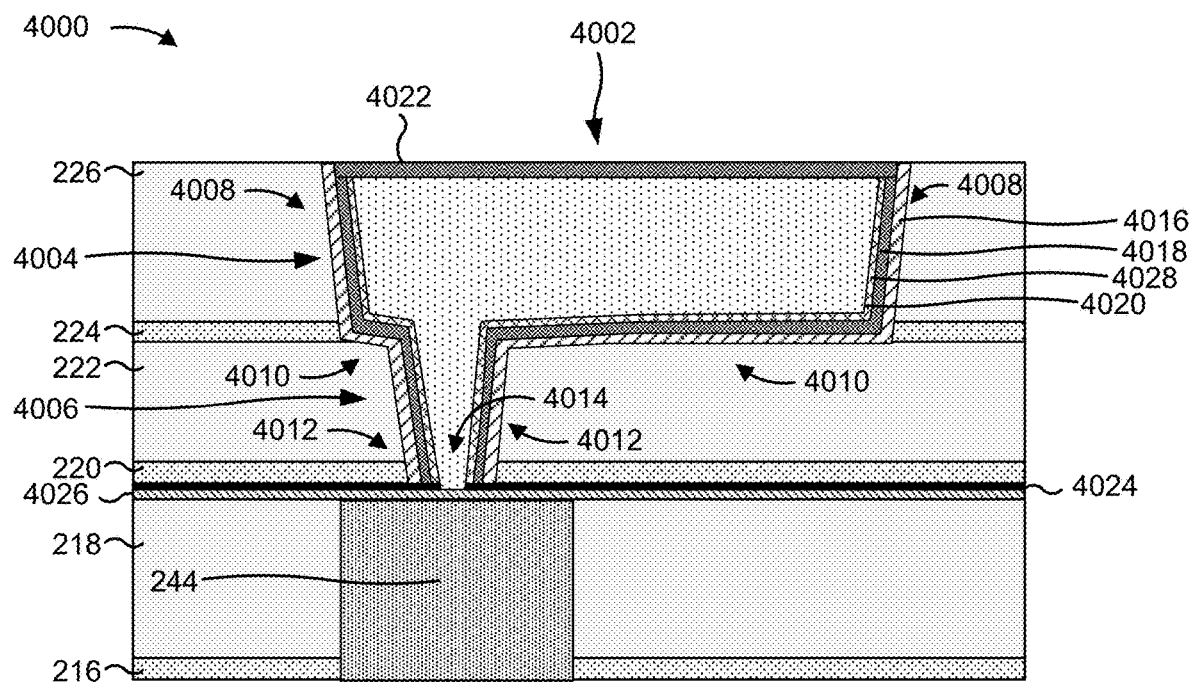
FIGS. 40-51 are diagrams of example semiconductor structures described herein.

FIG. 40 is a diagram of an example semiconductor structure 4000 described herein. The semiconductor structure 4000 includes a BEOL layer 4002, which may include one or more of the BEOL layers of the device 200 described in connection with FIG. 2. The BEOL layer 4002 includes a similar configuration of layers and/or structures as the BEOL layer 3802 of FIG. 38. However, the graphene layer 4024 is included between the cobalt layer 4026 and the ESL 220 as opposed to the graphene layer 3824 being included between the cobalt layer 3826 and the dielectric layer 218 and between the cobalt layer 3826 and the conductive structure 244. In these implementations, the conductive structure 4020 is electrically coupled directly with the cobalt layer 4026, and is electrically coupled with the conductive structure 244 through the cobalt layer 4026.

As indicated above, FIG. 40 is provided as an example. Other examples may differ from what is described with regard to FIG. 40. For example, the BEOL layer 4002 may alternatively include a single damascene structure. As another example, the metal liner layer 4018 may alternatively include a ruthenium (Ru) liner as opposed to a cobalt (Co) liner, and the metal liner layer 4028 may alternatively include a cobalt (Co) liner as opposed to a ruthenium (Ru) liner (similar to the BEOL layer 1102 of the semiconductor structure 1100 in FIG. 11). As another example, the cobalt capping layer 4022 may alternatively include a ruthenium cobalt (RuCo) capping layer. As another example, a trimming operation described herein may be performed to reduce the thickness of one or more portions of the metal liner layer 4018 and/or the thickness of one or more portions of the metal liner layer 4028.

Figure 41:
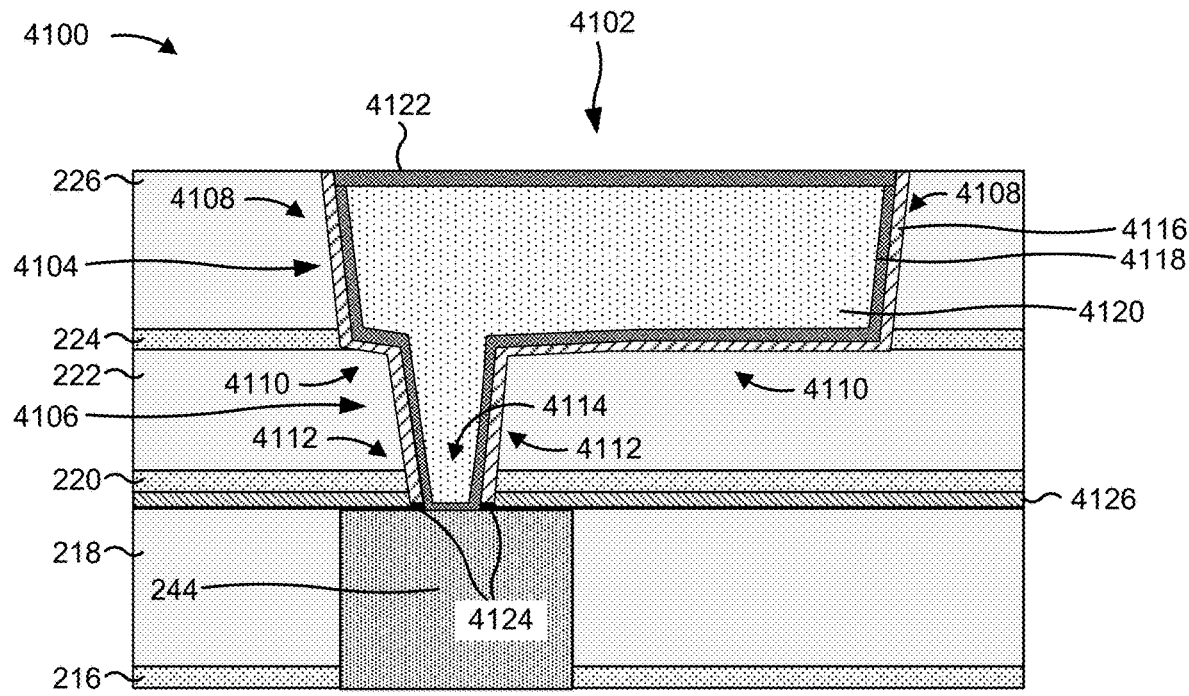

FIG. 41 is a diagram of an example semiconductor structure 4100 described herein. The semiconductor structure 4100 includes a BEOL layer 4102, which may include one or more of the BEOL layers of the device 200 described in connection with FIG. 2. The BEOL layer 4102 includes a similar configuration of layers and/or structures as the BEOL layer 2902 of FIG. 29. However, the graphene layer 4124 is included between the barrier layer 4116 and the top surface of the conductive structure 244 only, as opposed to being an interfacial layer between the cobalt layer 4126 and the ESL 220. This is because the graphene layer 4124 is formed through an opening (e.g., an opening in the dielectric layers 222, 226 and in the ESLs 220, 224) in which the BEOL layer 4102 is formed, as opposed to being formed as an interfacial layer prior to formation of the dielectric layers 222, 226 and in the ESLs 220, 224.

In some implementations, the graphene layer 4124 is used instead of the blocking layer 416 of the example implementation 400 to block the formation of the barrier layer 4116 on the top surface of the conductive structure 244. In some implementations, the graphene layer 4124 is then removed from the top surface of the conductive structure 244, as described in the example implementation 3000. However, a portion of the graphene layer 4124 may remain between the barrier layer 4116 and the top surface of the conductive structure 244.

As indicated above, FIG. 41 is provided as an example. Other examples may differ from what is described with regard to FIG. 41. For example, the BEOL layer 4102 may alternatively include a single damascene structure. As another example, the metal liner layer 4118 may alternatively include a ruthenium (Ru) liner as opposed to a cobalt (Co) liner (similar to the BEOL layer 1300 of the semiconductor structure 1300 in FIG. 13). As another example, the cobalt capping layer 4122 may alternatively include a ruthenium cobalt (RuCo) capping layer. As another example, a trimming operation described herein may be performed to reduce the thickness of one or more portions of the metal liner layer 4118.

Figure 42:
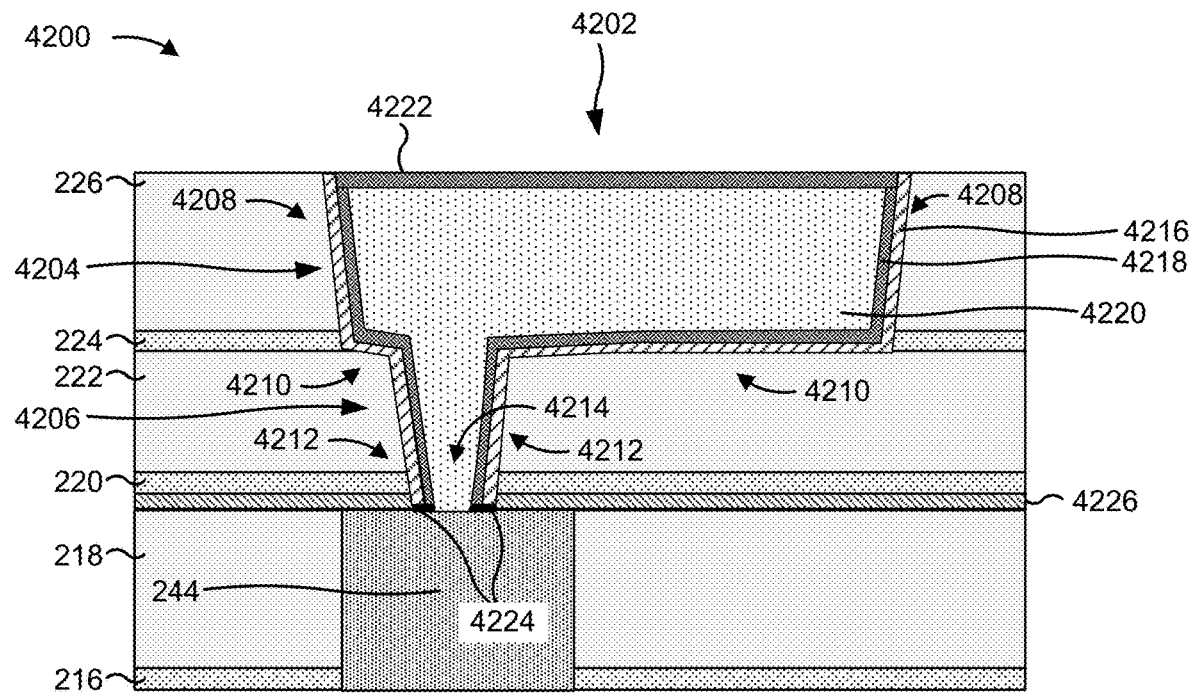

FIG. 42 is a diagram of an example semiconductor structure 4200 described herein. The semiconductor structure 4200 includes a BEOL layer 4202, which may include one or more of the BEOL layers of the device 200 described in connection with FIG. 2. The BEOL layer 4202 includes a similar configuration of layers and/or structures as the BEOL layer 3102 of FIG. 31. However, the graphene layer 4224 is included between the barrier layer 4216 and the top surface of the conductive structure 244 and between the metal liner layer 4218 and the top surface of the conductive structure 244 only, as opposed to being an interfacial layer between the dielectric layer 218 and the cobalt layer 4226 (or between the cobalt layer 4226 and the ESL 220). This is because the graphene layer 4224 is formed through an opening (e.g., an opening in the dielectric layers 222, 226 and in the ESLs 220, 224) in which the BEOL layer 4202 is formed, as opposed to being formed as an interfacial layer prior to formation of the dielectric layers 222, 226 and in the ESLs 220, 224.

In some implementations, the graphene layer 4224 is used instead of the blocking layer 616 of the example implementation 600 to block the formation of the barrier layer 4216 and the metal liner layer 4218 on the top surface of the conductive structure 244. In some implementations, the graphene layer 4224 is then removed from the top surface of the conductive structure 244, as described in the example implementation 3200. However, a portion of the graphene layer 4224 may remain between the barrier layer 4216 and the top surface of the conductive structure 244, and between the metal liner layer 4218 and the top surface of the conductive structure 244.

In the example semiconductor structure 4200 of FIG. 42, the metal liner layer 4218 may include a cobalt (Co) liner and the conductive structure 244 (the bottom interconnect) may include ruthenium (Ru). The graphene layer 4224 may be included between the metal liner layer 4218 and the conductive structure 244 to prevent cobalt diffusion into the ruthenium bottom interconnect (e.g., the conductive structure 244).

As indicated above, FIG. 42 is provided as an example. Other examples may differ from what is described with regard to FIG. 42. For example, the BEOL layer 4202 may alternatively include a single damascene structure. As another example, the metal liner layer 4218 may alternatively include a ruthenium (Ru) liner as opposed to a cobalt (Co) liner (similar to the BEOL layer 1502 of the semiconductor structure 1500 in FIG. 15). As another example, the cobalt capping layer 4222 may alternatively include a ruthenium cobalt (RuCo) capping layer. As another example, a trimming operation described herein may be performed to reduce the thickness of one or more portions of the metal liner layer 4218.

Figure 43:
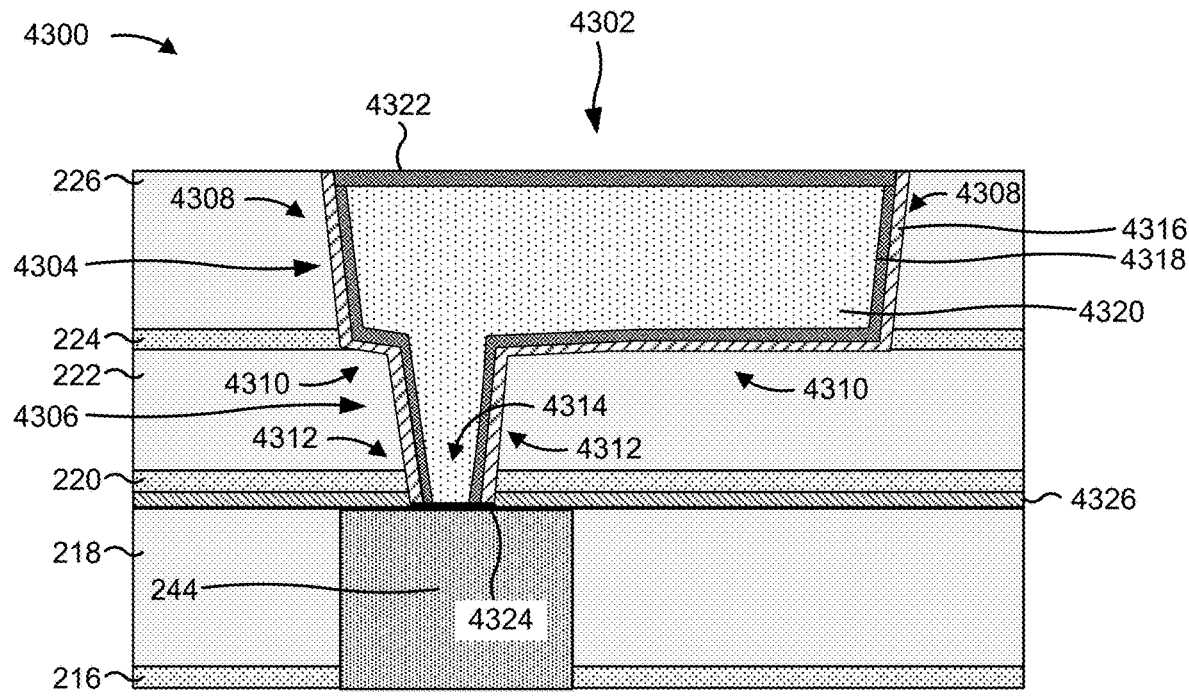

FIG. 43 is a diagram of an example semiconductor structure 4300 described herein. The semiconductor structure 4300 includes a BEOL layer 4302, which may include one or more of the BEOL layers of the device 200 described in connection with FIG. 2. The BEOL layer 4302 includes a similar configuration of layers and/or structures as the BEOL layer 4202 of FIG. 42. However, the graphene layer 4324 is included between the conductive structure 4320 and the conductive structure 244. As a result, the graphene layer 4324 is electrically coupled directly with the top surface of the conductive structure 244 and the conductive structure 4320 is electrically coupled with the conductive structure 244 through the graphene layer 4324, as opposed to the conductive structure 4220 being electrically coupled directly with the top surface of the conductive structure 244.

The graphene layer 4324 is formed to prevent or block the barrier layer 4316 and the metal liner layer 4318 from forming on the conductive structure 244. Here, the graphene layer 4324 functions as a blocking layer and resists bonding to the barrier layer 4316 and the metal liner layer 4318 because of the lack of vertical bonding sites on the graphene layer 4324. After formation of the barrier layer 4316 and the metal liner layer 4318, the plasma tool 116 performs a plasma operation to create bonding sites on the graphene layer 4324 for the material of the conductive structure 4320. Without the plasma operation, the conductive structure 4320 may experience poor adhesion and/or bonding to the graphene layer 4324, which may result in the formation of voids between the graphene layer 4324 and the conductive structure 4320. The plasma operation is performed to break the graphene structure of the graphene layer 4324 to form carbon ligands (e.g., carbonyl (—CO) ligands and/or cyanide (—CN) ligands, among other examples) and/or to break the SP2 bonds of the graphene layer 4324. In some implementations, the plasma tool 116 uses a plasma such as a nitrogen ($N_2$) plasma, an ammonia ($NH_3$) plasma, an argon (Ar) plasma, an oxygen ($O_2$) plasma, and/or another type of plasma to break the graphene structure of the graphene layer 4324. The plasma tool 116 then uses a hydrogen ($H_2$) plasma and/or hydrogen (H) radicals to remove the ligands from the graphene structure of the graphene layer 4324, which creates nucleation (e.g., bonding) sites for the conductive structure 4320. The conductive structure 4320 is then formed over the graphene layer 4324 such that the conductive structure 4320 bonds to the nucleation sites.

As indicated above, FIG. 43 is provided as an example. Other examples may differ from what is described with regard to FIG. 43. For example, the BEOL layer 4302 may alternatively include a single damascene structure. As another example, the metal liner layer 4318 may alternatively include a ruthenium (Ru) liner as opposed to a cobalt (Co) liner (similar to the BEOL layer 1502 of the semiconductor structure 1500 in FIG. 15). As another example, the cobalt capping layer 4322 may alternatively include a ruthenium cobalt (RuCo) capping layer. As another example, a trimming operation described herein may be performed to reduce the thickness of one or more portions of the metal liner layer 4318.

Figure 44:
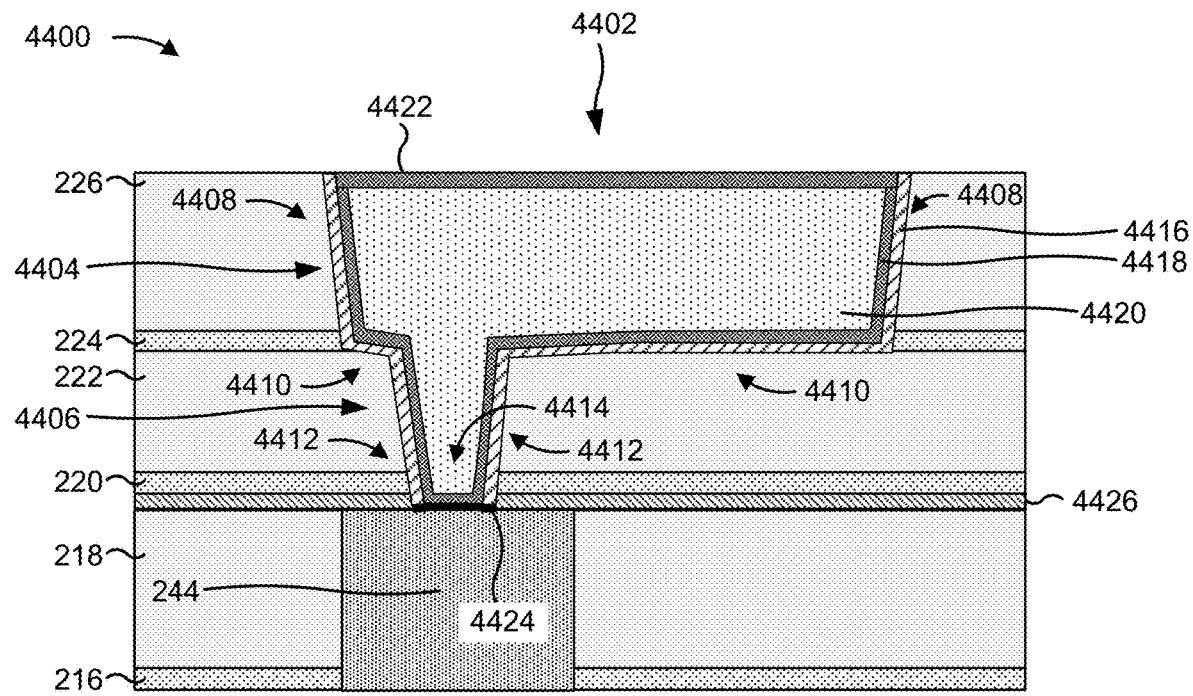

FIG. 44 is a diagram of an example semiconductor structure 4400 described herein. The semiconductor structure 4400 includes a BEOL layer 4402, which may include one or more of the BEOL layers of the device 200 described in connection with FIG. 2. The BEOL layer 4402 includes a similar configuration of layers and/or structures as the BEOL layer 4102 of FIG. 41. However, the graphene layer 4424 is included between the conductive structure 244 and the metal liner layer 4418 at the bottom surface 4414 of the BEOL layer 4402. As a result, the graphene layer 4424 is electrically coupled directly with the top surface of the conductive structure 244, metal liner layer 4418 is electrically coupled directly with the graphene layer 4424, and the conductive structure 4420 is electrically coupled with the conductive structure 244 through the graphene layer 4424 and the metal liner layer 4418.

The plasma tool 116 may form the semiconductor structure 4400 using the plasma operation described above in connection with FIG. 43. In particular, the plasma tool 116 performs the plasma operation after formation of the barrier layer 4416 to create nucleation sites in the graphene layer 4424 for the metal liner layer 4418.

As indicated above, FIG. 44 is provided as an example. Other examples may differ from what is described with regard to FIG. 44. For example, the BEOL layer 4402 may alternatively include a single damascene structure. As another example, the metal liner layer 4418 may alternatively include a ruthenium (Ru) liner as opposed to a cobalt (Co) liner (similar to the BEOL layer 1302 of the semiconductor structure 1300 in FIG. 13). As another example, the cobalt capping layer 4422 may alternatively include a ruthenium cobalt (RuCo) capping layer. As another example, a trimming operation described herein may be performed to reduce the thickness of one or more portions of the metal liner layer 4418.

Figure 45:
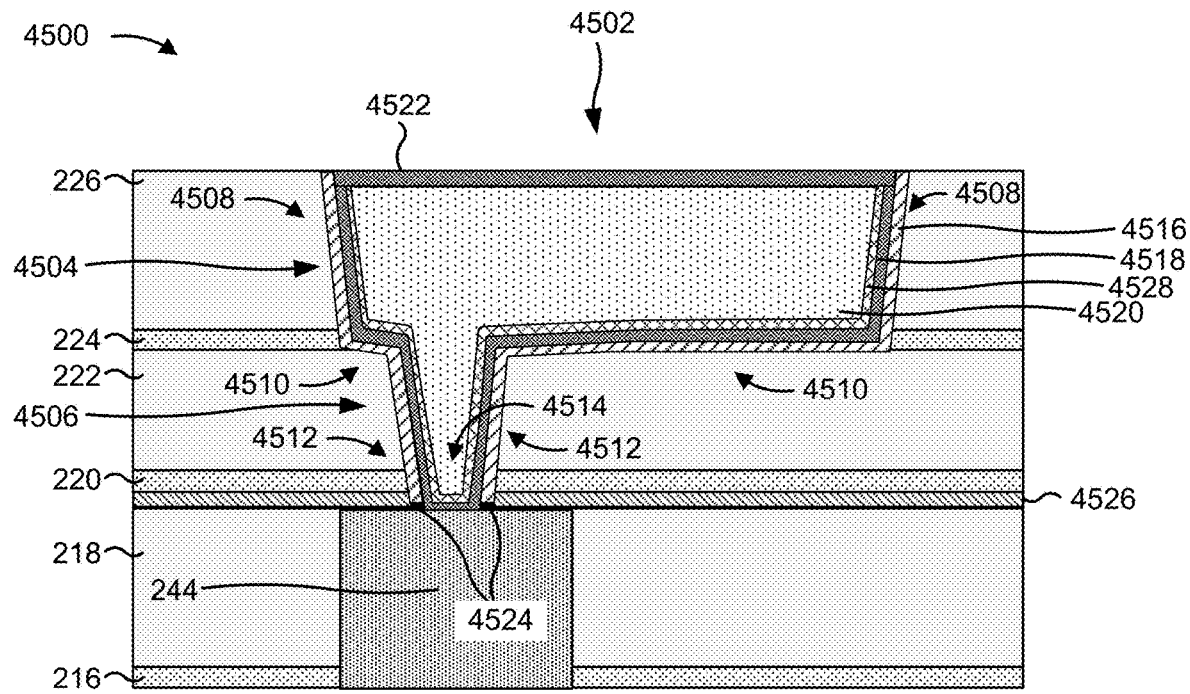

FIG. 45 is a diagram of an example semiconductor structure 4500 described herein. The semiconductor structure 4500 includes a BEOL layer 4502, which may include one or more of the BEOL layers of the device 200 described in connection with FIG. 2. The BEOL layer 4502 includes a similar configuration of layers and/or structures as the BEOL layer 4102 of FIG. 41. However, the BEOL layer 4502 includes another metal liner layer 4528 between the metal liner layer 4518 and the conductive structure 4520. As a result, the metal liner layer 4518 is electrically coupled directly with the top surface of the conductive structure 244, the metal liner layer 4528 is electrically coupled directly with the metal liner layer 4518, and the conductive structure 4520 is electrically coupled with the conductive structure 244 through the metal liner layers 4518 and 4528.

The plasma tool 116 may form the semiconductor structure 4500 using the plasma operation described above in connection with FIG. 43. In particular, the plasma tool 116 performs the plasma operation after formation of the barrier layer 4516 to create nucleation sites in the graphene layer 4524 for the metal liner layer 4518. The metal liner layer 4528 is then formed over and/or on the metal liner layer 4518, and the conductive structure 4520 is formed over and/or on the metal liner layer 4528.

In the example semiconductor structure 4500 of FIG. 45, the metal liner layer 4528 may include a cobalt (Co) liner and the conductive structure 244 (the bottom interconnect) may include ruthenium (Ru). The metal liner layer 4518 may include ruthenium (Ru). Cobalt may easily occupy ruthenium vacancies, but may have difficulty to be interstitials. Thus for cobalt of the metal liner layer 4528 to diffuse into the ruthenium of the conductive structure 244, the vacancies in the ruthenium need to be adjacent. The ruthenium of the metal liner layer 4518 and the cobalt of the metal liner layer 4528 intermix, which results in RuCo intermixing at the grain boundary. This intermixing helps to further reduce diffusion of the cobalt of the metal liner layer 4528 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 4524 may be included between the metal liner layer 4528 and the conductive structure 244 to further prevent cobalt diffusion into the ruthenium bottom interconnect (e.g., the conductive structure 244). Moreover, the graphene layer 4524 can help to reduce scattering between the cobalt and ruthenium because of the two-dimensional dangling bond free graphene of the graphene layer 4524.

As indicated above, FIG. 45 is provided as an example. Other examples may differ from what is described with regard to FIG. 45. For example, the BEOL layer 4502 may alternatively include a single damascene structure. As another example, the metal liner layer 4518 may alternatively include a ruthenium (Ru) liner as opposed to a cobalt (Co) liner, and the metal liner layer 4528 may alternatively include a cobalt (Co) liner as opposed to a ruthenium (Ru) liner (similar to the BEOL layer 702 of the semiconductor structure 700 in FIG. 7). As another example, the cobalt capping layer 4522 may alternatively include a ruthenium cobalt (RuCo) capping layer. As another example, a trimming operation described herein may be performed to reduce the thickness of one or more portions of the metal liner layer 4518 and/or to reduce the thickness of one or more portions of the metal liner layer 4528.

Figure 46:
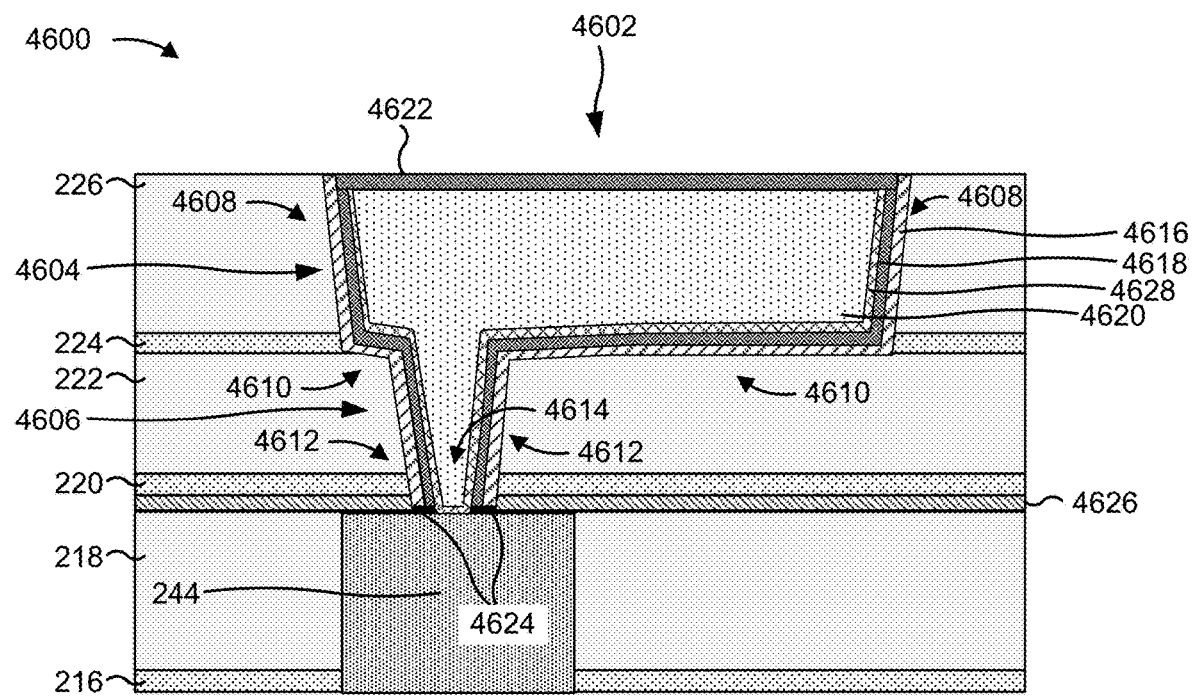

FIG. 46 is a diagram of an example semiconductor structure 4600 described herein. The semiconductor structure 4600 includes a BEOL layer 4602, which may include one or more of the BEOL layers of the device 200 described in connection with FIG. 2. The BEOL layer 4602 includes a similar configuration of layers and/or structures as the BEOL layer 4502 of FIG. 45. However, the graphene layer 4624 is between the top surface of the conductive structure 244 and the metal liner layer 4618 at the bottom surface 4614 of the BEOL layer 4602. The graphene layer 4624 is removed from the top surface of the conductive structure 244 after formation of the barrier layer 4616 and the metal liner layer 4618. The metal liner layer 4628 is then formed over and/or on the metal liner layer 4618 and over and/or on the top surface of the conductive structure 244. As a result, the metal liner layer 4628 is electrically coupled directly with the top surface of the conductive structure 244, and the conductive structure 4620 is electrically coupled with the conductive structure 244 through the metal liner layer 4628. Portions of the graphene layer 4624 may remain between the top surface of the conductive structure 244 and the barrier layer 4616, and between the top surface of the conductive structure 244 and the metal liner layer 4618.

In the example semiconductor structure 4600 of FIG. 46, the metal liner layer 4628 may include a cobalt (Co) liner and the conductive structure 244 (the bottom interconnect) may include ruthenium (Ru). The metal liner layer 4618 may include ruthenium (Ru). Cobalt may easily occupy ruthenium vacancies, but may have difficulty to be interstitials. Thus for cobalt of the metal liner layer 4628 to diffuse into the ruthenium of the conductive structure 244, the vacancies in the ruthenium need to be adjacent. The ruthenium of the metal liner layer 4618 and the cobalt of the metal liner layer 4628 intermix, which results in RuCo intermixing at the grain boundary. This intermixing helps to further reduce diffusion of the cobalt of the metal liner layer 4628 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 4624 may be included between the metal liner layer 4628 and the conductive structure 244 to further prevent cobalt diffusion into the ruthenium bottom interconnect (e.g., the conductive structure 244). Moreover, the graphene layer 4624 can help to reduce scattering between the cobalt and ruthenium because of the two-dimensional dangling bond free graphene of the graphene layer 4624.

As indicated above, FIG. 46 is provided as an example. Other examples may differ from what is described with regard to FIG. 46. For example, the BEOL layer 4602 may alternatively include a single damascene structure. As another example, the metal liner layer 4618 may alternatively include a ruthenium (Ru) liner as opposed to a cobalt (Co) liner, and the metal liner layer 4628 may alternatively include a cobalt (Co) liner as opposed to a ruthenium (Ru) liner (similar to the BEOL layer 902 of the semiconductor structure 900 in FIG. 9). As another example, the cobalt capping layer 4622 may alternatively include a ruthenium cobalt (RuCo) capping layer. As another example, a trimming operation described herein may be performed to reduce the thickness of one or more portions of the metal liner layer 4618 and/or to reduce the thickness of one or more portions of the metal liner layer 4628.

Figure 47:
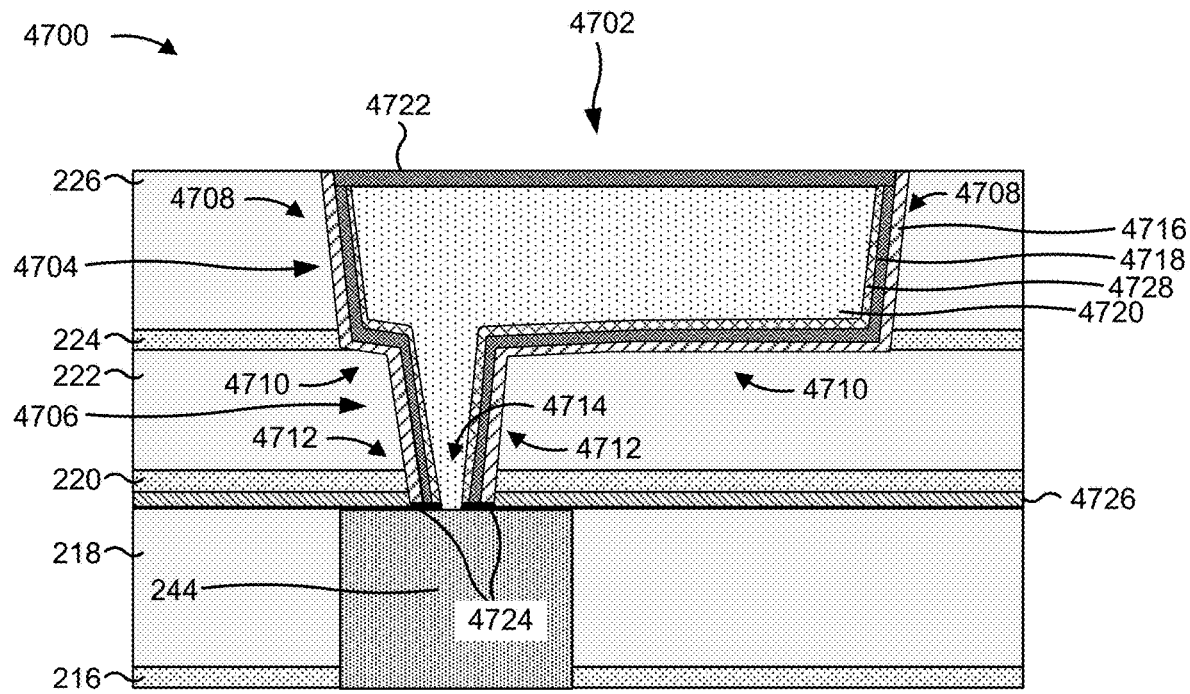

FIG. 47 is a diagram of an example semiconductor structure 4700 described herein. The semiconductor structure 4700 includes a BEOL layer 4702, which may include one or more of the BEOL layers of the device 200 described in connection with FIG. 2. The BEOL layer 4702 includes a similar configuration of layers and/or structures as the BEOL layer 3802 of FIG. 38. However, the graphene layer 4724 is included between the barrier layer 4716 and the top surface of the conductive structure 244, between the metal liner layer 4718 and the top surface of the conductive structure 244, and between the metal liner layer 4728 and the top surface of the conductive structure 244 only, as opposed to being an interfacial layer between the dielectric layer 218 and the cobalt layer 4726 (or between the cobalt layer 4726 and the ESL 220). This is because the graphene layer 4724 is formed through an opening (e.g., an opening in the dielectric layers 222, 226 and in the ESLs 220, 224) in which the BEOL layer 4702 is formed, as opposed to being formed as an interfacial layer prior to formation of the dielectric layers 222, 226 and in the ESLs 220, 224.

In some implementations, the graphene layer 4724 is used instead of the blocking layer 2216 of the example implementation 2200 to block the formation of the barrier layer 4716, the metal liner layer 4718, and the metal liner layer 4728 on the top surface of the conductive structure 244. In some implementations, the graphene layer 4724 is then removed from the top surface of the conductive structure 244 through the opening, as described in the example implementation 3900. However, a portion of the graphene layer 4724 may remain between the barrier layer 4716 and the top surface of the conductive structure 244, between the metal liner layer 4718 and the top surface of the conductive structure 244, and between the metal liner layer 4728 and the top surface of the conductive structure 244.

In the example semiconductor structure 4700 of FIG. 47, the metal liner layer 4728 may include a cobalt (Co) liner and the conductive structure 244 (the bottom interconnect) may include ruthenium (Ru). The metal liner layer 4718 may include ruthenium (Ru). Cobalt may easily occupy ruthenium vacancies, but may have difficulty to be interstitials. Thus for cobalt of the metal liner layer 4728 to diffuse into the ruthenium of the conductive structure 244, the vacancies in the ruthenium need to be adjacent. The ruthenium of the metal liner layer 4718 and the cobalt of the metal liner layer 4728 intermix, which results in RuCo intermixing at the grain boundary. This intermixing helps to further reduce diffusion of the cobalt of the metal liner layer 4728 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 4724 may be included between the metal liner layer 4728 and the conductive structure 244 to further prevent cobalt diffusion into the ruthenium bottom interconnect (e.g., the conductive structure 244). Moreover, the graphene layer 4724 can help to reduce scattering between the cobalt and ruthenium because of the two-dimensional dangling bond free graphene of the graphene layer 4724.

As indicated above, FIG. 47 is provided as an example. Other examples may differ from what is described with regard to FIG. 47. For example, the BEOL layer 4702 may alternatively include a single damascene structure. As another example, the metal liner layer 4718 may alternatively include a ruthenium (Ru) liner as opposed to a cobalt (Co) liner, and the metal liner layer 4728 may alternatively include a cobalt (Co) liner as opposed to a ruthenium (Ru) liner (similar to the BEOL layer 1102 of the semiconductor structure 1100 in FIG. 11). As another example, the cobalt capping layer 4722 may alternatively include a ruthenium cobalt (RuCo) capping layer. As another example, a trimming operation described herein may be performed to reduce the thickness of one or more portions of the metal liner layer 4718 and/or to reduce the thickness of one or more portions of the metal liner layer 4728.

Figure 48:
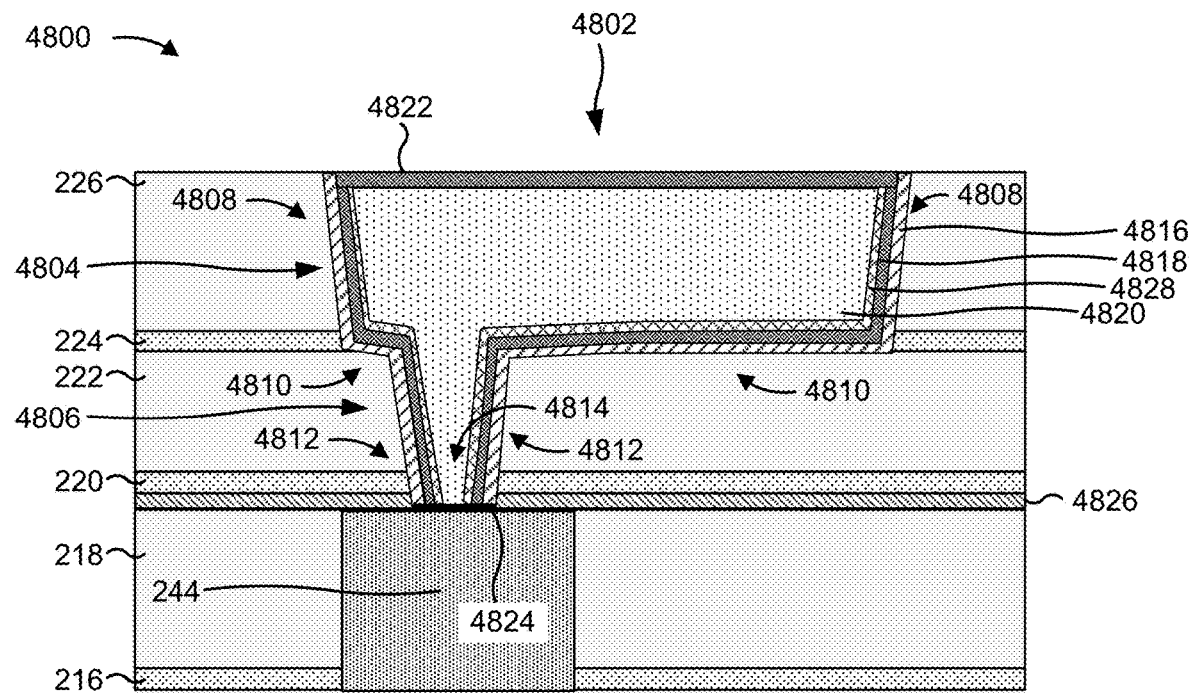

FIG. 48 is a diagram of an example semiconductor structure 4800 described herein. The semiconductor structure 4800 includes a BEOL layer 4802, which may include one or more of the BEOL layers of the device 200 described in connection with FIG. 2. The BEOL layer 4802 includes a similar configuration of layers and/or structures as the BEOL layer 4702 of FIG. 47. However, the graphene layer 4824 is included between the conductive structure 4820 and the conductive structure 244. As a result, the graphene layer 4824 is electrically coupled directly with the top surface of the conductive structure 244 and the conductive structure 4820 is electrically coupled with the conductive structure 244 through the graphene layer 4824, as opposed to the conductive structure 4720 being electrically coupled directly with the top surface of the conductive structure 244.

The plasma tool 116 may form the semiconductor structure 4800 using the plasma operation described above in connection with FIG. 43. In particular, the plasma tool 116 performs the plasma operation after formation of the barrier layer 4816, the metal liner layer 4818, and the metal liner layer 4828 to create nucleation sites in the graphene layer 4824 for the conductive structure 4820.

In the example semiconductor structure 4800 of FIG. 48, the metal liner layer 4828 may include a cobalt (Co) liner and the conductive structure 244 (the bottom interconnect) may include ruthenium (Ru). The metal liner layer 4818 may include ruthenium (Ru). Cobalt may easily occupy ruthenium vacancies, but may have difficulty to be interstitials. Thus for cobalt of the metal liner layer 4828 to diffuse into the ruthenium of the conductive structure 244, the vacancies in the ruthenium need to be adjacent. The ruthenium of the metal liner layer 4818 and the cobalt of the metal liner layer 4828 intermix, which results in RuCo intermixing at the grain boundary. This intermixing helps to further reduce diffusion of the cobalt of the metal liner layer 4828 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 4824 may be included between the metal liner layer 4828 and the conductive structure 244 to further prevent cobalt diffusion into the ruthenium bottom interconnect (e.g., the conductive structure 244). Moreover, the graphene layer 4824 can help to reduce scattering between the cobalt and ruthenium because of the two-dimensional dangling bond free graphene of the graphene layer 4824.

As indicated above, FIG. 48 is provided as an example. Other examples may differ from what is described with regard to FIG. 48. For example, the BEOL layer 4802 may alternatively include a single damascene structure. As another example, the metal liner layer 4818 may alternatively include a ruthenium (Ru) liner as opposed to a cobalt (Co) liner, and the metal liner layer 4828 may alternatively include a cobalt (Co) liner as opposed to a ruthenium (Ru) liner (similar to the BEOL layer 1102 of the semiconductor structure 1100 in FIG. 11). As another example, the cobalt capping layer 4822 may alternatively include a ruthenium cobalt (RuCo) capping layer. As another example, a trimming operation described herein may be performed to reduce the thickness of one or more portions of the metal liner layer 4818 and/or to reduce the thickness of one or more portions of the metal liner layer 4828.

Figure 49:
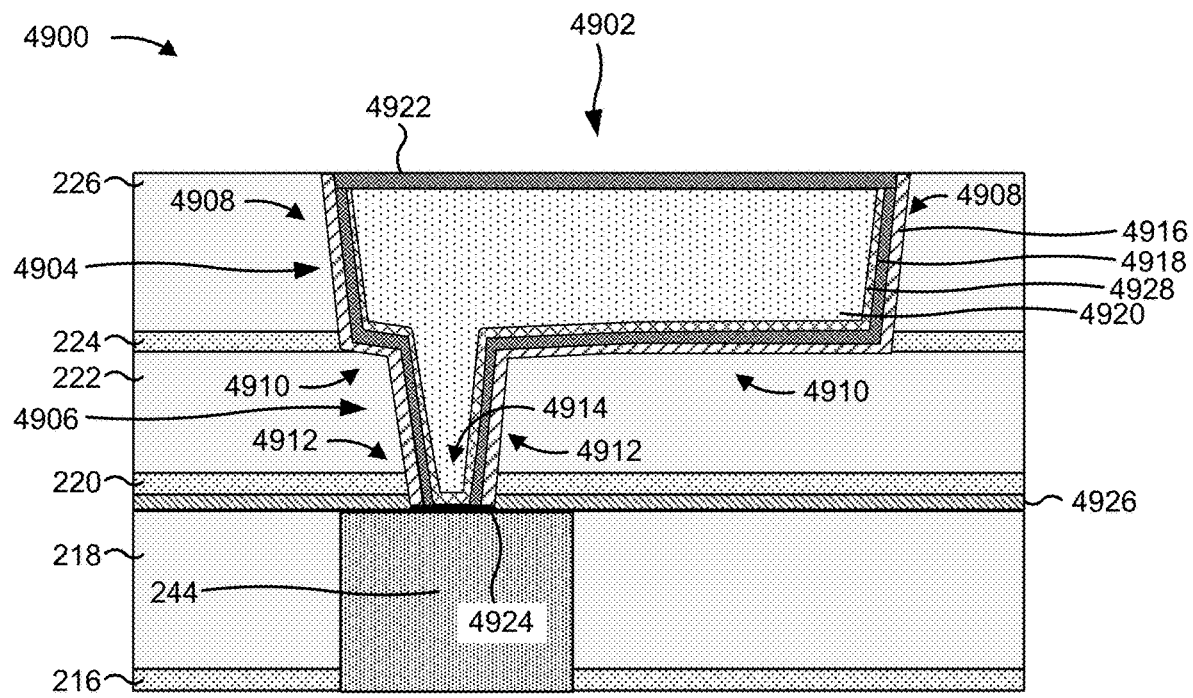

FIG. 49 is a diagram of an example semiconductor structure 4900 described herein. The semiconductor structure 4900 includes a BEOL layer 4902, which may include one or more of the BEOL layers of the device 200 described in connection with FIG. 2. The BEOL layer 4902 includes a similar configuration of layers and/or structures as the BEOL layer 4802 of FIG. 48. However, the metal liner layer 4928 is included between the conductive structure 4920 and the graphene layer 4924 at the bottom surface of the BEOL layer 4902. As a result, the graphene layer 4924 is electrically coupled directly with the top surface of the conductive structure 244, the metal liner layer 4928 is electrically coupled directly with the graphene layer 4924, and the conductive structure 4920 is electrically coupled with the conductive structure 244 through the graphene layer 4924 and the metal liner layer 4928, as opposed to the conductive structure 4820 being electrically coupled with the top surface of the conductive structure 244 through the graphene layer 4724.

The plasma tool 116 may form the semiconductor structure 4900 using the plasma operation described above in connection with FIG. 43. In particular, the plasma tool 116 performs the plasma operation after formation of the barrier layer 4916 and the metal liner layer 4918, to create nucleation sites in the graphene layer 4924 for the metal liner layer 4928. The conductive structure 4820 is then formed over and/or on the metal liner layer 4928.

In the example semiconductor structure 4900 of FIG. 49, the metal liner layer 4928 may include a cobalt (Co) liner and the conductive structure 244 (the bottom interconnect) may include ruthenium (Ru). The metal liner layer 4918 may include ruthenium (Ru). Cobalt may easily occupy ruthenium vacancies, but may have difficulty to be interstitials. Thus for cobalt of the metal liner layer 4928 to diffuse into the ruthenium of the conductive structure 244, the vacancies in the ruthenium need to be adjacent. The ruthenium of the metal liner layer 4918 and the cobalt of the metal liner layer 4928 intermix, which results in RuCo intermixing at the grain boundary. This intermixing helps to further reduce diffusion of the cobalt of the metal liner layer 4928 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 4924 may be included between the metal liner layer 4928 and the conductive structure 244 to further prevent cobalt diffusion into the ruthenium bottom interconnect (e.g., the conductive structure 244). Moreover, the graphene layer 4924 can help to reduce scattering between the cobalt and ruthenium because of the two-dimensional dangling bond free graphene of the graphene layer 4924.

As indicated above, FIG. 49 is provided as an example. Other examples may differ from what is described with regard to FIG. 49. For example, the BEOL layer 4902 may alternatively include a single damascene structure. As another example, the metal liner layer 4918 may alternatively include a ruthenium (Ru) liner as opposed to a cobalt (Co) liner, and the metal liner layer 4928 may alternatively include a cobalt (Co) liner as opposed to a ruthenium (Ru) liner (similar to the BEOL layer 902 of the semiconductor structure 900 in FIG. 9). As another example, the cobalt capping layer 4922 may alternatively include a ruthenium cobalt (RuCo) capping layer. As another example, a trimming operation described herein may be performed to reduce the thickness of one or more portions of the metal liner layer 4918 and/or to reduce the thickness of one or more portions of the metal liner layer 4928.

Figure 50:
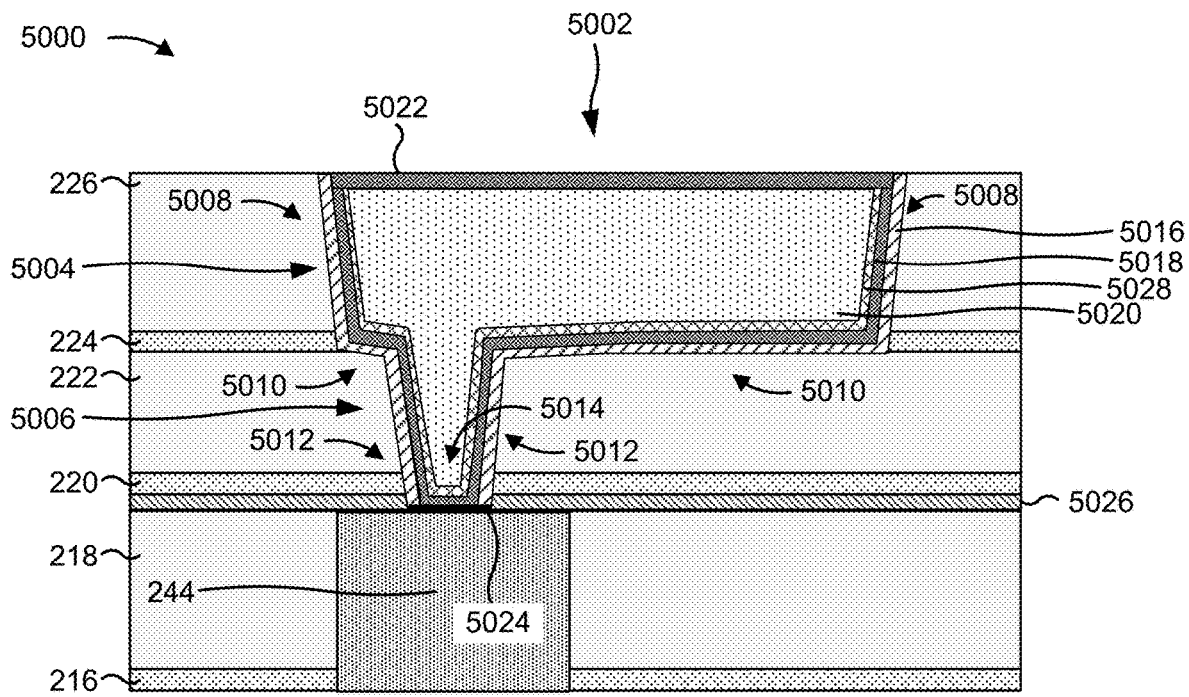

FIG. 50 is a diagram of an example semiconductor structure 5000 described herein. The semiconductor structure 5000 includes a BEOL layer 5002, which may include one or more of the BEOL layers of the device 200 described in connection with FIG. 2. The BEOL layer 5002 includes a similar configuration of layers and/or structures as the BEOL layer 4902 of FIG. 49. However, the metal liner layer 5018 and the metal liner layer 5028 are included between the conductive structure 5020 and the graphene layer 5024 at the bottom surface 5014 of the BEOL layer 5002. As a result, the graphene layer 5024 is electrically coupled directly with the top surface of the conductive structure 244, the metal liner layer 5018 is electrically coupled directly with the graphene layer 5024, the metal liner layer 5028 is electrically coupled directly with the metal liner layer 5018, and the conductive structure 5020 is electrically coupled with the conductive structure 244 through the graphene layer 5024 and the metal liner layers 5018 and 5028.

The plasma tool 116 may form the semiconductor structure 5000 using the plasma operation described above in connection with FIG. 43. In particular, the plasma tool 116 performs the plasma operation after formation of the barrier layer 5016 and prior to formation of the metal liner layer 5018 to create nucleation sites in the graphene layer 5024 for the metal liner layer 5018. The metal liner layer 5018 is then formed, the metal liner layer 5028 is formed over and/or on the metal liner layer 5018, and the conductive structure 5020 is then formed over and/or on the metal liner layer 5028.

In the example semiconductor structure 5000 of FIG. 50, the metal liner layer 5028 may include a cobalt (Co) liner and the conductive structure 244 (the bottom interconnect) may include ruthenium (Ru). The metal liner layer 5018 may include ruthenium (Ru). Cobalt may easily occupy ruthenium vacancies, but may have difficulty to be interstitials. Thus for cobalt of the metal liner layer 5028 to diffuse into the ruthenium of the conductive structure 244, the vacancies in the ruthenium need to be adjacent. The ruthenium of the metal liner layer 5018 and the cobalt of the metal liner layer 5028 intermix, which results in RuCo intermixing at the grain boundary. This intermixing helps to further reduce diffusion of the cobalt of the metal liner layer 5028 into the ruthenium of the conductive structure 244 because of the lower energy (e.g., approximately 0.2 eV) needed for the intermixing compared to the energy needed to adjacently diffuse into the ruthenium of the conductive structure 244 (e.g., approximately 3.2 eV). The graphene layer 5024 may be included between the metal liner layer 5028 and the conductive structure 244 to further prevent cobalt diffusion into the ruthenium bottom interconnect (e.g., the conductive structure 244). Moreover, the graphene layer 5024 can help to reduce scattering between the cobalt and ruthenium because of the two-dimensional dangling bond free graphene of the graphene layer 5024.

As indicated above, FIG. 50 is provided as an example. Other examples may differ from what is described with regard to FIG. 50. For example, the BEOL layer 5002 may alternatively include a single damascene structure. As another example, the metal liner layer 5018 may alternatively include a ruthenium (Ru) liner as opposed to a cobalt (Co) liner, and the metal liner layer 5028 may alternatively include a cobalt (Co) liner as opposed to a ruthenium (Ru) liner (similar to the BEOL layer 702 of the semiconductor structure 700 in FIG. 7). As another example, the cobalt capping layer 5022 may alternatively include a ruthenium cobalt (RuCo) capping layer. As another example, a trimming operation described herein may be performed to reduce the thickness of one or more portions of the metal liner layer 5018 and/or to reduce the thickness of one or more portions of the metal liner layer 5028.

Figure 51:
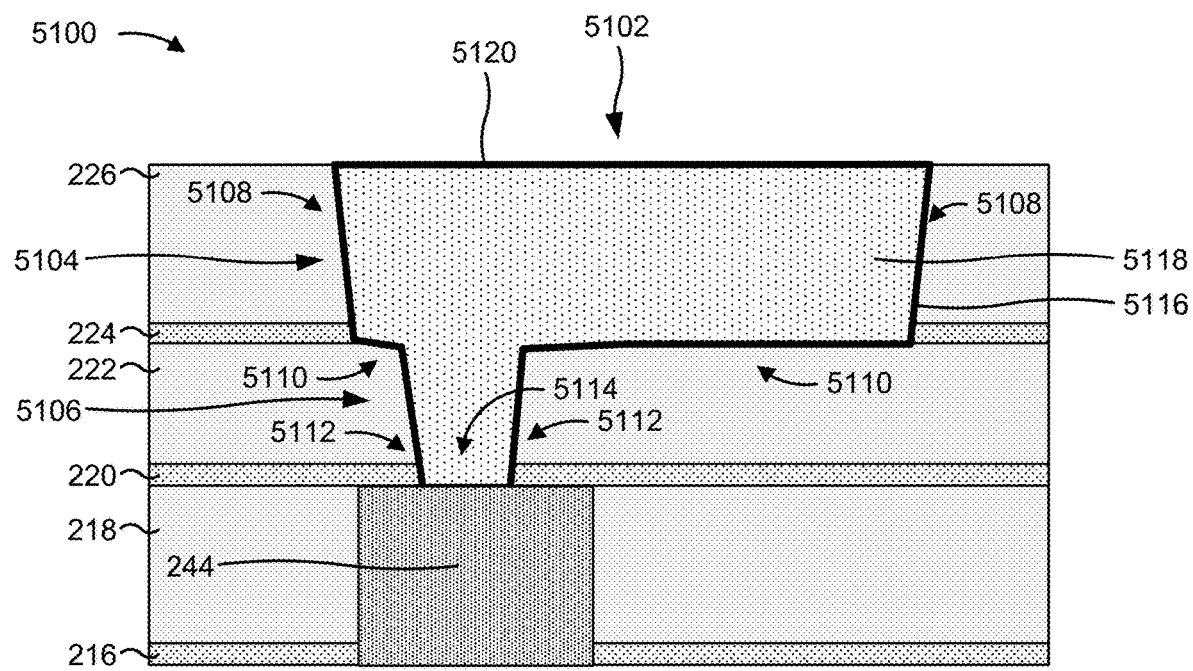

FIG. 51 is a diagram of an example semiconductor structure 5100 described herein. The semiconductor structure 5100 includes a BEOL layer 5102, which may include one or more of the BEOL layers of the device 200 described in connection with FIG. 2. The semiconductor structure 5100 includes a similar configuration of layers and/or structures as the semiconductor structure 300 of FIG. 3. However, a graphene barrier layer 5116 is included in the semiconductor structure 5100 along the sidewalls 5108, 5112 and over the bottom surface 5110 of the BEOL layer 5102 as opposed to a tantalum nitride (TaN) barrier layer 316. The use of the graphene barrier layer 5116 enables metal liner layers to be omitted from the BEOL layer 5102, which increases the gap filling area and/or volume for forming the conductive structure 5118. In some implementations, a graphene capping layer 5120 is included in the BEOL layer 5102 as opposed to a cobalt capping layer.

In some implementations, the graphene barrier layer 5116 is substantially absent and/or omitted from the bottom surface 5114 of the BEOL layer 5102. In some implementations, the graphene barrier layer 5116 is included on the top surface of the conductive structure 244 between the conductive structure 244 and the conductive structure 5118 at the bottom surface 5114.

The graphene barrier layer 5116 includes a multilayer graphene such as bilayer graphene. As described herein, the stacked structure of the graphene barrier layer 5116 resists and/or blocks penetration and/or diffusion of conductive materials of the conductive structure 5118 through the graphene barrier layer 5116, which reduces and/or prevents copper and/or cobalt diffusion from the BEOL layer 5102. In particular, the inter-atom spacing of the stacked structure of the graphene barrier layer 5116 is less than an atomic size of the conductive materials of the conductive structure 5118, which reduces and/or prevents copper and/or cobalt diffusion from the BEOL layer 5102.

In some implementations, a thickness of the graphene barrier layer 5116 on the sidewalls 5108, 5112, and on the bottom surface 5110 is in a range of approximately 3 Å to approximately 20 Å to provide sufficiently low sheet resistance and sufficiently low contact resistance while providing a copper and/or cobalt diffusion resistance. However, other values for the range are within the scope of the present disclosure. In some implementations, a thickness of the graphene barrier layer 5116 on the bottom surface 5114 is in a range of approximately 0 Å to approximately 5 Å to provide sufficiently low sheet resistance and sufficiently low contact resistance while providing a copper and/or cobalt diffusion resistance. However, other values for the range are within the scope of the present disclosure.

As indicated above, FIG. 51 is provided as an example. Other examples may differ from what is described with regard to FIG. 51.

FIGS. 52A-52E are diagrams of an example implementation 5200 described herein. Example implementation 5200 may be an example process for forming the BEOL layer 5102 over a conductive structure (e.g., the conductive structure 244 or another conductive structure) of the device 200.

Figure 52A:
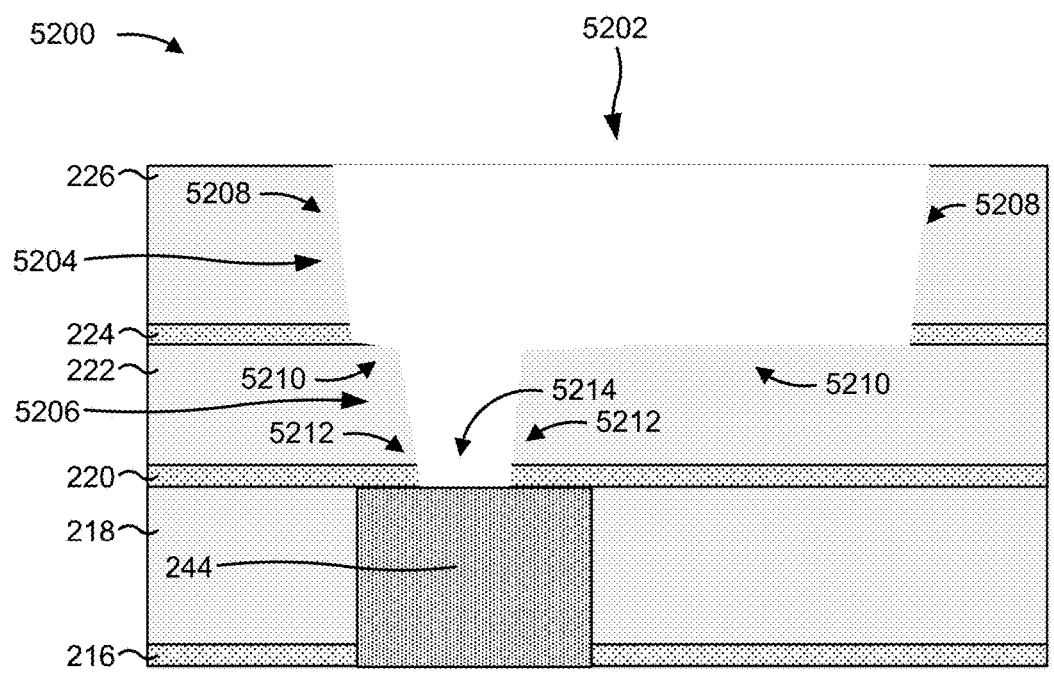
FIGS. 52A-52E are diagrams of an example implementation described herein.

As shown in FIG. 52A, an opening 5202 is formed in and/or through one or more dielectric layers of the device 200, such as the dielectric layer 222 and 226. The opening 5202 may be formed to a portion of a top surface of the conductive structure 244. In some implementations, the opening 5202 is formed in and/or through additional layers, such as one or more ESLs (e.g., the ESL 220 and/or the ESL 224, among other examples). The deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226, the ESL 224, the dielectric layer 222, and/or the ESL 220 to form the opening 5202. In some implementations, a photoresist removal tool removes the remaining portions of the photoresist layer (e.g., using a chemical stripper, a plasma asher, and/or another technique) after the etch tool 108 forms the opening 5202.

For a dual damascene profile, as is shown in the example in FIG. 52A, the opening 5202 may be formed using at least two separate etching steps. The dual damascene profile may be formed using a trench first technique (e.g., where a metallization layer opening 5204 is formed first, and a via opening 5206 is formed second) or a via-first technique (e.g., where the via opening 5206 is formed first, and the metallization layer opening 5204 is formed second), among other examples.

As shown in FIG. 52A, the opening 5202 may include sidewalls 5208 and a bottom surface 5210 of the metallization layer opening 5204, and sidewalls 5212 and a bottom surface 5214 of the via opening 5206. The bottom surface 5214 may correspond to the bottom surface of the opening 5202, and may correspond to the top surface of the conductive structure 244.

Figure 52B:
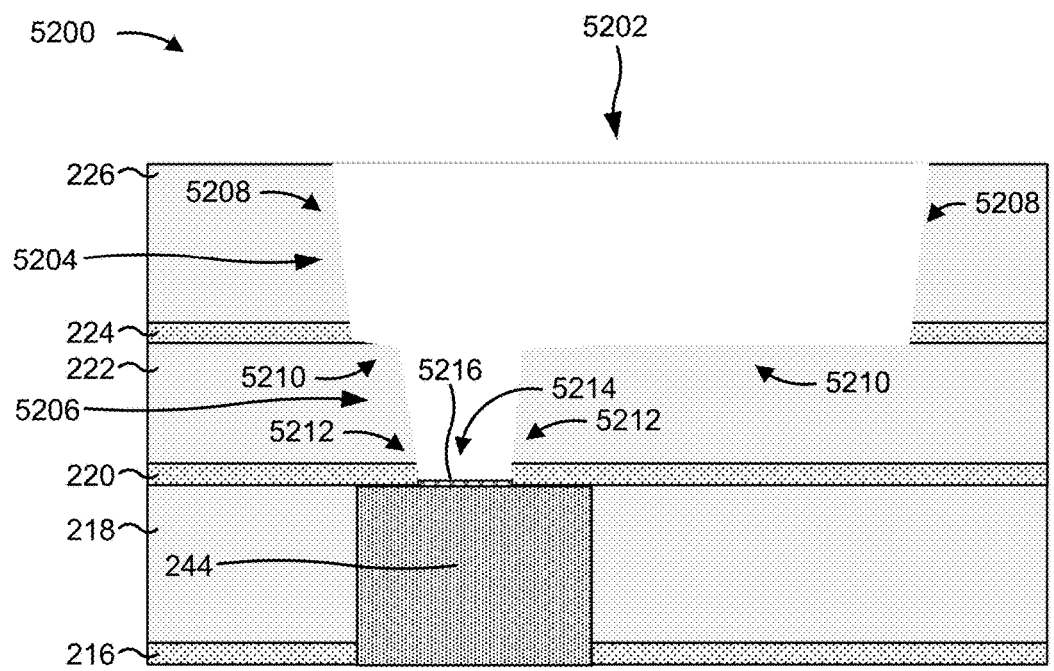

As shown in FIG. 52B, the pre-treatment tool 114 modifies the bottom surface 5214 to forming a blocking layer 5216. The blocking layer 5216 is formed to block and/or prevent the graphene barrier layer 5116 from being formed on the top surface of the conductive structure 244.

Figure 52C:
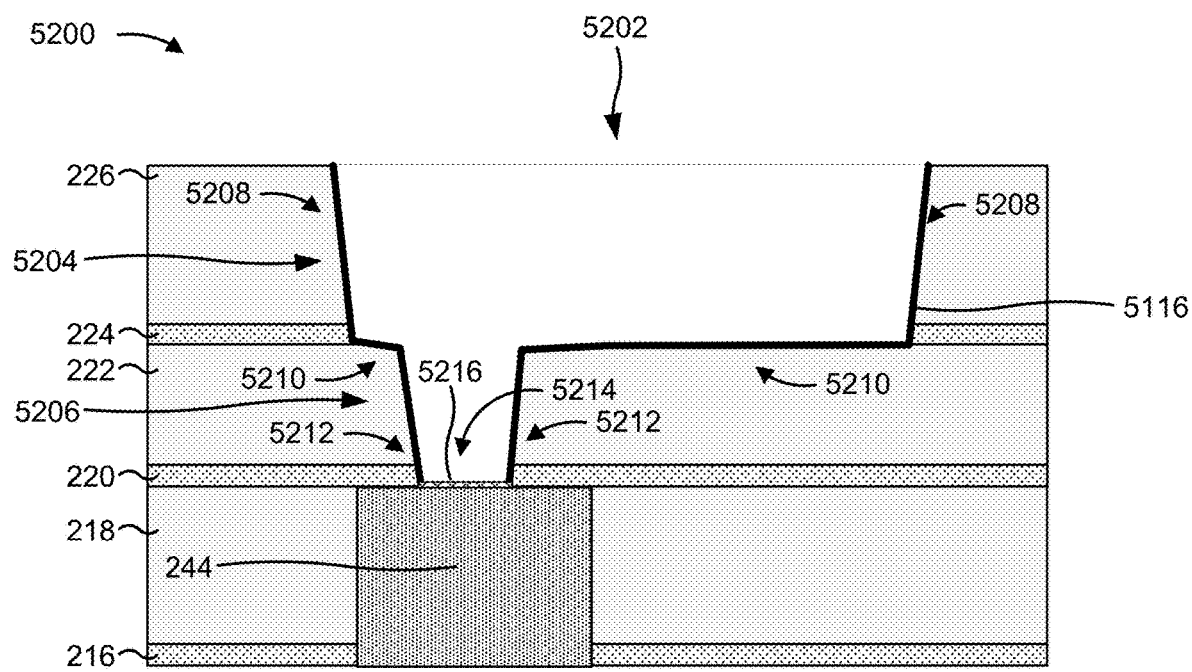

As shown in FIG. 52C, the graphene barrier layer 5116 is formed on the sidewalls 5208, 5212 and on the bottom surface 5210 of the opening 5202. The blocking layer 5216 blocks the graphene barrier layer 5116 from being formed on the top surface of the conductive structure 244. Alternatively, the operations to form the blocking layer 5216 is omitted such that the graphene barrier layer 5116 is formed on the top surface of the conductive structure 244.

The deposition tool 102 may deposit the graphene barrier layer 5116 using a CVD technique, a PVD technique, an ALD technique, or another type of deposition technique. In some implementations, the plasma tool 116 performs the plasma operation described in connection with FIG. 43 to create nucleation sites in the graphene barrier layer 5116 to facilitate bonding between the graphene barrier layer 5116 and the conductive structure 5118.

Figure 52D:
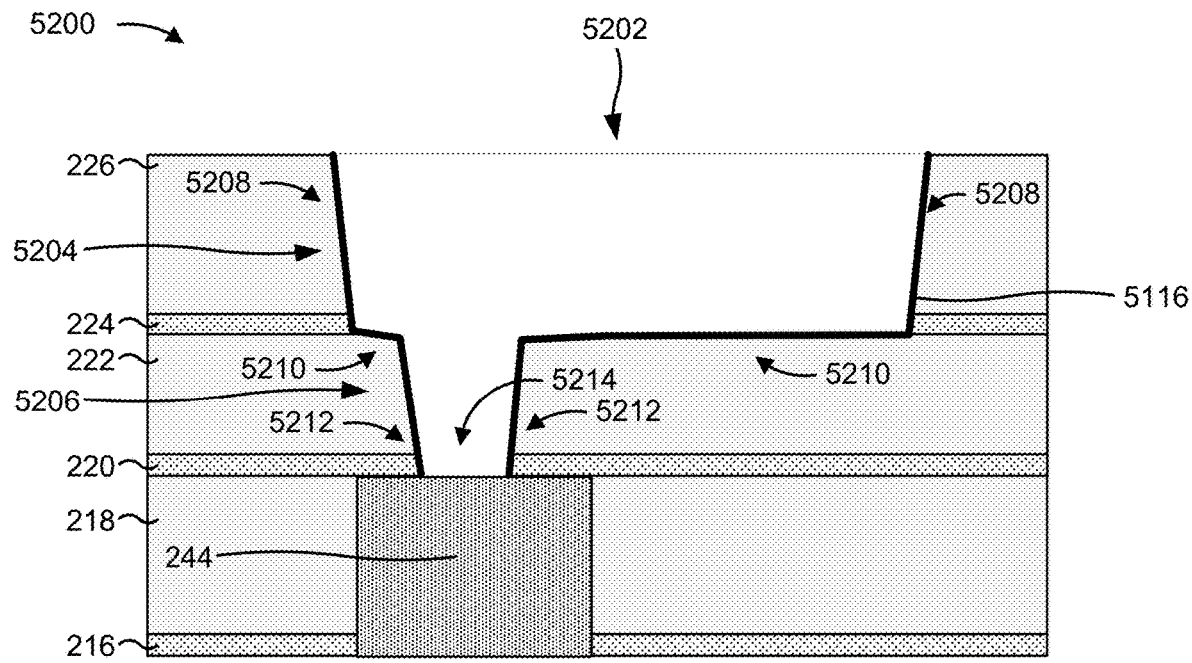

As shown in FIG. 52D, the blocking layer 5216 is removed using techniques described in the example implementation 400. The blocking layer 5216 is removed after formation of the graphene barrier layer 5116.

Figure 52E:
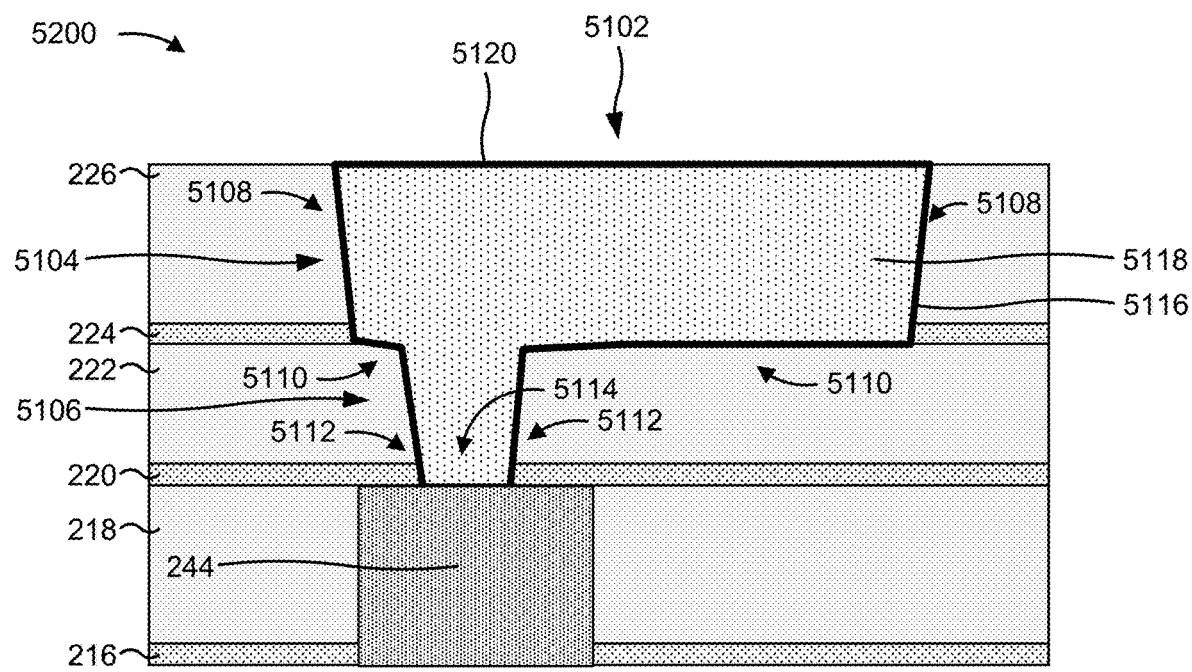

As shown in FIG. 52E, the material (e.g., copper or another material) of the conductive structure 5118 is formed in the opening 5202 over the graphene barrier layer 5116 and over the top surface of the conductive structure 244. The deposition tool 102 may deposit copper of the conductive structure 5118 using a CVD technique, a PVD technique, an ALD technique, or another type of deposition technique, the plating tool 112 may deposit the copper of the conductive structure 5118 using an electroplating operation, or a combination thereof. For example, the deposition tool 102 may deposit a seed layer on the graphene barrier layer 5116 promote adhesion between the graphene barrier layer 5116 and the conductive structure 5118, and the plating tool 112 may deposit the remaining material of the conductive structure 5118 on the seed layer.

In some implementations, the copper flows over the top surface of the dielectric layer 226 as well as into the opening 5202. Accordingly, the BEOL layer 5102 may be planarized. The planarization tool 110 may planarize the BEOL layer 5102 after the conductive structure 5118 is deposited. Additionally, portions of the graphene barrier layer 5116 deposited over the top surface of the dielectric layer 226 may be removed during planarization. In some implementations, the planarization tool 110 uses CMP technique.

As further shown in FIG. 52E, the graphene capping layer 5120 is formed over the conductive structure 5118. Using CMP to planarize the BEOL layer 5102 may cause a recess to form in the conductive structure 5118 due to dishing. Accordingly, the graphene capping layer 5120 may be formed to fill in the recess. The deposition tool 102 may deposit the graphene capping layer 5120 by a CVD technique, a PVD technique, an ALD technique, or another type of deposition technique.

As indicated above, FIGS. 52A-52E are provided as an example. Other examples may differ from what is described with regard to FIGS. 52A-52E. For example, the techniques described in connection with FIGS. 52A-52E may be performed to form a single damascene structure for the BEOL layer 5102.

Figure 53:
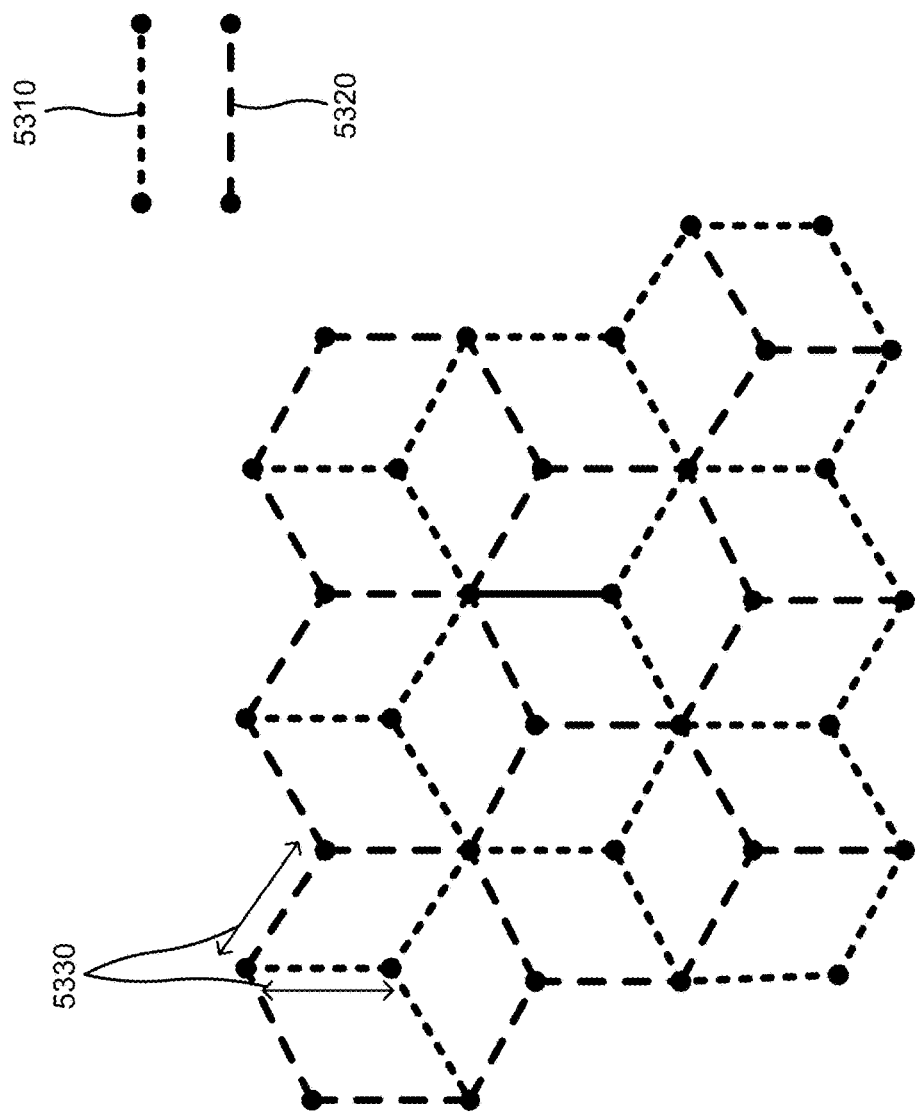
FIG. 53 is a diagram of an example implementation of bilayer graphene described herein.

FIG. 53 is a diagram of an example implementation 5300 of bilayer graphene described herein. Bilayer graphene (and more generally, multilayer graphene) may be used in one or more implementations described herein as a blocking layer and/or a barrier layer. As shown in FIG. 53, bilayer graphene includes a first layer 5310 of graphene and a second layer 5320 of graphene that is stacked over the first layer 5310. Each of the first layer 5310 and the second layer 5320 is formed in a sheet of repeating hexagonal shapes that are formed by two-dimensional carbon-carbon bonds. The example implementation 5300 includes an example of AB-stacked bilayer graphene, in which approximately half of the carbon atoms of the first layer 5310 are positioned approximately in the center of the hexagonal shapes of the second layer 5320, and in which approximately half of the carbon atoms of the second layer 5320 are positioned approximately in the center of the hexagonal shapes of the first layer 5310. However, other stacking arrangements may be used herein, including AA-stacked (e.g., where the hexagonal shapes of the first layer 5310 and the second layer 5320 are aligned) and twisted (where one of the first layer 5310 or the second layer 5320 is rotated relative to the other layer).

As further shown in FIG. 53, the bilayer graphene includes an inter-atom spacing 5330. The inter-atom spacing is less than an atomic size of the materials of the barrier layers described herein, the materials of the metal liner layers described herein, and the materials of the conductive structures described herein. The atomic size may refer to an atomic diameter, the lattice constant, and/or another atomic size parameter. As an example, the inter-atom spacing 5330 of bilayer graphene may be approximately 1.42 Å, whereas the atomic diameter of a copper (Cu) atom may be approximately 2.56 Å. In this way, bilayer graphene may be used herein as a blocking layer and/or a barrier layer because of an inability of the atoms of the materials described herein to penetrate and/or diffuse through bilayer graphene resulting in the greater atomic size of the materials described herein relative to the inter-atom spacing 5330 of bilayer graphene.

As indicated above, FIG. 53 is provided as an example. Other examples may differ from what is described with regard to FIG. 53.

Figure 54:
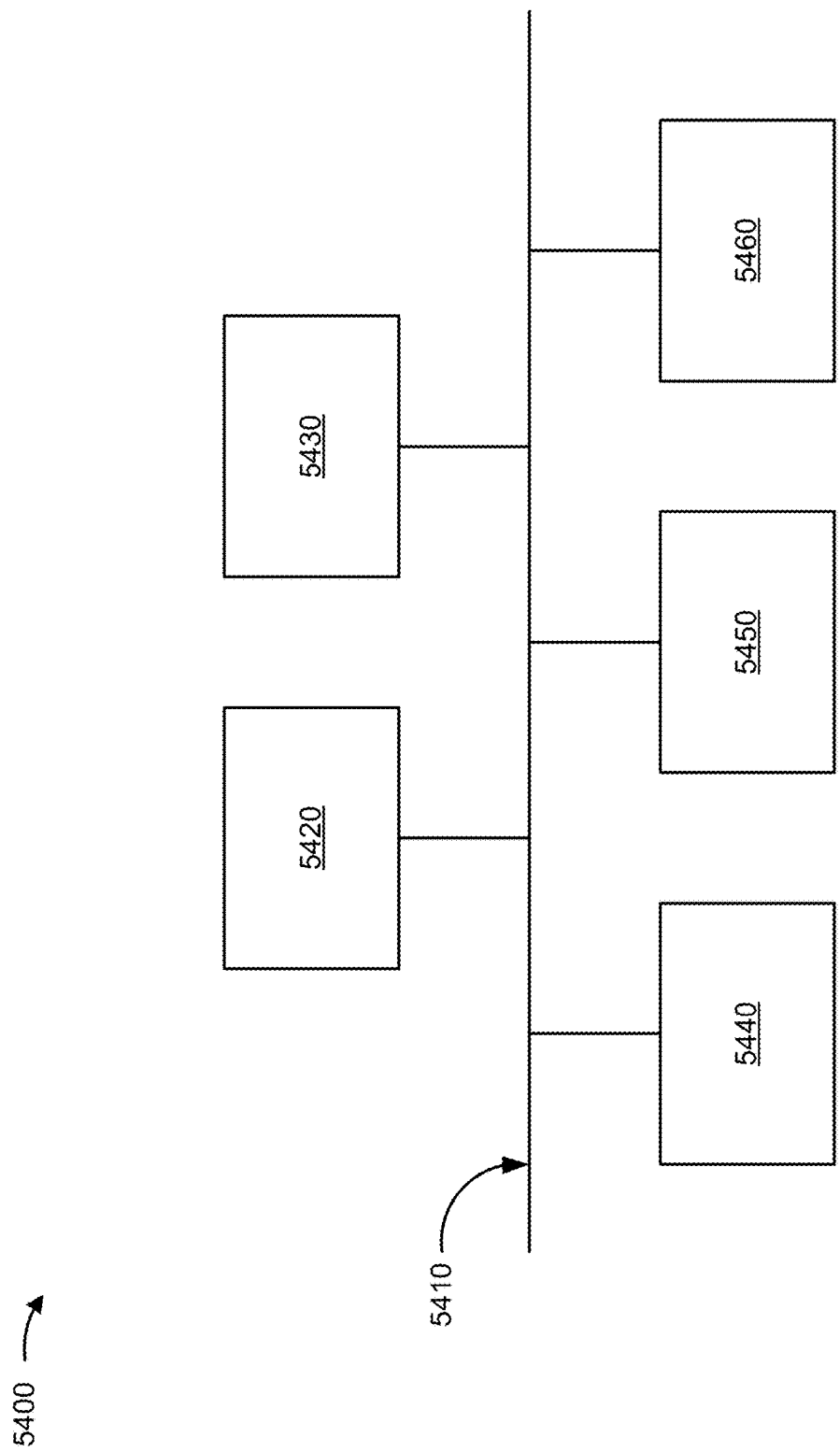
FIG. 54 is a diagram of example components of one or more devices of FIG. 1 described herein.

FIG. 54 is a diagram of example components of a device 5400. In some implementations, one or more of the semiconductor processing tools 102-116 and/or the wafer/die transport tool 118 include one or more devices 5400 and/or one or more components of device 5400. As shown in FIG. 54, device 5400 may include a bus 5410, a processor 5420, a memory 5430, an input component 5440, an output component 5450, and a communication component 5460.

Bus 5410 includes one or more components that enable wired and/or wireless communication among the components of device 5400. Bus 5410 may couple together two or more components of FIG. 54, such as via operative coupling, communicative coupling, electronic coupling, and/or electric coupling. Processor 5420 includes a central processing unit, a graphics processing unit, a microprocessor, a controller, a microcontroller, a digital signal processor, a field-programmable gate array, an application-specific integrated circuit, and/or another type of processing component. Processor 5420 is implemented in hardware, firmware, or a combination of hardware and software. In some implementations, processor 5420 includes one or more processors capable of being programmed to perform one or more operations or processes described elsewhere herein.

Memory 5430 includes volatile and/or nonvolatile memory. For example, memory 5430 may include random access memory (RAM), read only memory (ROM), a hard disk drive, and/or another type of memory (e.g., a flash memory, a magnetic memory, and/or an optical memory). Memory 5430 may include internal memory (e.g., RAM, ROM, or a hard disk drive) and/or removable memory (e.g., removable via a universal serial bus connection). Memory 5430 may be a non-transitory computer-readable medium. Memory 5430 stores information, instructions, and/or software (e.g., one or more software applications) related to the operation of device 5400. In some implementations, memory 5430 includes one or more memories that are coupled with one or more processors (e.g., processor 5420), such as via bus 5410.

Input component 5440 enables device 5400 to receive input, such as user input and/or sensed input. For example, input component 5440 may include a touch screen, a keyboard, a keypad, a mouse, a button, a microphone, a switch, a sensor, a global positioning system sensor, an accelerometer, a gyroscope, and/or an actuator. Output component 5450 enables device 5400 to provide output, such as via a display, a speaker, and/or a light-emitting diode. Communication component 5460 enables device 5400 to communicate with other devices via a wired connection and/or a wireless connection. For example, communication component 5460 may include a receiver, a transmitter, a transceiver, a modem, a network interface card, and/or an antenna.

Device 5400 may perform one or more operations or processes described herein. For example, a non-transitory computer-readable medium (e.g., memory 5430) may store a set of instructions (e.g., one or more instructions or code) for execution by processor 5420. Processor 5420 may execute the set of instructions to perform one or more operations or processes described herein. In some implementations, execution of the set of instructions, by one or more processors 5420, causes the one or more processors 5420 and/or the device 5400 to perform one or more operations or processes described herein. In some implementations, hardwired circuitry is used instead of or in combination with the instructions to perform one or more operations or processes described herein. Additionally, or alternatively, processor 5420 may be configured to perform one or more operations or processes described herein. Thus, implementations described herein are not limited to any specific combination of hardware circuitry and software.

The number and arrangement of components shown in FIG. 54 are provided as an example. Device 5400 may include additional components, fewer components, different components, or differently arranged components than those shown in FIG. 54. Additionally, or alternatively, a set of components (e.g., one or more components) of device 5400 may perform one or more functions described as being performed by another set of components of device 5400.

Figure 55:
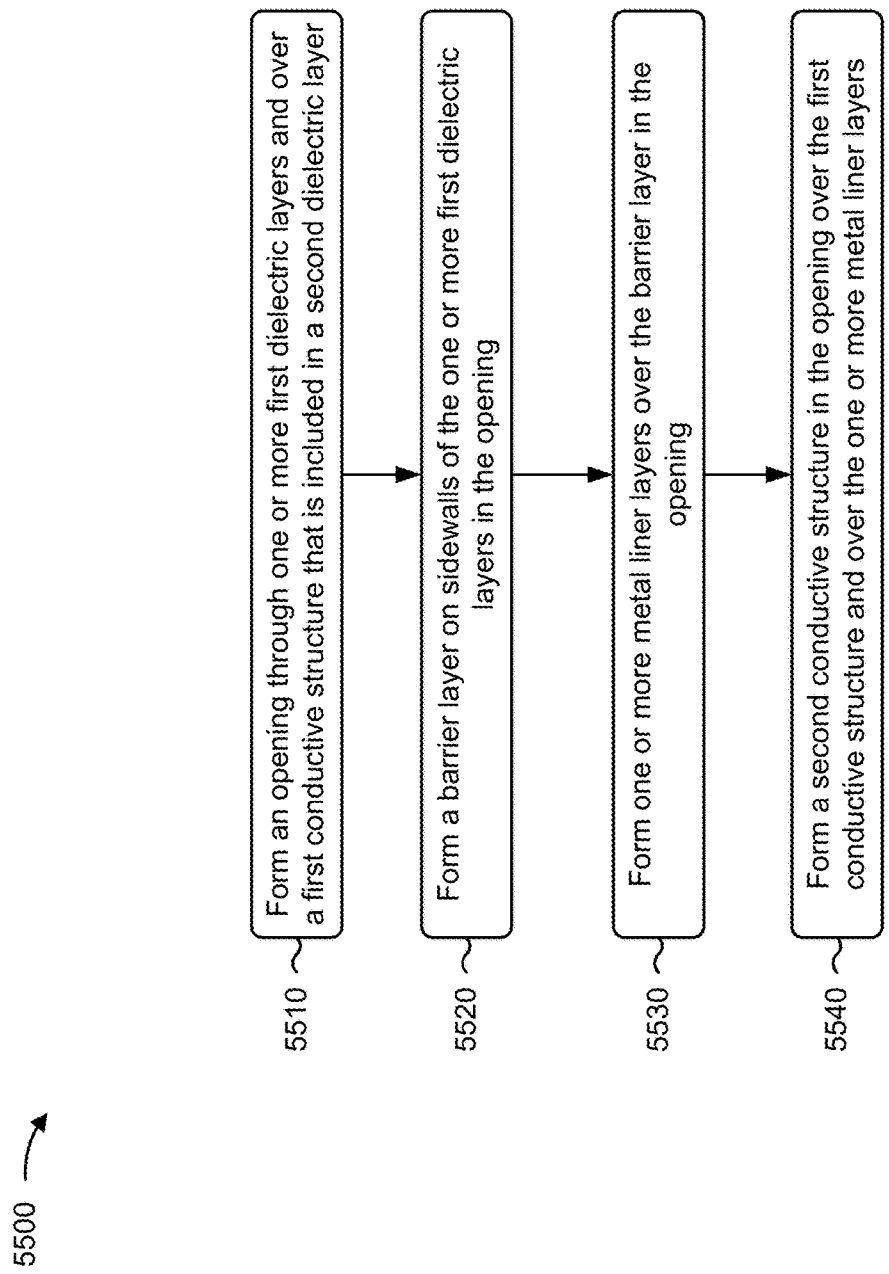
FIGS. 55 and 56 are flowcharts of example processes associated with forming a semiconductor device described herein.

FIG. 55 is a flowchart of an example process 5500 associated with forming a semiconductor structure. In some implementations, one or more process blocks of FIG. 55 are performed by a one or more of the semiconductor processing tools 102-116 (e.g., one or more of the semiconductor processing tools 102-116). Additionally, or alternatively, one or more process blocks of FIG. 55 may be performed by one or more components of device 5400, such as processor 5420, memory 5430, input component 5440, output component 5450, and/or communication component 5460.

As shown in FIG. 55, process 5500 may include forming an opening through one or more first dielectric layers and over a first conductive structure that is included in a second dielectric layer (block 5510). For example, one or more of the semiconductor processing tools 102-116 may form an opening (3002, 3202, 3502, 3702, 3902) through one or more first dielectric layers (222, 226) and over a first conductive structure (244) that is included in a second dielectric layer (218), as described above.

As further shown in FIG. 55, process 5500 may include forming a barrier layer on sidewalls of the one or more first dielectric layers in the opening (block 5520). For example, one or more of the semiconductor processing tools 102-116 may form a barrier layer (2916-5016) on sidewalls of the one or more first dielectric layers in the opening, as described above. In some implementations, a graphene layer (2924-4024, 4124-5024) over the first conductive structure in the opening reduces a likelihood of the barrier layer being formed on the first conductive structure.

As further shown in FIG. 55, process 5500 may include forming one or more metal liner layers over the barrier layer in the opening (block 5530). For example, one or more of the semiconductor processing tools 102-116 may form one or more metal liner layers (2918-5018, 3428-4028, 4528-5028) over the barrier layer in the opening, as described above.

As further shown in FIG. 55, process 5500 may include forming a second conductive structure in the opening over the first conductive structure and over the one or more metal liner layers (block 5540). For example, one or more of the semiconductor processing tools 102-116 may form a second conductive structure (2920-5020) in the opening over the first conductive structure and over the one or more metal liner layers, as described above.

Process 5500 may include additional implementations, such as any single implementation or any combination of implementations described below and/or in connection with one or more other processes described elsewhere herein.

In a first implementation, process 5500 includes removing, through the opening, a portion of the graphene layer from a top surface of the first conductive structure after forming the barrier layer, where forming the one or more metal liner layers includes forming the one or more metal liner layers over the top surface of the first conductive structure after removing the graphene layer from the top surface of the first conductive structure. In a second implementation, alone or in combination with the first implementation, forming the one or more metal liner layers includes forming a first metal liner layer, of the one or more metal liner layers, on the barrier layer in the opening, where the graphene layer reduces a likelihood of the first metal liner layer being formed on the first conductive structure, process 5500 includes removing, through the opening, a portion of the graphene layer from a top surface of the first conductive structure after forming the first metal liner layer, and forming the one or more metal liner layers includes forming a second metal liner layer of the one or more metal liner layers on the first metal liner layer and on the top surface of the first conductive structure after removing the graphene layer from the top surface of the first conductive structure.

In a third implementation, alone or in combination with one or more of the first and second implementations, forming the one or more metal liner layers includes forming a first metal liner layer, of the one or more metal liner layers, on the barrier layer in the opening, and forming a second metal liner layer, of the one or more metal liner layers, on the first metal liner layer in the opening, where the graphene layer reduces a likelihood of the first metal liner layer and the second metal liner layer being formed on the first conductive structure, and where the method further includes removing, through the opening, a portion of the graphene layer from a top surface of the first conductive structure after forming the second metal liner layer.

In a fourth implementation, alone or in combination with one or more of the first through third implementations, process 5500 includes removing, through the opening, a portion of the graphene layer from a top surface of the first conductive structure after forming the barrier layer, removing the portion of the graphene layer includes using an argon (Ar) plasma to break bonds of the portion of the graphene layer, which results in formation of oxygen-terminated defects and hydroxyl-terminated defects in the portion of the graphene layer, where the oxygen-terminated defects and the hydroxyl-terminated defects cause the portion of the graphene layer to transition to an amorphous organic carbon, and using at least one of a hydrogen ($H_2$) plasma or hydrogen (H) radicals to remove the amorphous organic carbon from the top surface of the first conductive structure.

In a fifth implementation, alone or in combination with one or more of the first through fourth implementations, process 5500 includes performing a surface treatment of the graphene layer to create nucleation sites in the graphene layer, where forming the one or more metal liner layers comprises forming, using the nucleation sites, at least one of the one or more metal liners on the graphene layer after performing the surface treatment of the graphene layer.

In a sixth implementation, alone or in combination with one or more of the first through fifth implementations, process 5500 includes forming the second dielectric layer, forming the first conductive structure in the second dielectric layer, forming the graphene layer over the second dielectric layer and over the first conductive structure, and forming the one or more first dielectric layers over the graphene layer, where forming the opening includes forming the opening through the one or more first dielectric layers to the graphene layer over the first conductive structure. In a seventh implementation, alone or in combination with one or more of the first through sixth implementations, process 5500 includes forming, after forming the opening, the graphene layer over the first conductive structure in the opening prior to forming the barrier layer.

Although FIG. 55 shows example blocks of process 5500, in some implementations, process 5500 includes additional blocks, fewer blocks, different blocks, or differently arranged blocks than those depicted in FIG. 55. Additionally, or alternatively, two or more of the blocks of process 5500 may be performed in parallel.

Figure 56:
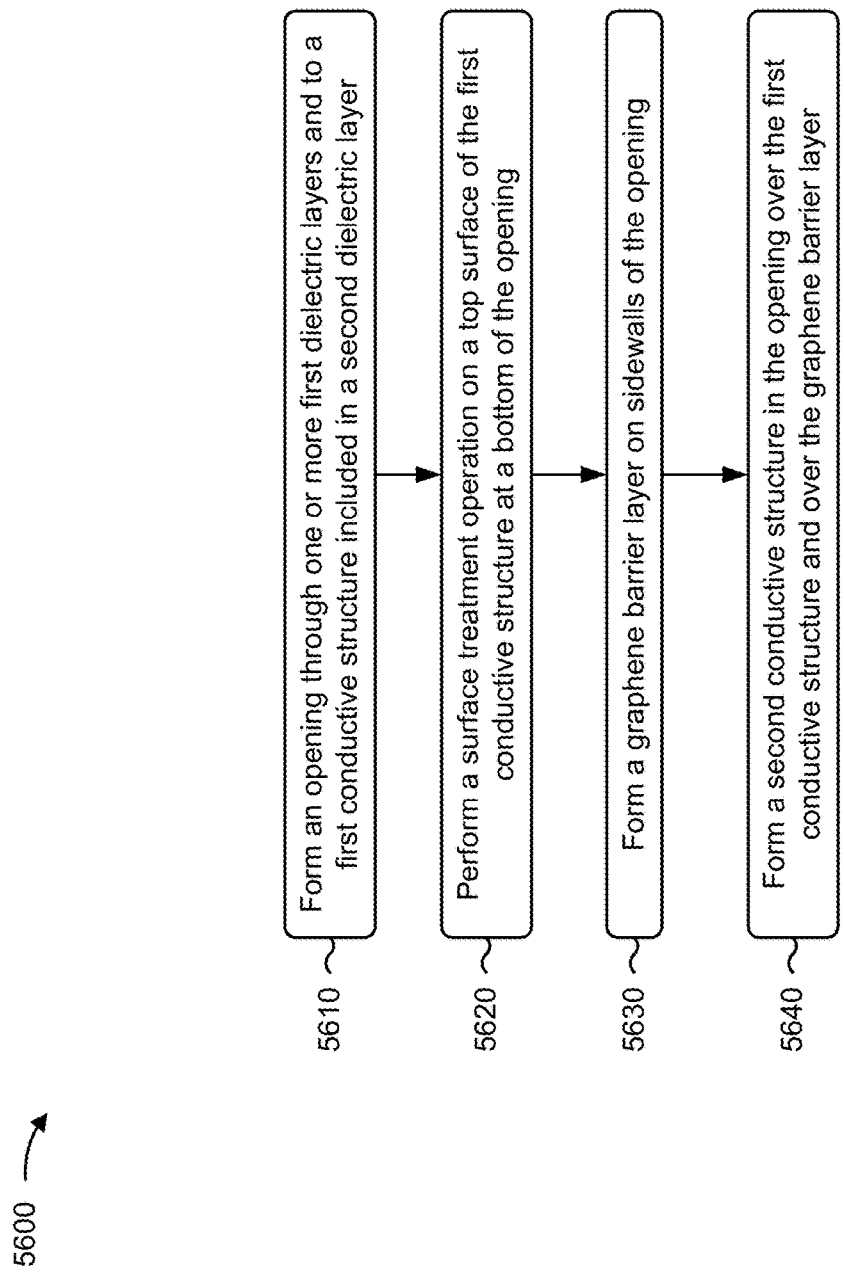

FIG. 56 is a flowchart of an example process 5600 associated with forming a semiconductor structure. In some implementations, one or more process blocks of FIG. 56 are performed by one or more of the semiconductor processing tools (e.g., one or more of the semiconductor processing tools 102-116). Additionally, or alternatively, one or more process blocks of FIG. 56 may be performed by one or more components of device 5400, such as processor 5420, memory 5430, input component 5440, output component 5450, and/or communication component 5460.

As shown in FIG. 56, process 5600 may include forming an opening through one or more first dielectric layers and to a first conductive structure included in a second dielectric layer (block 5610). For example, one or more of the semiconductor processing tools 102-116 may form an opening (5202) through one or more first dielectric layers (222, 226) and to a first conductive structure (244) included in a second dielectric layer (218), as described above.

As further shown in FIG. 56, process 5600 may include performing a surface treatment operation on a top surface of the first conductive structure at a bottom of the opening (block 5620). For example, one or more of the semiconductor processing tools 102-116 may perform a surface treatment operation on a top surface of the first conductive structure at a bottom surface (5214) of the opening, as described above.

As further shown in FIG. 56, process 5600 may include forming a graphene barrier layer on sidewalls of the opening (block 5630). For example, one or more of the semiconductor processing tools 102-116 may form a graphene barrier layer on sidewalls (5208, 5212) of the opening, as described above. In some implementations, the surface treatment operation reduces a likelihood of the graphene barrier layer being formed on the top surface of the first conductive structure.

As further shown in FIG. 56, process 5600 may include forming a second conductive structure in the opening over the first conductive structure and over the graphene barrier layer (block 5640). For example, one or more of the semiconductor processing tools 102-116 may form a second conductive structure (5118) in the opening over the first conductive structure and over the graphene barrier layer, as described above.

Process 5600 may include additional implementations, such as any single implementation or any combination of implementations described below and/or in connection with one or more other processes described elsewhere herein.

In a first implementation, the graphene barrier layer includes bilayer graphene. In a second implementation, alone or in combination with the first implementation, an inter-atom spacing of the bilayer graphene of the graphene barrier layer is less than an atomic diameter of a conductive material of the second conductive structure.

Although FIG. 56 shows example blocks of process 5600, in some implementations, process 5600 includes additional blocks, fewer blocks, different blocks, or differently arranged blocks than those depicted in FIG. 56. Additionally, or alternatively, two or more of the blocks of process 5600 may be performed in parallel.

Some implementations described herein provide various techniques for forming the barrier layer such that the barrier layer is omitted from a top surface of the conductive structure in the opening. Some techniques described herein include performing a surface treatment operation on the top surface of the conductive structure such that material of the barrier layer does not bond to the top surface of the conductive structure, which prevents and/or reduces the likelihood of the barrier layer forming on the top surface of the conductive structure. Some techniques described herein include forming a graphene layer in the opening on the top surface of the conductive structure, where the graphene layer prevents and/or reduces the likelihood of the barrier layer forming on the top surface of the conductive structure. In this way, the reminder of the opening may be filled with a conductive material to form a BEOL layer in the opening over the conductive structure such that no intervening barrier layer is between the conductive structure and the BEOL layer. This reduces contact resistance between the conductive structure and the BEOL layer, which increases semiconductor device performance of a semiconductor device in which the semiconductor structure is included. In some implementations described herein, one or more metal liners (e.g., a ruthenium (Ru) liner, a cobalt (Co) liner) are included between the barrier layer and the BEOL layer to decrease surface roughness and promote adhesion between the barrier layer and the BEOL layer. In some implementations described herein, bilayer (or multilayer) graphene is used as the barrier layer. The inter-atom spacing of bilayer graphene is less than an atomic size (e.g., an atomic diameter) of a material used for the BEOL layer, which prevents atoms of the material used for the BEOL layer from diffusing through the bilayer graphene.

As described in greater detail above, some implementations described herein provide a semiconductor structure. The semiconductor structure includes a first dielectric layer. The semiconductor structure includes a first conductive structure in the first dielectric layer. The semiconductor structure includes one or more second dielectric layers above the first dielectric layer and above the first conductive structure. The semiconductor structure includes a second conductive structure in the one or more second dielectric layers and over the first conductive structure. The semiconductor structure includes one or more metal liner layers between the second conductive structure and the one or more second dielectric layers. The semiconductor structure includes a nitride barrier layer between the one or more metal liner layers and the one or more second dielectric layers, where at least one metal liner layer of the one or more metal liner layers is electrically coupled directly with a top surface of the first conductive structure, and the second conductive structure is electrically coupled with the top surface of the first conductive structure through the at least one metal liner layer, or where the second conductive structure is electrically coupled directly with the top surface of the first conductive structure.

As described in greater detail above, some implementations described herein provide a method. The method includes forming an opening through one or more first dielectric layers and over a first conductive structure that is included in a second dielectric layer. The method includes forming a barrier layer on sidewalls of the one or more first dielectric layers in the opening, where a graphene layer over the first conductive structure in the opening reduces a likelihood of the barrier layer being formed on the first conductive structure. The method includes forming one or more metal liner layers over the barrier layer in the opening. The method includes forming a second conductive structure in the opening over the first conductive structure and over the one or more metal liner layers.

As described in greater detail above, some implementations described herein provide a method. The method includes forming an opening through one or more first dielectric layers and to a first conductive structure included in a second dielectric layer. The method includes performing a surface treatment operation on a top surface of the first conductive structure at a bottom of the opening. The method includes forming a graphene barrier layer on sidewalls of the opening, where the surface treatment operation reduces a likelihood of the graphene barrier layer being formed on the top surface of the first conductive structure. The method includes forming a second conductive structure in the opening over the first conductive structure and over the graphene barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an opening through one or more first dielectric layers and over a first conductive structure that is included in a second dielectric layer, wherein the opening comprises first sidewalls, second sidewalls, and slanted bottom surfaces, wherein the second sidewalls form a bottom of the opening and are connected to the first sidewalls via the slanted bottom surfaces;
    forming a barrier layer on the first sidewalls, the second sidewalls, and the slanted bottom surfaces of the one or more first dielectric layers in the opening,
        wherein a graphene layer is over the first conductive structure in the opening;
    performing a surface treatment of the graphene layer to create nucleation sites in the graphene layer;
    forming, using the nucleation sites, one or more metal liner layers over the graphene layer; and
    forming a second conductive structure in the opening over the first conductive structure and over the one or more metal liner layers.

2. The method of claim 1, further comprising:
removing, through the opening, a portion of the graphene layer from a top surface of the first conductive structure after forming the barrier layer.

3. The method of claim 2, wherein the second conductive structure comprises copper (Cu).

4. The method of claim 2, wherein the one or more first dielectric layers comprises a plurality of first dielectric layers.

5. The method of claim 1, wherein forming the one or more metal liner layers comprises:
forming a first metal liner layer, of the one or more metal liner layers, on the barrier layer in the opening, wherein the graphene layer reduces a likelihood of the first metal liner layer being formed on the first conductive structure;
wherein the method further comprises:
removing, through the opening, a portion of the graphene layer from a top surface of the first conductive structure after forming the first metal liner layer; and
wherein forming the one or more metal liner layers comprises:
forming a second metal liner layer of the one or more metal liner layers on the first metal liner layer and on the top surface of the first conductive structure after removing the graphene layer from the top surface of the first conductive structure.

6. The method of claim 1, wherein forming the one or more metal liner layers comprises:
forming a first metal liner layer, of the one or more metal liner layers, on the barrier layer in the opening; and
forming a second metal liner layer, of the one or more metal liner layers, on the first metal liner layer in the opening,
wherein the graphene layer reduces a likelihood of the first metal liner layer and the second metal liner layer being formed on the first conductive structure; and
wherein the method further comprises:
removing, through the opening, a portion of the graphene layer from a top surface of the first conductive structure after forming the second metal liner layer.

7. The method of claim 1, further comprising:
removing, through the opening, a portion of the graphene layer from a top surface of the first conductive structure after forming the barrier layer,
wherein removing the portion of the graphene layer comprises:
using an argon (Ar) plasma to break bonds of the portion of the graphene layer, which results in formation of oxygen-terminated defects and hydroxyl-terminated defects in the portion of the graphene layer,
wherein the oxygen-terminated defects and the hydroxyl-terminated defects cause the portion of the graphene layer to transition to an amorphous organic carbon; and
using at least one of a hydrogen ($H_2$) plasma or hydrogen (H) radicals to remove the amorphous organic carbon from the top surface of the first conductive structure.

8. The method of claim 1, further comprising:
forming the second dielectric layer;
forming the first conductive structure in the second dielectric layer;
forming the graphene layer over the second dielectric layer and over the first conductive structure; and
forming the one or more first dielectric layers over the graphene layer,
wherein forming the opening comprises:
forming the opening through the one or more first dielectric layers to the graphene layer over the first conductive structure.

9. The method of claim 1, further comprising:
forming, after forming the opening, the graphene layer over the first conductive structure in the opening prior to forming the barrier layer.

10. A method, comprising:
forming an opening through one or more first dielectric layers and to a first conductive structure included in a second dielectric layer, wherein the opening comprises first slanted sidewalls, second slanted sidewalls, and bottom surfaces, wherein the second slanted sidewalls form a bottom of the opening and are connected to the first slanted sidewalls via the bottom surfaces;
performing a surface treatment operation on a top surface of the first conductive structure at the bottom of the opening;
forming a graphene barrier layer on the first slanted sidewalls, the second slanted sidewalls, and the bottom surfaces of the one or more first dielectric layers in the opening;
removing, through the opening, a portion of the graphene barrier layer from a top surface of the first conductive structure,
wherein removing the portion of the graphene barrier layer comprises:
using an argon (Ar) plasma to break bonds of the portion of the graphene barrier layer, which results in formation of oxygen-terminated defects and hydroxyl-terminated defects in the portion of the graphene barrier layer,
wherein the oxygen-terminated defects and the hydroxyl-terminated defects cause the portion of the graphene barrier layer to transition to an amorphous organic carbon; and
using at least one of a hydrogen ($H_2$) plasma or hydrogen (H) radicals to remove the amorphous organic carbon from the top surface of the first conductive structure; and
forming, after removing the portion of the graphene barrier layer, a second conductive structure in the opening over the first conductive structure and over the graphene barrier layer.

11. The method of claim 10, wherein the graphene barrier layer comprises bilayer graphene.

12. The method of claim 11, wherein an inter-atom spacing of the bilayer graphene of the graphene barrier layer is less than an atomic diameter of a conductive material of the second conductive structure.

13. A method, comprising:
forming an opening through one or more first dielectric layers and over a first conductive structure that is included in a second dielectric layer;
forming a graphene barrier layer on sidewalls of the opening;
performing a surface treatment of the graphene barrier layer to create nucleation sites in the graphene barrier layer;
forming, using the nucleation sites, one or more metal liner layers over the graphene barrier layer;
forming a second conductive structure in the opening over the first conductive structure and over the one or more metal liner layers; and forming a cobalt capping layer over the second conductive structure.

14. The method of claim 13, further comprising:
   forming one or more metal liner layers over the graphene barrier layer in the opening.

15. The method of claim 14, wherein the one or more metal liner layers comprise at least one of: a cobalt (Co) liner, or a ruthenium (Ru) liner.

16. The method of claim 14, further comprising:
   forming a nitride barrier layer between the one or more metal liner layers and the one or more second dielectric layers.

17. The method of claim 16, wherein at least one metal liner layer, of the one or more metal liner layers, is electrically coupled directly with a top surface of the first conductive structure, and wherein the second conductive structure is electrically coupled with a top surface of the first conductive structure through the at least one metal liner layer.

18. The method of claim 17, wherein the at least one metal liner layer comprises a first metal liner layer and a second metal liner layer.

19. The method of claim 18, wherein a first thickness, of the first metal liner layer between the nitride barrier layer and the second conductive structure, is greater relative to a second thickness of first metal liner layer between the first conductive structure and the second conductive structure.

20. The method of claim 13, wherein the second conductive structure comprises copper (Cu).

21. The method of claim 13, wherein the one or more first dielectric layers comprises a plurality of first dielectric layers.

* * * * *